United States Patent
Imoto et al.

(10) Patent No.: US 12,149,839 B2
(45) Date of Patent: Nov. 19, 2024

(54) SOLID-STATE IMAGING DEVICE WITH TRANSISTOR DRAIN CONNECTED TO SENSE NODE OF LOGARITHMIC CONVERSION CIRCUIT

(71) Applicant: Sony Semiconductor Solutions Corporation, Kanagawa (JP)

(72) Inventors: Tsutomu Imoto, Kanagawa (JP); Yusuke Ikeda, Tokyo (JP); Atsumi Niwa, Kanagawa (JP); Atsushi Suzuki, Kanagawa (JP); Shinichirou Etou, Kanagawa (JP); Kenichi Takamiya, Kanagawa (JP); Takuya Maruyama, Kanagawa (JP); Ren Hiyoshi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 73 days.

(21) Appl. No.: 18/011,437

(22) PCT Filed: Apr. 23, 2021

(86) PCT No.: PCT/JP2021/016555
§ 371 (c)(1),
(2) Date: Dec. 19, 2022

(87) PCT Pub. No.: WO2021/261069
PCT Pub. Date: Dec. 30, 2021

(65) Prior Publication Data
US 2023/0247314 A1    Aug. 3, 2023

(30) Foreign Application Priority Data

Jun. 26, 2020 (JP) .................. 2020-110956
Mar. 25, 2021 (JP) .................. 2021-052370

(51) Int. Cl.
*H04N 25/47* (2023.01)
*H04N 25/60* (2023.01)
(Continued)

(52) U.S. Cl.
CPC .............. *H04N 25/47* (2023.01); *H04N 25/77* (2023.01); *H04N 25/78* (2023.01); *H04N 25/60* (2023.01)

(58) Field of Classification Search
CPC ........ H04N 25/47; H04N 25/77; H04N 25/78; H04N 25/60; H04N 25/707; H04N 25/79;
(Continued)

(56) References Cited

U.S. PATENT DOCUMENTS 10,348,994 B2 * 7/2019 Zamir .................. H04N 25/533
10,811,447 B2 * 10/2020 Hanzawa ............... H04N 25/57
(Continued)

FOREIGN PATENT DOCUMENTS

JP         5244587 B2     4/2013
JP      2019134271 A     8/2019
(Continued)

OTHER PUBLICATIONS

International Search Report (PCT/ISA/210), International Application No. PCT/JP2021/016555, dated Jun. 8, 2021.

*Primary Examiner* — Ahmed A Berhan
(74) *Attorney, Agent, or Firm* — Michael Best & Friedrich LLP

(57) ABSTRACT

Suppressing a dead period at the time of mode switching. A solid-state imaging device includes: a plurality of pixels (300) that each outputs a luminance change of incident light; and a detection circuit (305) that outputs an event signal based on the luminance change output from each of the pixels, in which each of the pixels includes: a photoelectric conversion element (311) that generates a charge according to an incident light amount; a logarithmic conversion circuit (312, 313) that is connected to the photoelectric conversion element and converts a photocurrent flowing out of the photoelectric conversion element into a voltage signal corresponding to a logarithmic value of the photocurrent; and a first transistor (318) having a drain connected to a sense node of the logarithmic conversion circuit.

20 Claims, 80 Drawing Sheets

(51) Int. Cl.
*H04N 25/77* (2023.01)
*H04N 25/78* (2023.01)

(58) Field of Classification Search
CPC .............................. H04N 25/573; H04N 25/76; H01L 27/14612; H01L 27/14609; H01L 27/14636
See application file for complete search history.

(56) References Cited

U.S. PATENT DOCUMENTS

| | | |
|---|---|---|
| 2020/0351455 A1 | 11/2020 | Niwa |
| 2022/0132054 A1 | 4/2022 | Zhu |
| 2022/0038645 A1 | 8/2022 | Takahashi |

FOREIGN PATENT DOCUMENTS

| | | |
|---|---|---|
| WO | 2019239722 A1 | 12/2019 |
| WO | 2020066433 A1 | 4/2020 |
| WO | WO-2020090460 A1 | 5/2020 |
| WO | 2020129435 A1 | 6/2020 |
| WO | WO-2020110537 A1 | 6/2020 |

\* cited by examiner

☐ : N1 WIRING LINE  
▨ : N3 WIRING LINE  
▦ : N4 WIRING LINE  
■ : POWER SUPPLY LINE (VDD, GND, AND VSS)

☐ : N1 WIRING LINE  
▨ : N3 WIRING LINE  
▦ : N4 WIRING LINE  
■ : POWER SUPPLY LINE (VDD, GND, AND VSS)

SOLID-STATE IMAGING DEVICE WITH TRANSISTOR DRAIN CONNECTED TO SENSE NODE OF LOGARITHMIC CONVERSION CIRCUIT

FIELD

The present disclosure relates to a solid-state imaging device and an imaging device.

BACKGROUND

Conventional technologies related to imaging devices, or the like have used a synchronous solid-state imaging device that captures image data (frames) in synchronization with a synchronization signal such as a vertical synchronization signal. This typical synchronous solid-state imaging device can only acquire image data every synchronization signal period (for example, ¹/₆₀ second), making it difficult to deal with faster processing when required in fields related to transportation, robots, or the like. To handle this, there has been proposed a solid-state imaging device that detects, for each pixel address, an event that the change amount of the luminance of the pixel has exceeded a threshold, as an address event (refer to Patent Literature 1, for example). The solid-state imaging device that detects an address event for each pixel in this manner is also referred to as an Event-based Vision Sensor (EVS) or a Dynamic Vision Sensor (DVS).

CITATION LIST

Patent Literature

Patent Literature 1: JP 5244587 B2

SUMMARY

Technical Problem

With the conventional EVS, however, there is a case where the operation becomes unstable due to generation of noise, fluctuation of the potential at the time of switching the operation mode, and the like.

In view of this, the present disclosure proposes a solid-state imaging device and an imaging device capable of suppressing occurrence of unstable operation.

Solution to Problem

To solve the above-described problem, a solid-state imaging device according to one aspect of the present disclosure comprises: a plurality of pixels that each outputs a luminance change of incident light; and a detection circuit that outputs an event signal based on the luminance change output from each of the pixels, wherein each of the pixels includes: a photoelectric conversion element that generates a charge according to an incident light amount; a logarithmic conversion circuit that is connected to the photoelectric conversion element and converts a photocurrent flowing out of the photoelectric conversion element into a voltage signal corresponding to a logarithmic value of the photocurrent; and a first transistor having a drain connected to a sense node of the logarithmic conversion circuit.

DESCRIPTION OF EMBODIMENTS

Figure 1:
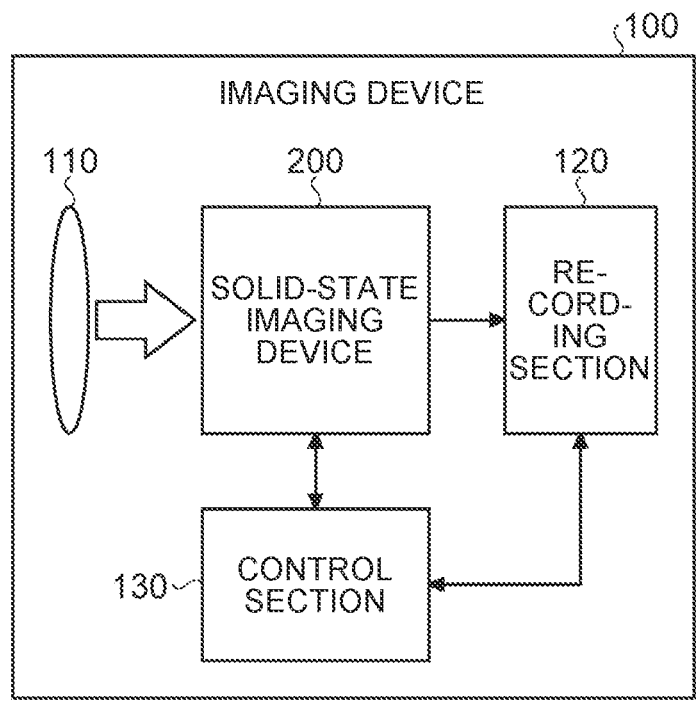
FIG. 1 is a block diagram illustrating a configuration example of an imaging device according to a first embodiment.

An embodiment of the present disclosure will be described below in detail with reference to the drawings. In each of the following embodiments, the same parts are denoted by the same reference symbols, and a repetitive description thereof will be omitted.

The present disclosure will be described in the following order.

1. First Embodiment
1.1 Configuration example of imaging device
1.2 Configuration example of solid-state imaging device
1.3 Configuration example of logarithmic response section
1.3.1 Modification of logarithmic response section
1.4 Configuration example of pixel circuit
1.5 Basic configuration example of response circuit
1.6 Configuration example of detection block
1.6.1 Configuration example of differentiator, selector, and comparator
1.7 Control example of row drive circuit
1.7.1 EVS mode
1.7.2 CIS mode
1.8 Configuration example of detection pixel and detection circuit
1.8.1 Operation example of solid-state imaging device in EVS Mode
1.9 Modification of detection pixel and detection circuit
1.9.1 Control example of row drive circuit according to modification
1.10 Dead period during mode transition
1.11 Configuration example of response circuit
1.12 Modification of response circuit
1.12.1 First modification
1.12.2 Second modification
1.12.3 Third modification
1.12.4 Fourth modification
1.12.5 Fifth modification
1.12.6 Sixth modification
1.12.7 Seventh modification
1.12.8 Eighth modification
1.13 Transition from CIS mode to EVS mode
1.14 Operation flow
1.15 Circuit sharing
1.15.1 First sharing example
1.15.2 Second sharing example
1.15.3 Third sharing example
1.15.4 Fourth sharing example
1.16 Binning mode and all-pixel mode using circuit sharing
1.17 Layout of shared block
1.17.1 First layout example
1.17.2 Second layout example
1.18 Action and effects
2. Second Embodiment
2.1 First control example
2.2 Second control example
2.3 Third control example
2.4 Fourth control example
2.5 Fifth control example
2.6 Sixth control example
2.7 Seventh control example
2.8 Action and effects
3. Third Embodiment
3.1 Configuration example of response circuit
3.1.1 Modification of response circuit
3.2 Transition from CIS mode to EVS mode
3.3 Operation flow
3.4 Action and effects
4. Fourth Embodiment
4.1 Configuration example of response circuit
4.1.1 Modification of response circuit
4.2 Transition from CIS mode to EVS mode
4.3 Operation flow
4.4 Action and effects
5. Fifth Embodiment
5.1 Layout example of detection chip
5.2 Basic configuration example of shared block
5.3 Binning mode by circuit sharing
5.3.1 First sharing example
5.3.2 Second sharing example
5.3.3 Third sharing example
5.4 Action and effects
6. Sixth Embodiment
6.1 Configuration example of response circuit
6.2 Action and effects
7. Seventh Embodiment
8. Eighth Embodiment
8.1 First layout modification
8.2 Second layout modification
8.3 Third layout modification
8.4 Fourth layout modification 8.5 Fifth layout modification
8.6 Sixth layout modification
8.7 Seventh layout modification
9. Ninth Embodiment
9.1 Wiring structure example
9.2 Effects
9.3 Specific example of wiring layout
10. Tenth Embodiment
10.1 Cross-sectional structure and wiring layout example
11. Example of application to moving object 1. First Embodiment First, a first embodiment will be described in detail with reference to the drawings. By switching, in the EVS, the number of photoelectric conversion elements used when detecting one address event, it is possible to implement various operation modes in which there are changes in sensitivity and resolution with respect to an address event. Furthermore, by incorporating, in the EVS, a readout circuit for generating gradation data from the photoelectric conversion element, it is also possible to implement an operation mode of generating grayscale or color image data in addition to an operation mode of detecting an address event.

However, when the operation mode is switched in the conventional EVS, the potential of a sense node in a circuit for detecting the address event sometimes deviate from a desired range. Deviation of the potential of the sense node from a normal range causes a failure in detection of the address event. Therefore, the conventional EVS has had a problem of occurrence of a dead period in which an address event cannot be detected until the potential of the sense node settles within a normal range.

In view of this, the present embodiment proposes a solid-state imaging device and an imaging device capable of suppressing a dead period at the time of mode switching.
1.1 Configuration Example of Imaging Device
FIG. 1 is a block diagram illustrating a configuration example of an imaging device 100 according to the first embodiment of the present disclosure. The imaging device 100 includes an optical section 110, a solid-state imaging device 200, a recording section 120, and a control section 130. Assumed examples of the imaging device 100 include devices such as a camera mounted on an industrial robot, and an in-vehicle camera.

The optical section 110 condenses incident light and guides the light to the solid-state imaging device 200. The solid-state imaging device 200 photoelectrically converts the incident light to generate image data. The solid-state imaging device 200 executes predetermined signal processing such as image recognition processing on the generated image data, and outputs the processed data to the recording section 120 through a signal line 209.

The recording section 120 includes devices such as flash memory, for example, and records data output from the solid-state imaging device 200 and data output from the control section 130.

Figure 2:
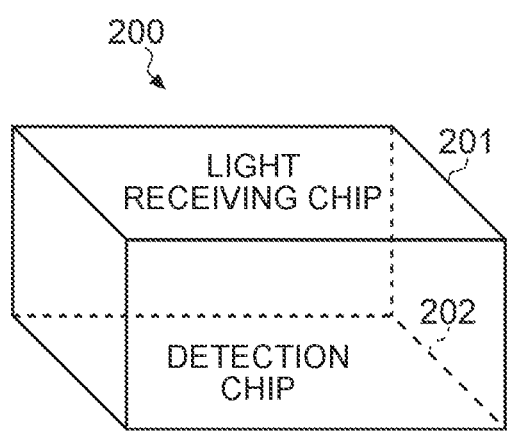
FIG. 2 is a diagram illustrating an example of a stacked structure of a solid-state imaging device according to the first embodiment.
Figure 3:
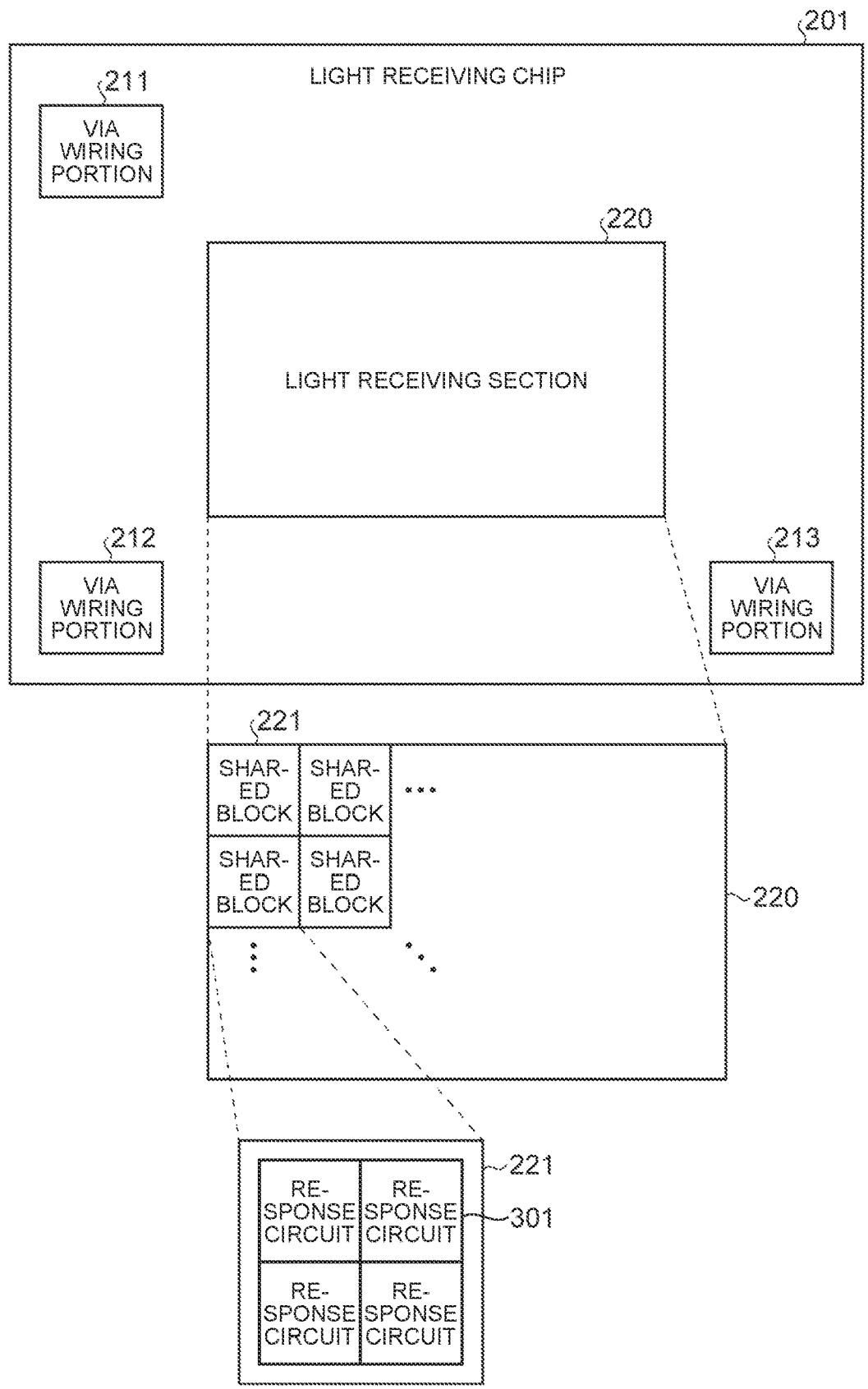
FIG. 3 is an example of a plan view of a light receiving chip according to the first embodiment.

The control section 130 includes an information processing device such as an application processor, for example, and controls the solid-state imaging device 200 to output image data.
1.2 Configuration Example of Solid-State Imaging Device
Example of Stack Structure
FIG. 2 is a diagram illustrating an example of a stacked structure of the solid-state imaging device 200 according to the present embodiment. The solid-state imaging device 200 includes a detection chip 202 and a light receiving chip 201 stacked on the detection chip 202. These chips are electrically connected to each other through a connection portion such as a via. In addition to the via, Cu—Cu bonding or a bump can be used for the connection. For example, the light receiving chip 201 may be an example of a first chip in the claims, and the detection chip 202 may be an example of a second chip in the claims.
(Layout Example of Light Receiving Chip)
FIG. 3 is an example of a plan view of a light receiving chip according to the present embodiment. The light receiving chip 201 includes a light receiving section 220 and via arrangement portions 211, 212, and 213.

The via arrangement portions 211, 212, and 213 are portions where vias connected to the detection chip 202 are arranged. The light receiving section 220 is a place where a plurality of shared blocks 221 is arranged in a two-dimensional lattice pattern.

In each of the shared blocks 221, one or more response circuits 301 are arranged. For example, four response circuits 301 are arranged in a 2 row×2 column pattern for each shared block 221. These four response circuits 301 share a circuit on the detection chip 202. Details of the shared circuit will be described below. Note that the number of the response circuits 301 in the shared block 221 is not limited to four. In addition, a part or all of the circuit configuration excluding a photoelectric conversion element 311 in each response circuit 301 may be arranged on the detection chip 202 side.

As described below, the response circuit 301 includes: a logarithmic response section 310 that converts the photocurrent flowing out of the photoelectric conversion element 311 into a voltage signal VPR according to the logarithmic value; and a pixel circuit 370 that generates a pixel signal (corresponding to gradation data) of a voltage value according to the charge amount of the charge accumulated in the photoelectric conversion element 311.

Figure 4:
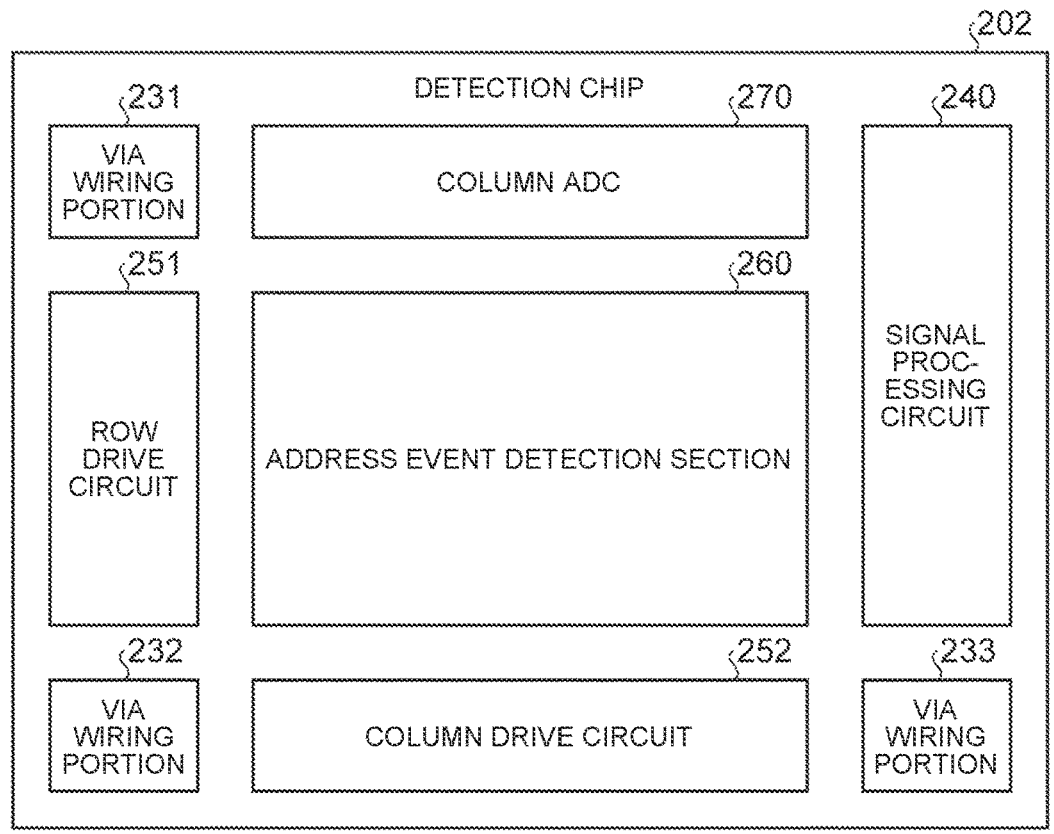
FIG. 4 is an example of a plan view of a detection chip according to the first embodiment.

A pixel address including a row address and a column address is allocated to each of the response circuits 301. Note that the pixel in the present disclosure may have a configuration based on a photoelectric conversion element 311 to be described below, and in the present embodiment, for example, may have a configuration referred to as a detection pixel and/or a gradation pixel to be described below.
(Layout Example of Detection Chip)
FIG. 4 is an example of a plan view of the detection chip according to the present embodiment. The detection chip 202 includes via arrangement portions 231, 232, and 233, a signal processing circuit 240, a row drive circuit 251, a column drive circuit 252, an address event detection section 260, and a column analog to digital converter (column ADC) 270. The via arrangement portions 231, 232, and 233 are portions where vias connected to the light receiving chip 201 are arranged.

The address event detection section 260 detects the presence or absence of an address event for each response circuit 301, more specifically, for each logarithmic response section 310, and generates a detection signal indicating a detection result.

The row drive circuit 251 selects a row address and causes the address event detection section 260 to output a detection signal corresponding to the row address.

The column drive circuit 252 selects a column address and causes the address event detection section 260 to output a detection signal corresponding to the column address.

The signal processing circuit 240 performs predetermined signal processing on the detection signal output from the address event detection section 260. The signal processing circuit 240 arranges the detection signals as pixel signals in a two-dimensional lattice pattern, and generates image data having 2-bit information for each pixel. The signal processing circuit 240 then executes signal processing such as image recognition processing on the image data.

Furthermore, the column ADC 270 includes, for example, an AD converter corresponding one-to-one to each of vertical signal lines VSL provided for each of the response circuits 301, more specifically, for each of the pixel circuits 370, and performs analog to digital (AD) conversion on an analog pixel signal input from each of the pixel circuits 370 through the vertical signal line VSL. Subsequently, the column ADC 270 supplies the digital signal that has undergone AD conversion to the signal processing circuit 240. The signal processing circuit 240 performs predetermined image processing on the image data including the digital signals. Note that the column ADC 270 may include, for example, a correlated double sampling (CDS) circuit and may reduce kTC noise included in a digital pixel signal.
(Layout Example of Detection Chip)

Figure 5:
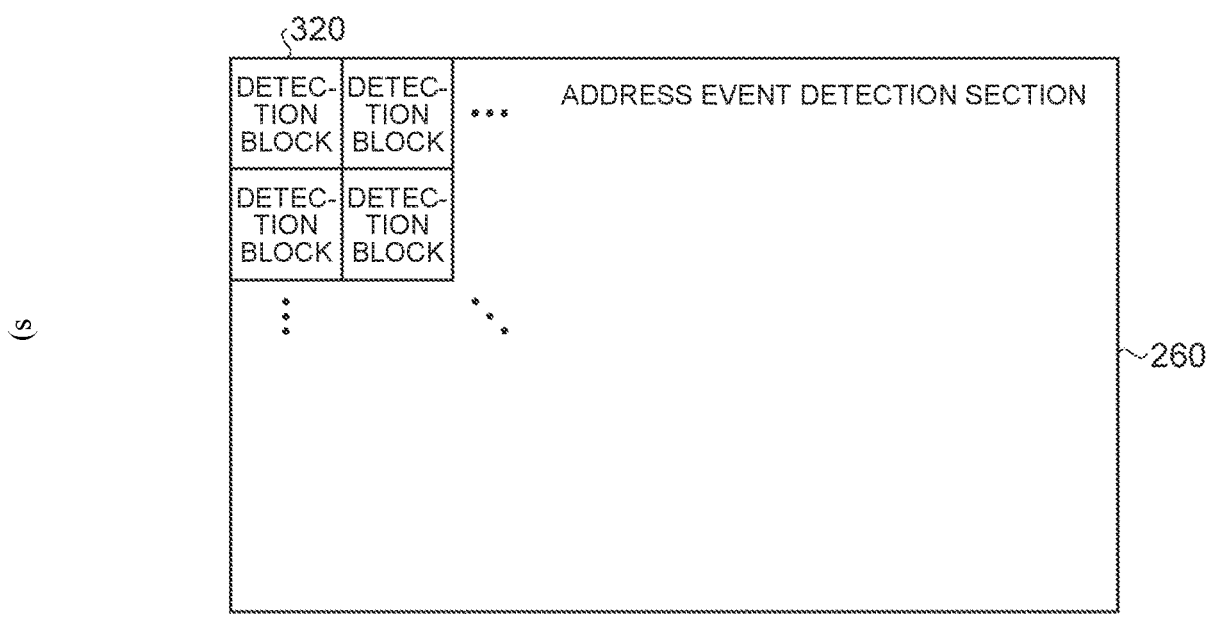
FIG. 5 is an example of a plan view of an address event detection section according to the first embodiment.

FIG. 5 is an example of a plan view of the address event detection section 260 according to the present embodiment. The address event detection section 260 is a section in which a plurality of detection blocks 320 is arranged. The detection block 320 is arranged for each shared block 221 on the light receiving chip 201. In a case where the number of the shared blocks 221 is N (N is an integer), N detection blocks 320 are arranged. Each detection block 320 is connected to the corresponding shared block 221.

1.3 Configuration Example of Logarithmic Response Section

Figure 6:
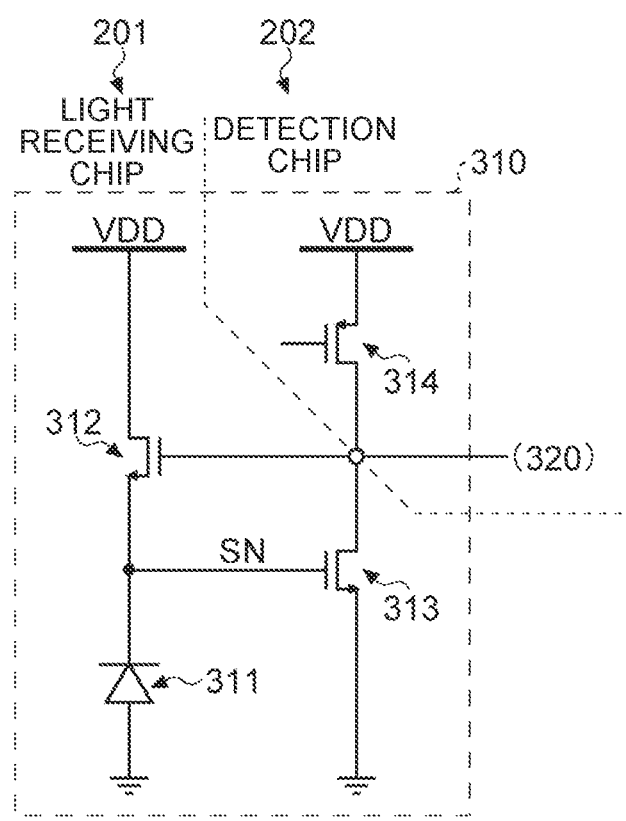
FIG. 6 is a circuit diagram illustrating a configuration example of a logarithmic response section according to the first embodiment.

FIG. 6 is a circuit diagram illustrating a basic configuration example of the logarithmic response section according to the present embodiment. As illustrated in FIG. 6, the logarithmic response section 310 included in the response circuit 301 includes a photoelectric conversion element 311, n-channel metal oxide semiconductor (nMOS) transistors 312 and 313, and a p-channel MOS (pMOS) transistor 314. Among these, the two nMOS transistors 312 and 313 constitute, for example, a logarithmic conversion circuit that converts the photocurrent flowing out of the photoelectric conversion element 311 into a voltage signal corresponding to the logarithmic value of the photocurrent. The wiring connected to the gate of the nMOS transistor 313 and the wiring through which the photocurrent from the photoelectric conversion element 311 flows function as a sense node SN at the time of detecting an address event. The nMOS transistor 313 can correspond to, for example, a second transistor in the claims, and the nMOS transistor 312 can correspond to a third transistor in the claims, for example.

Furthermore, the pMOS transistor 314 operates as a load MOS transistor for a logarithmic conversion circuit including the two nMOS transistors 312 and 313. Note that the photoelectric conversion element 311 and the nMOS transistors 312 and 313 can be arranged on the light receiving chip 201, for example, and the pMOS transistor 314 can be arranged on the detection chip 202.

The nMOS transistor 312 has a source connected to the cathode of the photoelectric conversion element 311, while having a drain connected to the power supply terminal. The pMOS transistor 314 and the nMOS transistor 313 are connected in series between the power supply terminal and the ground terminal. Furthermore, the connection point of the pMOS transistor 314 and the nMOS transistor 313 is connected to the gate of the nMOS transistor 312 and the input terminal of the detection block 320, and functions as an output node that outputs the voltage signal VPR to the detection block 320. Furthermore, a predetermined bias voltage Vbias1 is applied to the gate of the pMOS transistor 314.

The drains of the nMOS transistors 312 and 313 are connected to the power supply side, and such a circuit is referred to as a source follower. The two source followers connected in the loop shape converts the photocurrent from the photoelectric conversion element 311 into a voltage signal VPR corresponding to the logarithmic value. Furthermore, the pMOS transistor 314 supplies a constant current to the nMOS transistor 313.

Note that the ground of the light receiving chip 201 and the ground of the detection chip 202 may be isolated from each other for countermeasures against interference.

1.3.1 Modification of Logarithmic Response Section

Figure 7:
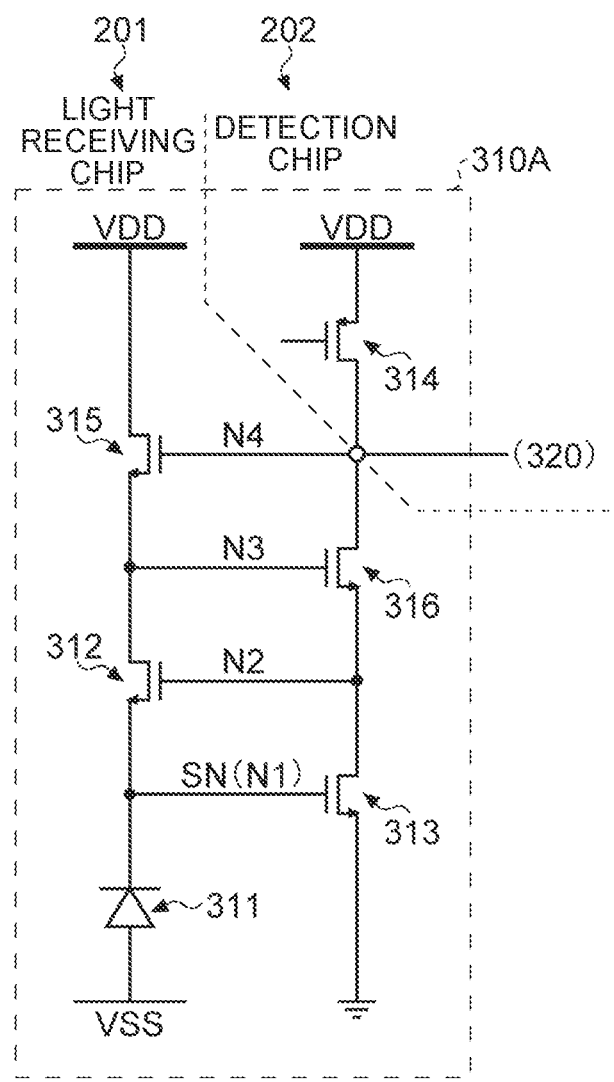
FIG. 7 is a circuit diagram illustrating another configuration example of the logarithmic response section according to the first embodiment.

Although FIG. 6 is an example of configuration of the source follower-type logarithmic response section 310, the configuration of the section is not limited to such an example. FIG. 7 is a circuit diagram illustrating a basic configuration example of a logarithmic response section according to a modification of the present embodiment. As illustrated in FIG. 7, for example, a logarithmic response section 310A has a configuration, referred to as a gain boost type circuit configuration, including an additional nMOS transistor 315, connected in series between the nMOS transistor 312 and a power supply line, and an additional nMOS transistor 316, connected in series between the nMOS transistor 313 and the pMOS transistor 314, as compared with the source follower type circuit configuration illustrated in FIG. 6. The four nMOS transistors 312, 313, 315, and 316 constitute, for example, a logarithmic conversion circuit that converts the photocurrent flowing out of the photoelectric conversion element 311 into a voltage signal VPR according to a logarithmic value of the photocurrent.

In this manner, even with the use of the gain boost type logarithmic response section 310A, it is possible to convert the photocurrent from the photoelectric conversion element 311 into the voltage signal VPR of a logarithmic value corresponding to the charge amount.

1.4 Configuration Example of Pixel Circuit

Figure 8:
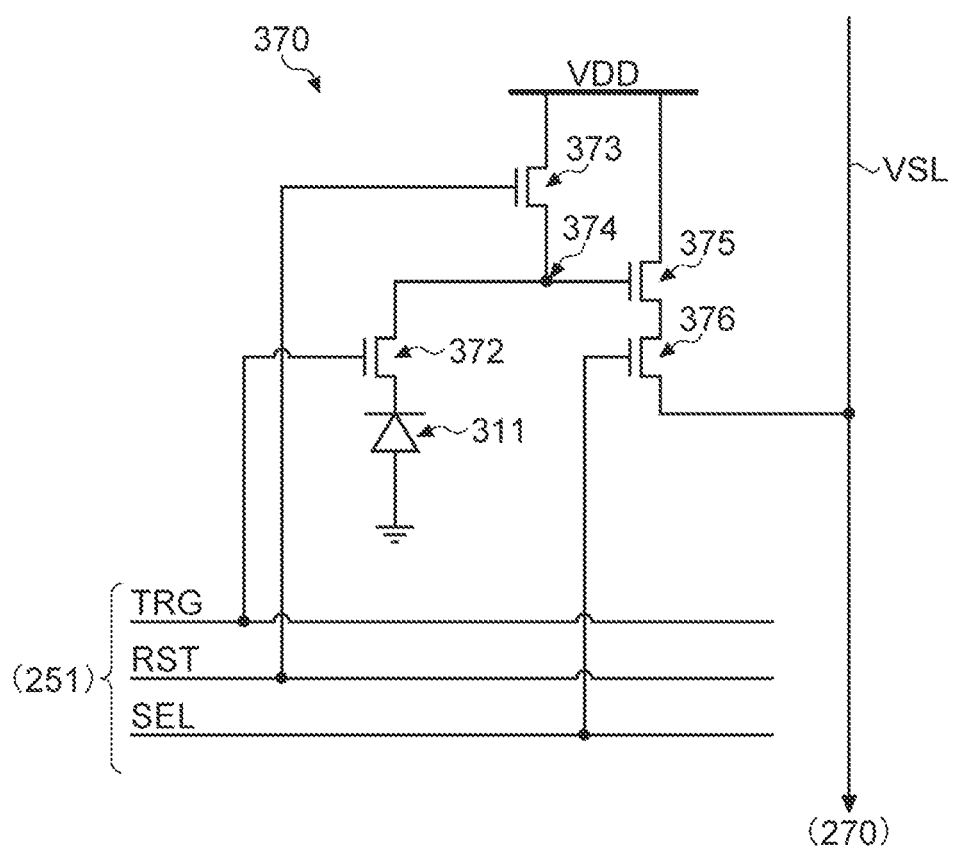
FIG. 8 is a circuit diagram illustrating a schematic configuration example of a readout circuit according to the first embodiment.

FIG. 8 is a circuit diagram illustrating a schematic configuration example of a pixel circuit according to the present embodiment. As illustrated in FIG. 8, the pixel circuit 370 in the response circuit 301 includes a transfer transistor 372, a reset transistor 373, an amplification transistor 375, and a selection transistor 376. A node connected with the drain of the transfer transistor 372, the source of the reset transistor 373, and the gate of the amplification transistor 375 functions as a floating diffusion region (FD) 374 having a current-voltage conversion function, that is a function of converting accumulated charge into a voltage corresponding to the charge amount. The transfer transistor 372 can correspond to a fifth transistor in the claims, for example.

The pixel circuit 370 shares the photoelectric conversion element 311 with the logarithmic response section 310/310A in an identical response circuit 301, and operates as a gradation pixel that generates a pixel signal according to the amount of light received by the photoelectric conversion element 311.

The drain of the reset transistor 373 and the drain of the amplification transistor 375 are connected to a power supply voltage VDD, for example. However, the drain of the reset transistor 373 may be connected to, for example, a reset voltage different from the power supply voltage VDD. The source of the amplification transistor 375 is connected to the drain of the selection transistor 376, and the source of the selection transistor 376 is connected to the vertical signal line VSL for inputting an analog pixel signal to the column ADC 270 described below.

When the pixel signal is read, a high-level transfer signal TRG is applied from the row drive circuit 251 to the gate of the transfer transistor 372. This turns on the transfer transistor 372, causing the charge accumulated in the cathode of the photoelectric conversion element 311 to be transferred to the floating diffusion region 374 through the transfer transistor 372. As a result, a pixel signal having a voltage value corresponding to the charge amount of the charge accumulated in the floating diffusion region 374 appears at the source of the amplification transistor 375. Subsequently, by setting the selection signal SEL applied from the row drive circuit 251 to the gate of the selection transistor 376 to the high level, the pixel signal appearing in the source of the amplification transistor 375 appears in the vertical signal line VSL.

Furthermore, when the charge accumulated in the floating diffusion region 374 is released to reset the floating diffusion region 374, a high-level reset signal RST is applied from the row drive circuit 251 to the gate of the reset transistor 373. This allows the charge accumulated in the floating diffusion region 374 to be discharged to the power supply side through the reset transistor 373 (FD reset). At that time, by turning on the transfer transistor 372 during the same period, it is also possible to discharge the charge accumulated in the cathode of the photoelectric conversion element 311 to the power supply side (PD reset).

In each shared block 221, the number of photoelectric conversion elements 311 simultaneously connected to the pixel circuit 370 when the gradation image data is read, that is, the number of transfer transistors 372 turned on during the same period is not limited to one, and may be plural. For example, when high-resolution gradation image data is read in each shared block 221, the transfer transistors 372 may be sequentially connected to the pixel circuit 370 in time division, and when reading is executed with an expanded dynamic range at low illuminance or the like (at the time of binning), two or more transfer transistors 372 may be turned on during the same period.

1.5 Basic Configuration Example of Response Circuit

Figure 9:
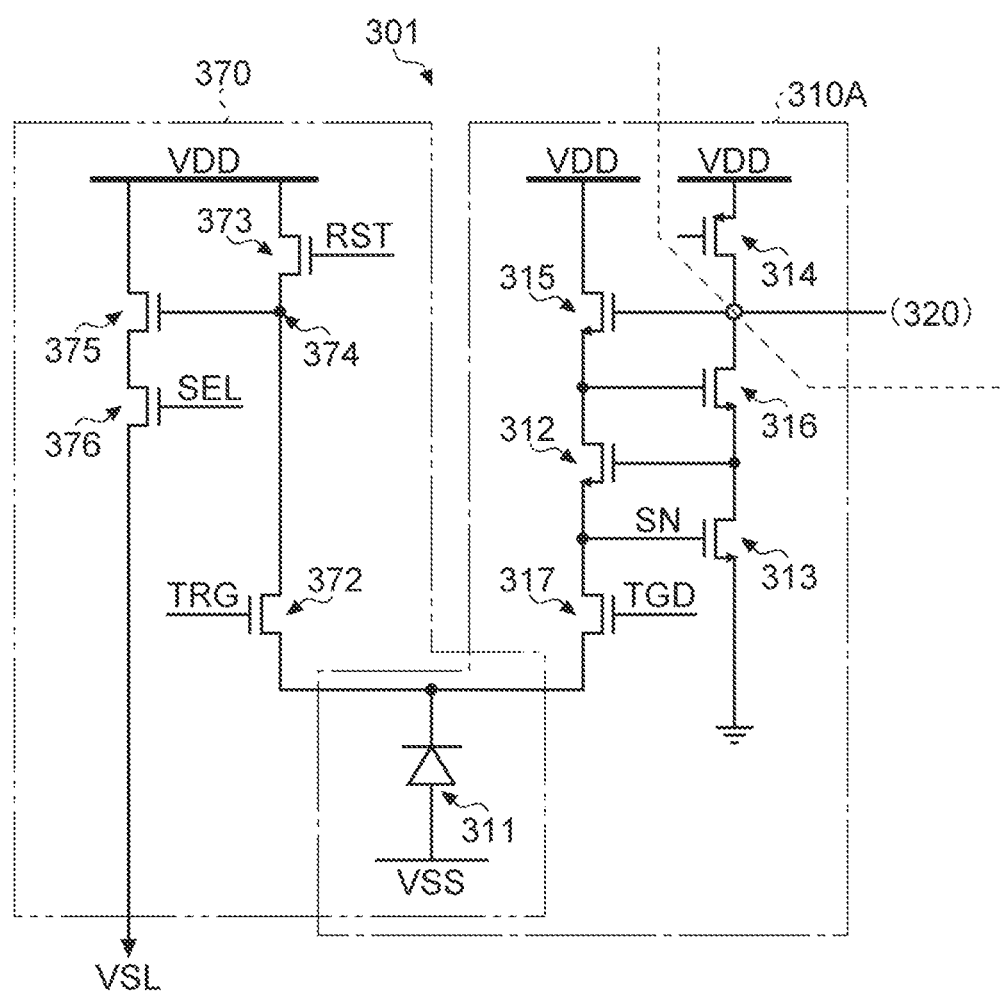
FIG. 9 is a circuit diagram illustrating a schematic configuration example of a response circuit according to the first embodiment.

Next, a basic configuration example of the response circuit 301 including the logarithmic response section 310/310A and the pixel circuit 370 will be described. FIG. 9 is a circuit diagram illustrating a basic configuration example of the response circuit according to the present embodiment. Although the following description is an exemplary case where the logarithmic response section 310A is used, the configuration is not limited thereto, and it is allowable to adopt various circuits that convert the photocurrent from the photoelectric conversion element 311 into the voltage signal VPR of a logarithmic value according to the charge amount, such as the logarithmic response section 310.

As illustrated in FIG. 9, the response circuit 301 according to the present embodiment has a configuration in which the logarithmic response section 310A illustrated in FIG. 7 and the pixel circuit 370 illustrated in FIG. 8 share the photoelectric conversion element 311. However, the response circuit 301 additionally includes a switching transistor 317 used for switching between the EVS mode and the CIS mode. The switching transistor 317 may be an nMOS transistor, for example. The switching transistor 317 can correspond to a fourth transistor in the claims, for example.

In the EVS mode, for example, the row drive circuit 251 constantly applies a high-level switching signal to the gate of the switching transistor 317. On the other hand, for example, the row drive circuit 251 constantly applies a low-level transfer signal TRG to the gate of the transfer transistor 372. This leads to formation of a current path through which the photocurrent flowing out of the photoelectric conversion element 311 flows to the sense node SN side through the switching transistor 317.

On the other hand, in the CIS mode, for example, a low-level switching signal is constantly applied from the row drive circuit 251 to the gate of the switching transistor 317. On the other hand, for example, a transfer signal TRG indicating a high level in accordance with a predetermined control operation is applied from the row drive circuit 251 to the gate of the transfer transistor 372. With this operation, the charge accumulated in the photoelectric conversion element 311 is transferred to the floating diffusion region 374 of the pixel circuit 370 at a predetermined timing.

1.6 Configuration Example of Detection Block

Figure 10:
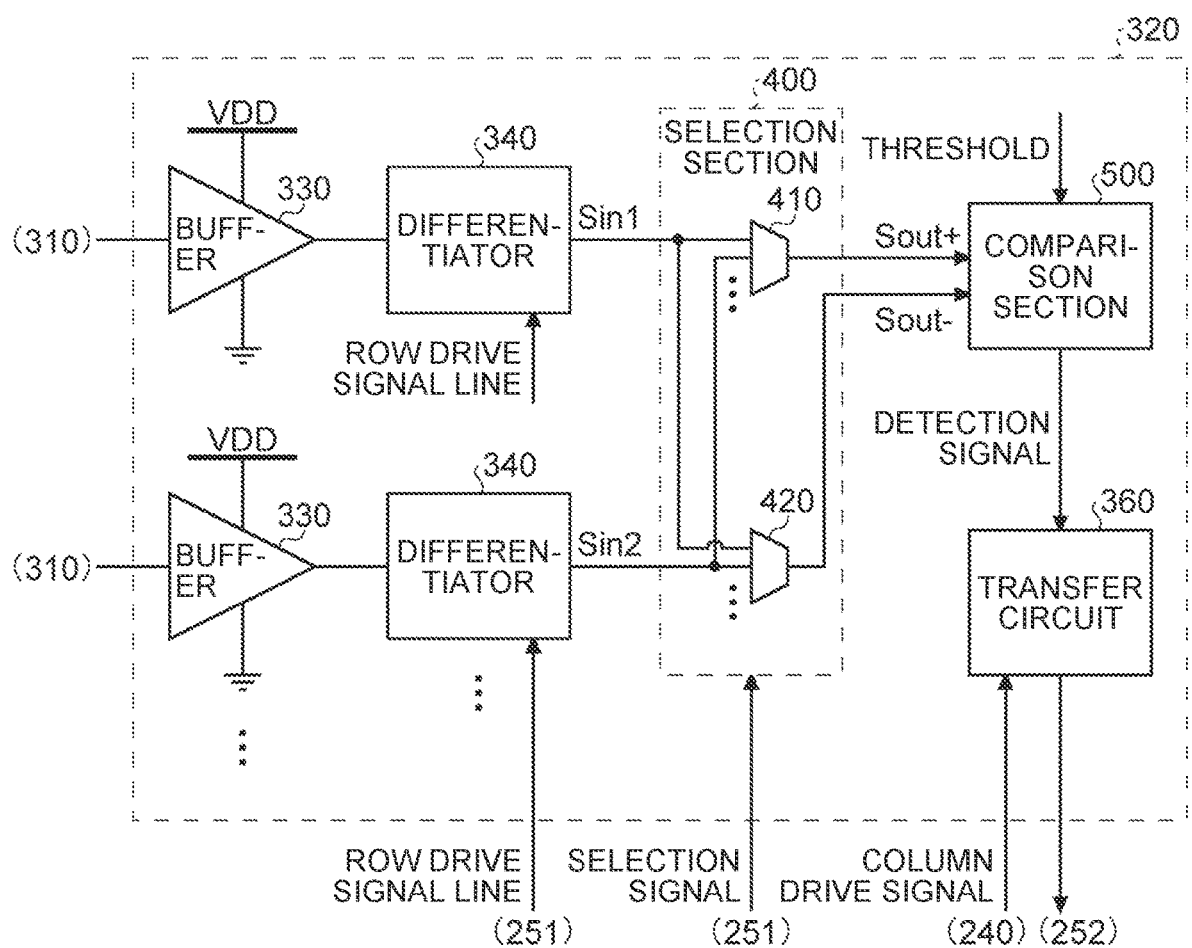
FIG. 10 is a block diagram illustrating a configuration example of a detection block according to the first embodiment.

FIG. 10 is a block diagram illustrating a configuration example of the detection block 320 according to the present embodiment. The detection block 320 includes a plurality of buffers 330, a plurality of differentiators 340, a selection section 400, a comparison section 500, and a transfer circuit 360. The buffer 330 and the differentiator 340 are disposed for each logarithmic response section 310 in the shared block 221. For example, when there are four logarithmic response sections 310 in the shared block 221, four buffers 330 and four differentiators 340 are disposed.

The buffer 330 outputs a voltage signal from the corresponding logarithmic response section 310 to the differentiator 340. The buffer 330 can improve the driving force used for driving the subsequent stage. In addition, the buffer 330 can ensure isolation of noise associated with a switching operation in the subsequent stage.

The differentiator 340 obtains a change amount of the voltage signal, that is, a luminance change of the light incident on the photoelectric conversion element 311 as a differential signal. The differentiator 340 receives a voltage signal from the corresponding logarithmic response section 310 through the buffer 330, and obtains a change amount of the voltage signal by differentiation. Subsequently, the differentiator 340 supplies the differential signal to the selection section 400. An m-th (m is an integer of 1 to M) differential signal Sin in the detection block 320 is defined as Sinm. The differentiator 340 can correspond to a first circuit in the claims, for example.

The selection section 400 selects one of the M differential signals according to a selection signal from the row drive circuit 251. The selection section 400 includes selectors 410 and 420.

M differential signals Sin are input to the selector 410. The selector 410 selects one of these differential signals Sin according to the selection signal, and supplies the selected differential signal Sin to the comparison section 500 as Sout+. M differential signals Sin are also input to the selector 420. The selector 420 selects one of these differential signals Sin according to the selection signal, and supplies the selected differential signal Sin to the comparison section 500 as Sout−.

The comparison section 500 compares the differential signal (that is, the change amount) selected by the selection section 400 with a predetermined threshold. The comparison section 500 supplies a signal indicating a comparison result to the transfer circuit 360 as a detection signal. The comparison section 500 can correspond to a second circuit in the claims, for example.

The transfer circuit 360 transfers the detection signal to the signal processing circuit 240 according to the column drive signal from the column drive circuit 252.

(Configuration Example of Differentiator)

Figure 11:
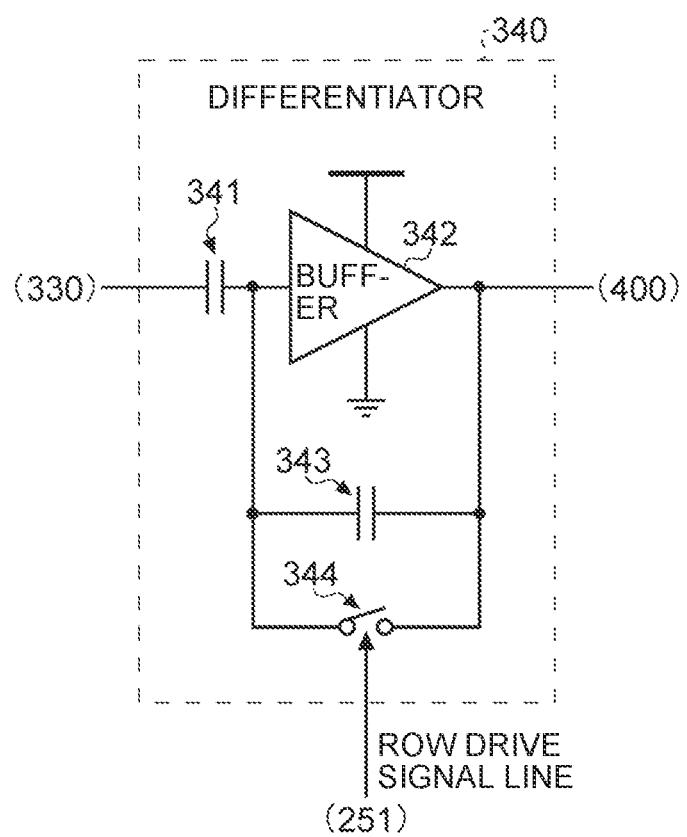
FIG. 11 is a circuit diagram illustrating a configuration example of a differentiator according to the first embodiment.

FIG. 11 is a circuit diagram illustrating a configuration example of the differentiator 340 according to the present embodiment. The differentiator 340 includes capacitors 341 and 343, an inverter 342, and a switch 344.

The capacitor 341 has one end connected to the output terminal of the buffer 330 and the other end connected to the input terminal of the inverter 342. The capacitor 343 is connected in parallel to the inverter 342. The switch 344 opens and closes a path connecting both ends of the capacitor 343 according to the row drive signal.

The inverter 342 inverts the voltage signal input through the capacitor 341. The inverter 342 outputs the inverted signal to the selection section 400.

When the switch 344 is turned on, a voltage signal $V_{init}$ is input to the buffer 330 side of the capacitor 341, causing the opposite side to be a virtual ground terminal. The potential of the virtual ground terminal is assumed to be zero for convenience. At this time, when the capacitance of the capacitor 341 is C1, a potential $Q_{init}$ accumulated in the capacitor 341 is expressed by the following Formula (1). On the other hand, since both ends of the capacitor 343 are short-circuited, the accumulated charge is 0.

$$Q_{init} = C1 \times V_{init} \quad (1)$$

Next, in an assumed case where the switch 344 is turned off and the voltage on the buffer 330 side of the capacitor 341 has changed to a voltage $V_{after}$, charge $Q_{after}$ accumulated in the capacitor 341 is expressed by the following Formula (2).

$$Q_{after} = C1 \times V_{after} \quad (2)$$

On the other hand, when the output voltage is $V_{out}$, the charge Q2 accumulated in the capacitor 343 is expressed by the following Formula (3).

$$Q2 = -C2 \times V_{out} \quad (3)$$

At this time, since the total charge amounts of the capacitors 341 and 343 do not change, the following Formula (4) holds.

$$Q_{init} = Q_{after} + Q2 \quad (4)$$

When Formulas (1) to (3) are substituted into Formula (4), then the result can be transformed into the following Formula (5).

$$V_{out} = -(C1/C2) \times (V_{after} - V_{init}) \quad (5)$$

Formula (5) represents a subtraction operation of the voltage signals, in which the gain for the subtraction result is C1/C2. Since maximized gain is desirable in usual cases, it is preferable to design C1 to be large and C2 to be small. On the other hand, excessively small C2 would increase kTC noise and cause deterioration in noise characteristics. Therefore, capacity reduction of C2 is limited to a noise tolerable range. In addition, since the differentiator 340 is provided for each pixel, the capacitances C1 and C2 have area restrictions. In consideration of these, for example, C1 is set to a value of 20 to 200 femtofarad (fF), and C2 is set to a value of 1 to 20 femtofarad (fF).

(Configuration Example of Comparison Section)

Figure 12:
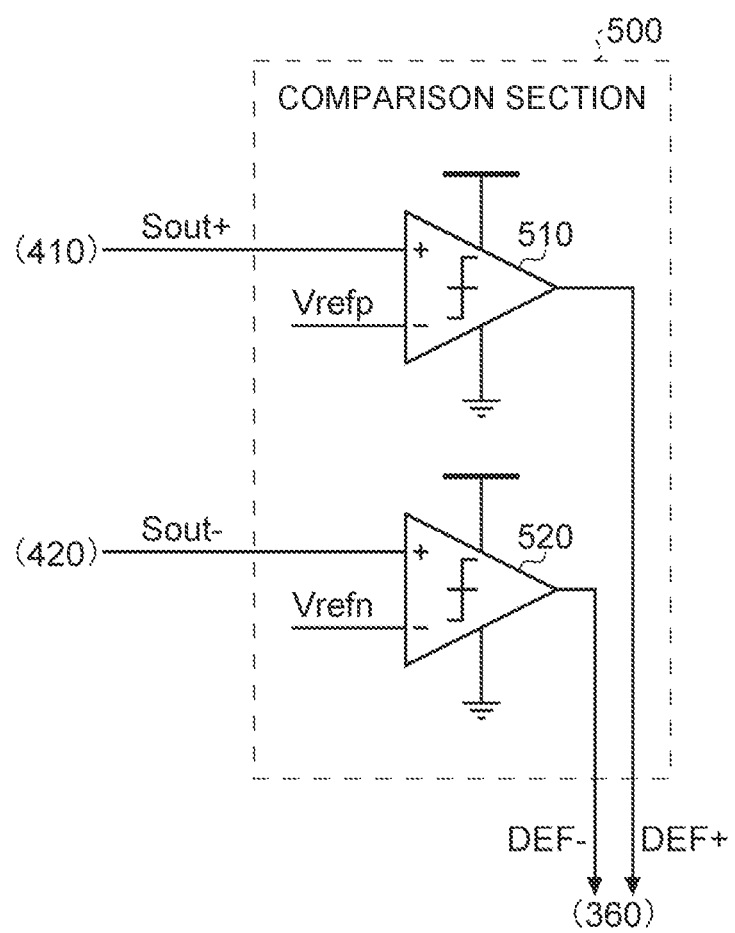
FIG. 12 is a circuit diagram illustrating a configuration example of a comparison section according to the first embodiment.

FIG. 12 is a circuit diagram illustrating a configuration example of the comparison section 500 according to the present embodiment. The comparison section 500 includes comparators 510 and 520.

The comparator 510 compares the differential signal Sout+ from the selector 410 with a predetermined upper threshold Vrefp. The comparator 510 supplies a result of the comparison to the transfer circuit 360 as a detection signal DET+. The detection signal DET+ indicates the presence or absence of an on-event. Here, the on-event represents an event that the change amount of the luminance exceeds a predetermined upper threshold.

The comparator 520 compares the differential signal Sout− from the selector 420 with a lower threshold Vrefn lower than the upper threshold Vrefp. The comparator 520 supplies a result of the comparison to the transfer circuit 360 as a detection signal DET−. The detection signal DET− indicates the presence or absence of an off-event. Here, the off-event represents an event that the change amount of the luminance is less than a predetermined lower threshold. Note that although the comparison section 500 detects the presence or absence of both the on-event and the off-event, it is also possible to detect only one of the on-event and the off-event.

Note that, for example, the comparator 510 may be an example of a first comparator described in the claims, and the comparator 520 may be an example of a second comparator described in the claims. For example, the upper threshold may be an example of a first threshold described in the claims, and the lower threshold may be an example of a second threshold described in the claims.

1.6.1 Configuration Example of Differentiator, Selector, and Comparator

Figure 13:
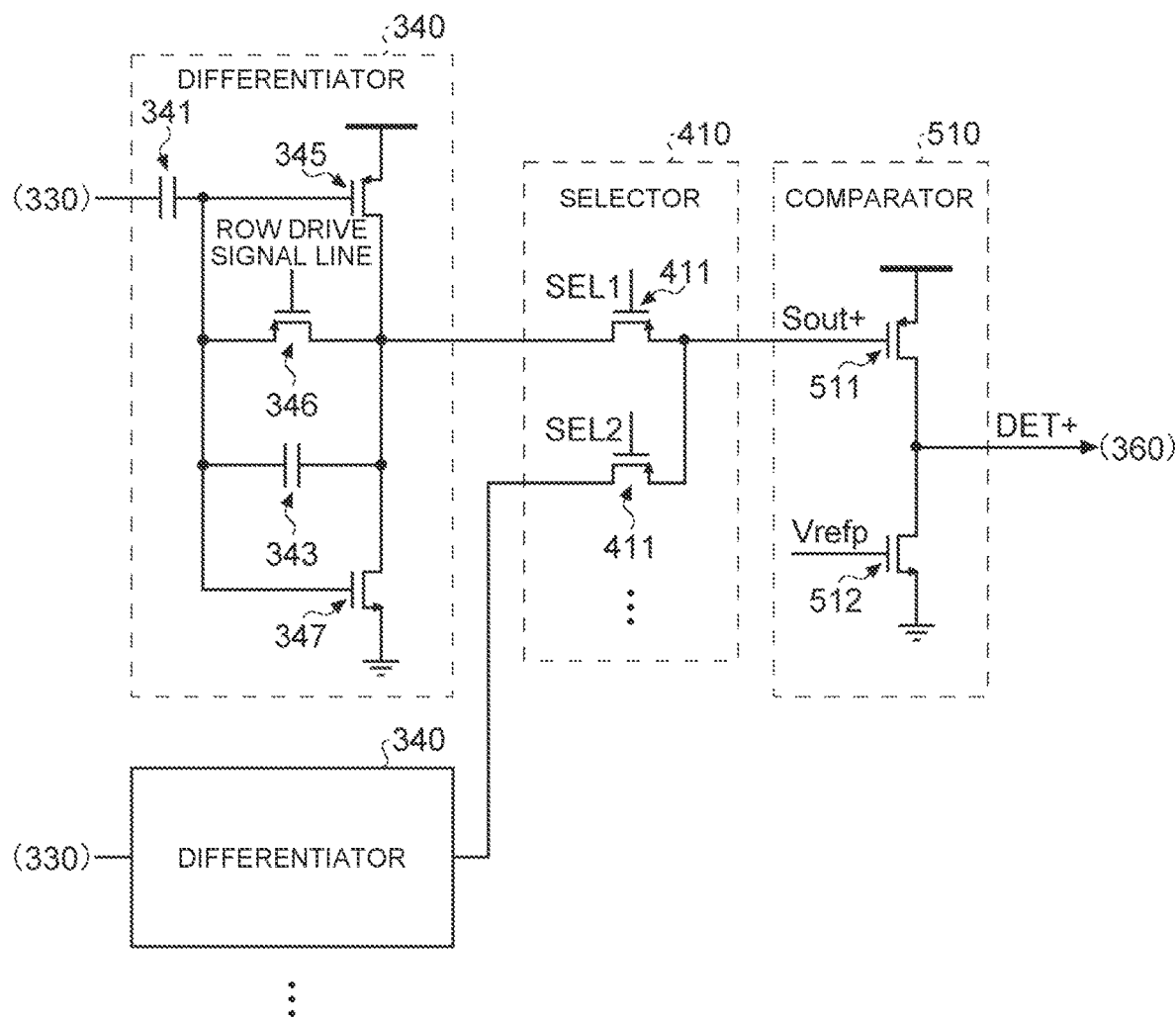
FIG. 13 is a circuit diagram illustrating a configuration example of a differentiator, a selector, and a comparator according to the first embodiment.

FIG. 13 is a circuit diagram illustrating a configuration example of the differentiator 340, the selector 410, and the comparator 510 in the detection block 320 according to the present embodiment.

The differentiator 340 includes capacitors 341 and 343, pMOS transistors 345 and 346, and an nMOS transistor 347. The pMOS transistor 345 and the nMOS transistor 347 are connected in series between a power supply terminal and a ground terminal with the pMOS transistor 345 as a power supply side. The capacitor 341 is inserted between the gates of the pMOS transistor 345/nMOS transistor 347 and the buffer 330. A connection point of the pMOS transistor 345 and the nMOS transistor 347 is connected to the selector 410. With this connection configuration, the pMOS transistor 345 and the nMOS transistor 347 function as the inverter 342.

In addition, the capacitor 341 and the pMOS transistor 345 are connected in parallel between the connection point of the pMOS transistor 346 and the nMOS transistor 347 and the capacitor 343. The pMOS transistor 346 functions as the switch 344.

Furthermore, the selector 410 is provided with a plurality of pMOS transistors 411. The pMOS transistor 411 is arranged for each differentiator 340.

The pMOS transistor 411 is inserted between the corresponding differentiator 340 and the comparator 510. Furthermore, the selection signal SEL is individually input to each of the gates of the pMOS transistor 411. The selection signal SEL of the m-th pMOS transistor 411 is referred to as SELm. By these selection signals SEL, the row drive circuit 251 can control to turn on one of the M pMOS transistors 411 and turn off the remaining others. In addition, the differential signal Sout+ is output to the comparator 510 as the selected signal through the pMOS transistor 411 in the on state. Note that the circuit configuration of the selector 420 is similar to that of the selector 410.

The comparator 510 includes a pMOS transistor 511 and an nMOS transistor 512. The pMOS transistor 511 and the nMOS transistor 512 are connected in series between the power supply terminal and the ground terminal. Furthermore, the differential signal Sout+ is input to the gate of the pMOS transistor 511, while the voltage of the upper threshold Vrefp is input to the gate of the nMOS transistor 512. The detection signal DET+ is output from a connection point of the pMOS transistor 511 and the nMOS transistor 512. Note that the circuit configuration of the comparator 520 is similar to that of the comparator 510.

Note that the circuit configurations of the differentiator 340, the selector 410, and the comparator 510 are not limited to those illustrated in FIG. 13 as long as they have the functions described with reference to FIG. 10. For example, the nMOS transistor and the pMOS transistor are interchangeable.

1.7 Control Example of Row Drive Circuit

Next, a control example of the row drive circuit 251 according to the present embodiment will be described. In the present embodiment, the row drive circuit 251 switches execution of operation modes between an operation mode of detecting an address event (hereinafter, referred to as an EVS mode) and an operation mode (hereinafter, referred to as a CIS mode) of acquiring clay scale or color image data (hereinafter, referred to as gradation image data).

1.7.1 EVS Mode

Figure 14:
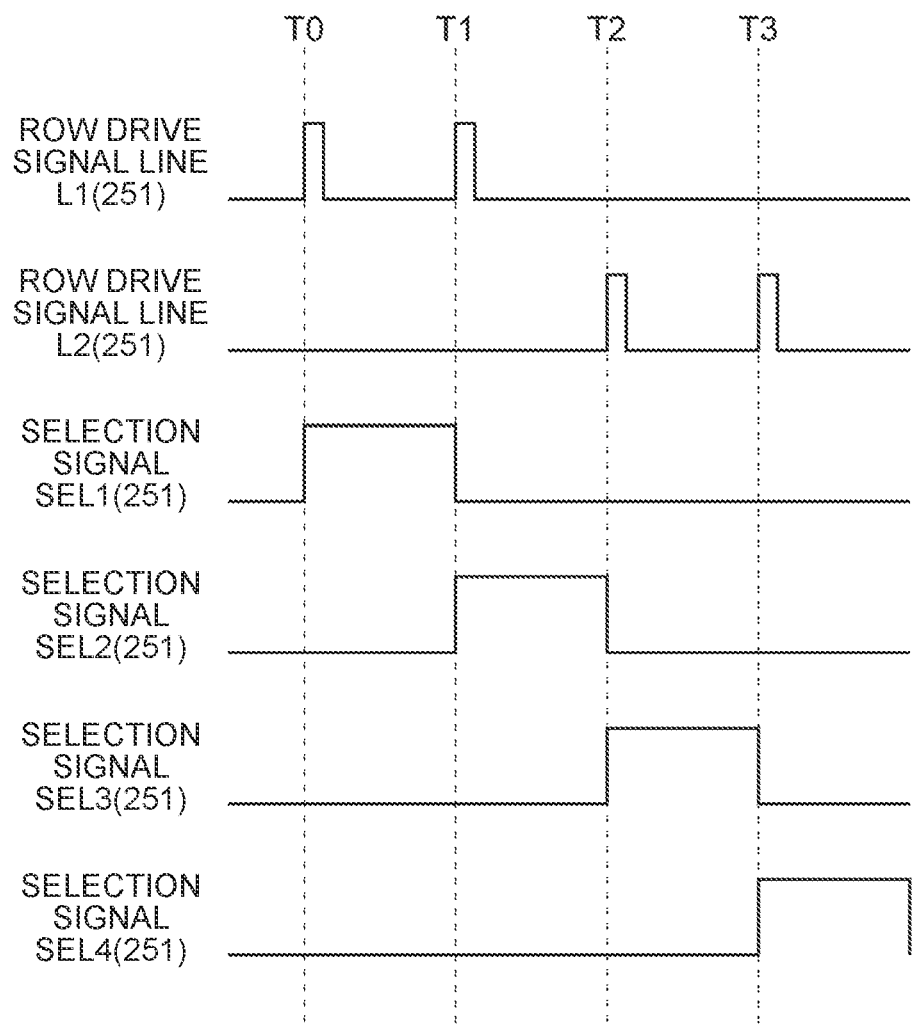
FIG. 14 is a timing chart illustrating an example of control of the row drive circuit in an EVS mode according to the first embodiment.

FIG. 14 is a timing chart illustrating an example of control of the row drive circuit in the EVS mode according to the present embodiment. At timing T0, the row drive circuit 251 selects the first row by a row drive signal L1 and drives the differentiator 340 of the selected row. The row drive signal L1 initializes the capacitor 343 in the differentiator 340 in the first row. In addition, the row drive circuit 251 selects the upper left of the 2 row×2 column pattern in the shared block 221 over a certain period of time by a selection signal SEL1, and drives the selection section 400. With this drive, the presence or absence of the address event is detected in the odd-numbered columns of the first row.

Next, at timing T1, the row drive circuit 251 drives the differentiator 340 in the first row again by the row drive signal L1. In addition, the row drive circuit 251 selects the upper right of the 2 row×2 column pattern in the shared block 221 over a certain period of time by a selection signal SEL2. Accordingly, the presence or absence of an address event is detected in the even-numbered columns of the first row.

At timing T2, the row drive circuit 251 drives the differentiator 340 in the second row by a row drive signal L2. The row drive signal L2 initializes the capacitor 343 in the differentiator 340 in the second row. In addition, the row drive circuit 251 selects the lower left of the 2 row×2 column pattern in the shared block 221 over a certain period of time by the selection signal SEL3. With this drive, the presence or absence of the address event is detected in the odd-numbered columns of the second row.

Subsequently, at timing T3, the row drive circuit 251 drives the differentiator 340 in the second row again by the row drive signal L2. In addition, the row drive circuit 251 selects the lower right of the 2 row×2 column pattern in the shared block 221 over a certain period of time by a selection signal SEL4. Accordingly, the presence or absence of an address event is detected in the even-numbered columns of the second row.

Thereafter, similarly, the row drive circuit 251 sequentially selects a row in which the response circuits 301 are arranged, and drives the selected row by the row drive signal. In addition, each time a row is selected, the row drive circuit 251 sequentially selects each of detection pixels 300 in the shared block 221 of the selected row by a selection signal. For example, in a case where the detection pixels 300 of a 2 row×2 column pattern are arranged in the shared block 221, each time a row is selected, an odd-numbered column and an even-numbered column in the row are sequentially selected.

Note that the row drive circuit 251 can also sequentially select a row (in other words, two rows of the response circuit 301) in which the shared block 221 is arranged. In this case, every time a row is selected, four detection pixels in the shared block 221 of the row are sequentially selected.

1.7.2 CIS Mode

Figure 15:
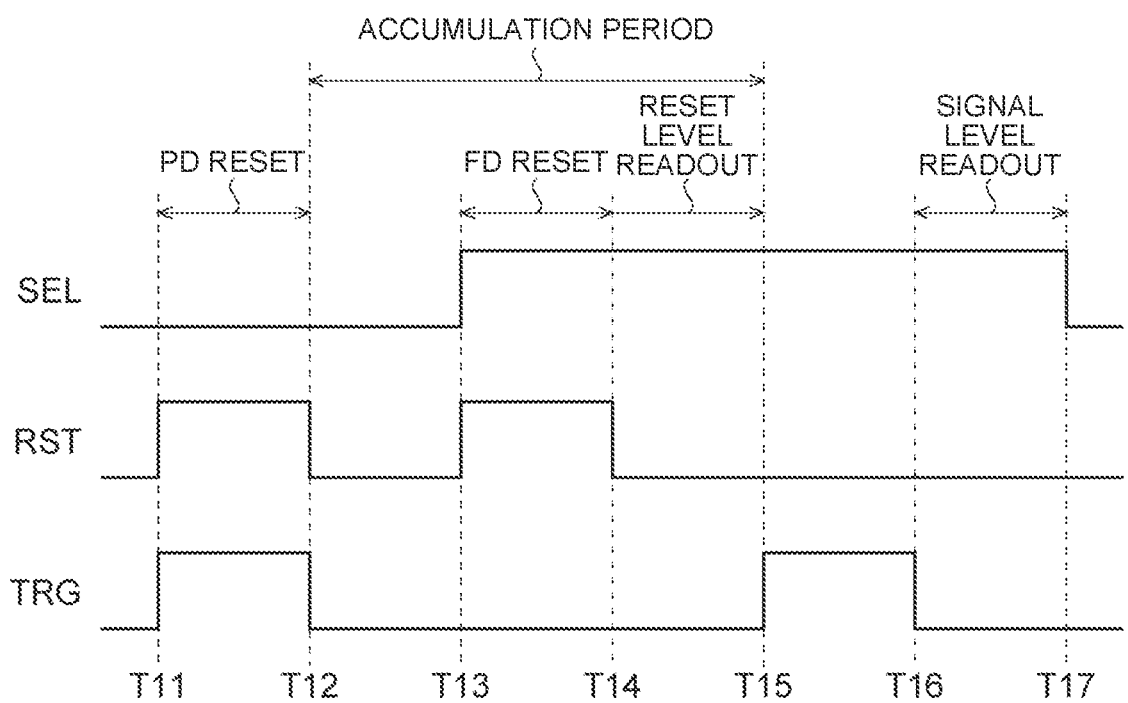
FIG. 15 is a timing chart illustrating an example of control of the row drive circuit in a CIS mode according to the first embodiment.

FIG. 15 is a timing chart illustrating an example of control of the row drive circuit in the CIS mode according to the present embodiment. As illustrated in FIG. 15, the row drive circuit 251 first resets the charge accumulated in the photoelectric conversion element 311. Specifically, the row drive circuit 251 sets the reset signal RST and the transfer signal TRG to a high level during a period of timings T11 to T12, thereby releasing the charge accumulated in the photoelectric conversion element 311 to the power supply (VDD) side through the transfer transistor 372 and the reset transistor 373 (PD reset).

Next, for example, the row drive circuit 251 sets the selection signal SEL to the high level at timing T13, and sets the reset signal RST to the high level during the period between of T13 to T14. This allows the charge accumulated in the floating diffusion region 374 to be discharged to the power supply (VDD) side through the reset transistor 373, thereby resetting the floating diffusion region 374 (FD reset).

In the subsequent period of timing T14 to T15, the potential appearing in the vertical signal line VSL in a state where the floating diffusion region 374 is reset is read by the column ADC 270 as a pixel signal of a reset level (also referred to as a reset signal) (reset level readout). The read reset signal is used for CDS processing in the column ADC 270, for example.

Next, the row drive circuit 251 sets the transfer signal TRG to the high level during a period of timings T15 to T16. This allows the charge accumulated in the photoelectric conversion element 311 to be transferred to the floating diffusion region 374 through the transfer transistor 372. Note that a period from a falling point of the reset signal RST at timing T12 to a rising point of the transfer signal TRG at timing T15 is an accumulation period (also referred to as an exposure period) during which the charge generated by photoelectric conversion is accumulated in the photoelectric conversion element 311.

The subsequent period of timing T16 to T17 is a period during which the potential appearing in the vertical signal line VSL is read by the column ADC 270 as a pixel signal of a signal level in a state where the charge transferred from the photoelectric conversion element 311 is accumulated in the floating diffusion region 374, in other words, in a state where a voltage based on the charge amount, namely, the amount of the charge transferred from the photoelectric conversion element 311, is applied to the gate of the amplification transistor 375. Note that the column ADC 270 performs CDS processing on the pixel signal read during the period of timing T16 to timing T17 by using the reset signal read earlier, thereby generating a pixel signal from which kTC noise and the like have been removed.

1.8 Configuration Example of Detection Pixel and Detection Circuit

Figure 16:
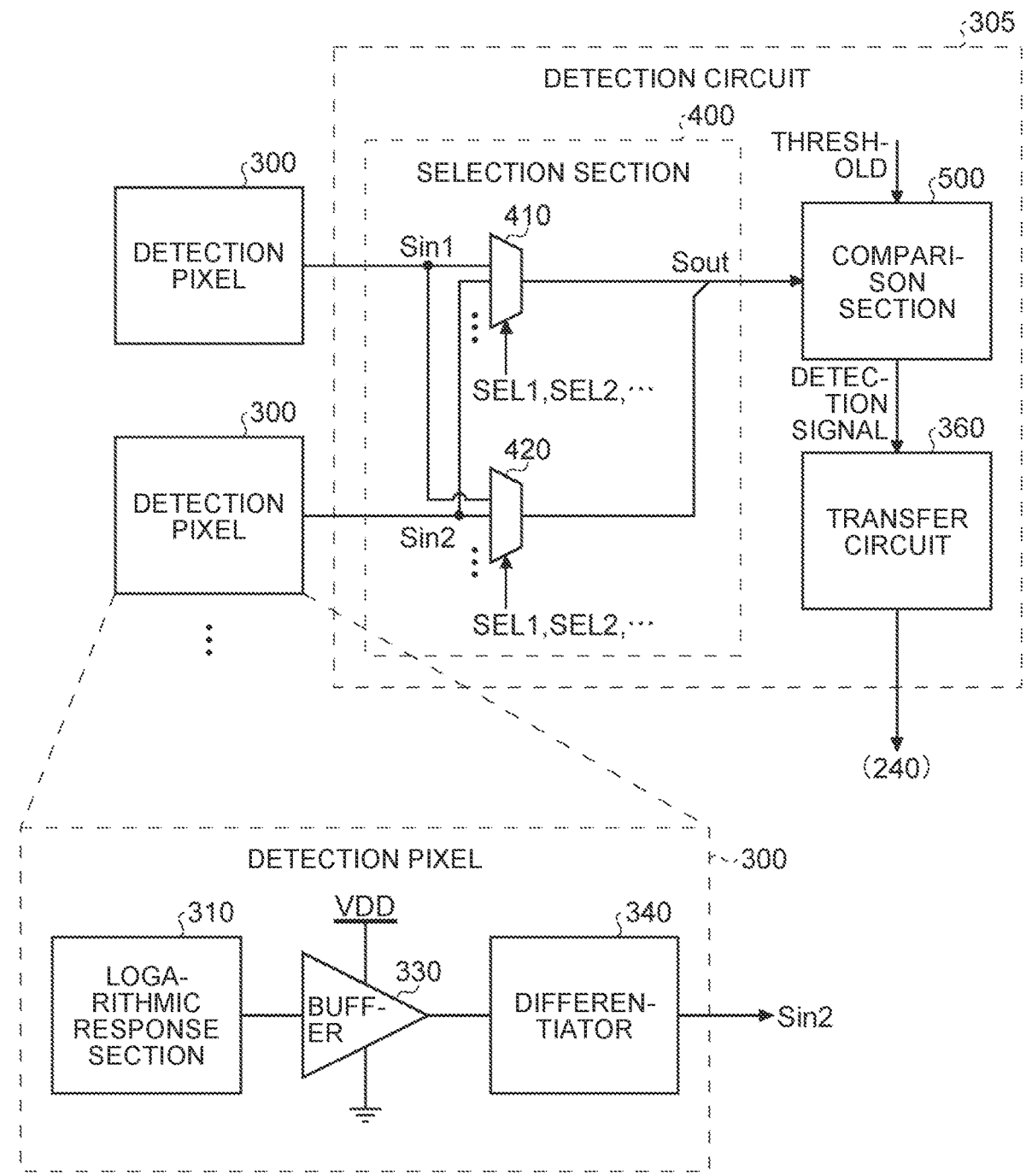
FIG. 16 is a block diagram illustrating a configuration example of a detection pixel and a detection circuit according to the first embodiment.

FIG. 16 is a block diagram illustrating a configuration example of the detection pixel 300 and a detection circuit 305 according to the present embodiment. Among the detection blocks 320 shared by the plurality of logarithmic response sections 310 in the shared block 221, a circuit including the selection section 400, the comparison section 500, and the transfer circuit 360 is defined as the detection circuit 305. Furthermore, a circuit including the logarithmic response section 310, the buffer 330, and the differentiator 340 is defined as the detection pixel 300. As illustrated in the drawing, the detection circuit 305 is shared by the plurality of the detection pixels 300.

Each of the plurality of detection pixels 300 sharing the detection circuit 305 generates a voltage signal corresponding to the logarithmic value of the photocurrent. Subsequently, each of the detection pixels 300 outputs a differential signal Sin indicating a change amount of the voltage signal to the detection circuit 305 according to the row drive signal. In each of the detection pixels 300, a voltage signal corresponding to a logarithmic value is generated by the logarithmic response section 310, while a differential signal is generated by the differentiator 340.

Selection signals such as selection signals SEL1 and SEL2 are commonly input to the selectors 410 and 420 in the detection circuit 305. The detection circuit 305 selects a differential signal (that is, the change amount) of the detection pixel indicated by the selection signal among the plurality of detection pixels 300, and detects whether the change amount exceeds a predetermined threshold. The detection circuit 305 then transfers the detection signal to the signal processing circuit 240 according to the column drive signal. In the detection circuit 305, the differential signal is selected by the selection section 400, and the comparison with the threshold is performed by the comparison section 500. In addition, the detection signal is transferred by the transfer circuit 360.

Here, in a typical DVS, the comparison section 500 and the transfer circuit 360 are arranged for each detection pixel together with the logarithmic response section 310, the buffer 330, and the differentiator 340. In contrast, in the above-described configuration in which the detection circuit 305 including the comparison section 500 and the transfer circuit 360 is shared by the plurality of detection pixels 300, it is possible to reduce the circuit scale of the solid-state imaging device 200 as compared with a case where the detection circuit is not shared. This facilitates microfabrication of pixels.

When the stacked structure is adopted in particular, using a conventional configuration with no shared use of the detection circuit 305 would lead to the detection chip 202 having a larger circuit scale compared to the light receiving chip 201. With this configuration, the density of the pixels is limited by the circuit on the detection chip 202, making it difficult to achieve microfabrication of the pixels. However, by using a configuration in which the plurality of detection pixels 300 shares the detection circuit 305, it is possible to reduce the circuit scale of the detection chip 202, facilitating microfabrication of the pixels.

Although the buffer 330 is arranged for each detection pixel 300, the configuration is not limited to this configuration, and it is also possible to omit the buffer 330.

In addition, although the photoelectric conversion element 311 and the nMOS transistors 312 and 313 of the logarithmic response section 310 are arranged on the light receiving chip 201, and the pMOS transistors 314 and subsequent transistors are arranged on the detection chip 202, the configuration is not limited to this example. For example, the photoelectric conversion element 311 alone can be arranged on the light receiving chip 201, and the other devices can be arranged on the detection chip 202. Alternatively, the logarithmic response section 310 alone can be arranged on the light receiving chip 201, and the buffers 330 and the subsequent devices can be arranged on the detection chip 202. Still alternatively, the logarithmic response section 310 and the buffer 330 can be arranged on the light receiving chip 201, while the differentiator 340 and the subsequent devices can be arranged on the detection chip 202. In addition, the logarithmic response section 310, the buffer 330, and the differentiator 340 can be arranged on the light receiving chip 201, and the detection circuit 305 and the subsequent circuits can be arranged on the detection chip 202. Still alternatively, portions up to the selection section 400 can be arranged on the light receiving chip 201, while the comparison section 500 and the subsequent sections can be arranged on the detection chip 202.

1.8.1 Operation Example of Solid-State Imaging Device in EVS Mode

Figure 17:
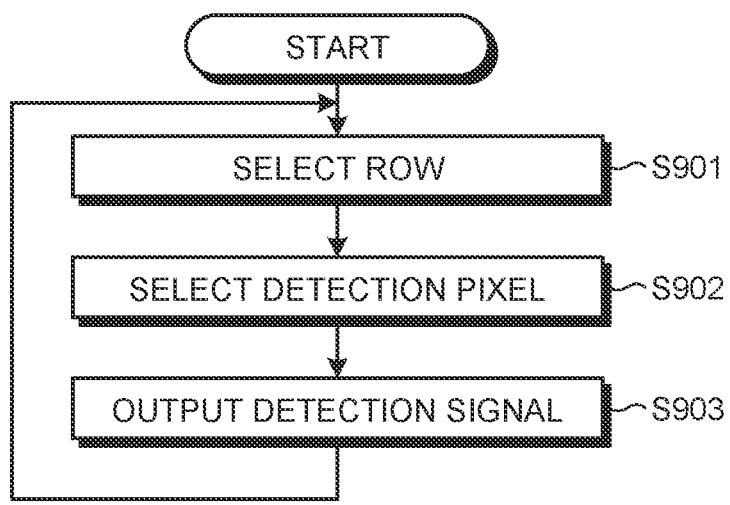
FIG. 17 is a flowchart illustrating an example of operation of the solid-state imaging device according to the first embodiment.

FIG. 17 is a flowchart illustrating an example of the operation of the solid-state imaging device in the EVS mode according to the present embodiment. The operation is started at a timing of execution of a predetermined application for detecting the presence or absence of an address event, for example.

As illustrated in FIG. 17, in the EVS mode, the row drive circuit 251 selects one of the rows (step S901). The row drive circuit 251 selects and drives one of the detection pixels 300 in each shared block 221 in the selected row (step S902). The detection circuit 305 detects the presence or absence of an address event in the selected detection pixel 300 (step S903). After step S903, the solid-state imaging device 200 repeatedly executes step S901 and subsequent steps.

In this manner, the present embodiment has a configuration in which the detection circuit 305 that detects the presence or absence of the address event is shared by the plurality of detection pixels 300, making it possible to reduce the circuit scale as compared with the case where the detection circuit 305 is not shared. This facilitates microfabrication of the detection pixel 300.

1.9 Modification of Detection Pixel and Detection Circuit

In the first embodiment described above, the solid-state imaging device 200 selects the detection pixels 300 one by one, and simultaneously detects an on-event and an off-event for the detection pixels. Alternatively, the solid-state imaging device 200 can also select two detection pixels, detect an on-event for one of the detection pixels, and detect an off-event for the other detection pixel. The solid-state imaging device 200 according to a modification of the first embodiment is different from that of the first embodiment in that an on-event is detected for one of two detection pixels and an off-event is detected for the other detection pixel.

Figure 18:
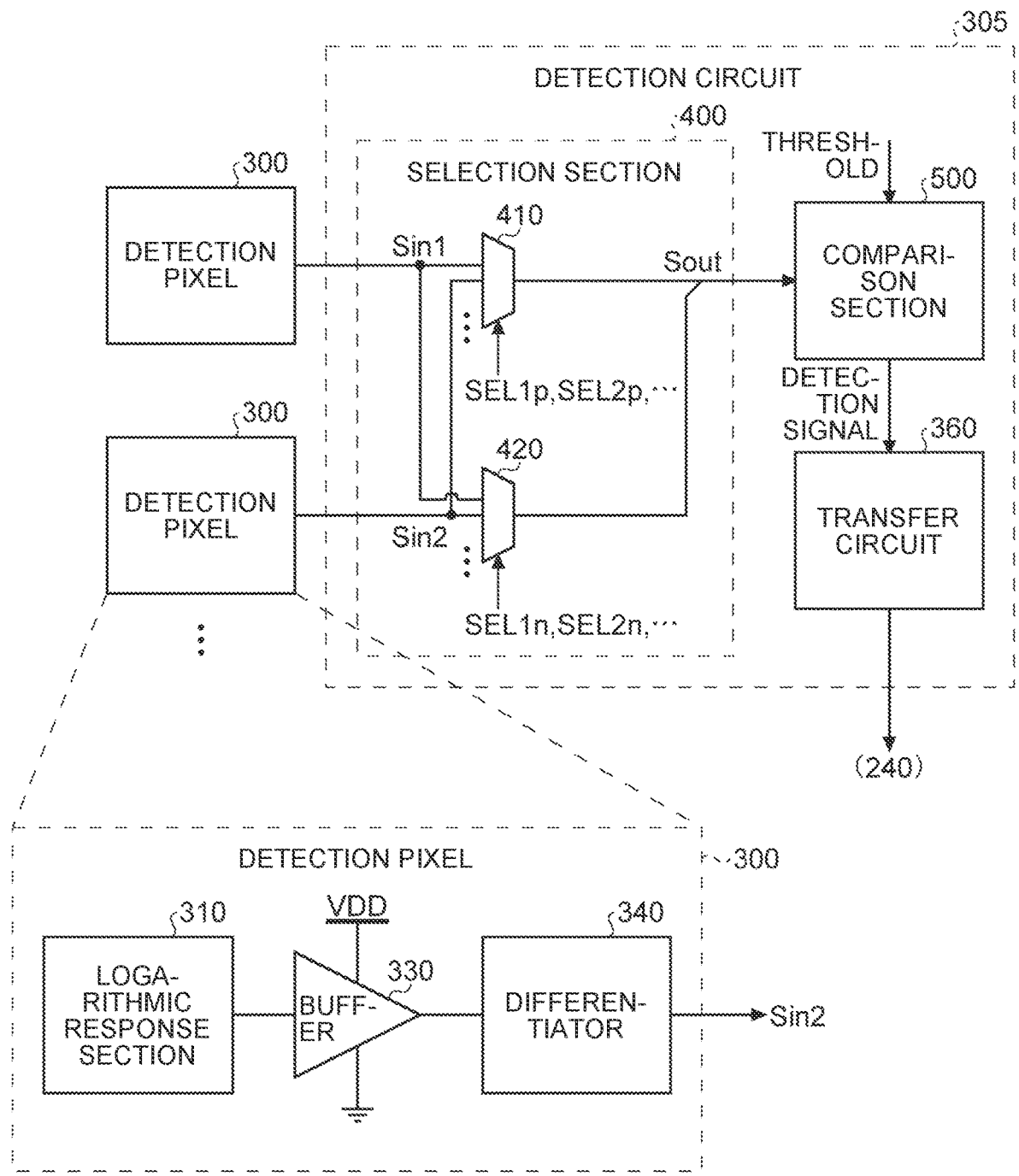
FIG. 18 is a block diagram illustrating a configuration example of a detection pixel and a detection circuit according to a modification of the first embodiment.

FIG. 18 is a block diagram illustrating a configuration example of the detection pixel 300 and the detection circuit 305 according to the modification of the present embodiment. The detection circuit 305 according to the modification of the first embodiment is different from that of the first embodiment in that a selection signal such as a selection signal SEL1p or SEL2p is input to the selector 410 while a selection signal such as a selection signal SEL1n or SEL2n is input to the selector 420. In the modification of the first embodiment, two detection pixels 300 are selected, and the selector 410 selects one differential signal according to a selection signal SEL1p, SEL2p, or the like. At the same time, the selector 420 selects the other differential signal according to the selection signal SEL1n, SEL2n, or the like.

Figure 19:
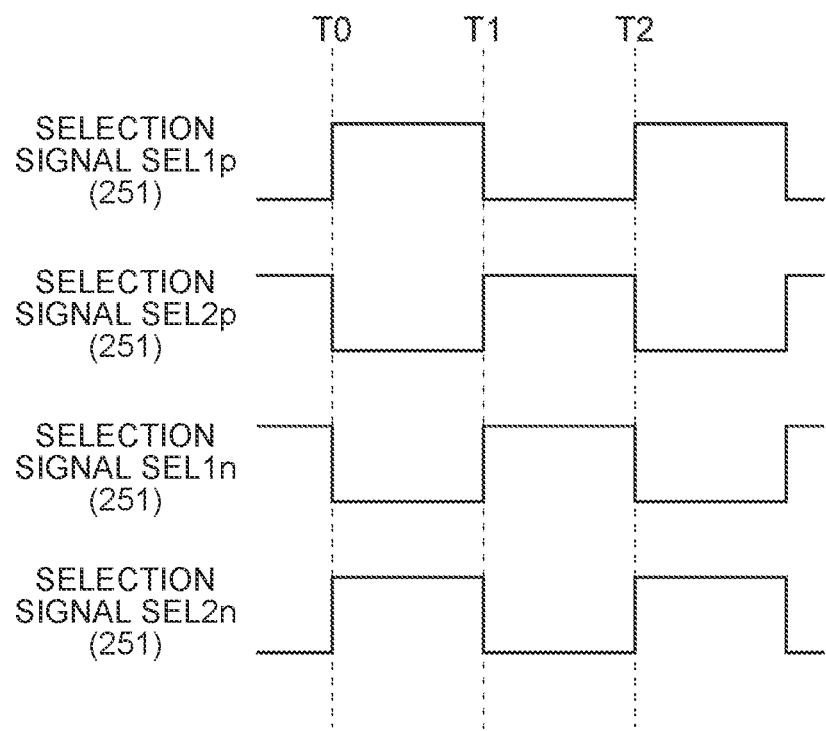
FIG. 19 is a timing chart illustrating an example of control of a row drive circuit according to the modification of the first embodiment.

1.9.1 Control Example of Row Drive Circuit According to Modification FIG. 19 is a timing chart illustrating an example of control of the row drive circuit 251 in the modification of the present embodiment. At the timings T0 to T2, it is assumed that two pixels are selected, that is, the detection pixel 300 that outputs a differential signal Sin1 and the detection pixel 300 that outputs a differential signal Sin2. At timings T0 to T1, the row drive circuit 251 sets the selection signals SEL1p and SEL2n to the high level and sets the selection signals SEL2p and SEL1n to the low level. With this setting, an on-event is detected for the pixel corresponding to the differential signal Sin1, and an off-event is detected for the pixel corresponding to the differential signal Sin2.

Next, at timings T1 to T2, the row drive circuit 251 sets the selection signals SEL1p and SEL2n to the low level and sets the selection signals SEL2p and SEL1n to the high level. With this setting, an on-event is detected for the pixel corresponding to the differential signal Sin2, and an off-event is detected for the pixel corresponding to the differential signal Sin1.

In this manner, according to the modification of the present embodiment, since the on-event is detected for one of the two detection pixels and the off-event is detected for the other detection pixel, it is possible to detect the on-event and the off-event spatially in parallel at the same time.

1.10 Dead Period During Mode Transition

Figure 20:
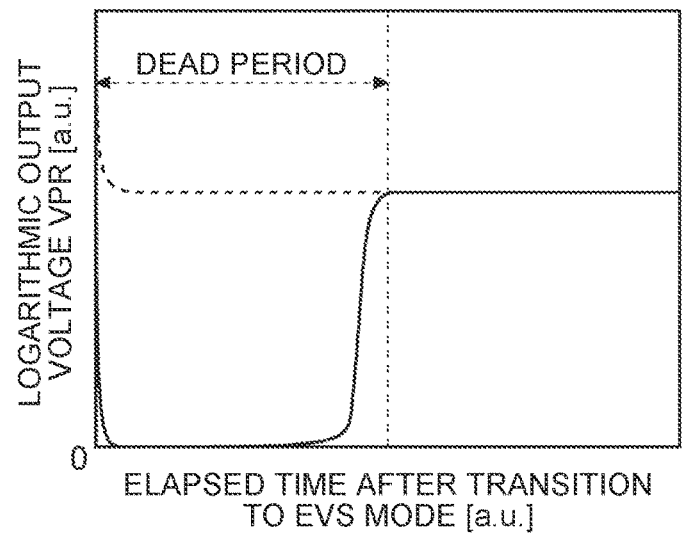
FIG. 20 is a waveform diagram illustrating a dead period at the time of mode transition.

FIG. 20 is a waveform diagram illustrating a dead period at the time of mode transition. With the above-described configuration in the CIS mode, the cathode potential of the photoelectric conversion element 311 is reset to a potential higher than the potential (for example, 0.5 volt (V)) of the sense node SN (PD reset), similarly to the floating diffusion region 374. Here, the amount of charge generated in the photoelectric conversion element 311 is small at low illuminance. Therefore, even at the end of the CIS mode, the cathode potential of the photoelectric conversion element 311 is maintained at a potential higher than the potential of the sense node SN (hereinafter, referred to as an SN potential.). In this state, when the mode transitions to the EVS mode and the switching transistor 317 is turned on, the cathode potential of the photoelectric conversion element 311, which is higher than the SN potential, is short-circuited with the sense node SN, leading to an increase in the SN potential. This turns off the nMOS transistors 312 and 315 as illustrated in FIG. 20, causing the voltage level of the voltage signal VPR to remain stuck to the ground potential (GND). This results in an occurrence of a dead period in which there is no reaction to the photocurrent flowing out of the photoelectric conversion element 311, in other words, a period of address event detection failure. This dead period is continued until the SN potential settles to a predetermined potential, and thus can be a long period of about 100 milliseconds (ms), for example.

In view of this, in the present embodiment, at the time of mode transition from the CIS mode to the EVS mode, the SN potential is fixed to a voltage VX, which is lower than the SN potential at normal operation. With this configuration, even when the switching transistor 317 transitions to an on state, it is possible to suppress an unintended increase in the SN potential, making it possible to avoid the nMOS transistors 312 and 315 from being turned off. As a result, it is possible to suppress a dead period caused by the voltage level of the voltage signal VPR stuck to the ground potential (GND).

1.11 Configuration Example of Response Circuit

Figure 21:
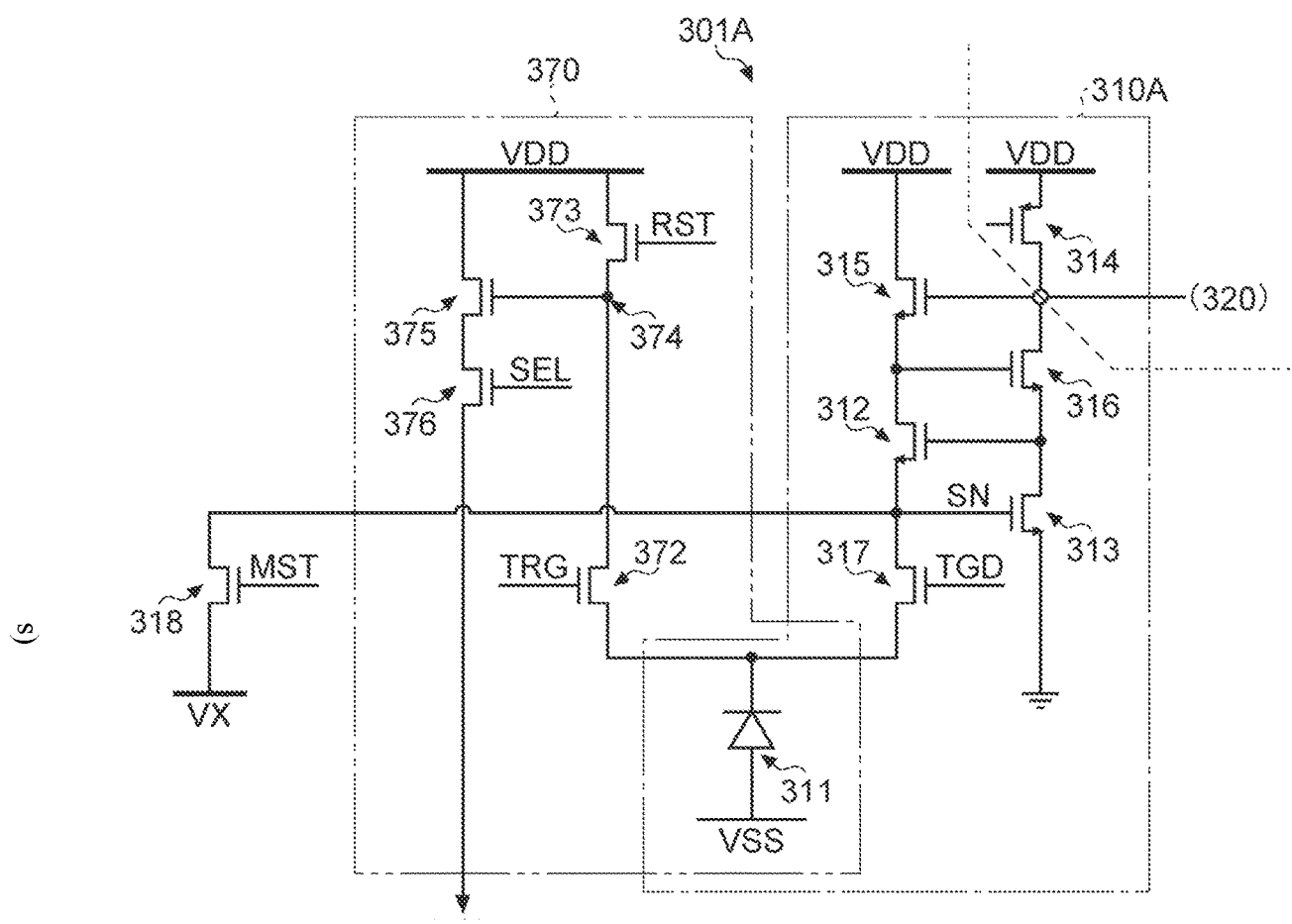
FIG. 21 is a circuit diagram illustrating a configuration example of a response circuit according to the first embodiment.

FIG. 21 is a circuit diagram illustrating a configuration example of a response circuit according to the present embodiment. As illustrated in FIG. 21, a response circuit 301A according to the present embodiment has a configuration similar to the response circuit 301 described above with reference to FIG. 9, in which a control transistor 318 is connected to the sense node SN. The control transistor 318 may be an nMOS transistor, for example. The control transistor 318 can correspond to a first transistor in the claims, for example.

As described above, the control transistor 318 has a drain connected to the sense node SN, and has source connected to a potential, for example, a fixed potential VX, which is equal to or higher than a reference potential and lower than the power supply voltage VDD. The reference potential may be, for example, a well potential VSS or a ground potential (GND) of an element isolation region of a semiconductor substrate on which the photoelectric conversion element 311 is formed. In addition, the well potential VSS of the element isolation region may be a negative potential. In that case, the voltage value of the fixed potential VX is, for example, a voltage value that is equal to or more than an anode potential (for example, VSS or GND) of the photoelectric conversion element 311, and equal to or less than a potential VSN of the sense node SN at normal operation. Note that the potential VSN of the sense node SN at normal operation may be the potential VSN of the sense node SN at normal operation of the logarithmic response section 310A, and may be, for example, a gate-source voltage VGS of the nMOS transistor 313 determined by a bias current BIAS flowing through the two nMOS transistors 313 and 316 and by a threshold voltage of the nMOS transistor 313.

Furthermore, a control signal MST for controlling on/off of the control transistor 318 is applied from the row drive circuit 251 to the gate of the control transistor 318, for example.

In such a configuration, at the time of transition from the CIS mode to the EVS mode, a high-level control signal MST is applied to the gate of the control transistor 318. This turns on the control transistor 318 and controls the SN potential of the sense node SN to be set to the fixed potential VX. Therefore, even when the switching transistor 317 transitions to the on state, it is possible to suppress an unintended increase in the SN potential. This makes it possible to avoid the nMOS transistors 312 and 315 from being turned off, leading to achievement of suppression of the dead period due to the voltage level of the voltage signal VPR stuck to the ground potential (GND).

1.12 Modification of Response Circuit

Next, modifications of the response circuit according to the present embodiment will be described with some examples.

1.12.1 First Modification

Figure 22:
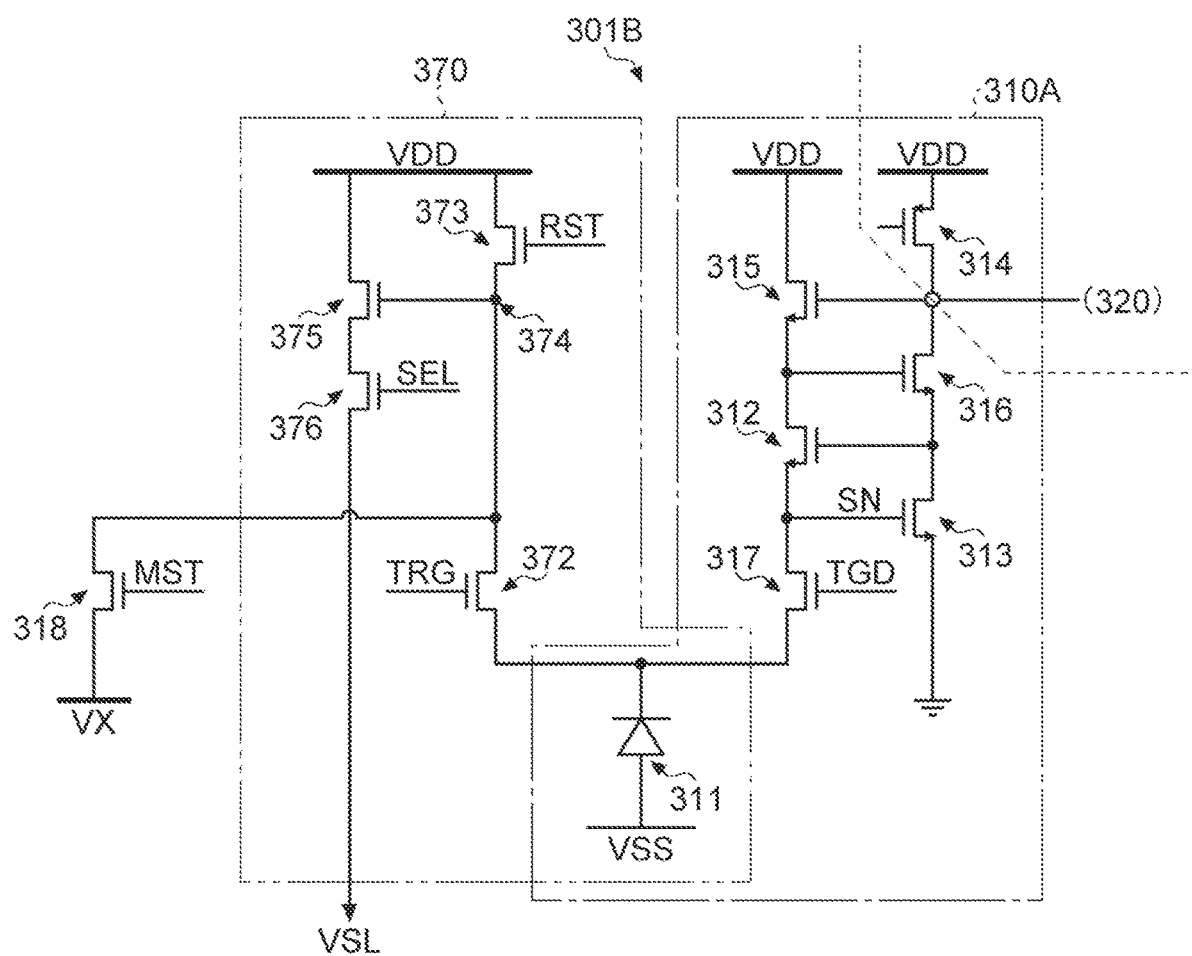
FIG. 22 is a circuit diagram illustrating a configuration example of a response circuit according to a first modification of the first embodiment.

FIG. 22 is a circuit diagram illustrating a configuration example of a response circuit according to a first modification of the present embodiment. As illustrated in FIG. 22, a response circuit 301B according to the first modification has a configuration similar to the response circuit 301A illustrated in FIG. 21, in which the drain of the control transistor 318 is connected to the drain of the transfer transistor 372 in the pixel circuit 370.

At the time of transition from the CIS mode to the EVS mode in such a configuration, the switching transistor 317 is turned on in a state where the control transistor 318 and the transfer transistor 372 are turned on. This allows the fixed potential VX to be applied to the sense node SN through the control transistor 318, the transfer transistor 372, and the switching transistor 317, making it possible to control the SN potential of the sense node SN to be set to the fixed potential VX. That is, it is possible to suppress an unintended increase in the SN potential even when the switching transistor 317 transitions to the on state.

1.12.2 Second Modification

Figure 23:
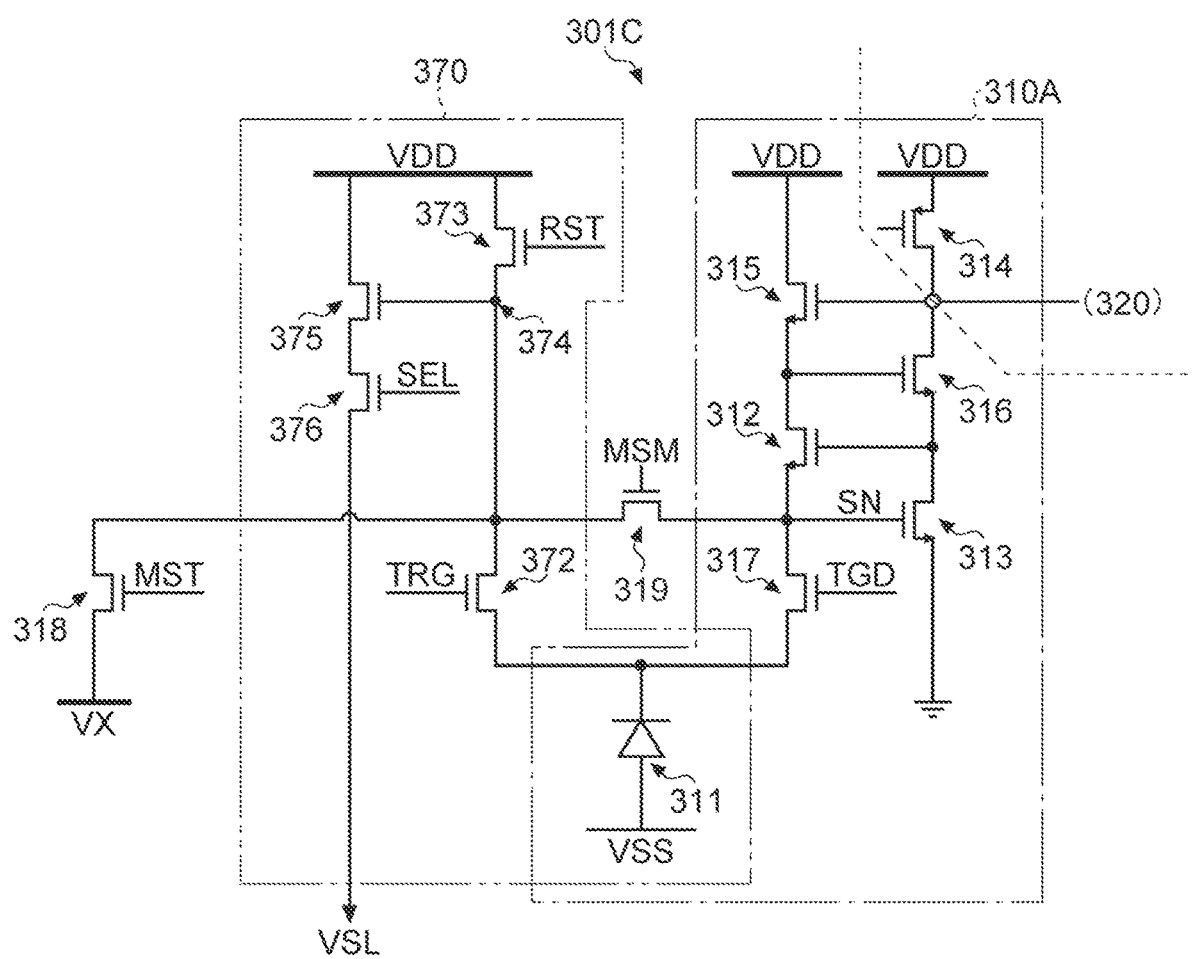
FIG. 23 is a circuit diagram illustrating a configuration example of a response circuit according to a second modification of the first embodiment.

FIG. 23 is a circuit diagram illustrating a configuration example of a response circuit according to a second modification of the present embodiment. As illustrated in FIG. 23, a response circuit 301C according to the second modification has a configuration similar to the response circuit 301B illustrated in FIG. 22, in which a control transistor 319 is further connected between the drains of the control transistor 318 and the transfer transistor 372 and the sense node SN. The control transistor 319 may correspond to a sixth transistor in the claims, for example.

The control transistor 319 has a source connected to the drains of the control transistor 318 and the transfer transistor 372, and has a drain connected to the sense node SN. Furthermore, for example, a control signal MSM is applied from the row drive circuit 251 to the gate of the control transistor 319.

In such a configuration, when transitioning from the CIS mode to the EVS mode, the control transistors 318 and 319 are turned on. This allows the fixed potential VX to be applied to the sense node SN through the control transistors 318 and 319, making it possible to control the SN potential of the sense node SN to be set to the fixed potential VX. This makes it possible to suppress an unintended increase in the SN potential even when the switching transistor 317 transitions to the on state.

1.12.3 Third Modification

Figure 24:
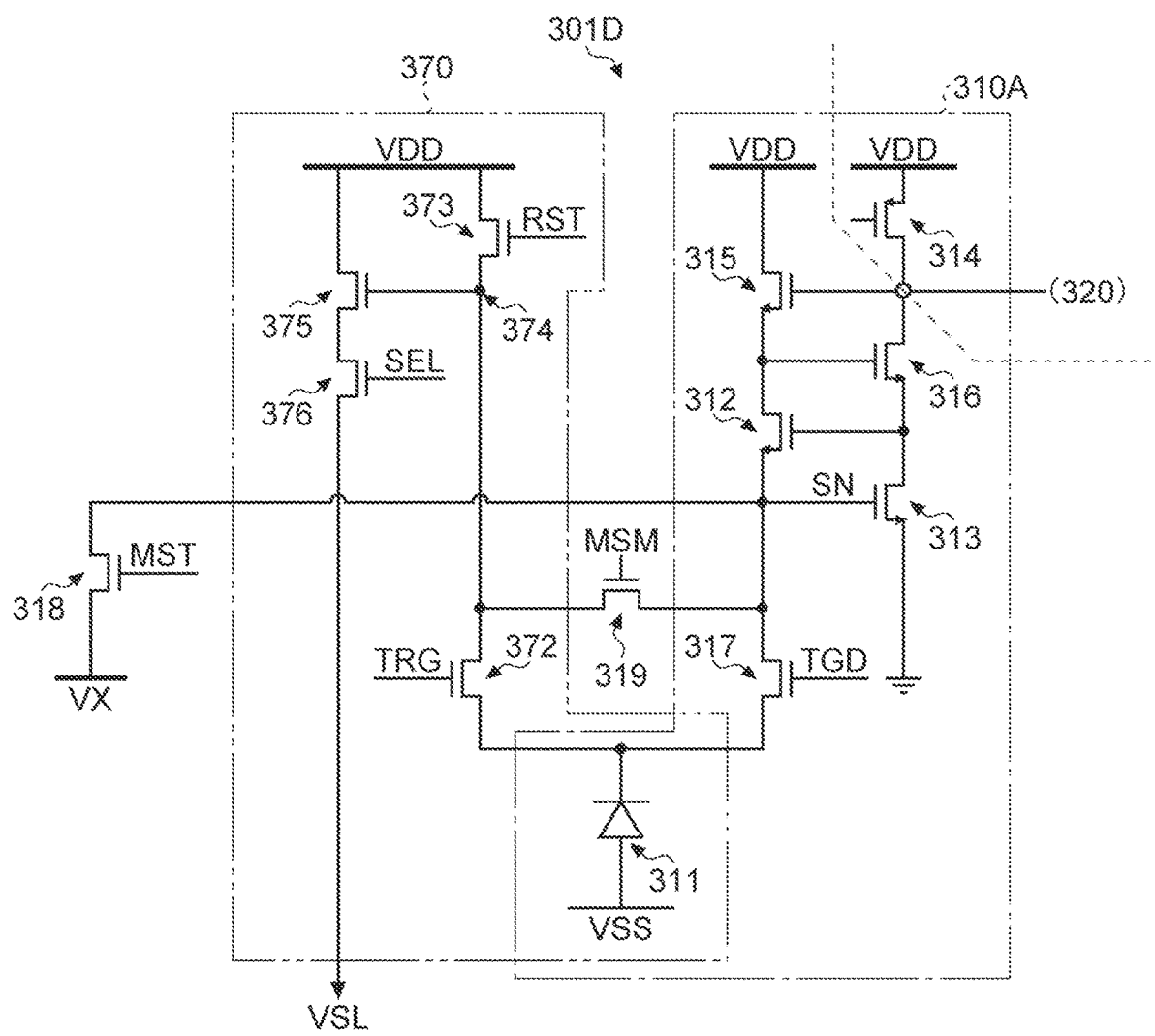
FIG. 24 is a circuit diagram illustrating a configuration example of a response circuit according to a third modification of the first embodiment.

FIG. 24 is a circuit diagram illustrating a configuration example of a response circuit according to a third modification of the present embodiment. As illustrated in FIG. 24, a response circuit 301D according to the third modification has a configuration similar to the response circuit 301A illustrated in FIG. 21, in which the drain of the transfer transistor 372 and the drain of the switching transistor 317 are connected to each other through the control transistor 319.

The control transistor 319 has a source connected to the drain of the transfer transistor 372, and has a drain connected to the drain of the switching transistor 317. Furthermore, for example, a control signal MSM is applied from the row drive circuit 251 to the gate of the control transistor 319.

In such a configuration, when transitioning from the CIS mode to the EVS mode, the control transistor 318 is turned on similarly to the first modification. This allows the fixed potential VX to be applied to the sense node SN through the control transistors 318, making it possible to control the SN potential of the sense node SN to be set to the fixed potential VX. This makes it possible to suppress an unintended increase in the SN potential even when the switching transistor 317 transitions to the on state.

1.12.4 Fourth Modification

Figure 25:
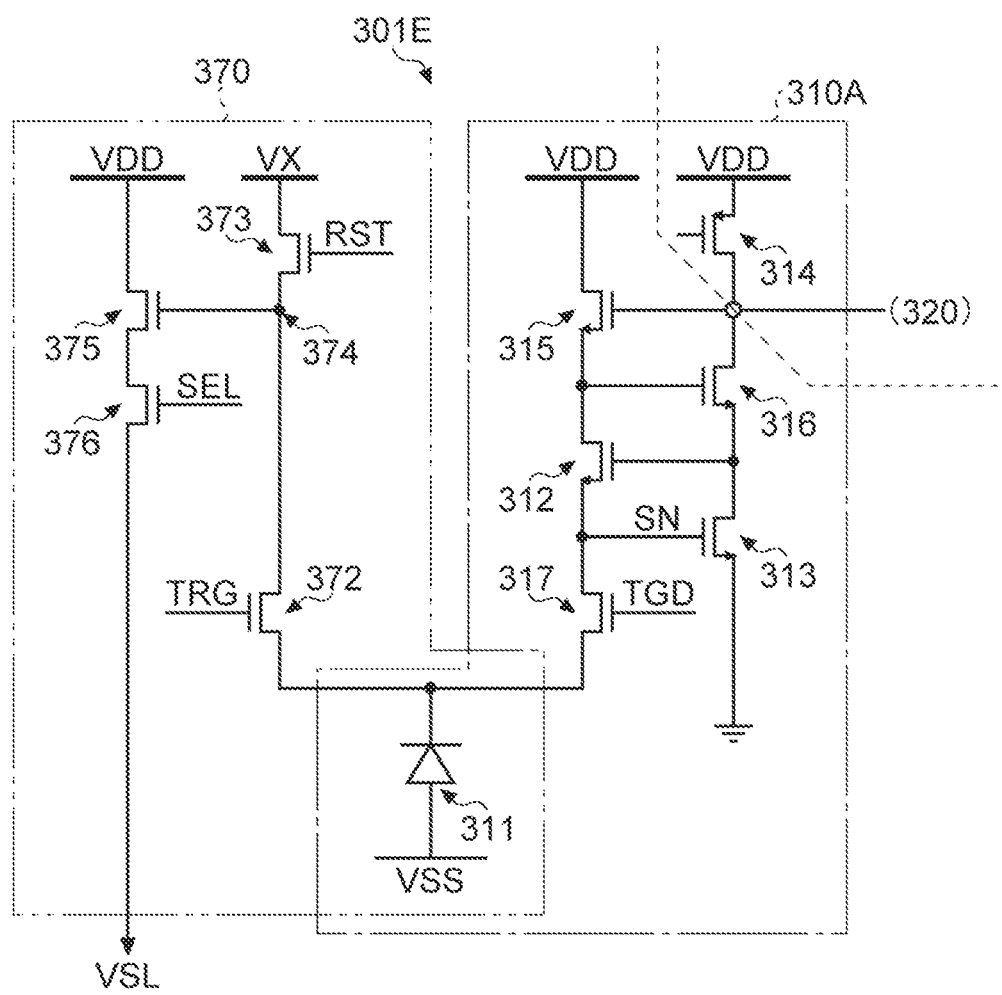
FIG. 25 is a circuit diagram illustrating a configuration example of a response circuit according to a fourth modification of the first embodiment.

FIG. 25 is a circuit diagram illustrating a configuration example of a response circuit according to a fourth modification of the present embodiment. As illustrated in FIG. 25, a response circuit 301E according to the fourth modification has a configuration similar to the response circuit 301 illustrated in FIG. 9, in which a fixed potential VX is used, instead of the power supply voltage VDD, as the reset voltage (FD reset voltage and PD reset voltage) of the pixel circuit 370.

In such a configuration, when transitioning from the CIS mode to the EVS mode, the reset transistor 373 and the transfer transistor 372 are turned on. This allows the fixed potential VX to be applied to the sense node SN through the reset transistor 373 and the transfer transistor 372, making it possible to control the SN potential of the sense node SN to be set to the fixed potential VX. This makes it possible to suppress an unintended increase in the SN potential even when the switching transistor 317 transitions to the on state.

1.12.5 Fifth Modification

Figure 26:
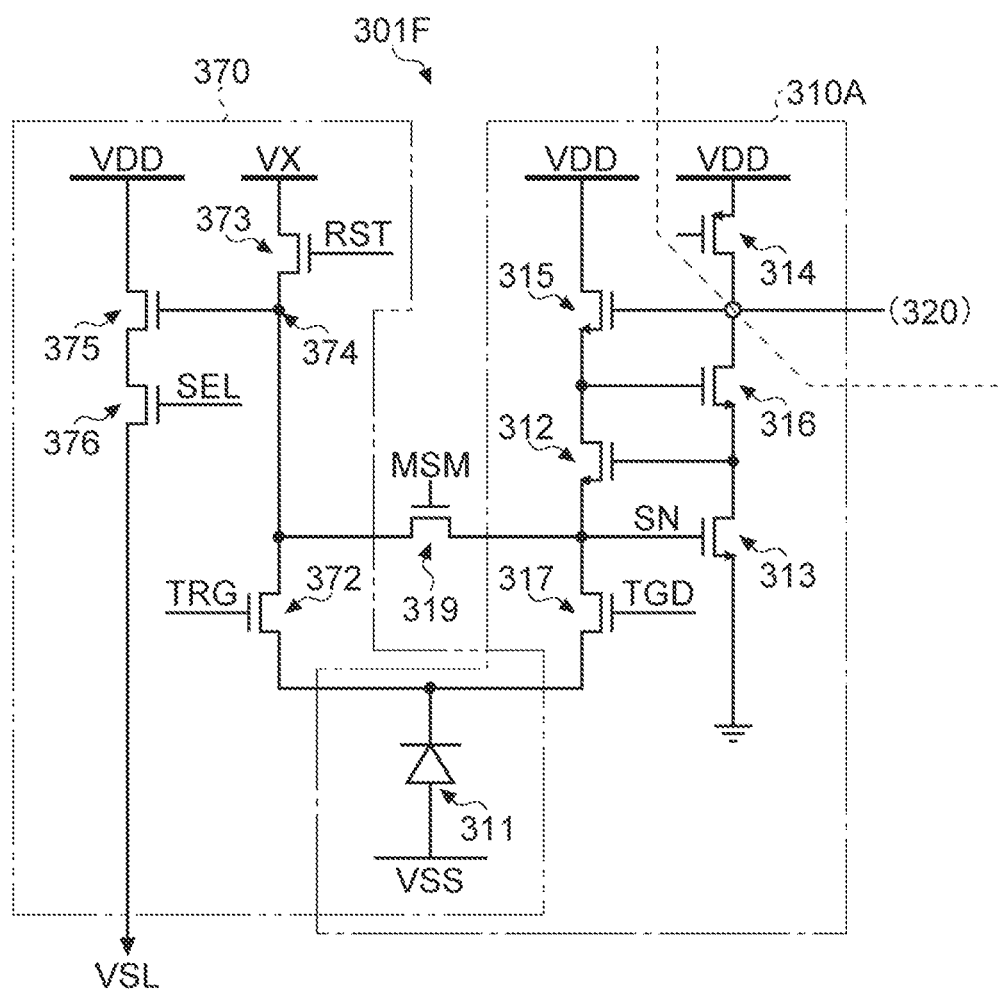
FIG. 26 is a circuit diagram illustrating a configuration example of a response circuit according to a fifth modification of the first embodiment.

FIG. 26 is a circuit diagram illustrating a configuration example of a response circuit according to a fifth modification of the present embodiment. As illustrated in FIG. 26, a response circuit 301F according to the fifth modification has a configuration similar to the response circuit 301E illustrated in FIG. 25, in which the drain of the transfer transistor 372 and the drain of the switching transistor 317 are connected to each other through the control transistor 319.

In such a configuration, at the time of transition from the CIS mode to the EVS mode, the reset transistor 373 and the control transistor 319 are turned on. This allows the fixed potential VX to be applied to the sense node SN through the reset transistor 373 and the control transistor 319, making it possible to control the SN potential of the sense node SN to be set to the fixed potential VX. This makes it possible to suppress an unintended increase in the SN potential even when the switching transistor 317 transitions to the on state.

1.12.6 Sixth Modification

Figure 27:
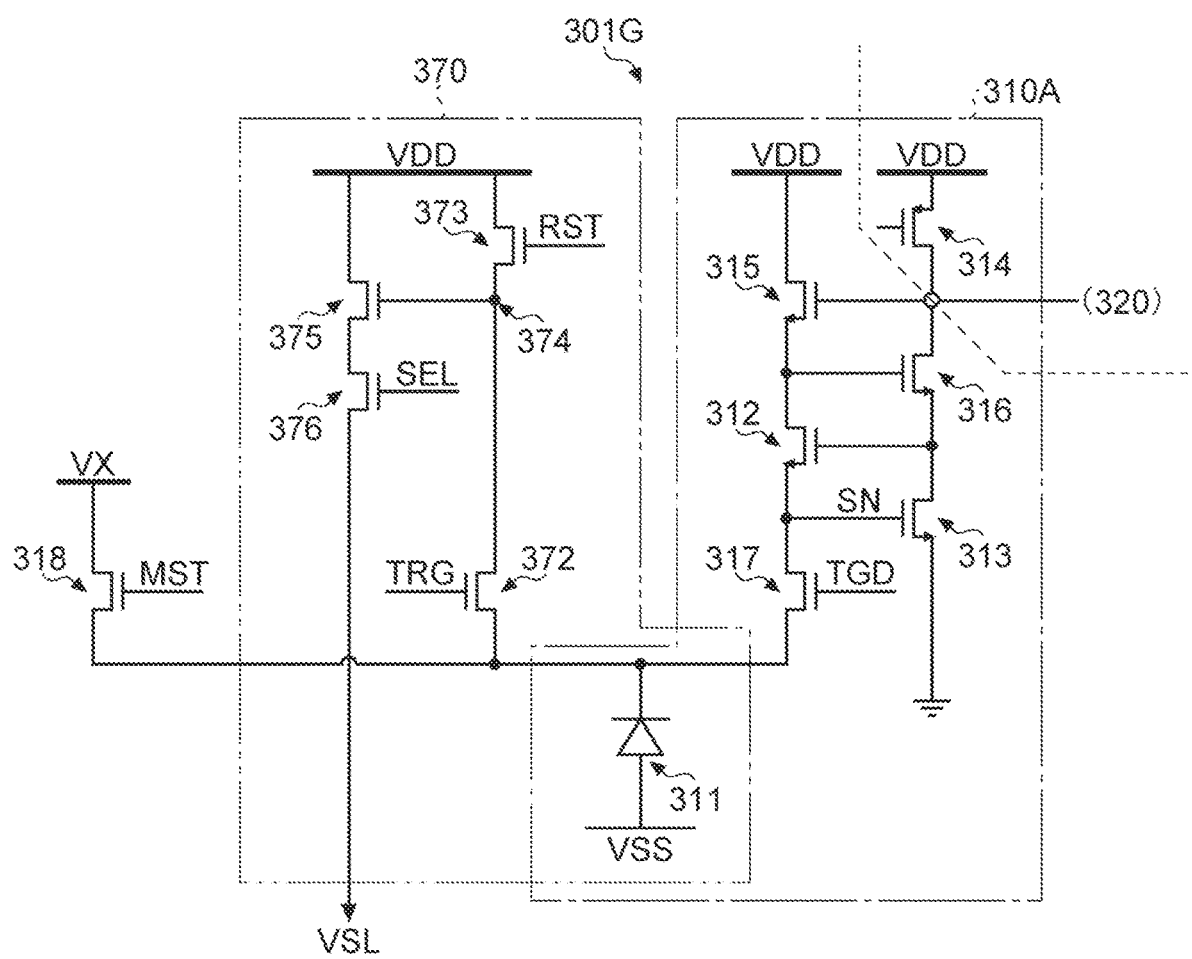
FIG. 27 is a circuit diagram illustrating a configuration example of a response circuit according to a sixth modification of the first embodiment.

FIG. 27 is a circuit diagram illustrating a configuration example of a response circuit according to a sixth modification of the present embodiment. As illustrated in FIG. 27, a response circuit 301G according to the sixth modification has a configuration similar to the response circuit 301A illustrated in FIG. 21, in which the control transistor 318 is connected to the cathode of the photoelectric conversion element 311 instead of the sense node SN.

In such a configuration, when transitioning from the CIS mode to the EVS mode, the switching transistor 317 is turned on while the control transistor 318 is turned on. This allows the fixed potential VX to be applied to the sense node SN through the control transistor 318 and the switching transistor 317, making it possible to control the SN potential of the sense node SN to be set to the fixed potential VX. This makes it possible to suppress an unintended increase in the SN potential even when the switching transistor 317 transitions to the on state.

1.12.7 Seventh Modification

Figure 28:
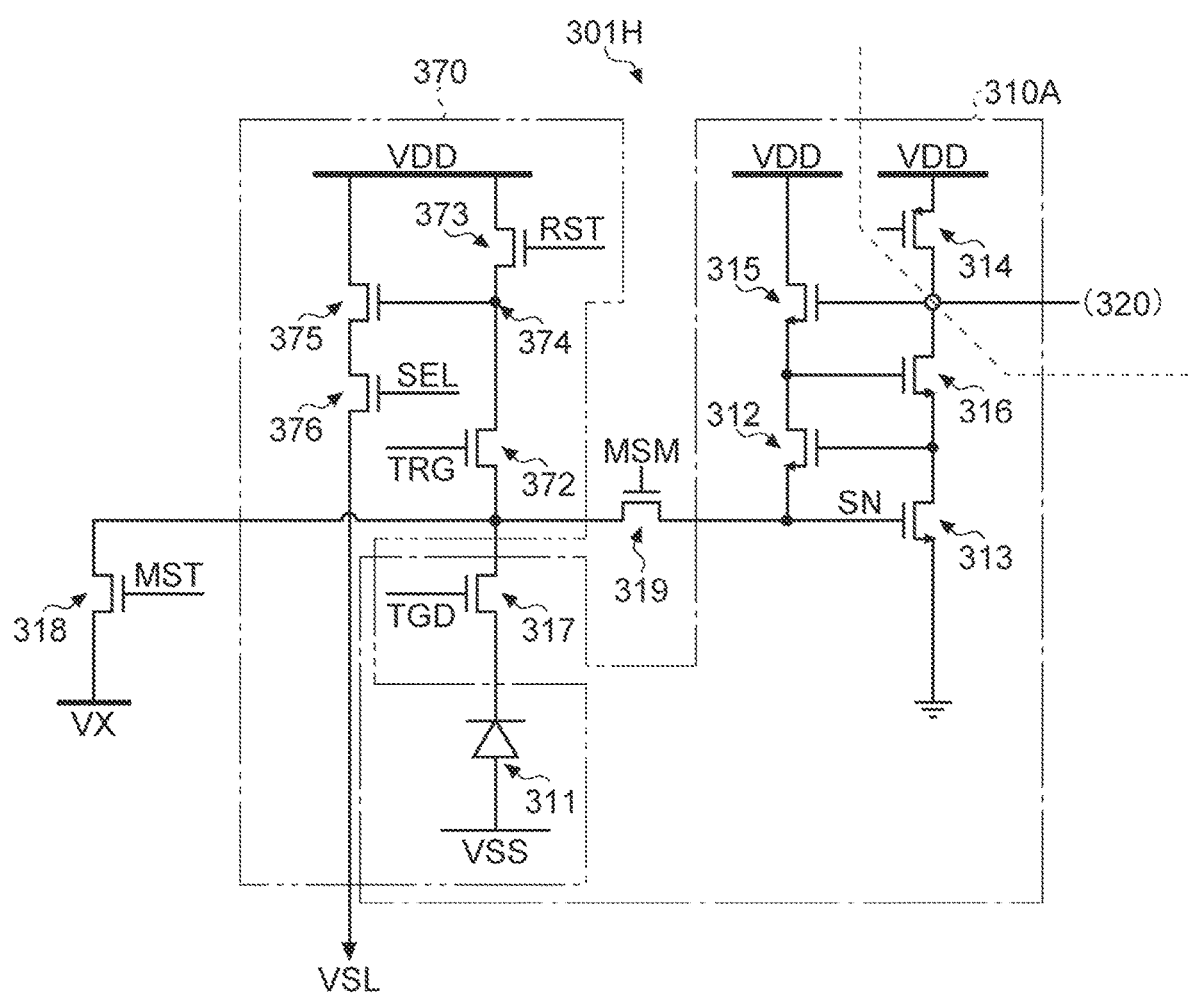
FIG. 28 is a circuit diagram illustrating a configuration example of a response circuit according to a seventh modification of the first embodiment.

FIG. 28 is a circuit diagram illustrating a configuration example of a response circuit according to a seventh modification of the present embodiment. As illustrated in FIG. 28, a response circuit 301H according to the seventh modification has a configuration similar to the response circuit 301C illustrated in FIG. 23, in which the transfer transistor 372 and the switching transistor 317 are connected in series, and the sense node SN is connected to the cathode of the photoelectric conversion element 311 through the control transistor 319 and the switching transistor 317.

In such a configuration, when transitioning from the CIS mode to the EVS mode, the control transistors 318 and 319 are turned on. This allows the fixed potential VX to be applied to the sense node SN through the control transistors 318 and 319, making it possible to control the SN potential of the sense node SN to be set to the fixed potential VX. This makes it possible to suppress an unintended increase in the SN potential even when the switching transistor 317 transitions to the on state.

1.12.8 Eighth Modification

Figure 29:
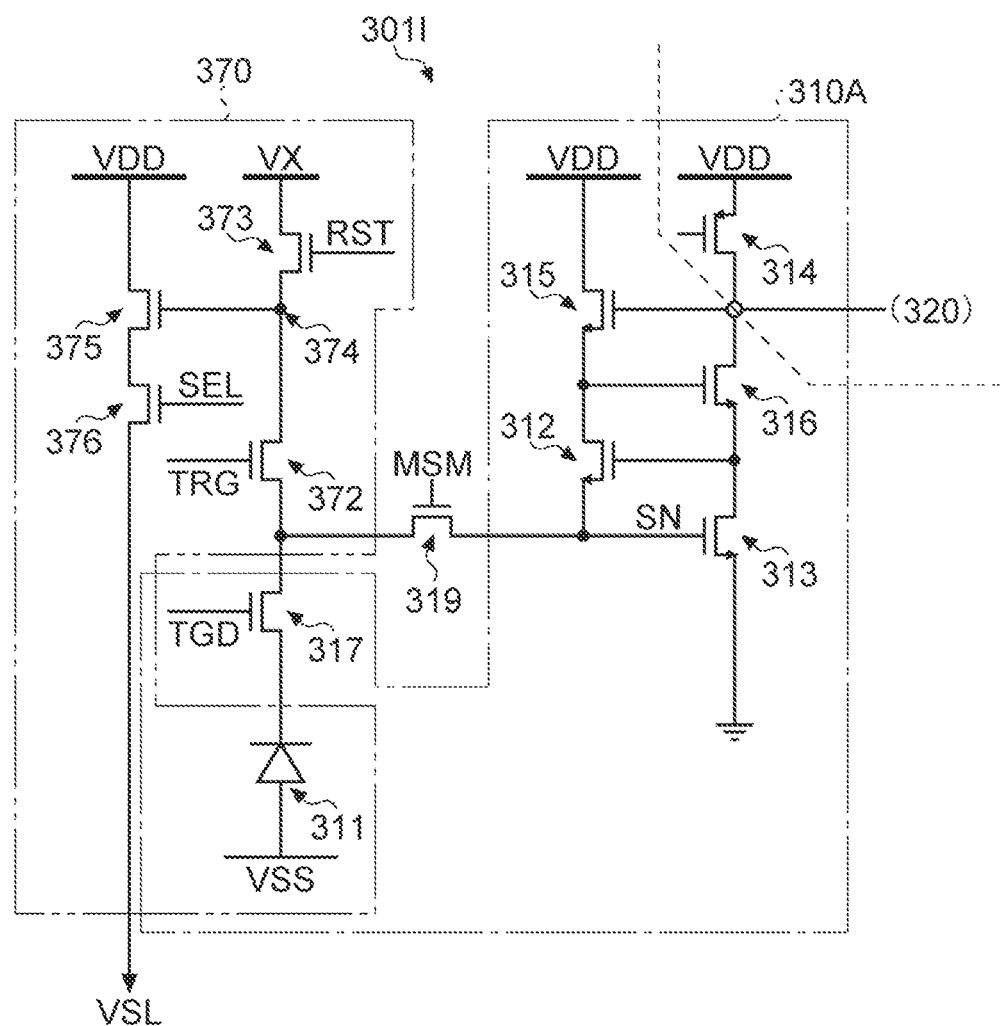
FIG. 29 is a circuit diagram illustrating a configuration example of a response circuit according to an eighth modification of the first embodiment.

FIG. 29 is a circuit diagram illustrating a configuration example of a response circuit according to an eighth modification of the present embodiment. As illustrated in FIG. 29, a response circuit 301I according to the eighth modification has a configuration similar to the response circuit 301F illustrated in FIG. 26, in which, similarly to the seventh modification, the transfer transistor 372 and the switching transistor 317 are connected in series, and the sense node SN is connected to the cathode of the photoelectric conversion element 311 through the control transistor 319 and the switching transistor 317.

In such a configuration, when transitioning from the CIS mode to the EVS mode, the reset transistor 373, the transfer transistor 372, and the control transistor 319 are turned on. This allows the fixed potential VX to be applied to the sense node SN through the reset transistor 373, the transfer transistor 372, and the control transistor 319, making it possible to control the SN potential of the sense node SN to be set to the fixed potential VX. This makes it possible to suppress an unintended increase in the SN potential even when the switching transistor 317 transitions to the on state.

1.13 Transition from CIS Mode to EVS Mode

Next, an operation at the time of transition from the CIS mode to the EVS mode will be described. The present description will be given with reference to the response circuit 301A exemplified in FIG. 21. However, by appropriately controlling the control transistor 319, the transfer transistor 372, the reset transistor 373, and the like in accordance with the control of the control transistor 318, it is also possible to achieve operation similarly with the modification.

Figure 30:
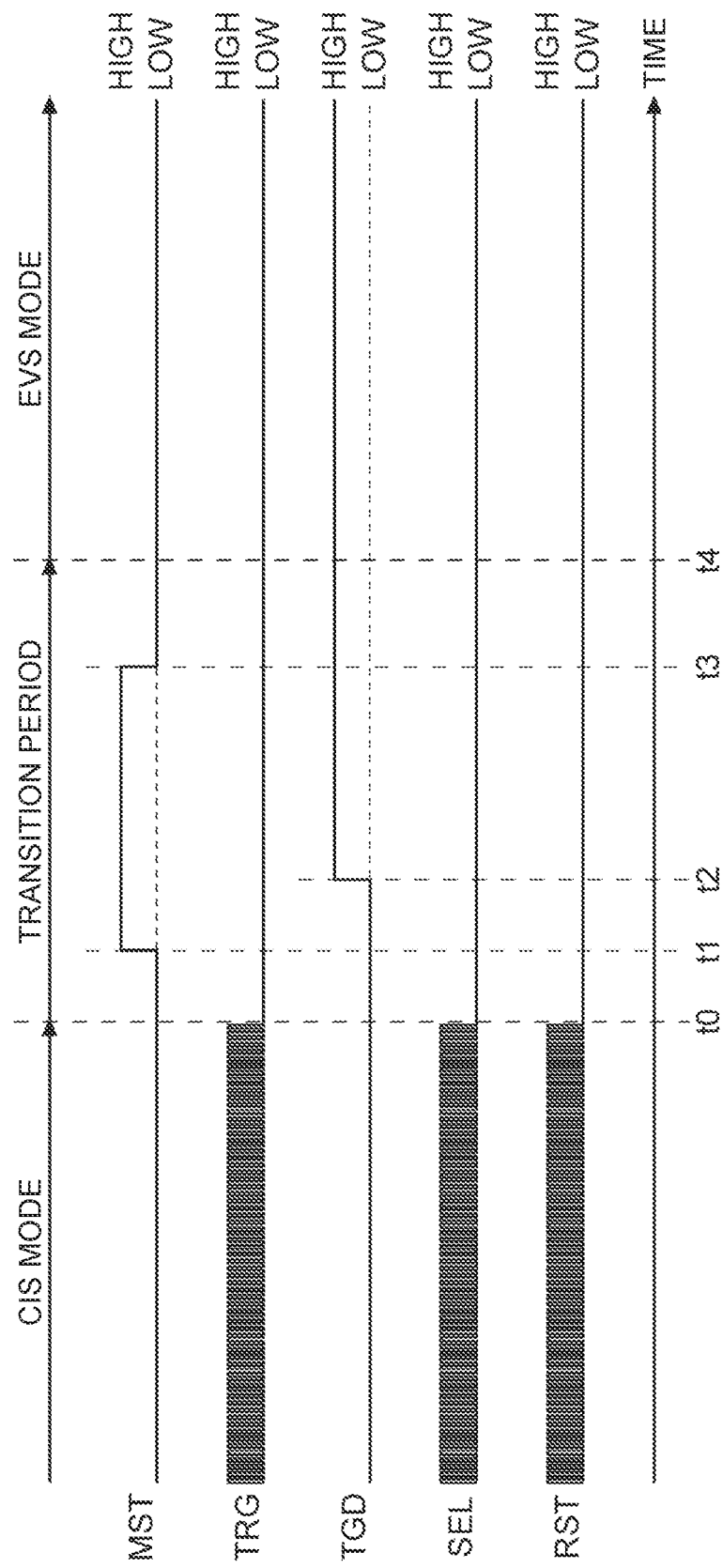
FIG. 30 is a timing chart illustrating an operation example at the time of transition from the CIS mode to the EVS mode according to the first embodiment.

FIG. 30 is a timing chart illustrating an operation example at the time of transition from the CIS mode to the EVS mode according to the present embodiment. As illustrated in FIG. 30, firstly in the transition from the CIS mode to the EVS mode, the supply of the control signal (TRG, SEL, and RST) from the row drive circuit 251 to the transfer transistor 372, the selection transistor 376, and the reset transistor 373, which constitute the pixel circuit 370, is stopped at the end timing t0 of the CIS mode.

Next, in a transition period (t0 to t4) from the CIS mode to the EVS mode, the row drive circuit 251 sets the control signal MST to the high level at timing t1 to turn on the control transistor 318. This allows the SN potential of the sense node SN to be fixed to the fixed potential VX. Subsequently, the row drive circuit 251 sets a switching signal TGD to the high level at timing t2 to turn on the switching transistor 317. At this time, since the SN potential of the sense node SN is fixed to the fixed potential VX, it is possible to avoid the voltage level of the voltage signal VPR from being stuck to the ground potential (GND).

Thereafter, the row drive circuit 251 turns off the control transistor 318 at timing t3. The row drive circuit 251 then executes the EVS mode from timing t4 onward.

1.14 Operation Flow

Figure 31:
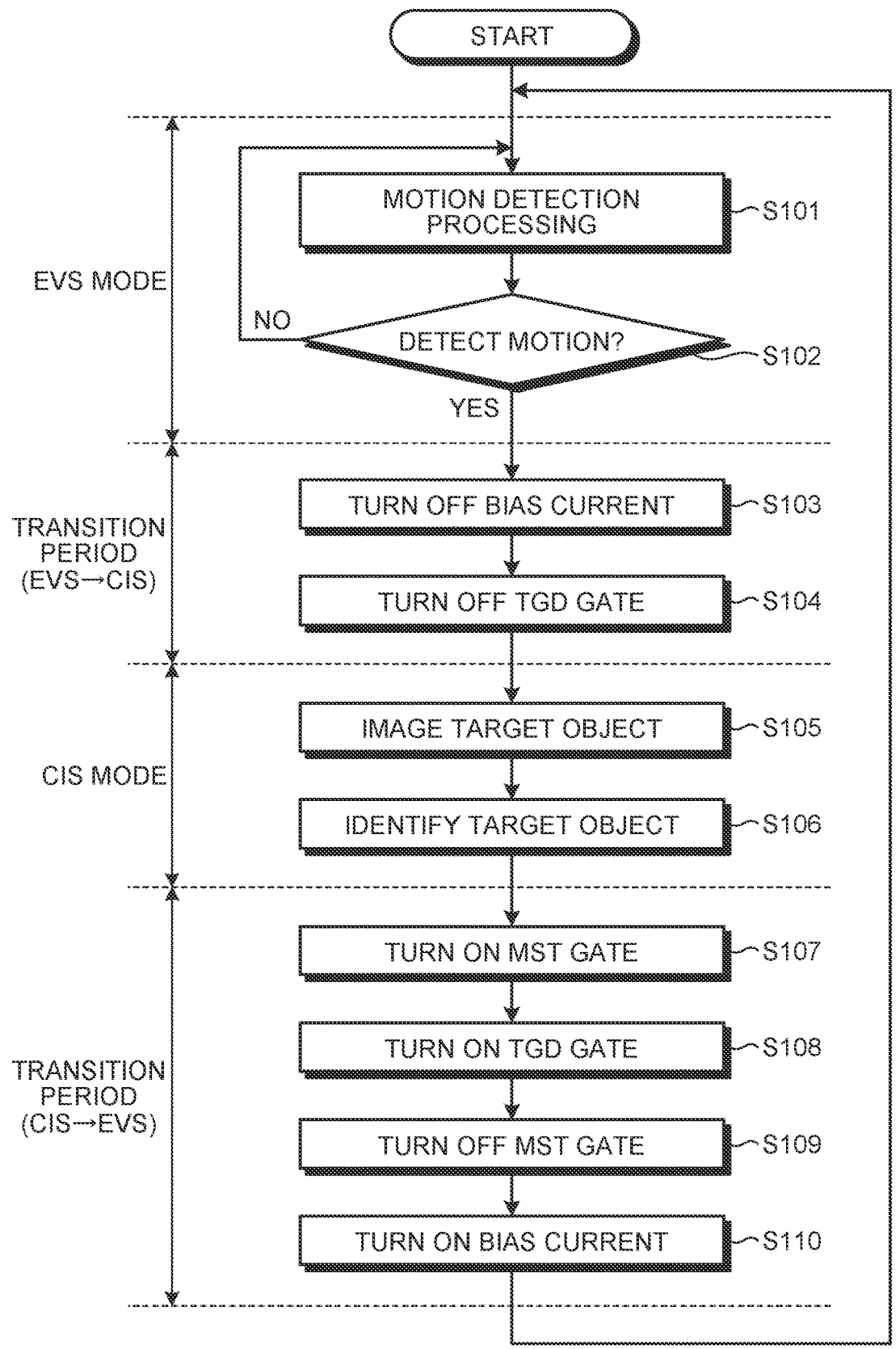
FIG. 31 is a flowchart illustrating an operation example of the imaging device according to the first embodiment.

Next, an operation example of the imaging device 100 according to the present embodiment will be described. FIG. 31 is a flowchart illustrating an operation example of the imaging device according to the present embodiment. The following description is an exemplary case where the response circuit 301A is incorporated in a shared block 221X. However, the configuration is not limited thereto, and the response circuit 301A may be replaced with the response circuits 301B to 301I, etc. according to the modifications. Furthermore, the operation illustrated in FIG. 31 may be terminated by an interruption operation such as shutdown, for example.

As illustrated in FIG. 31, in the present operation, when the imaging device 100 is activated, the EVS mode is first executed in the solid-state imaging device 200, for example. As described above, the EVS mode detects an on-event or an off-event based on the change amount of the photocurrent flowing out of the photoelectric conversion element 311, thereby detecting the motion of the object entering the angle of view of the imaging device 100 (step S101). Note that this motion detection may be executed by, for example, the signal processing circuit 240 or the like in the solid-state imaging device 200, or may be executed by the control section 130 connected to the solid-state imaging device 200, a server (including a cloud server or the like) connected to the imaging device 100 through a predetermined network, or the like.

Next, it is determined whether the motion of the object has been detected in step S101 (step S102). When the motion of the object has not been detected (NO in step S102), the imaging device 100 continues the EVS mode.

In contrast, when the motion of the object has been detected (YES in step S102), the transition from the EVS mode to the CIS mode is executed. In this transition period, the row drive circuit 251 first turns off the pMOS transistor 314 in the response circuit 301 to turn off a bias current BIAS flowing through the nMOS transistors 313 and 316 of the logarithmic response section 310A (step S103). Subsequently, the row drive circuit 251 turns off the switching transistor (also referred to as a TGD gate) 317 (step S104). This stops the supply of the photocurrent to the logarithmic response section 310A, and the mode transitions to the CIS mode.

In the CIS mode, the row drive circuit 251 drives the pixel circuits 370 to generate frame data of a captured image of an object (step S105). Subsequently, recognition processing is performed on the generated frame data to identify the captured object (step S106). Note that the object recognition processing may be executed not for one frame but for a plurality of frames. Note that the object recognition processing may be executed by, for example, the signal processing circuit 240 or the like in the solid-state imaging device 200, or may be executed by the control section 130 connected to the solid-state imaging device 200, a server (including a cloud server or the like) connected to the imaging device 100 via a predetermined network, or the like.

When the identification of the object is completed in this manner, the solid-state imaging device 200 executes the transition from the CIS mode to the EVS mode. During this transition period, the row drive circuit 251 first turns on the control transistor (also referred to as the MST gate) 318 (step S107). This allows the SN potential of the sense node SN of the logarithmic response section 310A to be controlled to the fixed potential VX. Subsequently, the row drive circuit 251 turns on the switching transistor 317 (step S108), turns off the control transistor 318 (step S109), and thereafter turns on the pMOS transistor 314 in the response circuit 301 so as to allow the bias current BIAS to flow in the nMOS transistors 313 and 316 of the logarithmic response section 310A (step S110). This starts the supply of the photocurrent to the logarithmic response section 310A, and the mode transitions to the EVS mode.

1.15 Circuit Sharing

The above description is an example of the configuration in which each of a plurality of response circuits 301X (the response circuit 301X may be any of the response circuits 301A to 301I described above and response circuits 301J to 301N described below) belonging to one shared block 221 includes one logarithmic response section 310/310A and one pixel circuit 370. However, some of the circuits constituting the response circuit 301X may be shared with other response circuits 301X. Hereinafter, a circuit configuration example of a shared block in which a part of the circuit configuration is shared among the plurality of response circuits 301X will be described with some examples.

1.15.1 First Sharing Example

Figure 32:
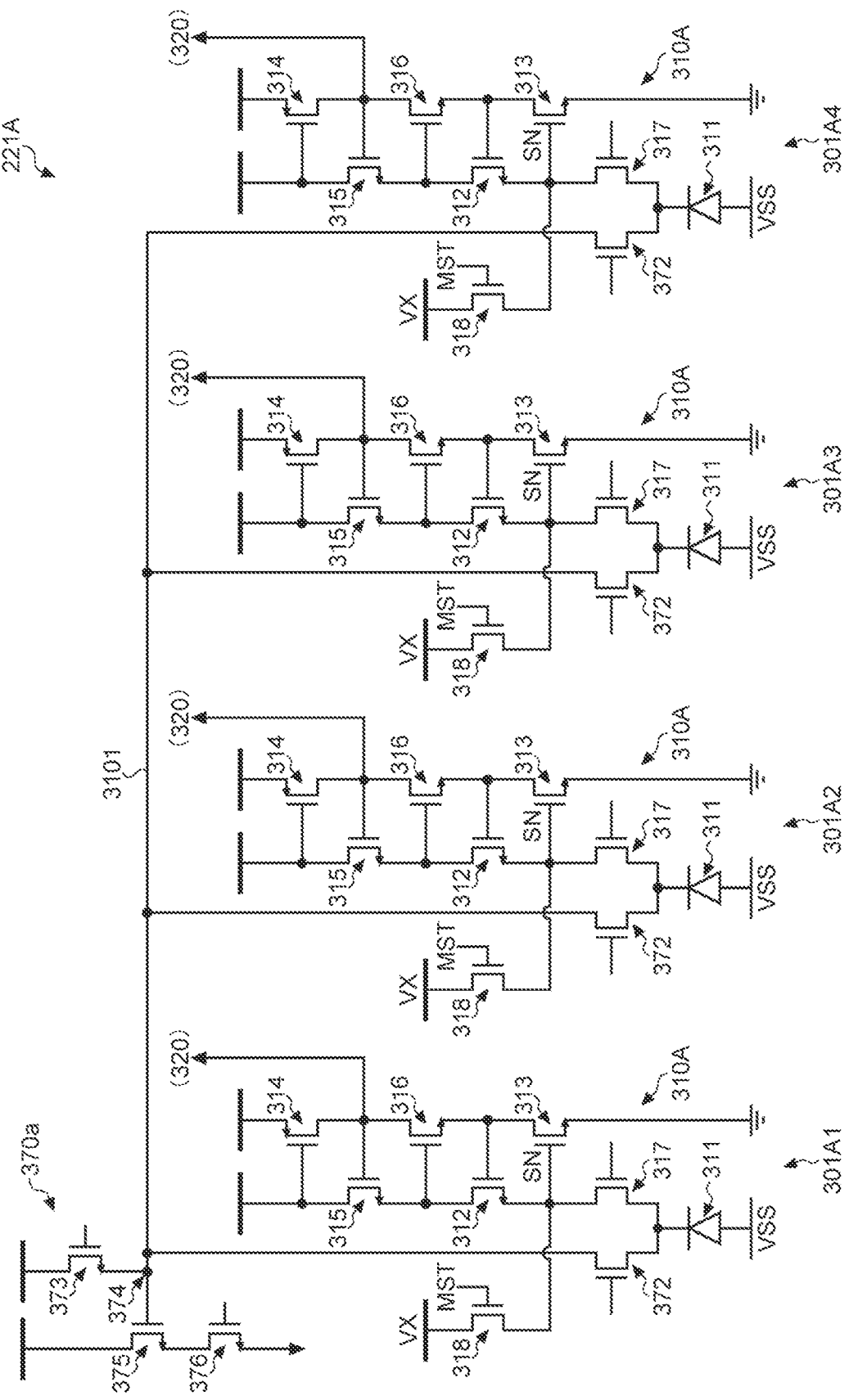
FIG. 32 is a circuit diagram illustrating a circuit configuration example of a shared block according to a first sharing example of the first embodiment.

FIG. 32 is a circuit diagram illustrating a circuit configuration example of a shared block according to a first sharing example. Note that the first sharing example illustrates a case where a part of the pixel circuit 370 (specifically, a circuit configuration excluding the photoelectric conversion element 311 and the transfer transistor 372) is shared in the shared block 221 including the four response circuits 301A illustrated in FIG. 21. In the following description, a circuit configuration excluding the photoelectric conversion element 311 and the transfer transistor 372 in the pixel circuit 370, that is, a circuit configuration including the reset transistor 373, the floating diffusion region 374, the amplification transistor 375, and the selection transistor 376, is referred to as a readout circuit 370a.

As illustrated in FIG. 32, in a shared block 221A according to the first sharing example, the drain of the transfer transistor 372 in each of response circuits 301A1 to 301A4 is connected to a common line 3101. The common line 3101 is connected with the readout circuit 370a. The readout circuit 370a is shared by the plurality of response circuits 301A1 to 301A4 through the common line 3101. That is, each of the four pixel circuits 370 in each shared block 221A includes the photoelectric conversion element 311 and the transfer transistor 372 of each response circuit 301A1 to 301A4, and the shared readout circuit 370a.

1.15.2 Second Sharing Example

Figure 33:
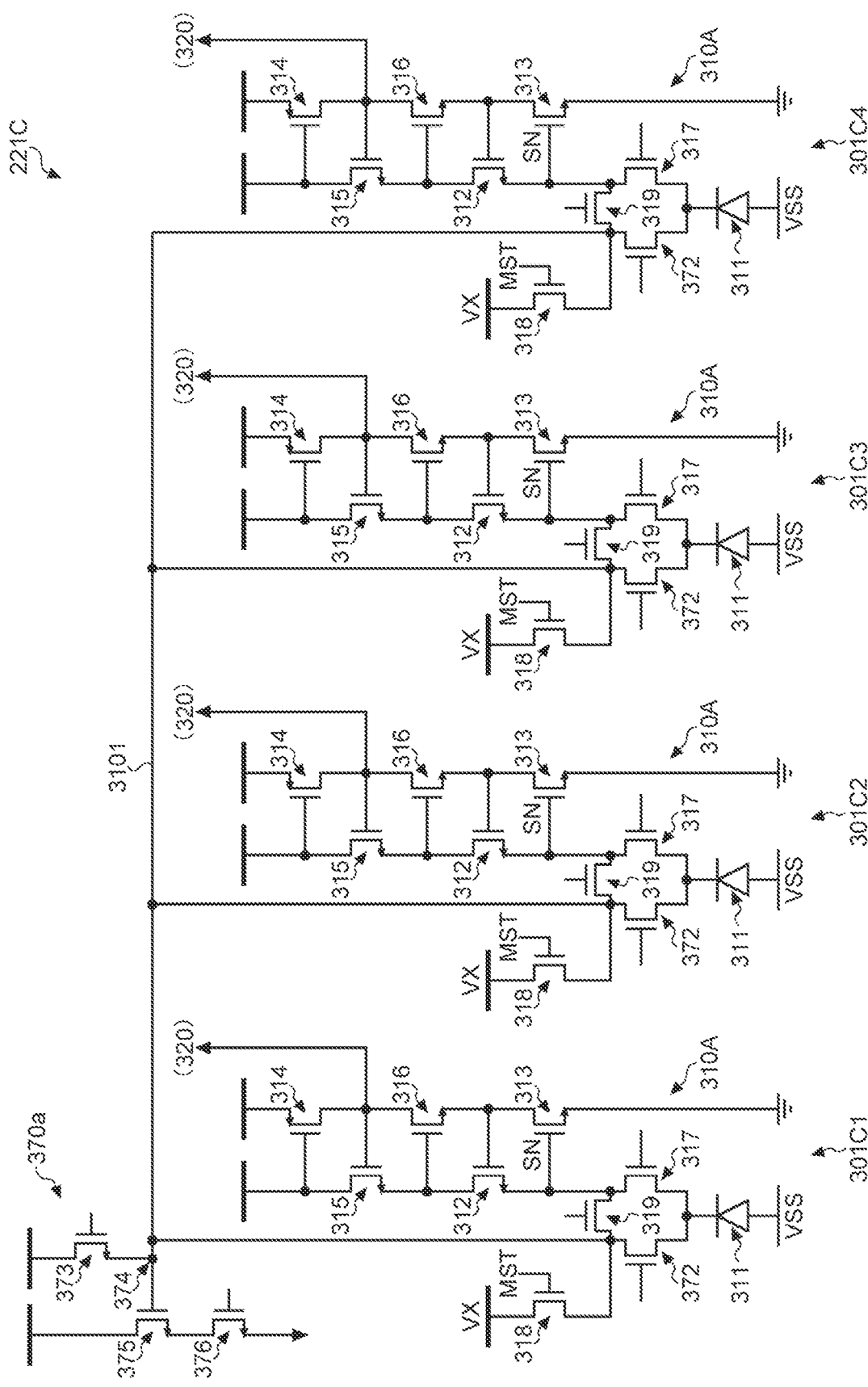
FIG. 33 is a circuit diagram illustrating a circuit configuration example of a shared block according to a second sharing example of the first embodiment.

FIG. 33 is a circuit diagram illustrating a circuit configuration example of a shared block according to a second sharing example. The second sharing example is a case where the readout circuit 370a of the pixel circuit 370 is shared in the shared block 221 including the four response circuits 301C illustrated in FIG. 23.

As illustrated in FIG. 33, similarly to the shared block 221A according to the first sharing example, a shared block 221C according to the second sharing example has a configuration in which the drain of the transfer transistor 372 in each of response circuits 301C1 to 301C4 is connected to the common line 3101, and the readout circuit 370a is connected to the common line 3101. With this configuration, each of the four pixel circuits 370 in each shared block 221C includes the photoelectric conversion element 311 and the transfer transistor 372 of each response circuit 301C1 to 301C4, and the shared readout circuit 370a.

1.15.3 Third Sharing Example

Figure 34:
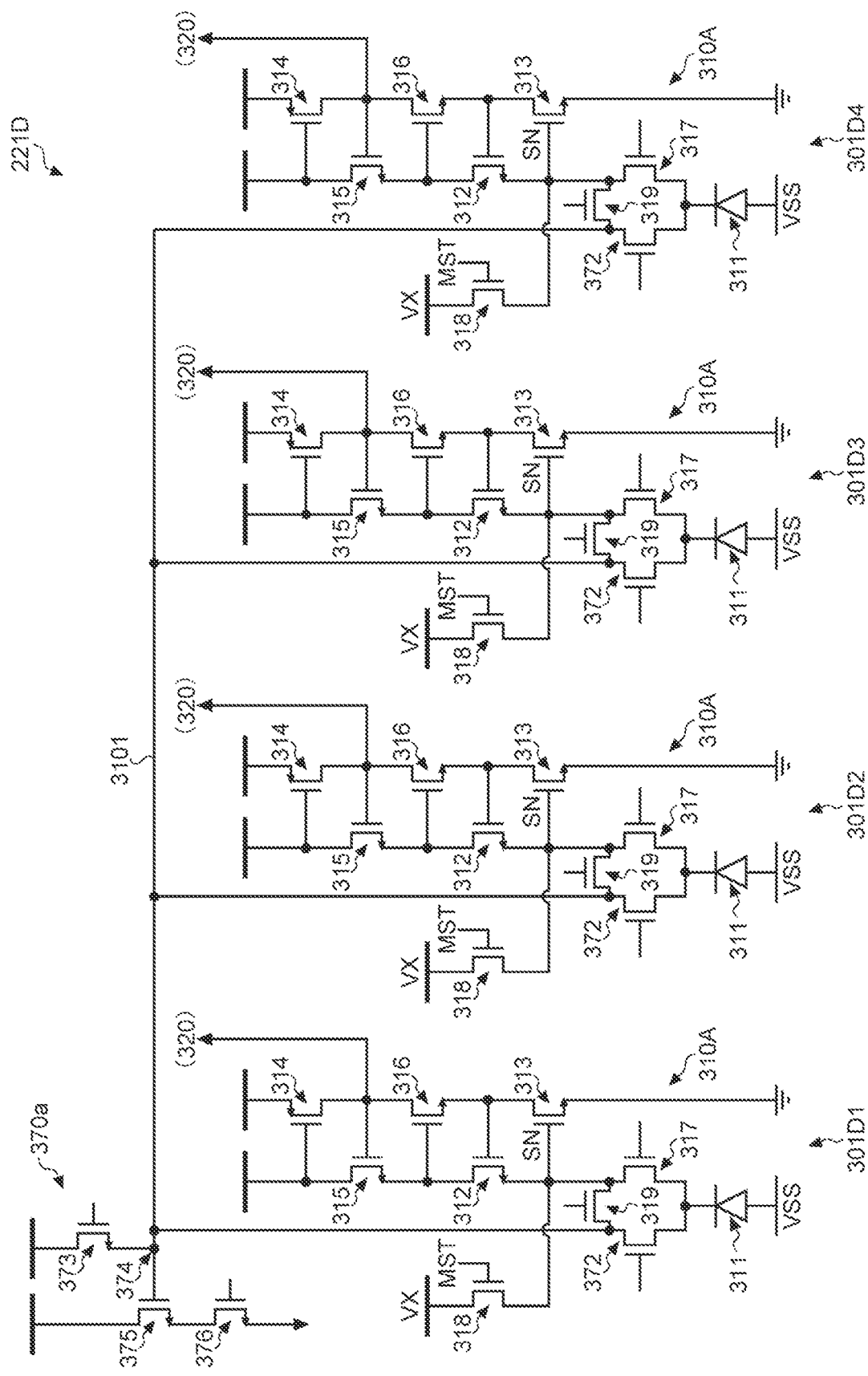
FIG. 34 is a circuit diagram illustrating a circuit configuration example of a shared block according to a third sharing example of the first embodiment.

FIG. 34 is a circuit diagram illustrating a circuit configuration example of a shared block according to a third sharing example. The third sharing example is a case where the readout circuit 370a of the pixel circuit 370 is shared in the shared block 221 including the four response circuits 301D illustrated in FIG. 24.

As illustrated in FIG. 34, similarly to the shared block 221A according to the first sharing example, a shared block 221D according to the third sharing example has a configuration in which the drain of the transfer transistor 372 in each of response circuits 301D1 to 301D4 is connected to the common line 3101, and the readout circuit 370a is connected to the common line 3101. With this configuration, each of the four pixel circuits 370 in each shared block 221D includes the photoelectric conversion element 311 and the transfer transistor 372 of each response circuit 301D1 to 301D4, and the shared readout circuit 370a.

1.15.4 Fourth Sharing Example

Figure 35:
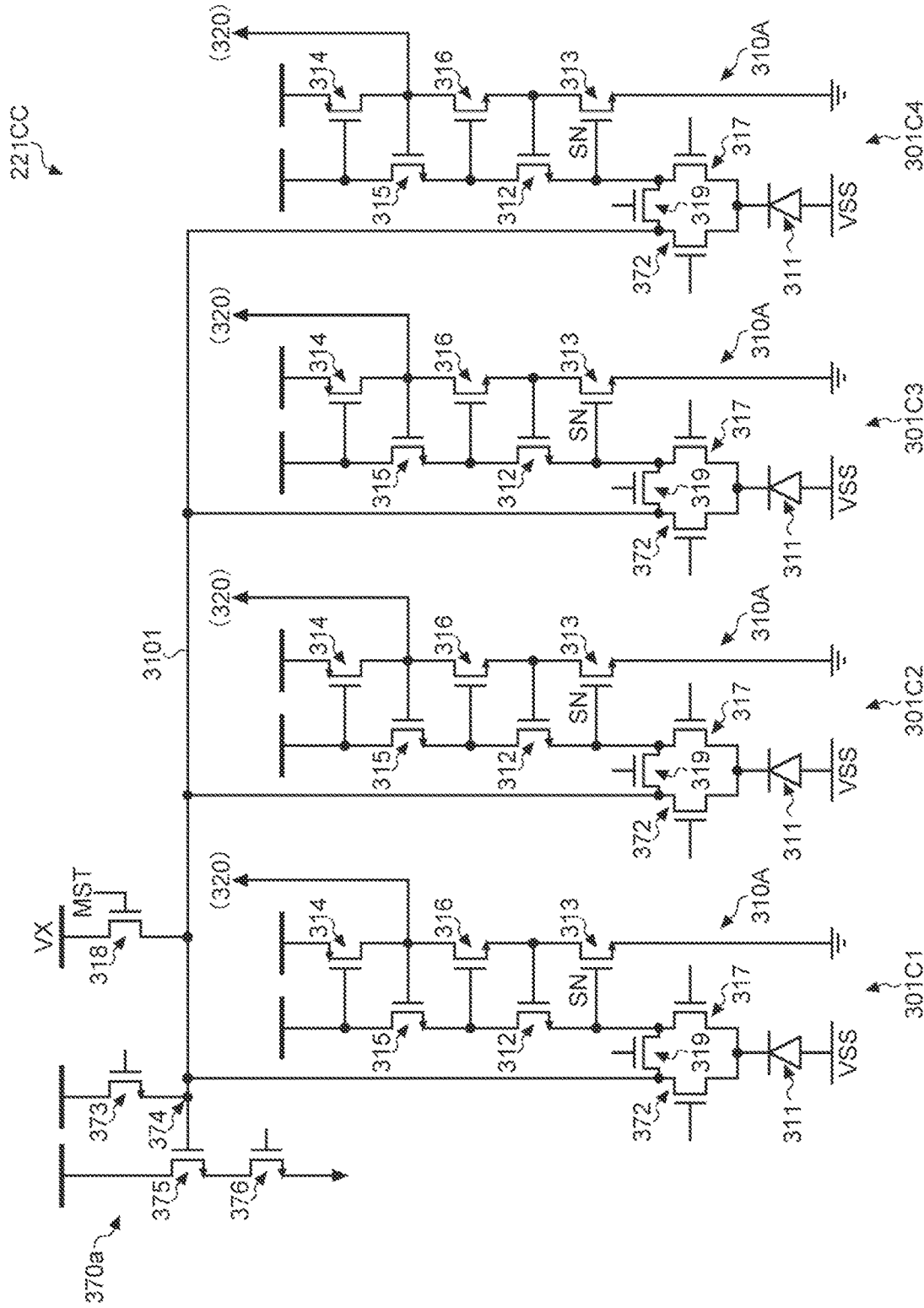
FIG. 35 is a circuit diagram illustrating a circuit configuration example of a shared block according to a fourth sharing example of the first embodiment.

FIG. 35 is a circuit diagram illustrating a circuit configuration example of a shared block according to a fourth sharing example. The fourth sharing example illustrates a case where the control transistor 318 is further shared in the second sharing example illustrated in FIG. 33.

As illustrated in FIG. 35, a shared block 221CC according to the fourth sharing example has a configuration similar to the shared block 221C according to the second sharing example, in which the control transistor 318 in each of the response circuits 301C1 to 301C4 is omitted, and instead, the source of one control transistor 318 is connected to the common line 3101. With this configuration, the control transistor 318 is shared by the logarithmic response section 310A of each of response circuits 301B1 to 301B4.

As described above, by sharing a part of the circuits by the plurality of response circuits 301X, it is possible to reduce the occupied area in the light receiving chip 201 and/or the detection chip 202, making it possible to obtain effects such as downsizing of the solid-state imaging device 200 and improvement in sensitivity by area expansion of the photoelectric conversion element 311.

1.16 Binning Mode and all-Pixel Mode Using Circuit Sharing

The shared readout circuit 370a and/or control transistor 318 may be used in different periods in each response circuit 301X, or may be used in the same period.

For example, in a case where the readout circuit 370a is used in different periods in each response circuit 301X in the CIS mode, each shared block 221X (the shared block 221X may be any of the above-described shared blocks 221A to 221D or any of the shared blocks obtained by applying another response circuit 301X to the shared blocks 221A to 221D) is driven in an operation mode (hereinafter, it is referred to as an all-pixel mode) in which each shared block 221X has four pixel circuits 370.

On the other hand, in a case where the readout circuit 370a is used in each response circuit 301X in the same period in the CIS mode, each shared block 221X is driven in an operation mode (hereinafter, referred to as a binning mode) in which each shared block 221X has one pixel circuit 370. The binning mode makes it possible for the charge generated in the plurality of photoelectric conversion elements 311 to be collected in one floating diffusion region 374, leading to expansion of a dynamic range at readout of gradation data (pixel signal), making it possible to improve image quality at low illuminance.

Furthermore, the all-pixel mode and the binning mode can be applied not only in the CIS mode but also in the EVS mode.

For example, in the first sharing example and the fourth sharing example in the sharing example described above, by using the configuration, in the EVS mode, in which the transfer transistor 372 and the switching transistor 317 in the response circuit 301A1/301B1 is turned on, the transfer transistors 372 in the other response circuits 301A2/301B1 to 301A4/301B4 are turned on, and the switching transistor 317 is turned off, it is possible to allow the photocurrent flowing out of the photoelectric conversion element 311 of each of the response circuits 301A1/301B1 to 301A4/301B4 to be aggregated in the logarithmic response section 310A of the response circuit 301A1/301B1 (binning mode).

Furthermore, in the second sharing example and the third sharing example in the sharing example described above, by using the configuration, in the EVS mode, in which the control transistor 319 and the switching transistor 317 in the response circuit 301C1/301D1 are turned on, the transfer transistors 372 in the other response circuits 301C2/301D2 to 301C4/301D4 are turned on, and the control transistor 319 and the switching transistor 317 are turned off, it is possible to allow the photocurrent flowing out of the photoelectric conversion element 311 of each of the response circuits 301C1/301D1 to 301C4/301D4 to be aggregated in the logarithmic response section 310A of the response circuit 301C1/301D1.

In this manner, by aggregating the photocurrents flowing out of each photoelectric conversion elements 311 in one logarithmic response section 310/310A, it is possible to increase the amount of photocurrents flowing at a time, leading to expansion of the dynamic range at detection of the address event. This makes it possible to improve sensitivity to an address event at low illuminance, for example.

Note that the all-pixel mode and the binning mode may be appropriately switched in execution in each of the CIS mode and the EVS mode. Even in this case, there is a possibility that the SN potential of the sense node SN swings at transition from the all-pixel mode to the binning mode or from the binning mode to the all-pixel mode. Therefore, similarly to the above-described transition from the CIS mode to the EVS mode, it is considered effective to shorten the settling time at the time of mode transition by fixing the SN potential to the fixed potential VX.

1.17 Layout of Shared Block

Furthermore, a layout in the light receiving section 220 of the shared block 221X according to the present embodiment will be described below with an example. For convenience of description, the following will describe a schematic layout example on an element formation surface side of the semiconductor substrate on which the photoelectric conversion element 311 is formed. Moreover, for the sake of clarity, the arrangement of each transistor is indicated by the position of the gate electrode.

1.17.1 First Layout Example

Figure 36:
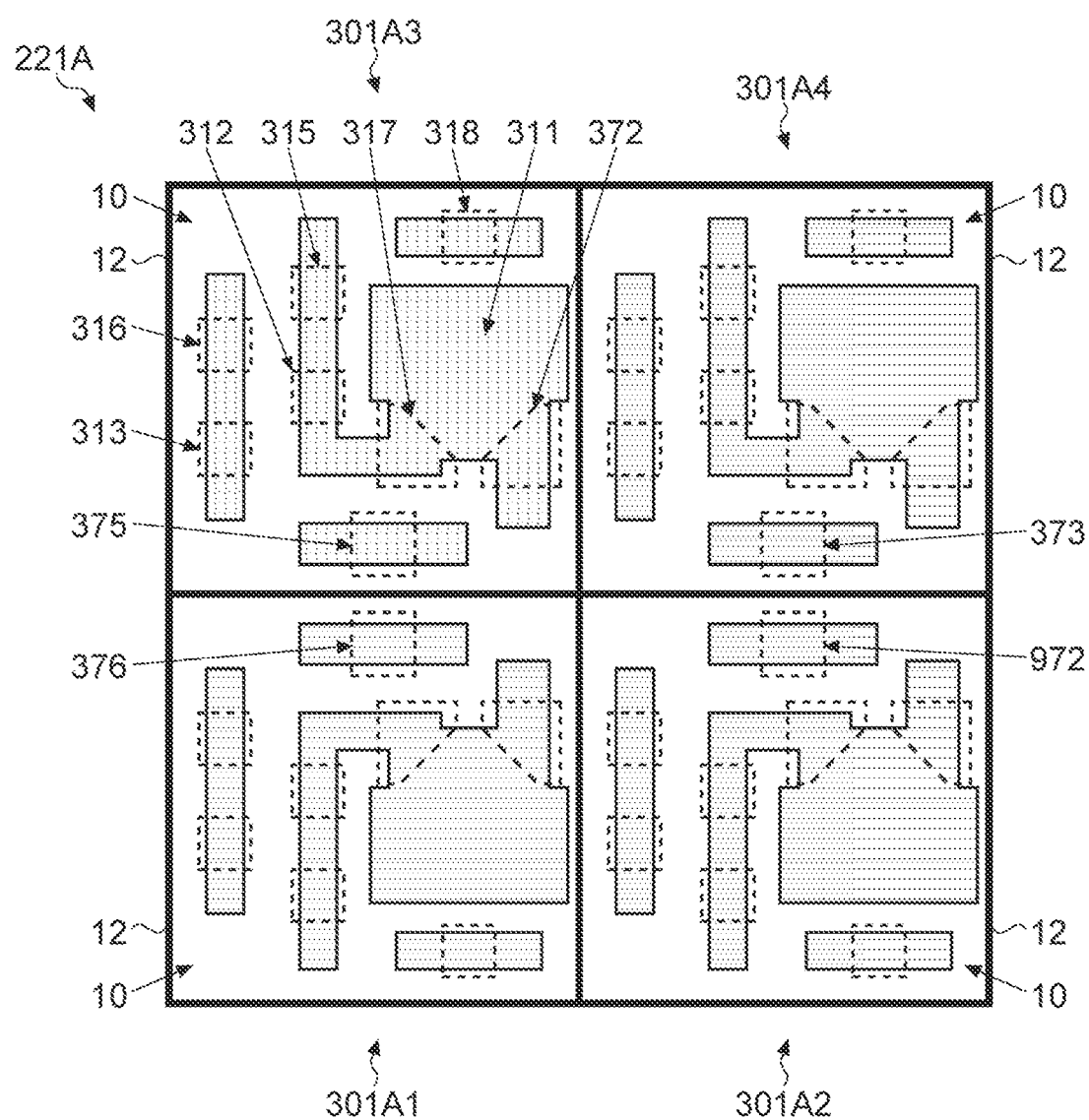
FIG. 36 is a plan view illustrating a layout example of a shared block according to a first layout example of the first embodiment.

As a first layout example, a layout example of the shared block 221A according to the first sharing example will be described. FIG. 36 is a plan view illustrating a layout example of the shared block according to the first layout example. As illustrated in FIG. 36, on the light receiving chip 201, a pixel area 10 in which one response circuit 301A is disposed is partitioned by a pixel isolation portion 12 extending in the row direction and the column direction. Each of the response circuits 301A1 to 301A4 includes the photoelectric conversion element 311, and transistors arranged along the outer peripheral portions of the pixel area, in other words, arranged so as to surround the photoelectric conversion element 311 from at least two directions (three directions in FIG. 36), which are the plurality of nMOS transistors 312, 313, 315, and 316, the switching transistor 317, and the control transistor 318. Furthermore, in each of the four pixel areas 10, any one of the three transistors (373, 375, or 376) constituting the readout circuit 370a, or a dummy transistor 972, is also disposed. Incidentally, the dummy transistor 972 is a transistor not included in the response circuit 301A, and may be an electrically floating transistor, for example.

In the layout example illustrated in FIG. 36, the four nMOS transistors 312, 313, 315, and 316 in each logarithmic response section 310A are arranged on one side of the photoelectric conversion element 311. In this manner, by collectively arranging the nMOS transistors 312, 313, 315, and 316 constituting the logarithmic response section 310A on one side of the photoelectric conversion element 311, it is possible to decrease the time constant formed by the wiring constituting the logarithmic conversion circuit, leading to improvement of the response speed of the logarithmic conversion circuit.

1.17.2 Second Layout Example

Figure 37:
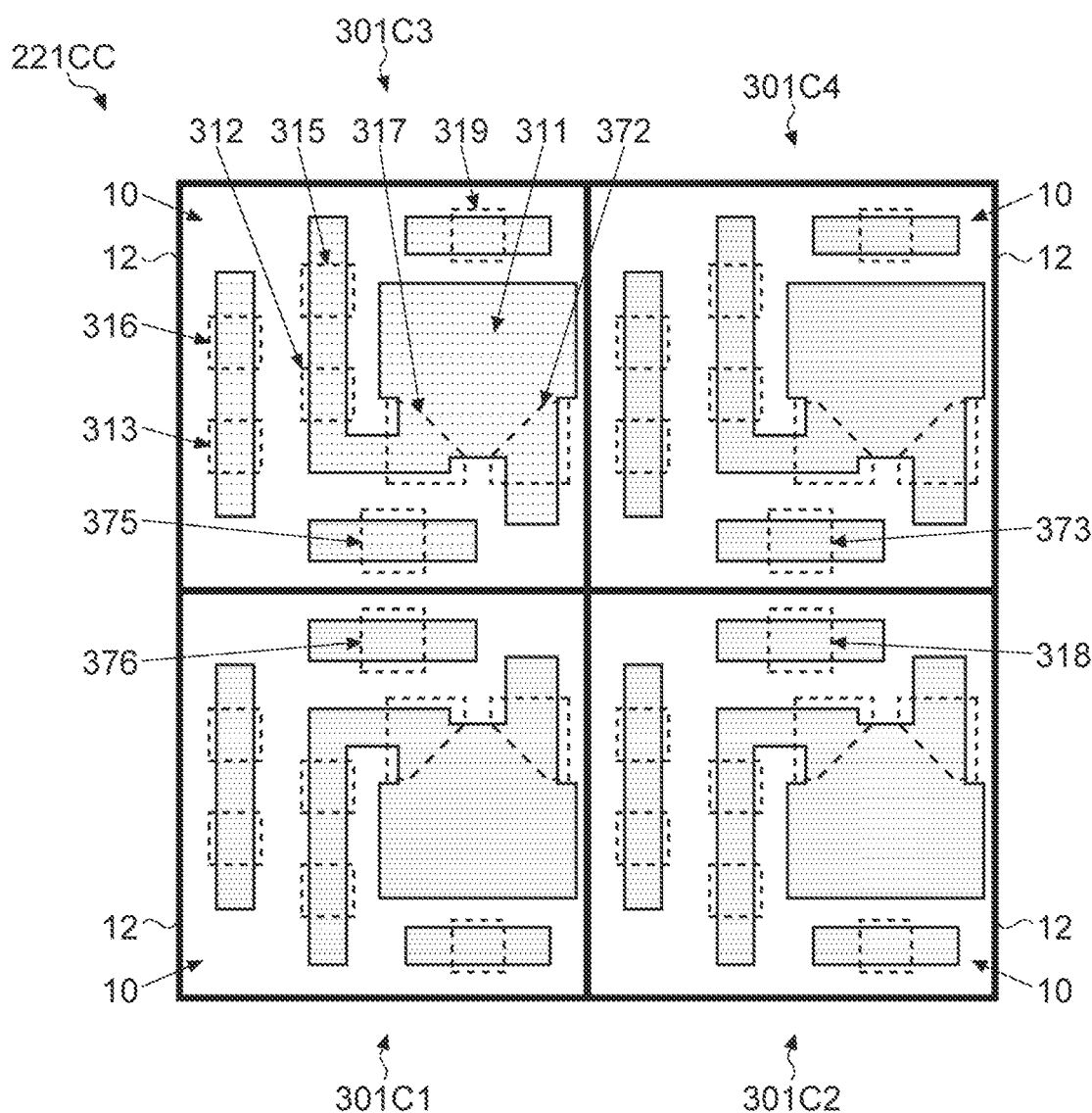
FIG. 37 is a plan view illustrating a layout example of a shared block according to a second layout example of the first embodiment.

As a second layout example, a layout example of a shared block 221CC according to the fourth sharing example will be described. FIG. 37 is a plan view illustrating a layout example of the shared block according to the second layout example. As illustrated in FIG. 37, the second layout example has a configuration similar to the first layout example, in which the control transistor 319 is disposed in a region where the control transistor 318 is disposed in the first layout example, and the common control transistor 318 is disposed in a region where the dummy transistor 972 is disposed.

1.18 Action and Effects

As described above, according to the present embodiment, at the time of mode transition from the CIS mode to the EVS mode, the SN potential is fixed to the voltage VX, which is lower than the SN potential at normal operation. With this configuration, even when the switching transistor 317 transitions to an on state, it is possible to suppress an unintended increase in the SN potential, making it possible to avoid the nMOS transistors 312 and 315 from being turned off. As a result, it is possible to suppress a dead period caused by the voltage level of the voltage signal VPR stuck to the ground potential (GND).

2. Second Embodiment

In the first embodiment described above, at the time of mode transition from the CIS mode to the EVS mode, the SN potential is fixed to the voltage VX, which is lower than the SN potential at normal operation, making it possible to suppress an unintended increase in the SN potential to suppress the dead period. In contrast, in the second embodiment, the cathode potential of the photoelectric conversion element 311 is once lowered to a potential lower than the SN potential at normal operation, and then the photoelectric conversion element 311 is electrically floated, and thereafter the switching transistor 317 is turned on. In this manner, by lowering the cathode potential of the photoelectric conversion element 311 to a potential lower than the SN potential at normal operation and then connecting the cathode of the photoelectric conversion element 311 and the sense node SN to each other, it is possible to suppress an unintended increase in the SN potential, similarly to the first embodiment. This makes it possible to suppress a dead period due to the voltage level of the voltage signal VPR stuck to the ground potential (GND). Hereinafter, control of the response circuit 301X at the time of transition from the CIS mode to the EVS mode will be described with some examples.

Since the configurations of the imaging device, the solid-state imaging device, and each section constituting the solid-state imaging device according to the present embodiment may be similar to the configurations of the first embodiment, the present embodiment will be described with reference.

2.1 First Control Example

Figure 38:
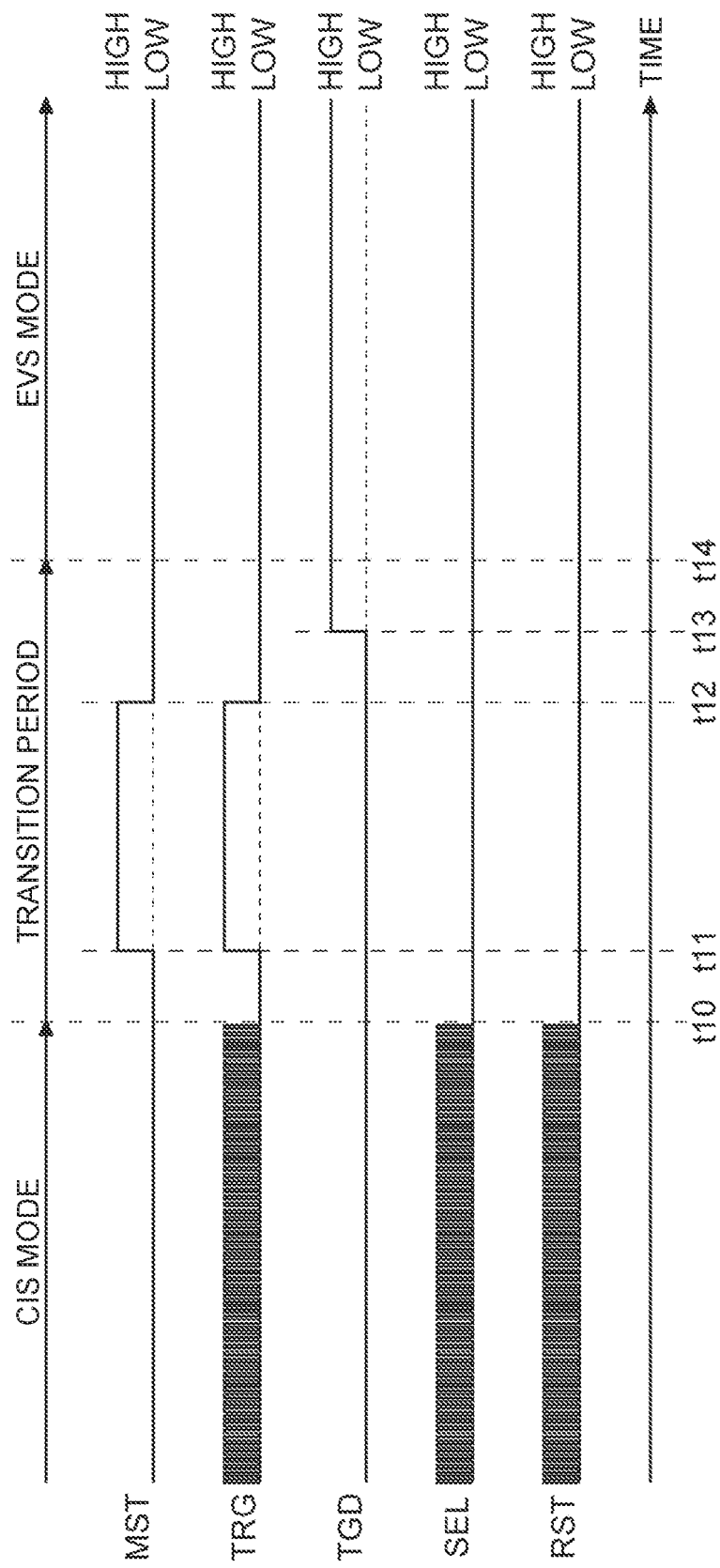
FIG. 38 is a timing chart illustrating an operation example at the time of transition from the CIS mode to the EVS mode according to the first control example of the second embodiment.

A first control example is an exemplary case where the present embodiment is applied to the response circuit 301B according to the first modification described with reference to FIG. 22 in the first embodiment. FIG. 38 is a timing chart illustrating an operation example at the time of transition from the CIS mode to the EVS mode according to the first control example. As illustrated in FIG. 38, in the configuration illustrated in FIG. 22, in the transition period (t10 to t14) at the time of transition from the CIS mode to the EVS mode, the row drive circuit 251 turns on the control transistor 318 and the transfer transistor 372 at timing t1. This allows the fixed potential VX to be applied to the cathode of the photoelectric conversion element 311 through the control transistor 318 and the transfer transistor 372, making it possible to control the cathode potential of the photoelectric conversion element 311 to be set to the fixed potential VX.

Thereafter, the row drive circuit 251 turns off the control transistor 318 and the transfer transistor 372 to electrically float the photoelectric conversion element 311 at timing t12, and then turns on the switching transistor 317 at timing t13. In that case, since the cathode potential of the photoelectric conversion element 311 is suppressed to the fixed potential VX which is lower than the SN potential at normal operation, it is possible to suppress an unintended increase in the SN potential even when the switching transistor 317 transitions to the on state.

2.2 Second Control Example

Figure 39:
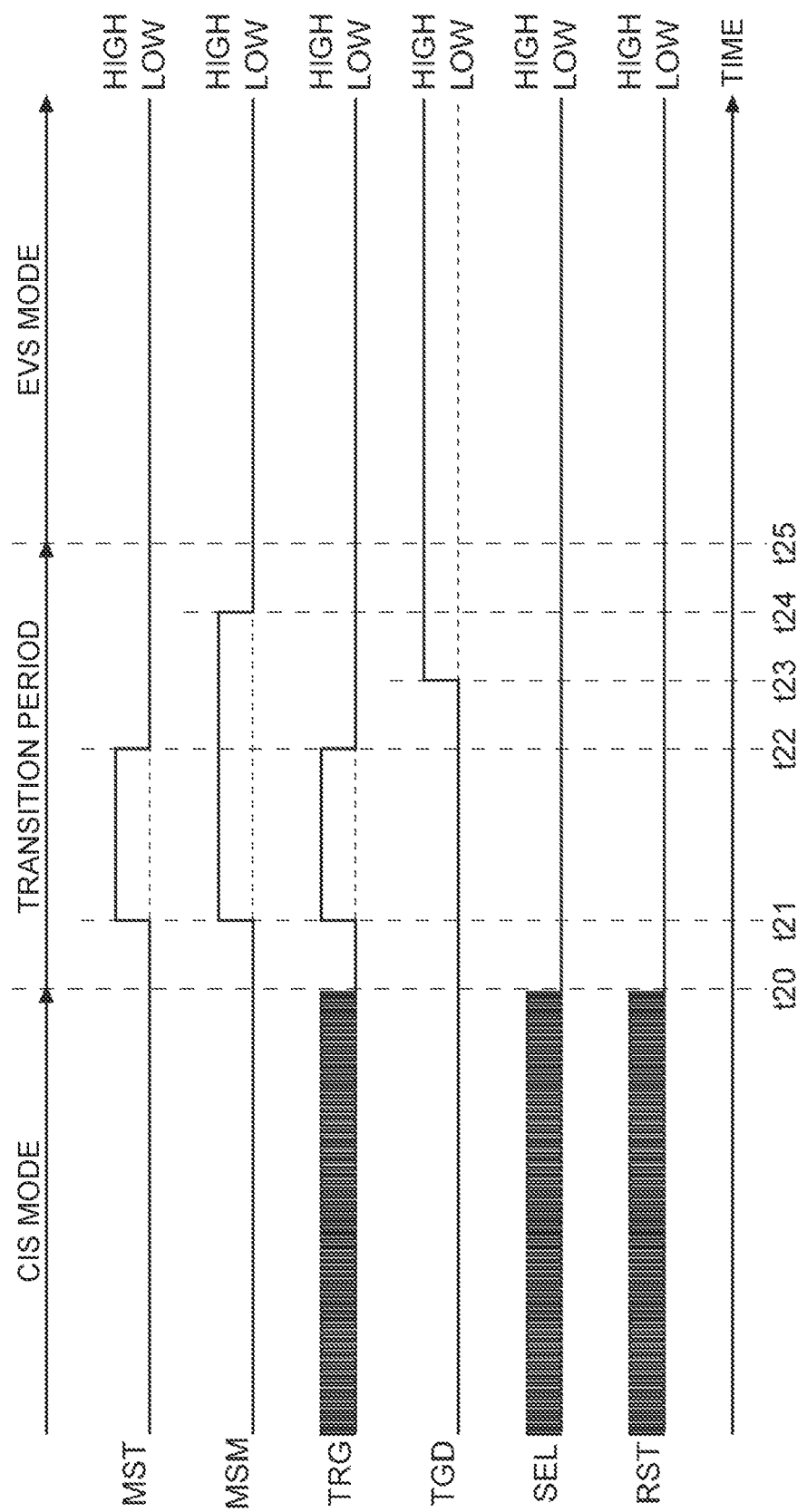
FIG. 39 is a timing chart illustrating an operation example at the time of transition from a CIS mode to an EVS mode according to a second control example of the second embodiment.

A second control example is an exemplary case where the present embodiment is applied to the response circuit 301C according to the second modification described with reference to FIG. 23 in the first embodiment. FIG. 39 is a timing chart illustrating an operation example at the time of transition from the CIS mode to the EVS mode according to the second control example. As illustrated in FIG. 39, in a configuration illustrated in FIG. 23, in the transition period (t20 to t25) at the time of transition from the CIS mode to the EVS mode, the row drive circuit 251 turns on the control transistor 318 and the transfer transistor 372 at timing t21 similarly to the first control example. This allows the fixed potential VX to be applied to the cathode of the photoelectric conversion element 311 through the control transistor 318 and the transfer transistor 372, making it possible to control the cathode potential of the photoelectric conversion element 311 to be set to the fixed potential VX.

Thereafter, similarly to the first control example, the row drive circuit 251 turns off the control transistor 318 and the transfer transistor 372 to electrically float the photoelectric conversion element 311 at timing t22, and then turns on the switching transistor 317 at timing t23. In that case, since the cathode potential of the photoelectric conversion element 311 is suppressed to the fixed potential VX which is lower than the SN potential at normal operation, it is possible to suppress an unintended increase in the SN potential even when the switching transistor 317 transitions to the on state.

Note that, as illustrated in FIG. 39, the row drive circuit 251 may turn on the control transistor 318 and the transfer transistor 372 at timing t21, and at the same time, may also turn on the control transistor 319 during the period of timing t21 to t24. This also controls the SN potential of the sense node SN to be set to the fixed potential VX, making it possible to further suppress an unintended increase in the SN potential.

2.3 Third Control Example

Figure 40:
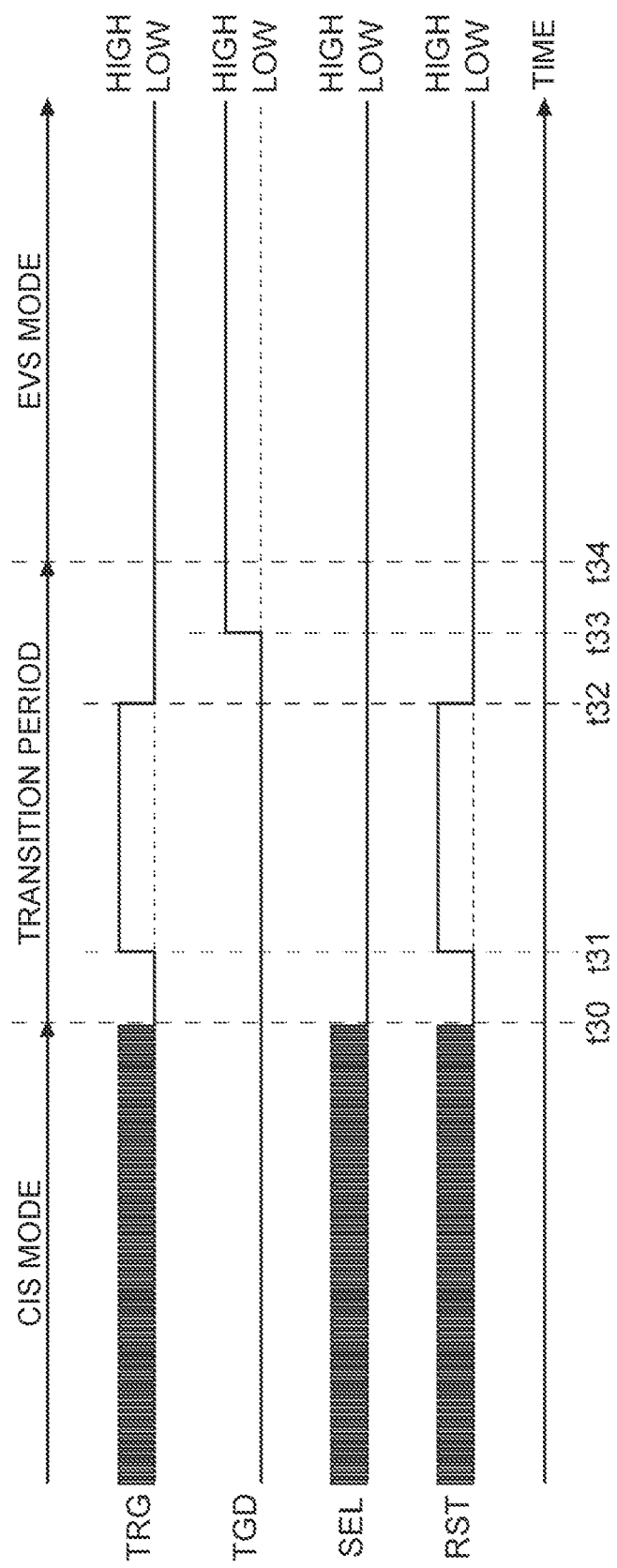
FIG. 40 is a timing chart illustrating an operation example at the time of transition from a CIS mode to an EVS mode according to a third control example of the second embodiment.

A third control example is an exemplary case where the present embodiment is applied to the response circuit 301E according to the fourth modification described with reference to FIG. 25 in the first embodiment. FIG. 40 is a timing chart illustrating an operation example at the time of transition from the CIS mode to the EVS mode according to the third control example. As illustrated in FIG. 40, in the configuration illustrated in FIG. 25, in the transition period (t30 to t34) at the time of transition from the CIS mode to the EVS mode, the row drive circuit 251 turns on the reset transistor 373 and the transfer transistor 372 at timing t31. This allows the fixed potential VX to be applied to the cathode of the photoelectric conversion element 311 through the reset transistor 373 and the transfer transistor 372, making it possible to control the cathode potential of the photoelectric conversion element 311 to be set to the fixed potential VX.

Thereafter, the row drive circuit 251 turns off the reset transistor 373 and the transfer transistor 372 to electrically float the photoelectric conversion element 311 at timing t32, and then turns on the switching transistor 317 at timing t33. In that case, since the cathode potential of the photoelectric conversion element 311 is suppressed to the fixed potential VX which is lower than the SN potential at normal operation, it is possible to suppress an unintended increase in the SN potential even when the switching transistor 317 transitions to the on state.

2.4 Fourth Control Example

Figure 41:
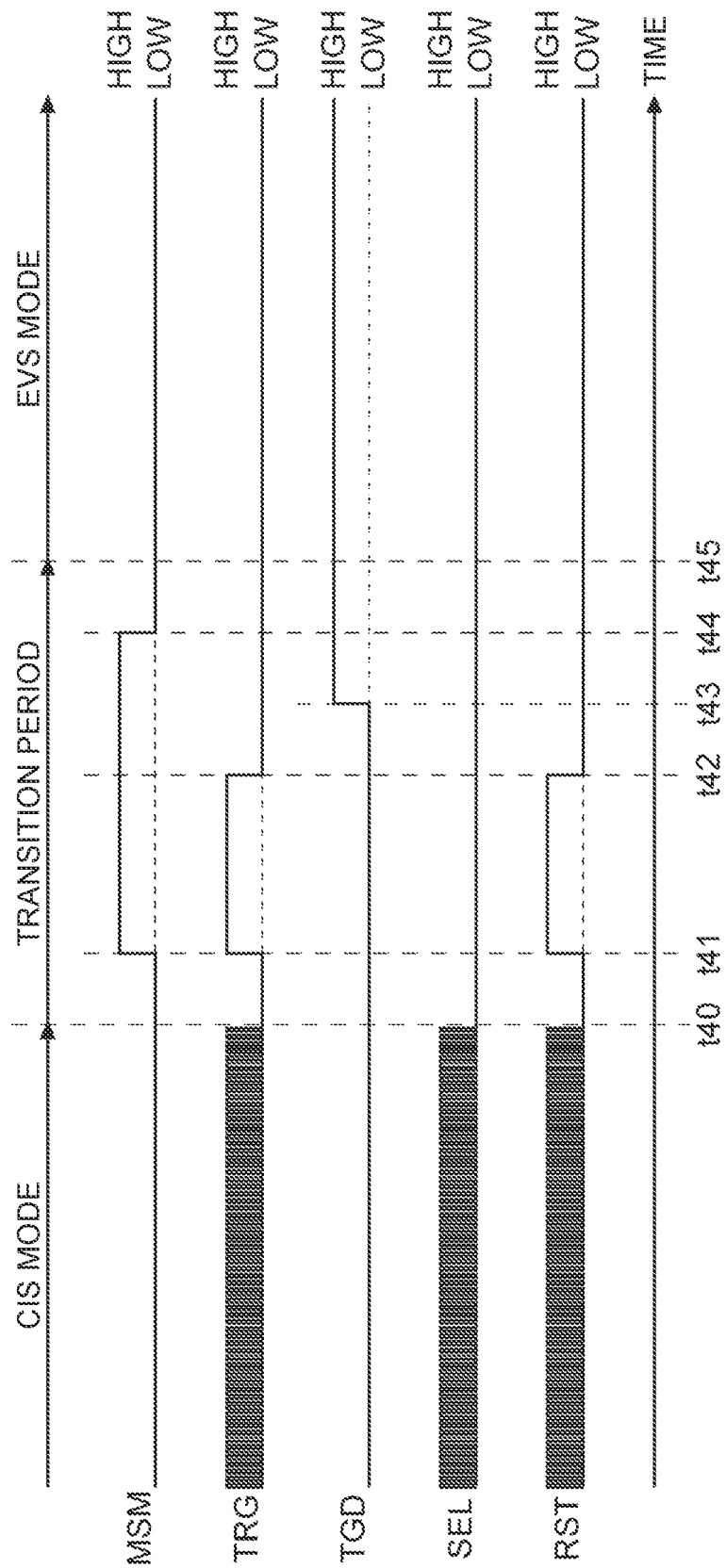
FIG. 41 is a timing chart illustrating an operation example at the time of transition from a CIS mode to an EVS mode according to a fourth control example of the second embodiment.

A fourth control example is an exemplary case where the present embodiment is applied to the response circuit 301F according to the fifth modification described with reference to FIG. 26 in the first embodiment. FIG. 41 is a timing chart illustrating an operation example at the time of transition from the CIS mode to the EVS mode according to the fourth control example. As illustrated in FIG. 41, in a configuration illustrated in FIG. 26, in the transition period (t40 to t45) at the time of transition from the CIS mode to the EVS mode, the row drive circuit 251 turns on the reset transistor 373 and the transfer transistor 372 at timing t41 similarly to the third control example. This allows the fixed potential VX to be applied to the cathode of the photoelectric conversion element 311 through the reset transistor 373 and the transfer transistor 372, making it possible to control the cathode potential of the photoelectric conversion element 311 to be set to the fixed potential VX.

Thereafter, similarly to the fourth control example, the row drive circuit 251 turns off the reset transistor 373 and the transfer transistor 372 to electrically float the photoelectric conversion element 311 at timing t42, and then turns on the switching transistor 317 at timing t23. In that case, since the cathode potential of the photoelectric conversion element 311 is suppressed to the fixed potential VX which is lower than the SN potential at normal operation, it is possible to suppress an unintended increase in the SN potential even when the switching transistor 317 transitions to the on state.

Note that, as illustrated in FIG. 41, the row drive circuit 251 may turn on the reset transistor 373 and the transfer transistor 372 at timing t41, and at the same time, may also turn on the control transistor 319 during the period of timing t41 to t44. This also controls the SN potential of the sense node SN to be set to the fixed potential VX, making it possible to further suppress an unintended increase in the SN potential.

2.5 Fifth Control Example

Figure 42:
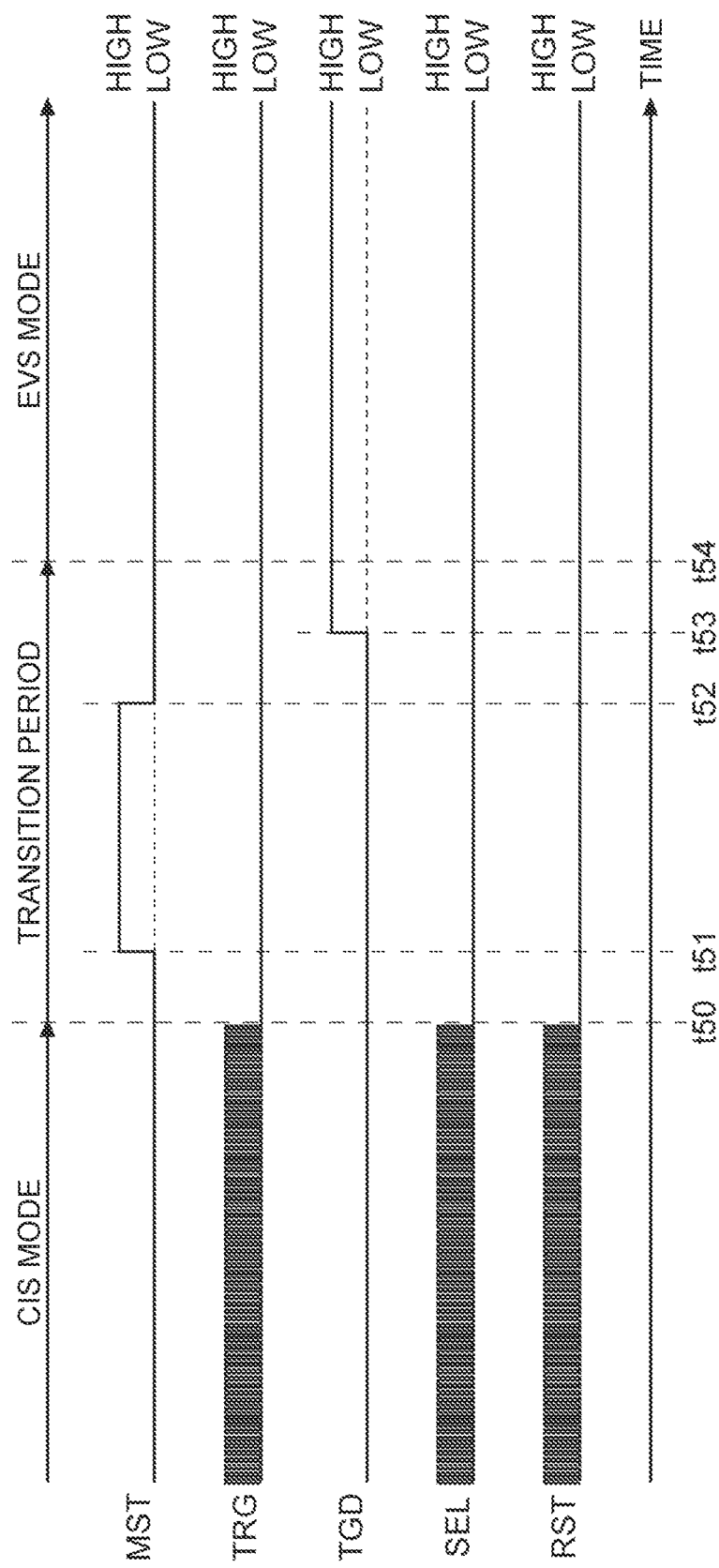
FIG. 42 is a timing chart illustrating an operation example at the time of transition from a CIS mode to an EVS mode according to a fifth control example of the second embodiment.

A fifth control example is an exemplary case where the present embodiment is applied to the response circuit 301G according to the sixth modification described with reference to FIG. 27 in the first embodiment. FIG. 42 is a timing chart illustrating an operation example at the time of transition from the CIS mode to the EVS mode according to the fifth control example. As illustrated in FIG. 42, in the configuration illustrated in FIG. 27, in the transition period (t50 to t54) at the time of transition from the CIS mode to the EVS mode, the row drive circuit 251 turns on the control transistor 318 at timing t51. This allows the fixed potential VX to be applied to the cathode of the photoelectric conversion element 311 through the control transistor 318, making it possible to control the cathode potential of the photoelectric conversion element 311 to be set to the fixed potential VX.

Thereafter, the row drive circuit 251 turns off the control transistor 318 to electrically float the photoelectric conversion element 311 at timing t52, and then turns on the switching transistor 317 at timing t53. In that case, since the cathode potential of the photoelectric conversion element 311 is suppressed to the fixed potential VX which is lower than the SN potential at normal operation, it is possible to suppress an unintended increase in the SN potential even when the switching transistor 317 transitions to the on state.

2.6 Sixth Control Example

Figure 43:
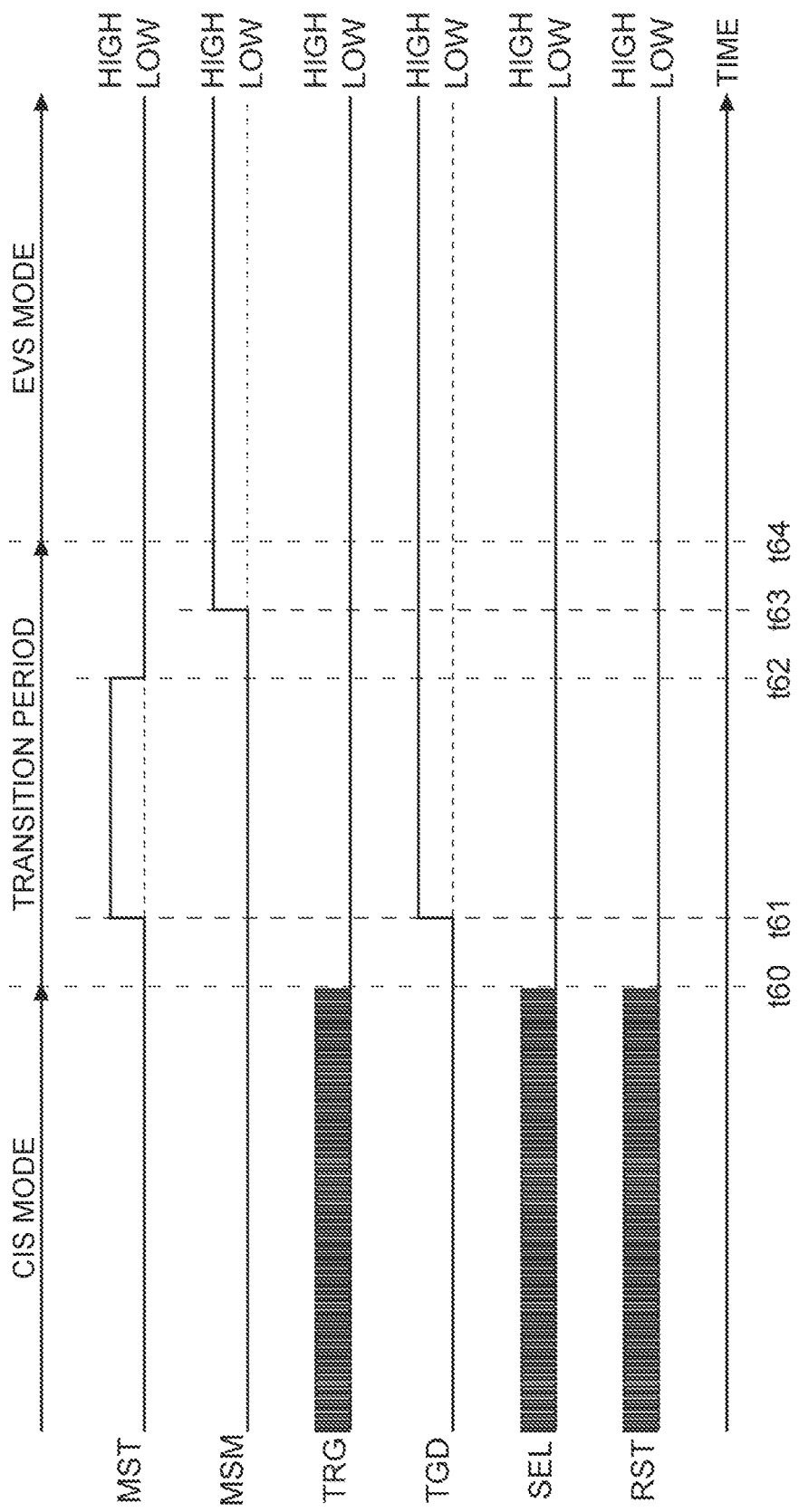
FIG. 43 is a timing chart illustrating an operation example at the time of transition from a CIS mode to an EVS mode according to a sixth control example of the second embodiment.

A sixth control example is an exemplary case where the present embodiment is applied to the response circuit 301H according to the seventh modification described with reference to FIG. 28 in the first embodiment. FIG. 43 is a timing chart illustrating an operation example at the time of transition from the CIS mode to the EVS mode according to the sixth control example. As illustrated in FIG. 43, in the configuration illustrated in FIG. 28, in the transition period (t60 to t64) at the time of transition from the CIS mode to the EVS mode, the row drive circuit 251 turns on the control transistor 318 and the switching transistor 317 at timing t61. This allows the fixed potential VX to be applied to the cathode of the photoelectric conversion element 311 through the control transistor 318 and the switching transistor 317, making it possible to control the cathode potential of the photoelectric conversion element 311 to be set to the fixed potential VX.

Thereafter, the row drive circuit 251 turns off the control transistor 318 to electrically float the photoelectric conversion element 311 and the switching transistor 317 at timing t62, and then turns on the control transistor 319 at timing t63. In that case, since the cathode potential of the photoelectric conversion element 311 is suppressed to the fixed potential VX lower than the SN potential during the normal operation, it is possible to suppress an unintended increase in the SN potential even when the control transistor 319 transitions to the on state.

Note that the row drive circuit 251 may turn on the control transistor 318 and the switching transistor 317 at timing t61, and at the same time, may turn on the control transistor 319. This also controls the SN potential of the sense node SN to be set to the fixed potential VX, making it possible to further suppress an unintended increase in the SN potential.

2.7 Seventh Control Example

Figure 44:
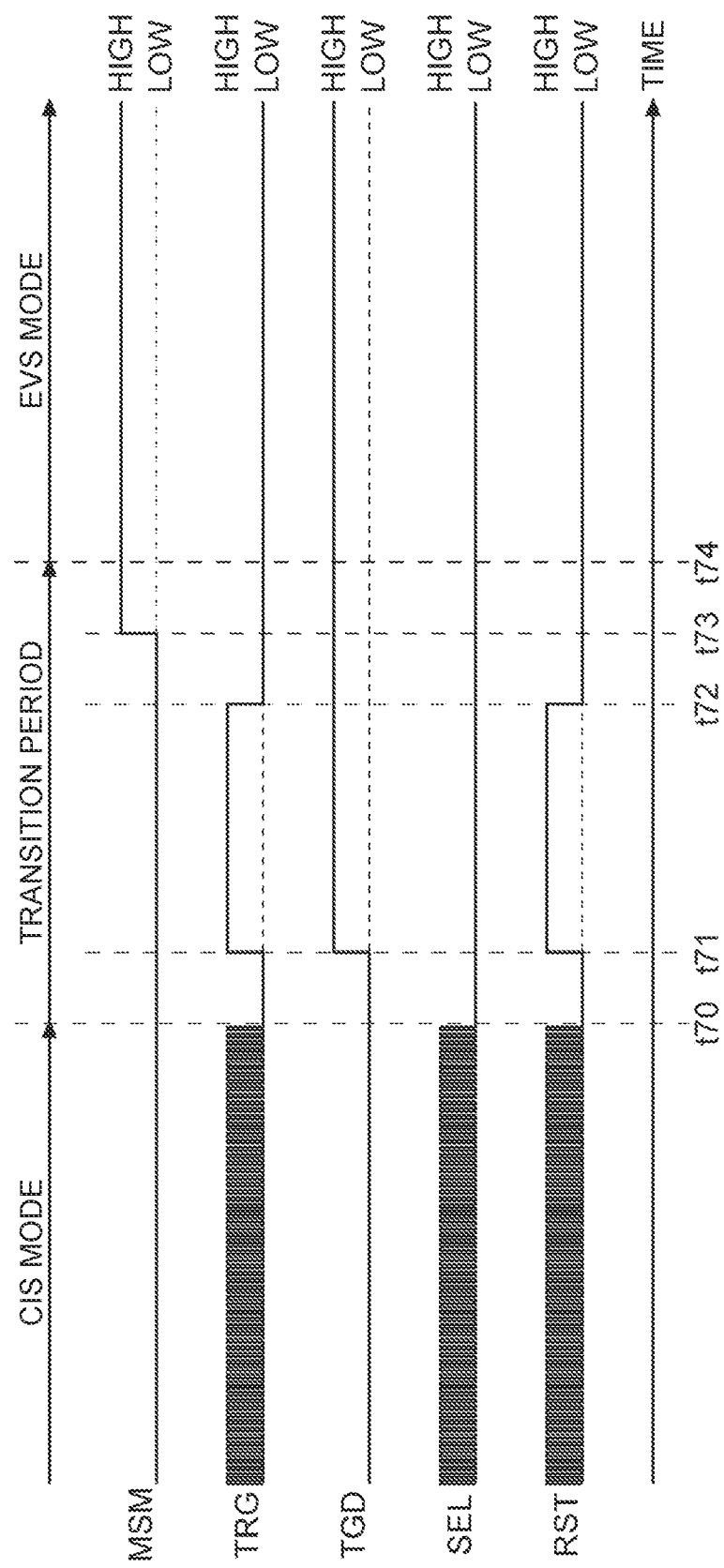
FIG. 44 is a timing chart illustrating an operation example at the time of transition from a CIS mode to an EVS mode according to a seventh control example of the second embodiment.

A seventh control example is an exemplary case where the present embodiment is applied to the response circuit 301I according to the eighth modification described with reference to FIG. 29 in the first embodiment. FIG. 44 is a timing chart illustrating an operation example at the time of transition from the CIS mode to the EVS mode according to the seventh control example. As illustrated in FIG. 44, in the configuration illustrated in FIG. 29, in the transition period (t70 to t74) at the time of transition from the CIS mode to the EVS mode, the row drive circuit 251 turns on the reset transistor 373, the transfer transistor 372, and the switching transistor 317 at timing t71. This allows the fixed potential VX to be applied to the cathode of the photoelectric conversion element 311 through the reset transistor 373, the transfer transistor 372, and the switching transistor 317, making it possible to control the cathode potential of the photoelectric conversion element 311 to be set to the fixed potential VX.

Thereafter, the row drive circuit 251 turns off the reset transistor 373 and the transfer transistor 372 to electrically float the photoelectric conversion element 311 and the switching transistor 317 at timing t72, and then turns on the control transistor 319 at timing t73. In that case, since the cathode potential of the photoelectric conversion element 311 is suppressed to the fixed potential VX lower than the SN potential during the normal operation, it is possible to suppress an unintended increase in the SN potential even when the control transistor 319 transitions to the on state.

Note that the row drive circuit 251 may turn on the reset transistor 373, the transfer transistor 372, and the switching transistor 317 at timing t71, and at the same time, may turn on the control transistor 319. This also controls the SN potential of the sense node SN to be set to the fixed potential VX, making it possible to further suppress an unintended increase in the SN potential.

2.8 Action and Effects

As described above, according to the present embodiment, the cathode potential of the photoelectric conversion element 311 is once lowered to a potential, which is lower than the SN potential at normal operation, the photoelectric conversion element 311 is electrically floated, and then the switching transistor 317 is turned on. This makes it possible to suppress an unintended increase in the SN potential similarly to the first embodiment, leading to suppression of the dead period due to the voltage level of the voltage signal VPR stuck to the ground potential (GND).

Since other configurations, operations, and effects may be similar to those in the above-described embodiment, detailed description thereof will be omitted here. Furthermore, the configuration according to the present embodiment may be appropriately combined with the above-described embodiment and/or the embodiment described below.

3. Third Embodiment

A third embodiment will describe a case, with an example, of controlling the bias current BIAS flowing through the nMOS transistors 313/nMOS transistors 313 and 316 in the logarithmic conversion circuit of the logarithmic response section 310/310A and thereby suppresses an unintended increase in the SN potential so as to suppress the dead period due to the voltage level of the voltage signal VPR stuck to the ground potential (GND).

Since the configurations of the imaging device, the solid-state imaging device, and each section constituting the solid-state imaging device according to the present embodiment may be similar to the configurations of the first embodiment, the present embodiment will be described with reference. However, in the present embodiment, the response circuit 301X constituting the shared block 221X is replaced with a response circuit to be described below. The following description is an exemplary case where the response circuit using the logarithmic response section 310A described with reference to FIG. 7 in the first embodiment. However, the configuration is not limited thereto, and it is also possible to use other logarithmic response sections such as the logarithmic response section 310 described with reference to FIG. 6.

3.1 Configuration Example of Response Circuit

Figure 45:
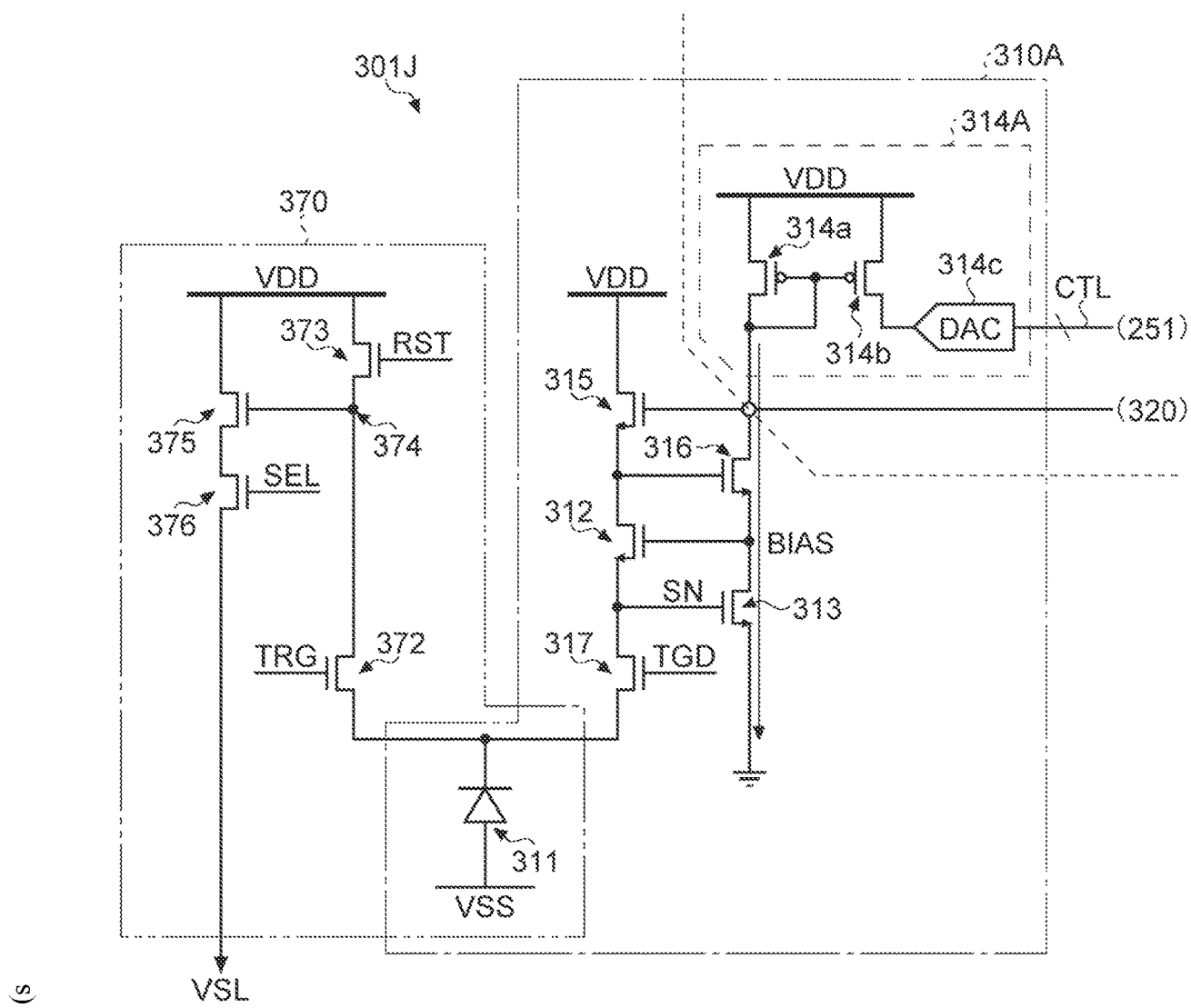
FIG. 45 is a circuit diagram illustrating a configuration example of a response circuit according to a third embodiment.

FIG. 45 is a circuit diagram illustrating a configuration example of a response circuit according to the present embodiment. As illustrated in FIG. 45, a response circuit 301J according to the present embodiment has a configuration similar to the response circuit 301 described with reference to FIG. 9 in the first embodiment, for example, in which a pMOS transistor 314 as a constant current circuit (also referred to as a load MOS transistor or a load resistor) in the logarithmic response section 310A is replaced with a bias circuit 314A.

The bias circuit 314A includes: two pMOS transistors, namely, pMOS transistors 314a and 314b, constituting a current mirror circuit; and a digital to analog converter (DAC) 314c that generates a voltage for controlling the bias current BIAS flowing through the current mirror circuit according to a control signal CTL input from the row drive circuit 251.

The DAC 314c converts the digital control signal CTL input from the row drive circuit 251 into an analog voltage and applies the obtained analog voltage to the source of the pMOS transistor 314b, thereby controlling the bias current BIAS flowing through the nMOS transistors 313 and 316 of the logarithmic conversion circuit connected to the source of the other pMOS transistor 314a.

Specifically, for example, when the control signal CTL indicating '1' is input from the row drive circuit 251, the DAC 314c supplies a reference current to the current mirror circuit. This allows a bias current BIAS corresponding to the reference current to flow through the nMOS transistors 313 and 316 of the logarithmic conversion circuit.

On the other hand, when the control signal CTL indicating '0' is input from the row drive circuit 251, the DAC 314c cuts off the supply of the reference current to the current mirror circuit. This will cut off the bias current BIAS flowing through the nMOS transistors 313 and 316 of the logarithmic conversion circuit.

The bias circuit 314A may be disposed on the detection chip 202 side, for example. Furthermore, the DAC 314c may be formed by using a binary system using an R-2R ladder, a current mirror using an nMOS transistor (hereinafter, also referred to as an nMOS current mirror), or the like. In the case of using an nMOS current mirror, it is possible to generate the reference current by a bandgap reference circuit.

3.1.1 Modification of Response Circuit

Figure 46:
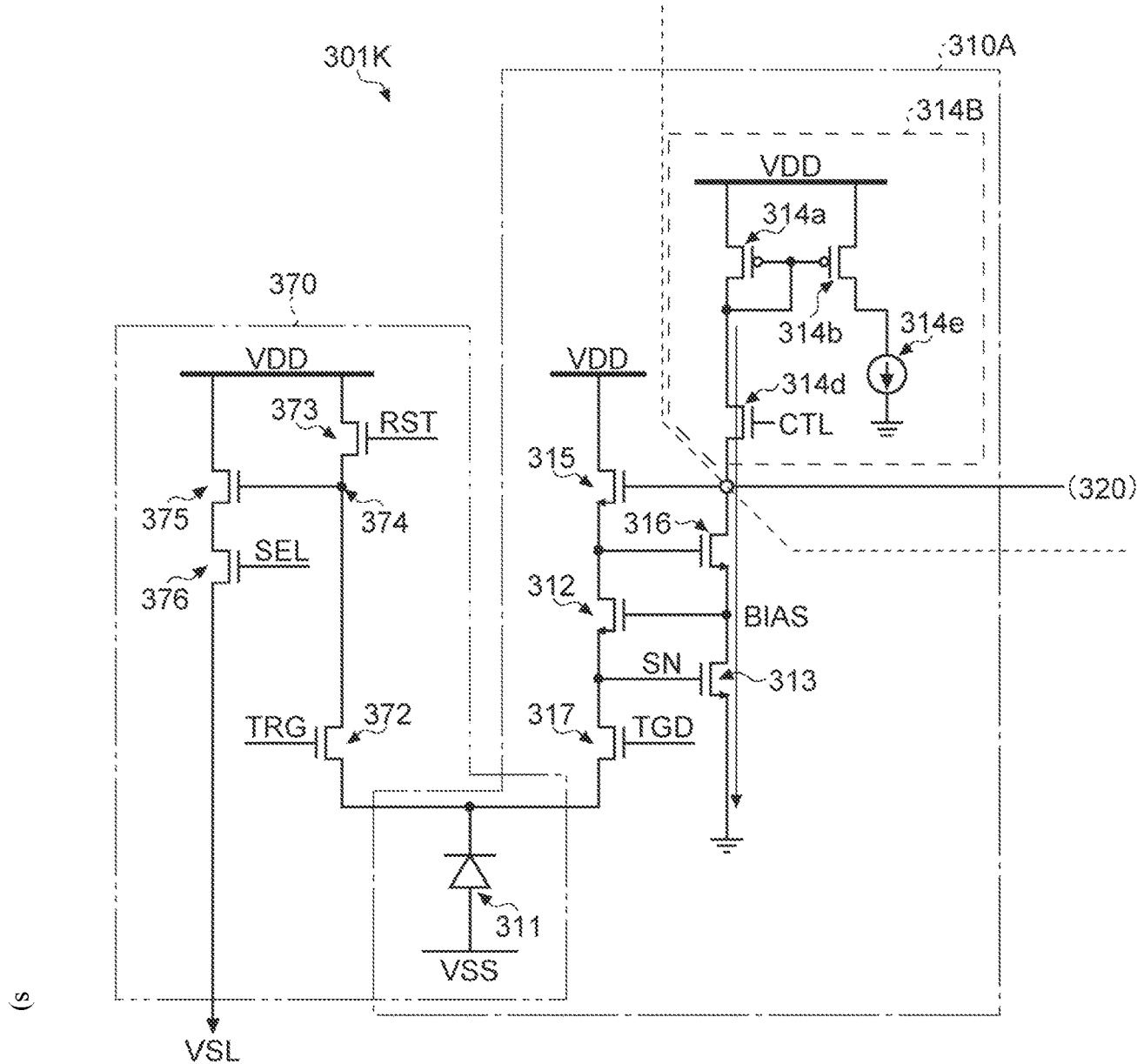
FIG. 46 is a circuit diagram illustrating a modification of the response circuit according to the third embodiment.

FIG. 46 is a circuit diagram illustrating a modification of the response circuit according to the present embodiment. As illustrated in FIG. 46, a response circuit 301K according to the modification has a configuration similar to the configuration of the response circuit 301J described above with reference to FIG. 45, in which the bias circuit 314A is replaced with a bias circuit 314B, for example.

The bias circuit 314B has a configuration similar to the configuration of the bias circuit 314A, in which the DAC 314c is replaced with a constant current source 314e, and a bias control transistor 314d is added to the source of the pMOS transistor 314a constituting the current mirror circuit.

When supplying the bias current to the logarithmic conversion circuit in such a configuration, the row drive circuit 251 applies the high-level control signal CTL to the gate of the bias control transistor 314d, for example. This forms a current path from the current mirror circuit to the logarithmic conversion circuit, allowing the bias current BIAS with the current flowing through the constant current source 314e as the reference current is supplied to the logarithmic conversion circuit. In contrast, when the bias current is not supplied to the logarithmic conversion circuit, the row drive circuit 251 applies the low-level control signal CTL to the gate of the bias control transistor 314d, for example. This cuts off the current path from the current mirror circuit to the logarithmic conversion circuit, leading to the cutoff of the supply of the bias current BIAS to the logarithmic conversion circuit.

The bias control transistor 314d may be disposed on the light receiving chip 201 or may be disposed on the detection chip 202. Other configurations may be similar to the configurations of the response circuit 301J described above.

In the above configuration, at the time of transition from the CIS mode to the EVS mode, the bias current BIAS flowing through the nMOS transistors 313 and 316 of the logarithmic conversion circuit is cut off using the control signal CTL provided to the DAC 314c or the bias control transistor 314d. This makes it possible, similarly to the above-described embodiment, to suppress an unintended increase in the SN potential when the switching transistor 317 transitions to the on state. This makes it possible to avoid the nMOS transistors 312 and 315 from being turned off, leading to achievement of suppression of the dead period due to the voltage level of the voltage signal VPR stuck to the ground potential (GND).

In addition, in a case where the flow of the bias current BIAS in the logarithmic conversion circuit is controlled as in the present embodiment, it is also possible to relax the restriction on the circuit design required for the response circuit 301J. This makes it possible to design the response circuit 301J, more specifically, the solid-state imaging device 200, with a higher degree of freedom in design.

3.2 Transition from CIS Mode to EVS Mode

Next, an operation at the time of transition from the CIS mode to the EVS mode will be described. Although the present description uses the response circuit 301J illustrated in FIG. 45 as a reference, it is also possible to similarly apply the present description to the response circuit 301K illustrated in FIG. 46.

Figure 47:
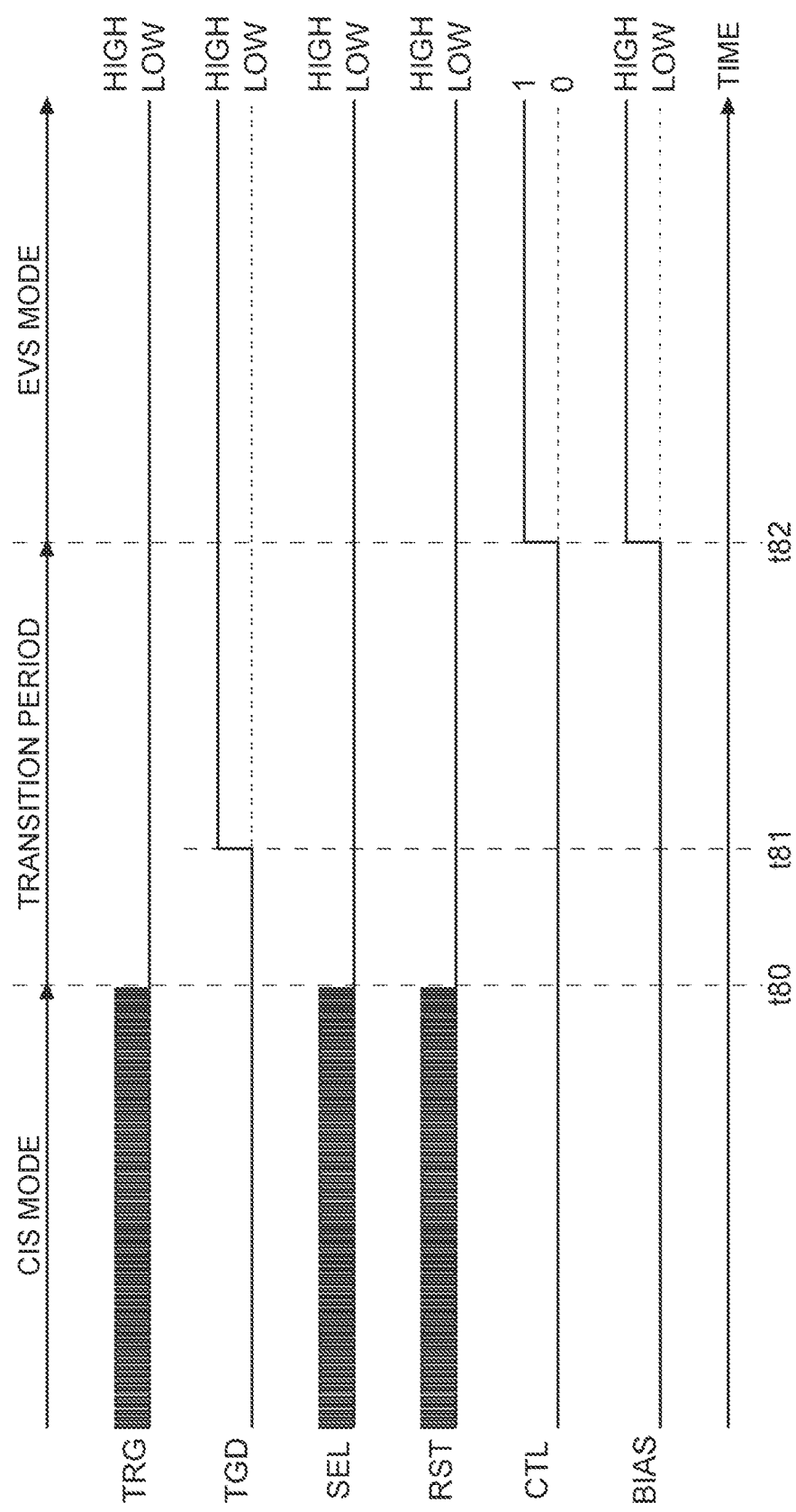
FIG. 47 is a timing chart illustrating an operation example at the time of transition from the CIS mode to the EVS mode according to the third embodiment.

FIG. 47 is a timing chart illustrating an operation example at the time of transition from the CIS mode to the EVS mode according to the present embodiment. As illustrated in FIG. 47, firstly in the transition from the CIS mode to the EVS mode, the supply of the control signal (TRG, SEL, and RST) from the row drive circuit 251 to the transfer transistor 372, the selection transistor 376, and the reset transistor 373, which constitute the pixel circuit 370, is stopped at the end timing t80 of the CIS mode.

Next, in a transition period (t80 to t82) from the CIS mode to the EVS mode, the row drive circuit 251 turns on the switching transistor 317 at timing t81. The control signal CTL indicates '0' during the transition period (t80 to t82), and thus, the bias current BIAS flowing through the logarithmic conversion circuit is cut off (at low level).

Thereafter, the row drive circuit 251 sets the control signal CTL to '1' at timing t82. This allows the bias current BIAS to be supplied (at a high level) to the logarithmic conversion circuit through the bias circuit 314A/314B. Subsequently, the row drive circuit 251 executes the EVS mode from timing t82 onward.

3.3 Operation Flow

Figure 48:
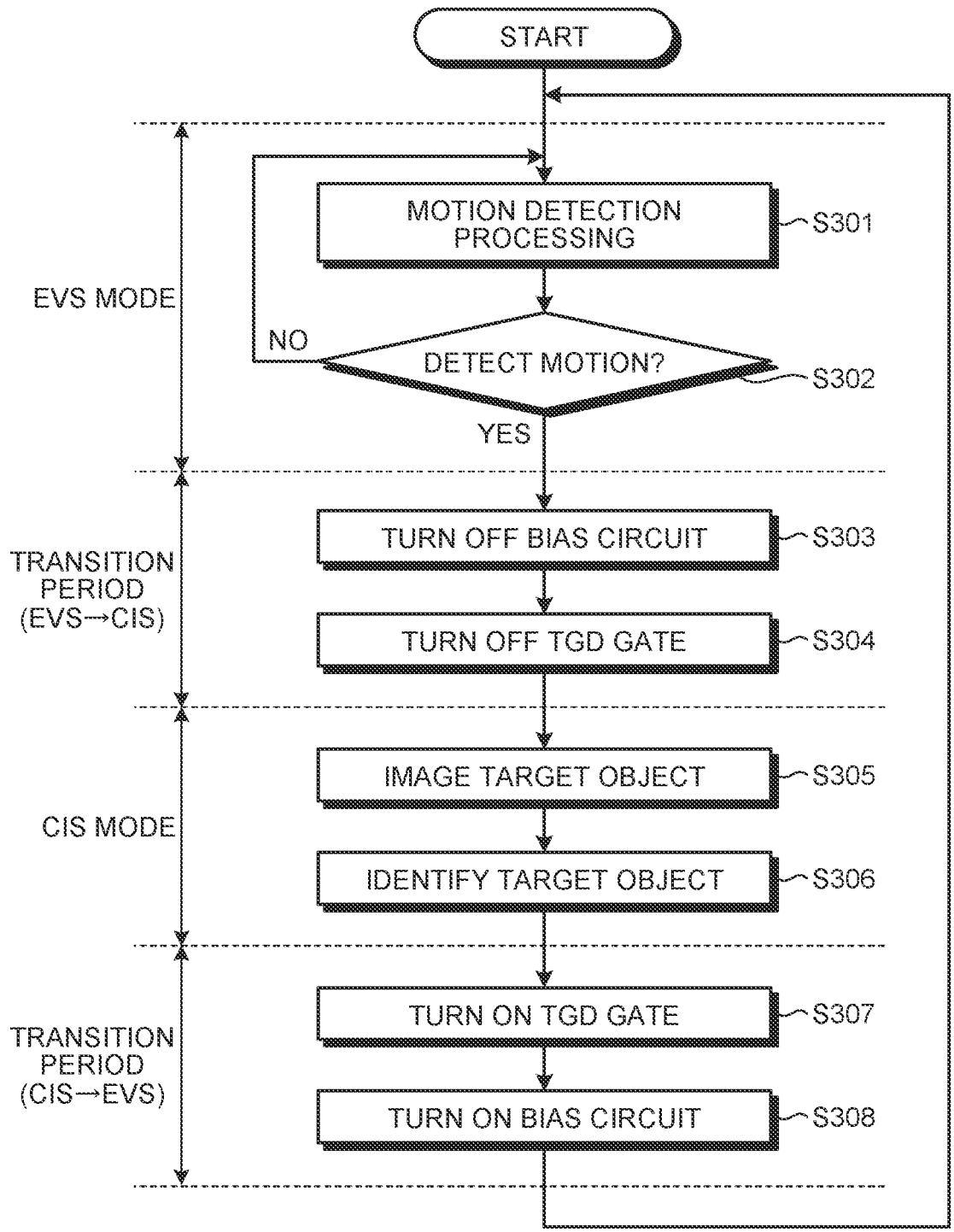
FIG. 48 is a flowchart illustrating an operation example of an imaging device according to the third embodiment.

Next, an operation example of the imaging device 100 according to the present embodiment will be described. FIG. 48 is a flowchart illustrating an operation example of the imaging device according to the present embodiment. The following description is an exemplary case where the response circuit 301J is incorporated in a shared block 221X. However, the configuration is not limited thereto, and the response circuit 301J may be replaced with the response circuits 301K, etc. according to the modifications. Furthermore, the operation illustrated in FIG. 48 may be terminated by an interruption operation such as shutdown, for example.

As illustrated in FIG. 48, in the present operation, when the imaging device 100 is activated, for example, the EVS mode is activated and motion detection processing is executed (step S301), so as to determine whether the motion of the object is detected (step S302) similarly to steps S101 to S102 of FIG. 31 in the first embodiment.

When the motion of the object is detected in step S302 (YES in step S302), the transition from the EVS mode to the CIS mode is executed. In this transition period, first, the row drive circuit 251 turns off the bias circuit 314A in the response circuit 301J to turn off the bias current BIAS flowing through the nMOS transistors 313 and 316 of the logarithmic response section 310A (step S303). Note that turning off the bias circuit 314A may be implemented by inputting the control signal CTL indicating '0' to the DAC 314c.

Subsequently, the row drive circuit 251 turns off the switching transistor (TGD gate) 317 (step S304). This stops the supply of the photocurrent to the logarithmic response section 310A, and the mode transitions to the CIS mode.

In the CIS mode, the row drive circuit 251 generates frame data of a captured image of an object (step S305), similarly to steps S105 to S106 in FIG. 31, and identifies the captured object (step S306).

When the identification of the object is completed in this manner, the solid-state imaging device 200 executes the transition from the CIS mode to the EVS mode. In this transition period, the row drive circuit 251 first turns on the switching transistor 317 (step S307), and then turns on the bias circuit 314A in the response circuit 301 to allow the bias current BIAS to flow to the nMOS transistors 313 and 316 of the logarithmic response section 310A (step S308). This starts the supply of the photocurrent to the logarithmic response section 310A, and the mode transitions to the EVS mode. Note that turning on the bias circuit 314A may be implemented by inputting the control signal CTL indicating '1' to the DAC 314c.

3.4 Action and Effects

As described above, according to the present embodiment, the supply of the bias current BIAS to the logarithmic conversion circuit is cut off during the transition period from the CIS mode to the EVS mode. This makes it possible, similarly to the above-described embodiment, to suppress an unintended increase in the SN potential when the switching transistor 317 transitions to the on state. This makes it possible to avoid the nMOS transistors 312 and 315 from being turned off, leading to achievement of suppression of the dead period due to the voltage level of the voltage signal VPR stuck to the ground potential (GND).

In addition, in a case where the flow of the bias current BIAS in the logarithmic conversion circuit is controlled as in the present embodiment, it is also possible to relax the restriction on the circuit design required for the response circuit 301J. This makes it possible to design the response circuit 301J, more specifically, the solid-state imaging device 200, with a higher degree of freedom in design.

Since other configurations, operations, and effects may be similar to those in the above-described embodiment, detailed description thereof will be omitted here. Furthermore, the configuration according to the present embodiment may be appropriately combined with the above-described embodiment and/or the embodiment described below.

4. Fourth Embodiment

A fourth embodiment will describe an exemplary case where the configuration according to the first and/or second embodiments and the configuration according to the third embodiment described above are combined with each other.

Since the configurations of the imaging device, the solid-state imaging device, and each section constituting the solid-state imaging device according to the present embodiment may be similar to the configurations of any of the first to third embodiments, the present embodiment will be described with reference. However, in the present embodiment, the response circuit 301X constituting the shared block 221X is replaced with a response circuit to be described below. The following description is an exemplary case where the response circuit using the logarithmic response section 310A described with reference to FIG. 7 in the first embodiment. However, the configuration is not limited thereto, and it is also possible to use other logarithmic response sections such as the logarithmic response section 310 described with reference to FIG. 6.

4.1 Configuration Example of Response Circuit

Figure 49:
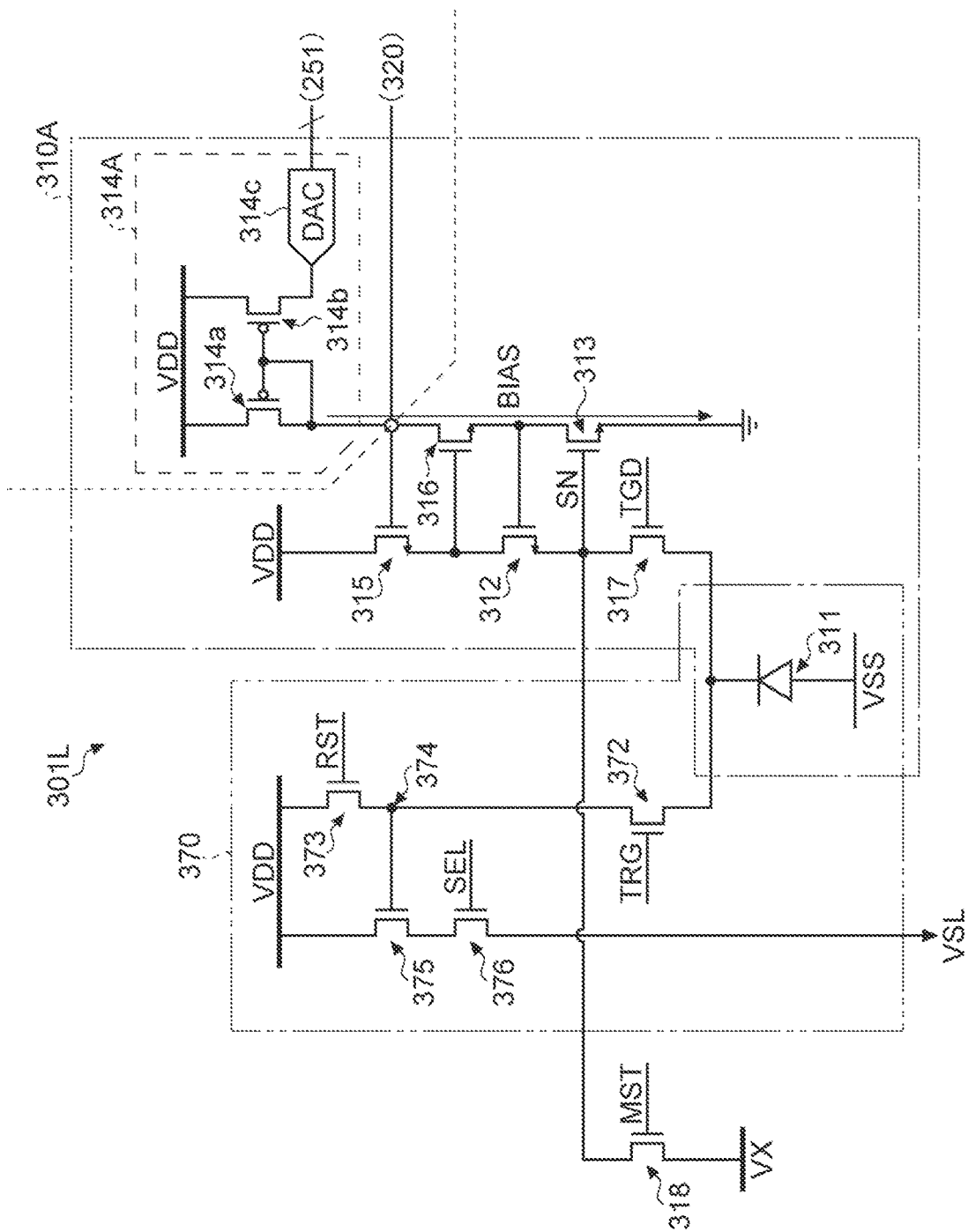
FIG. 49 is a circuit diagram illustrating a configuration example of a response circuit according to a fourth embodiment.

FIG. 49 is a circuit diagram illustrating a configuration example of a response circuit according to the present embodiment. As illustrated in FIG. 49, a response circuit 301L according to the present embodiment has a configuration, for example, that combines the response circuit 301A described with reference to FIG. 21 in the first or second embodiment with the response circuit 301J described with reference to FIG. 45 in the third embodiment. Specifically, the response circuit 301L has a configuration in which the control transistor 318 is connected to the sense node SN in the response circuit 301J described with reference to FIG. 45 in the third embodiment.

4.1.1 Modification of Response Circuit

Figure 50:
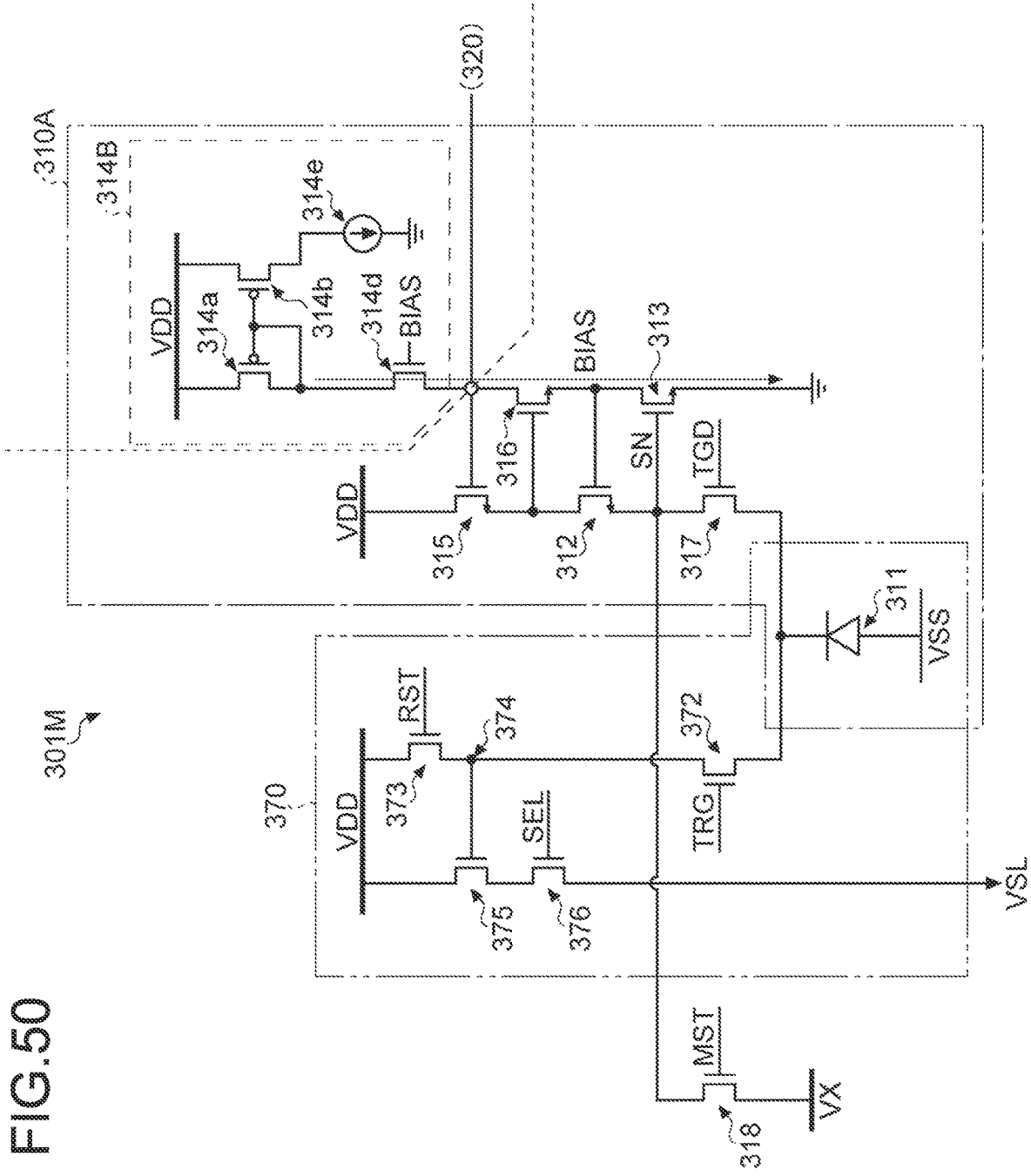
FIG. 50 is a circuit diagram illustrating a modification of the response circuit according to the fourth embodiment.

FIG. 50 is a circuit diagram illustrating a modification of the response circuit according to the present embodiment. As illustrated in FIG. 50, a response circuit 301M according to the modification has a configuration, for example, that combines the response circuit 301A described with reference to FIG. 21 in the first or second embodiment with the response circuit 301K described with reference to FIG. 46 in the third embodiment. Specifically, the response circuit 301M has a configuration in which the control transistor 318 is connected to the sense node SN in the response circuit 301K described with reference to FIG. 46 in the third embodiment.

According to such a configuration, at the time of transition from the CIS mode to the EVS mode, the SN potential of the sense node SN and/or the cathode potential of the photoelectric conversion element 311 can be fixed to the fixed potential VX lower than the SN potential at normal operation, and the supply of the bias current to the logarithmic response circuit in the logarithmic response section 310A can be cut off, making it possible to further suppress an unintended increase in the SN potential. This makes it possible to further suppress the dead period caused by the voltage level of the voltage signal VPR stuck to the ground potential (GND).

Note that the configuration combined with the response circuit 301J/301K according to the third embodiment is not limited to the response circuit 301A illustrated in FIG. 21, and may be any of the response circuits 301B to 301I illustrated in FIGS. 22 to 29, for example.

4.2 Transition from CIS Mode to EVS Mode

Next, an operation at the time of transition from the CIS mode to the EVS mode will be described. The present description will be given with reference to the response circuit 301L exemplified in FIG. 49. However, by appropriately controlling the control transistor 319, the transfer transistor 372, the reset transistor 373, and the like in accordance with the control of the control transistor 318, it is also possible to achieve operation similarly with the modification.

Figure 51:
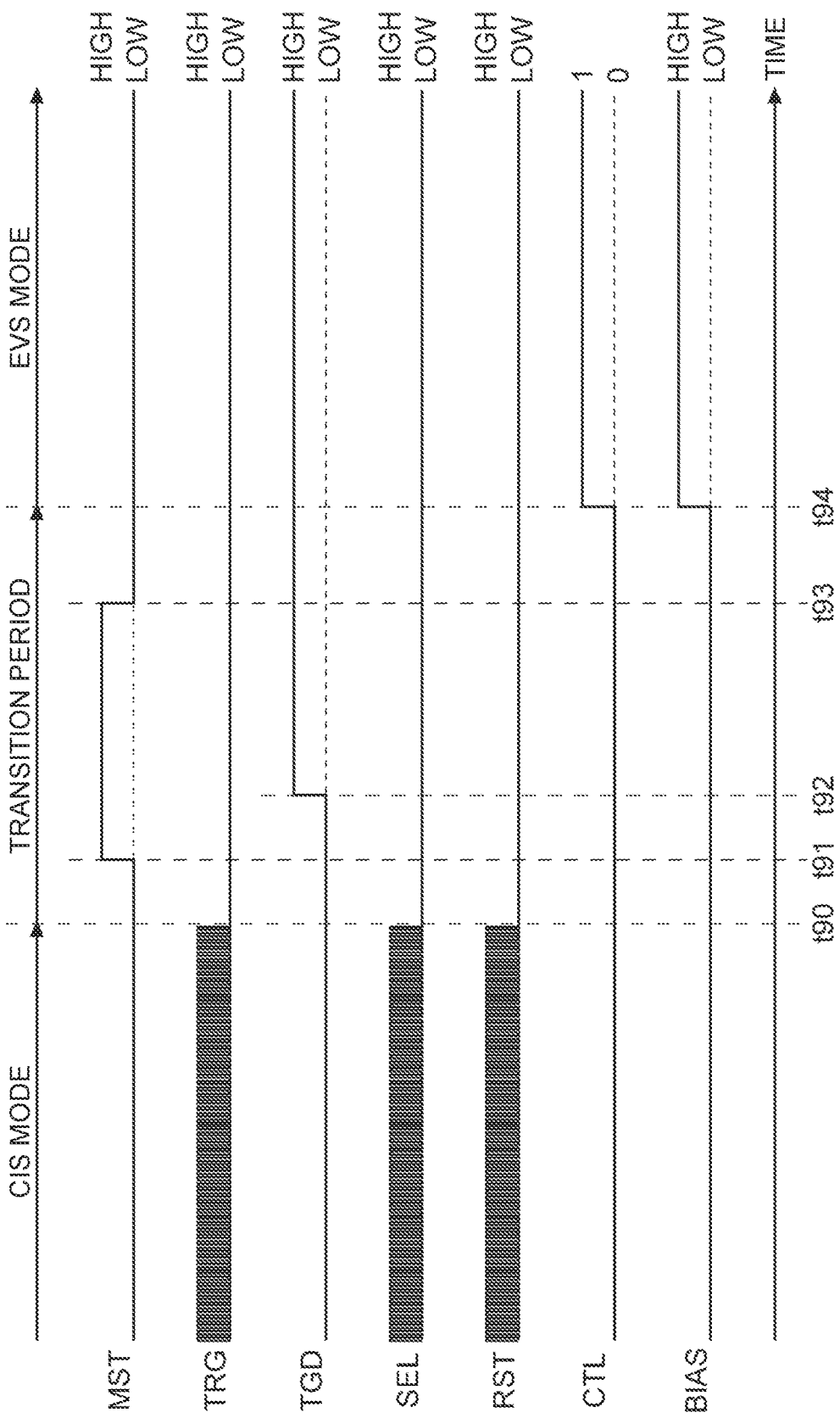
FIG. 51 is a timing chart illustrating an operation example at the time of transition from the CIS mode to the EVS mode according to the fourth embodiment.

FIG. 51 is a timing chart illustrating an operation example at the time of transition from the CIS mode to the EVS mode according to the present embodiment. As illustrated in FIG. 51, firstly in the transition from the CIS mode to the EVS mode, the supply of the control signal (TRG, SEL, and RST)

from the row drive circuit 251 to the transfer transistor 372, the selection transistor 376, and the reset transistor 373, which constitute the pixel circuit 370, is stopped at an end timing t90 of the CIS mode.

Next, in a transition period (t90 to t94) from the CIS mode to the EVS mode, the row drive circuit 251 sets the control signal MST to the high level at timing t91 to turn on the control transistor 318. This allows the SN potential of the sense node SN to be fixed to the fixed potential VX. The control signal CTL indicates '0' during the transition period (t90 to t92), and thus, the bias current BIAS flowing through the logarithmic conversion circuit is cut off (at low level).

Subsequently, the row drive circuit 251 sets the switching signal TGD to the high level at timing t92 to turn on the switching transistor 317. At this time, since the SN potential of the sense node SN is fixed to the fixed potential VX, it is possible to avoid the voltage level of the voltage signal VPR from being stuck to the ground potential (GND).

Thereafter, the row drive circuit 251 turns off the control transistor 318 at timing t93, and then sets the control signal CTL to '1' at timing t94. This allows the bias current BIAS to be supplied (at a high level) to the logarithmic conversion circuit through the bias circuit 314A/314B. Subsequently, the row drive circuit 251 executes the EVS mode from timing t94 onward.

4.3 Operation Flow

Figure 52:
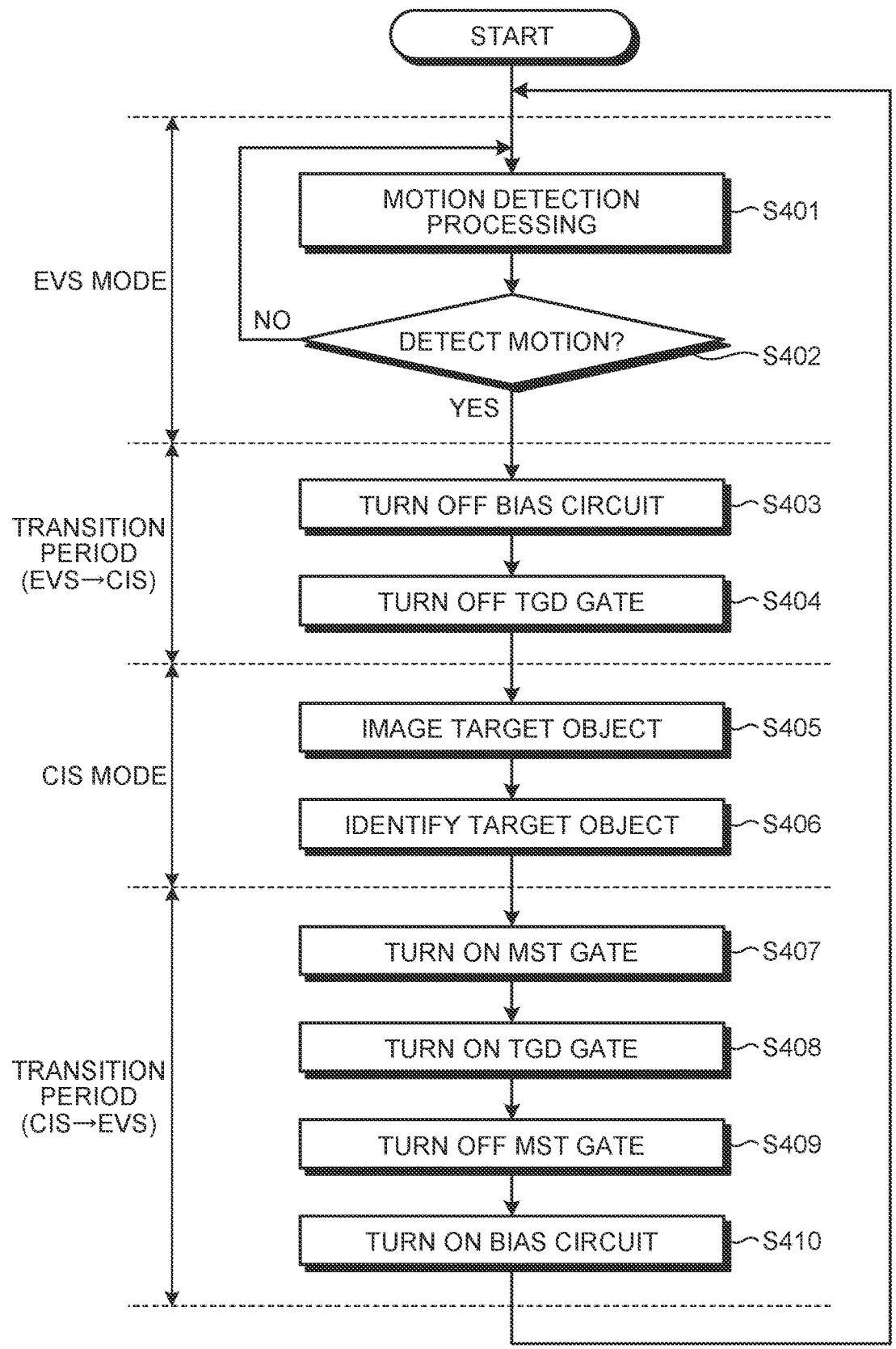
FIG. 52 is a flowchart illustrating an operation example of an imaging device according to the fourth embodiment.

Next, an operation example of the imaging device 100 according to the present embodiment will be described. FIG. 52 is a flowchart illustrating an operation example of the imaging device according to the present embodiment. The following description is an exemplary case where the response circuit 301L is incorporated in a shared block 221X. However, the configuration is not limited thereto, and the response circuit 301L may be replaced with the response circuits 301M, etc. according to the modifications. Furthermore, the operation illustrated in FIG. 52 may be terminated by an interruption operation such as shutdown, for example.

As illustrated in FIG. 52, in the present operation, when the imaging device 100 is activated, for example, the EVS mode is activated and motion detection processing is executed (step S401), so as to determine whether the motion of the object is detected (step S402). similarly to steps S101 to S102 of FIG. 31 in the first embodiment.

When the motion of the object has been detected in step S402 (YES in step S402), the transition from the EVS mode to the CIS mode is executed. During this transition period, for example, similarly to steps S303 to S304 in FIG. 48 in the third embodiment, the row drive circuit 251 turns off the bias circuit 314A in the response circuit 301L to turn off the bias current BIAS (step S403), and subsequently turns off the switching transistor (TGD gate) 317 (step S404). This stops the supply of the photocurrent to the logarithmic response section 310A, and the mode transitions to the CIS mode.

In the CIS mode, the row drive circuit 251 generates frame data of a captured image of an object (step S405), and identifies the captured object (step S406), similarly to steps S105 to S106 in FIG. 31 in the first embodiment or steps S305 to S306 in FIG. 48 in the third embodiment.

When the identification of the object is completed in this manner, the solid-state imaging device 200 executes the transition from the CIS mode to the EVS mode. During this transition period, the row drive circuit 251 turns on the control transistor (also referred to as the MST gate) 318 and the switching transistor 317 (steps S407 to S408), and turns off the control transistor 318 (step S409), similarly to steps S107 to S109 in FIG. 31 in the first embodiment. Subsequently, similarly to step S308 of FIG. 48 in the third embodiment, the row drive circuit 251 turns on the bias circuit 314A in the response circuit 301L to allow the bias current BIAS to flow to the nMOS transistors 313 and 316 of the logarithmic response section 310A (step S410). This starts the supply of the photocurrent to the logarithmic response section 310A, and the mode transitions to the EVS mode.

4.4 Action and Effects

As described above, according to the present embodiment, at the time of transition from the CIS mode to the EVS mode, the SN potential of the sense node SN and/or the cathode potential of the photoelectric conversion element 311 can be fixed to the fixed potential VX, which is lower than the SN potential at normal operation, and the supply of the bias current to the logarithmic response circuit in the logarithmic response section 310A can be cut off, making it possible to further suppress an unintended increase in the SN potential. This makes it possible to further suppress the dead period caused by the voltage level of the voltage signal VPR stuck to the ground potential (GND).

Since other configurations, operations, and effects may be similar to those in the above-described embodiment, detailed description thereof will be omitted here. Furthermore, the configuration according to the present embodiment may be appropriately combined with the above-described embodiment and/or the embodiment described below.

5. Fifth Embodiment

The above embodiment has described the case of suppressing the dead period occurring at the transition from the CIS mode to the EVS mode. The present embodiment will describe a case of suppressing the dead period which can occur at the transition from the all-pixel mode to the binning mode or from the binning mode to the all-pixel mode, for example, during the EVS operation (which may be the EVS mode).

As described above, while the solid-state imaging device 200 operates as EVS, the SN potential of the sense node SN can swing at transition from the all-pixel mode to the binning mode or from the binning mode to the all-pixel mode. In that case, there can be an occurrence of a dead period in which the address event cannot be detected during the settling time until the SN potential settles to the voltage level at normal operation. Therefore, in the present embodiment, a configuration capable of suppressing the occurrence of the dead period will be described with the following examples.

The following description will describe a case where the solid-state imaging device 200 does not include the CIS mode, that is, the solid-state imaging device 200 does not include the pixel circuit 370 for acquiring the gradation data. However, the present embodiment is not limited thereto, and similarly to the above-described embodiment, the present embodiment may be applied at the time of transition from the all-pixel mode to the binning mode or from the binning mode to the all-pixel mode while the solid-state imaging device 200 including the pixel circuit 370 is operating in the EVS mode.

Since the configurations of the imaging device, the solid-state imaging device, and each section constituting the solid-state imaging device according to the present embodiment may be similar to the configurations of any of the first to fourth embodiments, the present embodiment will be described with reference. However, in the present embodiment, the detection chip 202 is replaced with a detection chip to be described below, and the shared block 221X is replaced with a shared block to be described below. The following description is an exemplary case of using the logarithmic response section 310A described with reference to FIG. 7 in the first embodiment. However, the configuration is not limited thereto, and other logarithmic response sections such as the logarithmic response section 310 described with reference to FIG. 6 can be used as well.

5.1 Layout Example of Detection Chip

Figure 53:
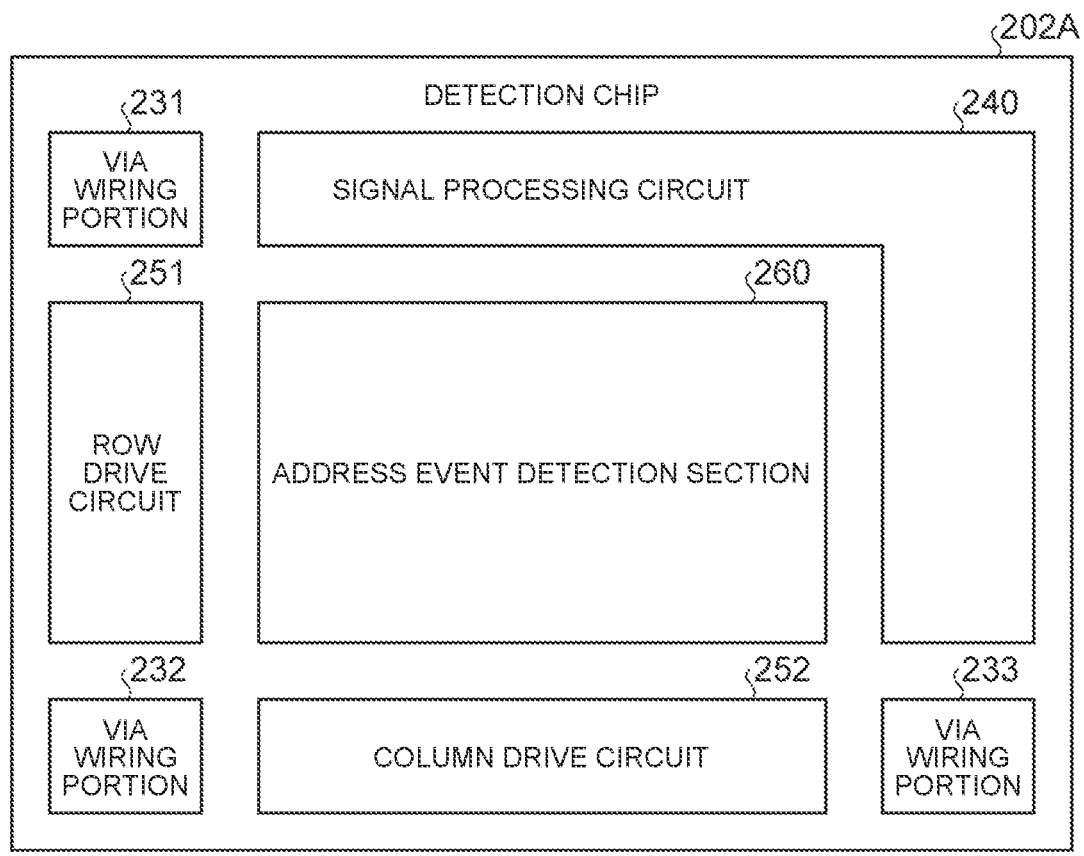
FIG. 53 is an example of a plan view of a detection chip according to a fifth embodiment.

FIG. 53 is an example of a plan view of the detection chip according to the present embodiment. As illustrated in FIG. 53, a detection chip 202A according to the present embodiment has a configuration in which the column ADC 270 for reading the lower order work data is omitted in a configuration similar to the detection chip 202 described with reference to FIG. 4 in the first embodiment.

5.2 Basic Configuration Example of Shared Block

Figure 54:
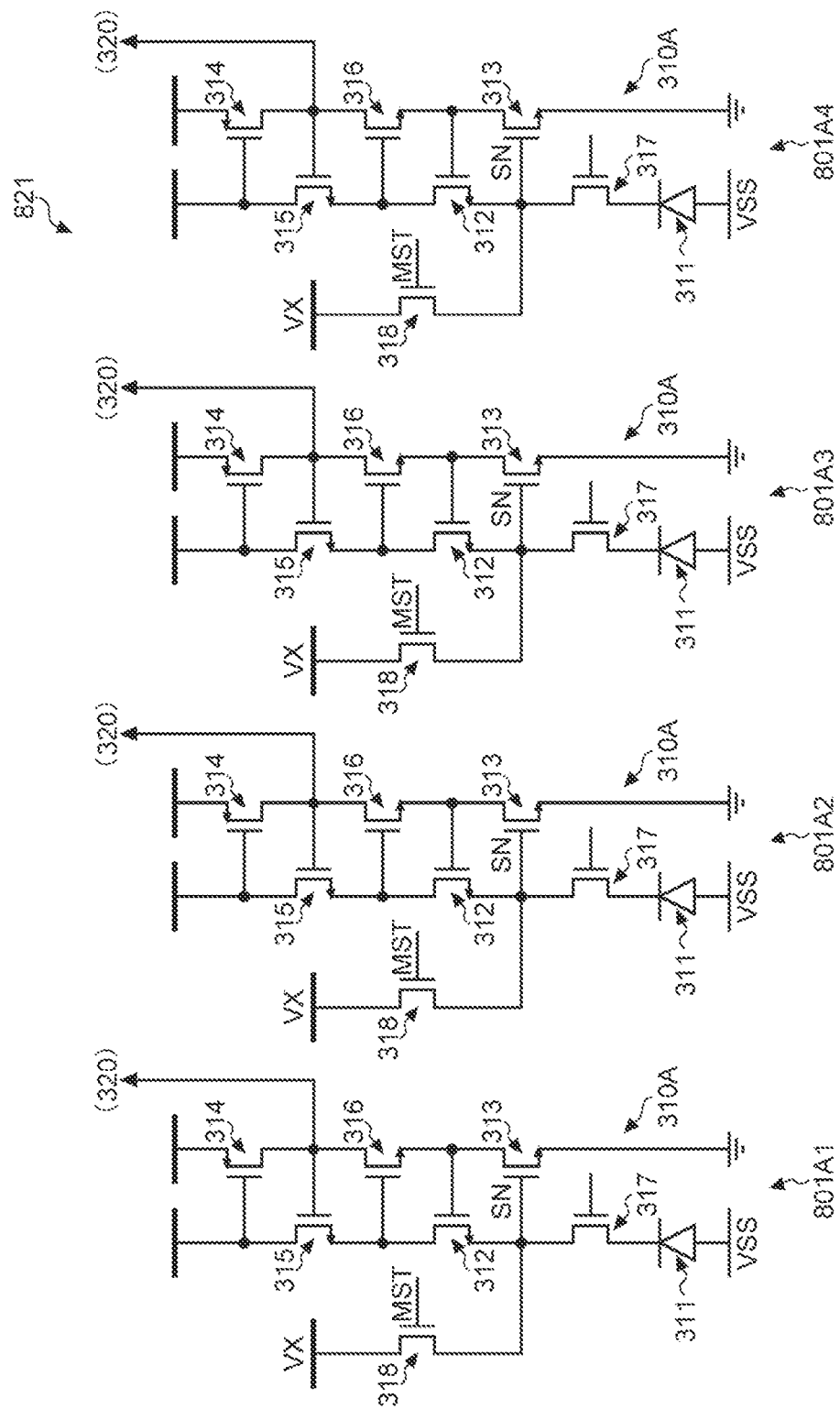
FIG. 54 is a circuit diagram illustrating a configuration example of a shared block according to the fifth embodiment.

FIG. 54 is a circuit diagram illustrating a configuration example of a shared block according to the present embodiment. As illustrated in FIG. 54, a shared block 821 according to the present embodiment includes a plurality of response circuits 801A1 to 801A4 (hereinafter, referred to as 801A when the response circuits 801A1 to 801A4 are not distinguished from each other). Note that the total number of response circuits 801A in the shared block 821 is not limited to four in a 2 row×2 column pattern, and may be an integer of 2 or more.

Each of the response circuits 801A has a configuration similar to the response circuit 301A described with reference to FIG. 21 in the first embodiment, for example, in which the transfer transistor 372, the reset transistor 373, the floating diffusion region 374, the amplification transistor 375, and the selection transistor 376 constituting the pixel circuit 370, are omitted.

In such a configuration, when suppressing the swing of the SN potential of the sense node SN in each response circuit 801, the control transistor 318 is turned on, and the fixed potential VX is applied to the sense node SN. This controls the SN potential of the sense node SN to be set to the fixed potential VX, making it possible to shorten the settling time generated by the swing of the SN potential.

5.3 Binning Mode by Circuit Sharing

In the configuration illustrated in FIG. 54, for example, by enabling formation of a current path connecting the sense nodes SN of the individual response circuits 801A, it is possible to obtain a configuration capable of switching between the all-pixel mode and the binning mode. Therefore, a circuit configuration example of the shared block 821 that enables switching between the all-pixel mode and the binning mode will be described below with some examples.

5.3.1 First Sharing Example

Figure 55:
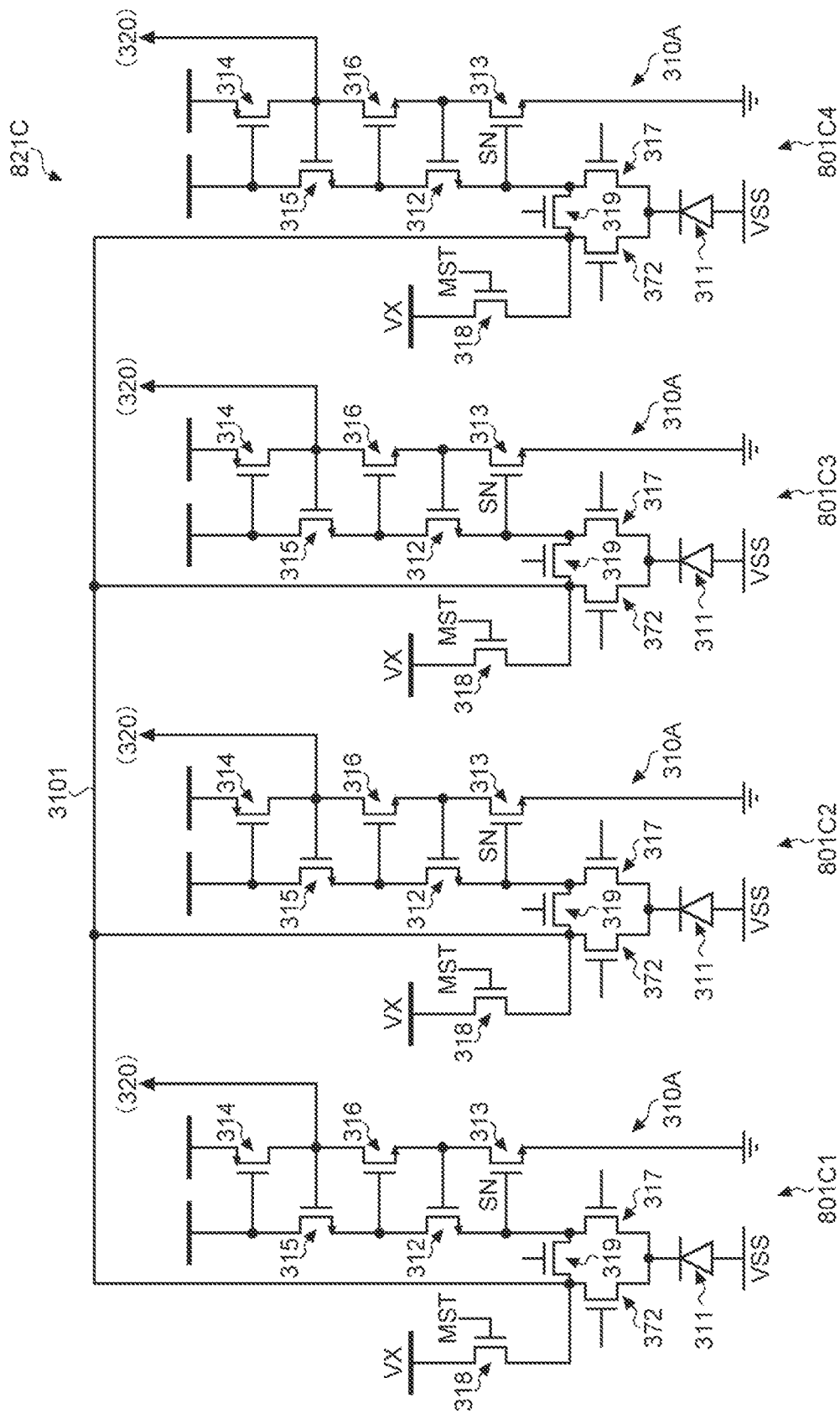
FIG. 55 is a circuit diagram illustrating a circuit configuration example of a shared block according to a first sharing example of the fifth embodiment.

FIG. 55 is a circuit diagram illustrating a circuit configuration example of a shared block according to a first sharing example. The first sharing example is an exemplary case where the shared block 221C according to the second sharing example described with reference to FIG. 33 in the first embodiment is used as a base.

As illustrated in FIG. 55, a shared block 821C according to the first sharing example has a configuration in which the readout circuit 370a connected to the common line 3101 is omitted from a configuration similar to the shared block 221C described with reference to FIG. 33. More specifically, the shared block 821C has a configuration in which sense nodes SN of a plurality of response circuits 801C1 to 801C4 are connected to each other through the control transistor 319 and the common line 3101. However, the shared block 821C has kept the transfer transistor 372 to control the connection between the photoelectric conversion element 311 and the common line 3101 in each of the response circuits 801C1 to 801C4.

In such a configuration, when the shared block 821C is driven in the all-pixel mode, the row drive circuit 251 turns off the transfer transistor 372 and the control transistor 319 of each of the response circuits 801C1 to 801C4. This allows the photoelectric conversion element 311 of each of the response circuits 801C1 to 801C4 to be connected to each sense node SN, making it possible to detect an address event in the all-pixel mode.

In addition, when suppressing the swing of the SN potential of the sense node SN in the all-pixel mode, the control transistors 318 and 319 of the response circuits 801C1 to 801C4 are turned on. This allows the fixed potential VX to be applied to the sense node SN of each of the response circuits 801C1 to 801C4, making it possible to shorten the settling time generated by the swing of the SN potential. At that time, the cathode potential of the photoelectric conversion element 311 may be controlled to the fixed potential VX by turning on the transfer transistor 372 and/or the switching transistor 317 of each of the response circuits 801C1 to 801C4.

Furthermore, when the shared block 821C is driven in the binning mode, the row drive circuit 251 turns on the switching transistor 317 and the control transistor 319 of the response circuit 801C1, turns off the switching transistor 317 and the control transistor 319 in the other response circuit 801C2 to 801C4, and turns on the transfer transistor 372. This leads to formation of a current path from the photoelectric conversion element 311 of each of the response circuits 801C1 to 801C4 to the sense node SN of the response circuit 801 C1, enabling detection of the address event in the binning mode.

In addition, when suppressing the swing of the SN potential of the sense node SN in the binning mode, the control transistors 318 and 319 of the response circuits 801C1 to 801C4 are turned on. This allows the fixed potential VX to be applied to the sense node SN of each of the response circuits 801C1 to 801C4, making it possible to shorten the settling time generated by the swing of the SN potential. At that time, the cathode potential of the photoelectric conversion element 311 may be controlled to the fixed potential VX by turning on the transfer transistor 372 and/or the switching transistor 317 of each of the response circuits 801C1 to 801C4.

5.3.2 Second Sharing Example

Figure 56:
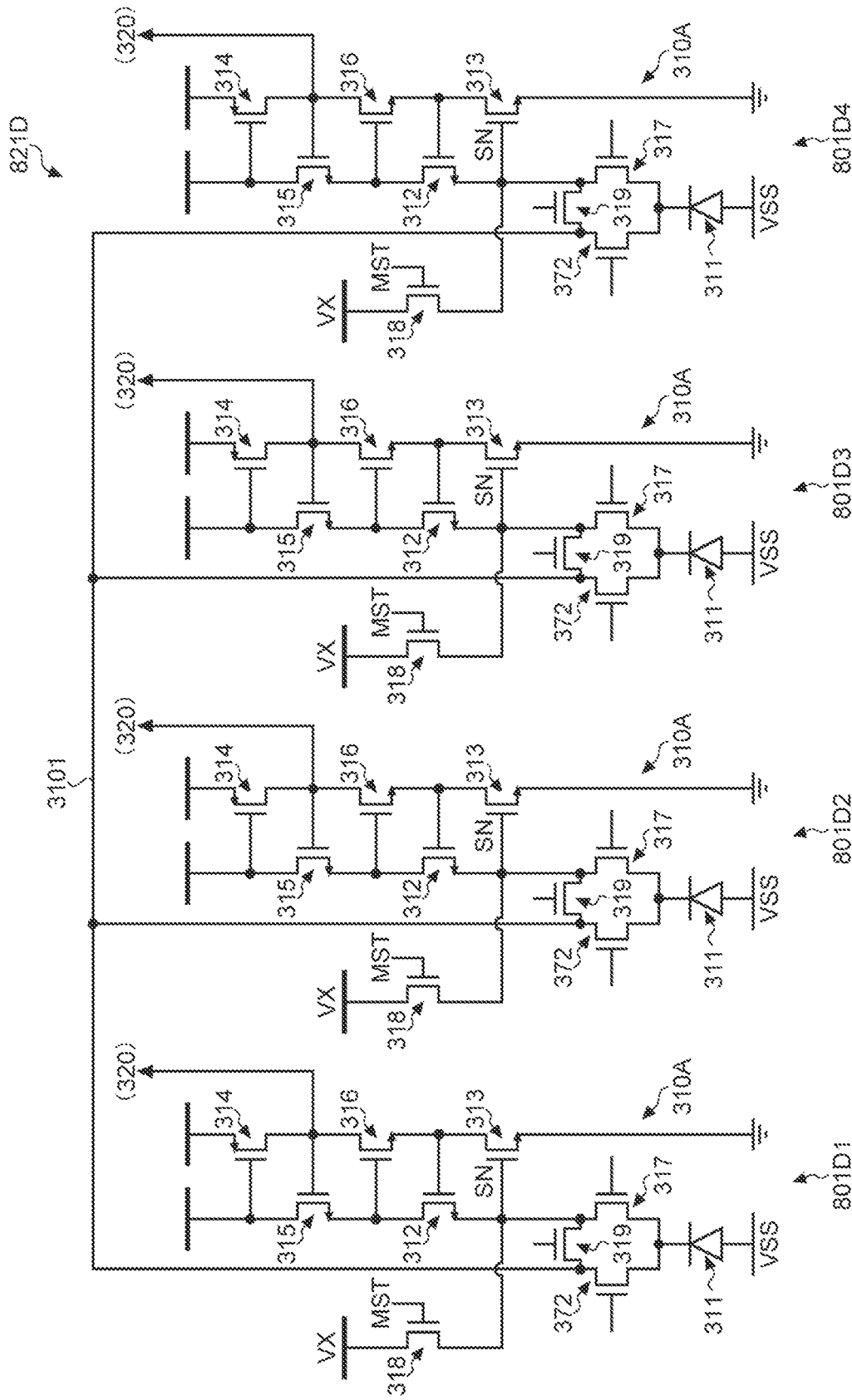
FIG. 56 is a circuit diagram illustrating a circuit configuration example of a shared block according to a second sharing example of the fifth embodiment.

FIG. 56 is a circuit diagram illustrating a circuit configuration example of a shared block according to a second sharing example. The second sharing example is an exemplary case based on the shared block 221D according to the third sharing example described with reference to FIG. 34 in the first embodiment.

As illustrated in FIG. 56, a shared block 821D according to the second sharing example has a configuration in which the readout circuit 370a connected to the common line 3101 is omitted from a configuration similar to the shared block 221D described with reference to FIG. 34. More specifically, the shared block 821D has a configuration in which sense nodes SN of a plurality of response circuits 801D1 to 801D4 are connected to each other through the control transistor 319 and the common line 3101. However, the shared block 821D has kept the transfer transistor 372 to control the connection between the photoelectric conversion element 311 and the common line 3101 in each of the response circuits 801D1 to 801D4.

In such a configuration, when the shared block 821D is driven in the all-pixel mode, the row drive circuit 251 turns off the transfer transistor 372 and the control transistor 319 of each of the response circuits 801D1 to 801D4. This allows the photoelectric conversion element 311 of each of the response circuits 801D1 to 801D4 to be connected to each sense node SN, making it possible to detect an address event in the all-pixel mode.

In addition, when suppressing the swing of the SN potential of the sense node SN in the all-pixel mode, the control transistors 318 of the response circuits 801D1 to 801D4 are turned on. This allows the fixed potential VX to be applied to the sense node SN of each of the response circuits 801D1 to 801D4, making it possible to shorten the settling time generated by the swing of the SN potential. At that time, the cathode potential of the photoelectric conversion element 311 may be controlled to the fixed potential VX by turning on the switching transistor 317 of each of the response circuits 801D1 to 801D4.

Furthermore, when the shared block 821D is driven in the binning mode, the row drive circuit 251 turns on the switching transistor 317 and the control transistor 319 of the response circuit 801D1, turns off the switching transistor 317 and the control transistor 319 in the other response circuit 801D2 to 801D4, and turns on the transfer transistor 372. This leads to formation of a current path from the photoelectric conversion element 311 of each of the response circuits 801D1 to 801D4 to the sense node SN of the response circuit 801D1, enabling detection of the address event in the binning mode.

In addition, when suppressing the swing of the SN potential of the sense node SN in the binning mode, the control transistors 318 of the response circuits 801D1 to 801D4 are turned on. This allows the fixed potential VX to be applied to the sense node SN of each of the response circuits 801D1 to 801D4, making it possible to shorten the settling time generated by the swing of the SN potential. At that time, the cathode potential of the photoelectric conversion element 311 may be controlled to the fixed potential VX by turning on the switching transistor 317 of each of the response circuits 801D1 to 801D4.

5.3.3 Third Sharing Example

Figure 57:
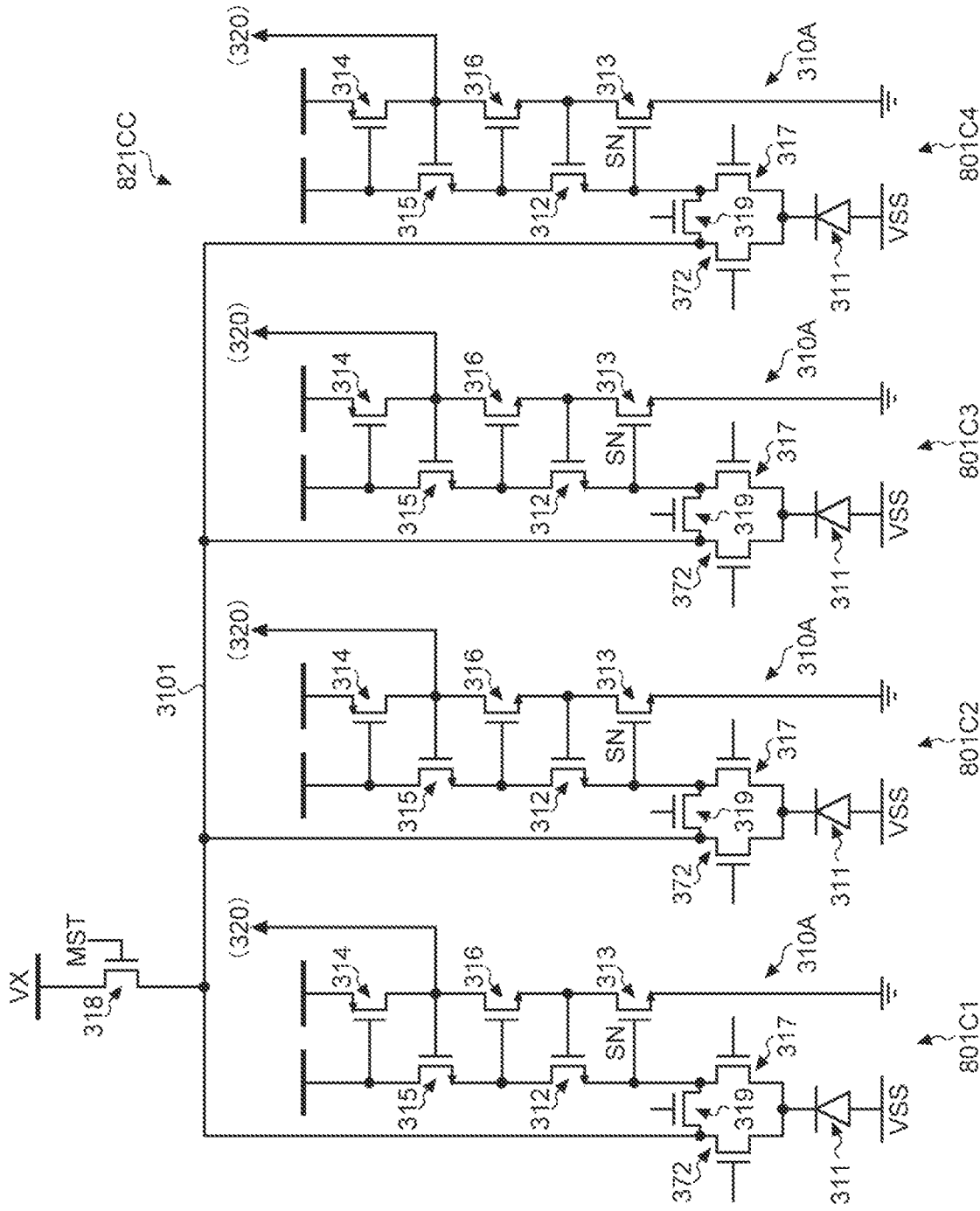
FIG. 57 is a circuit diagram illustrating a circuit configuration example of a shared block according to a third sharing example of the fifth embodiment.

FIG. 57 is a circuit diagram illustrating a circuit configuration example of a shared block according to a third sharing example. The third sharing example is an exemplary case where the shared block 221CC according to the fourth sharing example described with reference to FIG. 35 in the first embodiment is used as a base.

As illustrated in FIG. 57, a shared block 821CC according to the third sharing example has a configuration in which the readout circuit 370a connected to the common line 3101 is omitted from a configuration similar to the shared block 221CC described with reference to FIG. 35. More specifically, the shared block 821CC has a configuration in which sense nodes SN of a plurality of response circuits 801C1 to 801C4 are connected to each other through the control transistor 319 and the common line 3101. However, the shared block 821CC has kept the transfer transistor 372 to control the connection between the photoelectric conversion element 311 and the common line 3101 in each of the response circuits 801C1 to 801C4. This may be similar to the configuration in which the control transistor 318 in each of the response circuits 801C1 to 801C4 is replaced with the common control transistor 318 connected to the common line 3101 in the shared block 821C according to the first sharing example described with reference to FIG. 55.

In such a configuration, when the shared block 821D is driven in the all-pixel mode, the row drive circuit 251 turns off the transfer transistor 372 and the control transistor 319 of each of the response circuits 801C1 to 801C4. This allows the photoelectric conversion element 311 of each of the response circuits 801C1 to 801C4 to be connected to each sense node SN, making it possible to detect an address event in the all-pixel mode.

Furthermore, when suppressing the swing of the SN potential of the sense node SN in the all-pixel mode, the control transistor 318 connected to the common line 3101 is turned on. This allows the fixed potential VX to be applied to the sense node SN of each of the response circuits 801C1 to 801C4, making it possible to shorten the settling time generated by the swing of the SN potential. At that time, the cathode potential of the photoelectric conversion element 311 may be controlled to the fixed potential VX by turning on the switching transistor 317 of each of the response circuits 801C1 to 801C4.

Furthermore, when the shared block 821D is driven in the binning mode, the row drive circuit 251 turns on the switching transistor 317 and the control transistor 319 of the response circuit 801D1, turns off the switching transistor 317 and the control transistor 319 in the other response circuit 801D2 to 801D4, and turns on the transfer transistor 372. This leads to formation of a current path from the photoelectric conversion element 311 of each of the response circuits 801D1 to 801D4 to the sense node SN of the response circuit 801D1, enabling detection of the address event in the binning mode.

Furthermore, when suppressing the swing of the SN potential of the sense node SN in the binning mode, the control transistor 318 connected to the common line 3101 is turned on. This allows the fixed potential VX to be applied to the sense node SN of each of the response circuits 801C1 to 801C4, making it possible to shorten the settling time generated by the swing of the SN potential. At that time, the cathode potential of the photoelectric conversion element 311 may be controlled to the fixed potential VX by turning on the switching transistor 317 of each of the response circuits 801C1 to 801C4.

5.4 Action and Effects

As described above, even while the solid-state imaging device is operating as EVS, by fixing the SN potential of the sense node SN to the fixed potential VX at the time of transition from the pixel mode to the binning mode or from the binning mode to the all-pixel mode, it is possible to shorten the settling time generated by the swing of the SN potential and shorten the period required for the mode transition.

Since other configurations, operations, and effects may be similar to those in the above-described embodiment, detailed description thereof will be omitted here. Furthermore, the configuration according to the present embodiment may be appropriately combined with the above-described embodiment and/or the embodiment described below.

6. Sixth Embodiment

A sixth embodiment will describe an example of another configuration of fixing the SN potential of the sense node SN at the time of mode transition.

Since the configurations of the imaging device, the solid-state imaging device, and each section constituting the solid-state imaging device according to the present embodiment may be similar to the configurations of any of the first to third embodiments, the present embodiment will be described with reference. However, in the present embodiment, the response circuit 301X constituting the shared block 221X is replaced with a response circuit to be described below. The following description is an exemplary case where the response circuit using the logarithmic response section 310A described with reference to FIG. 7 in the first embodiment. However, the configuration is not limited thereto, and it is also possible to use other logarithmic response sections such as the logarithmic response section 310 described with reference to FIG. 6.

6.1 Configuration Example of Response Circuit

Figure 58:
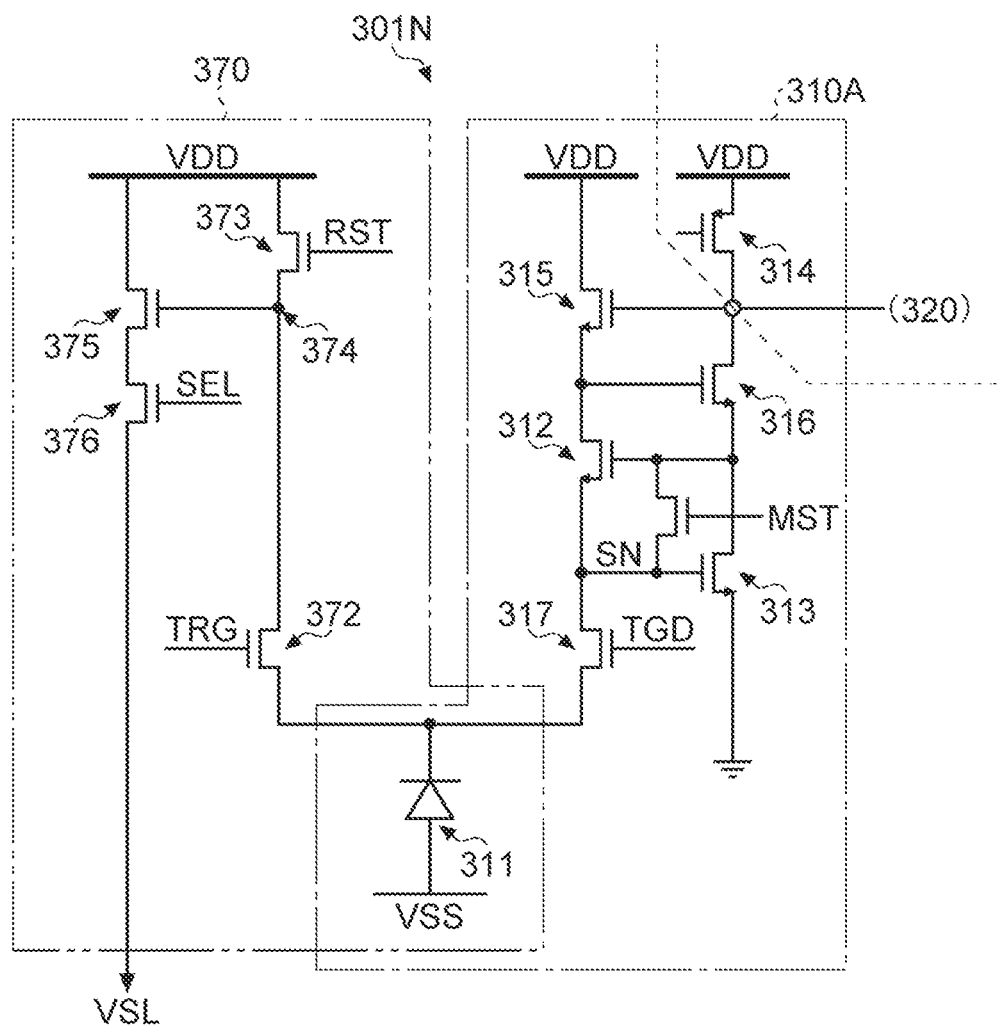
FIG. 58 is a circuit diagram illustrating a configuration example of a response circuit according to a sixth embodiment.

FIG. 58 is a circuit diagram illustrating a configuration example of a response circuit according to the present embodiment. As illustrated in FIG. 58, a response circuit 301N according to the present embodiment has a configuration similar to the configuration of the response circuit 301A described with reference to FIG. 21 in the first embodiment, for example, in which the control transistor 318 is connected between the gate of the nMOS transistor 312 and the gate (corresponding to the sense node SN) of the nMOS transistor 313 constituting the logarithmic conversion circuit.

6.2 Action and Effects

In the above configuration, when the control transistor 318 is turned on, the SN potential of the sense node SN can be determined by the bias current BIAS flowing through the nMOS transistor 313. Therefore, in the present embodiment, for example, at the time of transition from the CIS mode to the EVS node or at the time of switching between the all-pixel mode and the binning mode, the control transistor 318 is turned on in a state where the supply of the bias current BIAS to the nMOS transistor 313 is turned off, and then the switching transistor 317 is turned on in a state where the control transistor 318 is turned on. This makes it possible to have an SN potential lower than the SN potential at normal operation, leading to suppression of the dead period due to the voltage level of the voltage signal VPR stuck to the ground potential (GND). When the EVS mode is started, the supply of the bias current BIAS to the nMOS transistor 313 is started.

Since other configurations, operations, and effects may be similar to those in the above-described embodiment, detailed description thereof will be omitted here. Furthermore, the configuration according to the present embodiment may be appropriately combined with the above-described embodiment and/or the embodiment described below.

7. Seventh Embodiment

Figure 59:
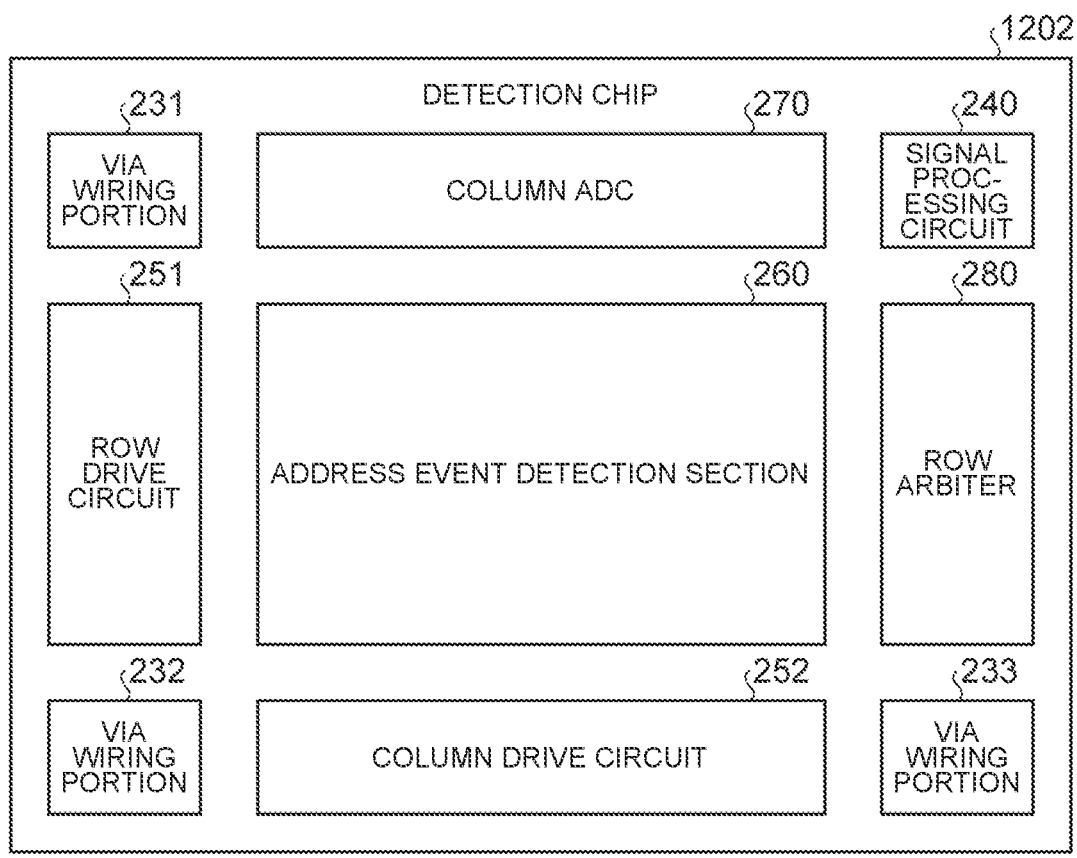
FIG. 59 is a plan view illustrating a schematic configuration example of a detection chip in a solid-state imaging device according to a seventh embodiment.

Although the above-described embodiment is an exemplary case of applying a synchronous EVS that does not require arbitration of a request for requesting readout of a detection signal output from each shared block 221 or the like to the solid-state imaging device 200, the configuration is not limited to such an example. For example, as illustrated as the solid-state imaging device in FIG. 59, it is also allowable to apply an asynchronous EVS including a row arbiter 280 that arbitrates requests output from each row of the address event detection section 260 and determines orders of readout rows of detection signals. Note that FIG. 59 illustrates a detection chip 1202 in the solid-state imaging device according to the present embodiment.

In this manner, even in a case where an asynchronous EVS is applied, it is possible to suppress the dead period at the time of the mode transition to achieve quick mode transition with a configuration and operation similar to those of the above-described embodiment.

Since other configurations, operations, and effects may be similar to those in the above-described embodiment, detailed description thereof will be omitted here. Furthermore, the configuration according to the present embodiment may be appropriately combined with the above-described embodiment and/or the embodiment described below.

8. Eighth Embodiment

When the response circuit 301/801 or the like includes the control transistors 318 and/or 319 as in the above-described embodiment, there will be a need to add wiring lines or the like to the existing response circuit. In that case, the wiring capacitance changes before and after the additional arrangement of the control transistors 318 and/or 319, leading to a possibility of having an impact on quantum efficiency with respect to incident light, operation characteristics of EVS, and the like. In view of this, an eighth embodiment will describe examples of pixel layout capable of suppressing the impact of the quantum efficiency, the operation characteristics, and the like even with additional control transistors 318 and/or 319.

The following description will be a layout example according to the present embodiment as a modification to the basic layout example (refer to FIG. 36 or FIG. 37) in the light receiving section 220 of the shared block 221X exemplified in the first embodiment. Furthermore, the following description will illustrate a schematic layout example on the element formation surface side of the semiconductor substrate on which the photoelectric conversion element 311 is formed, similarly to the description of FIG. 36 or 37 in the first embodiment. In addition, for the sake of clarity, the arrangement of each transistor is indicated by the position of the gate electrode.

8.1 First Layout Modification

Figure 60:
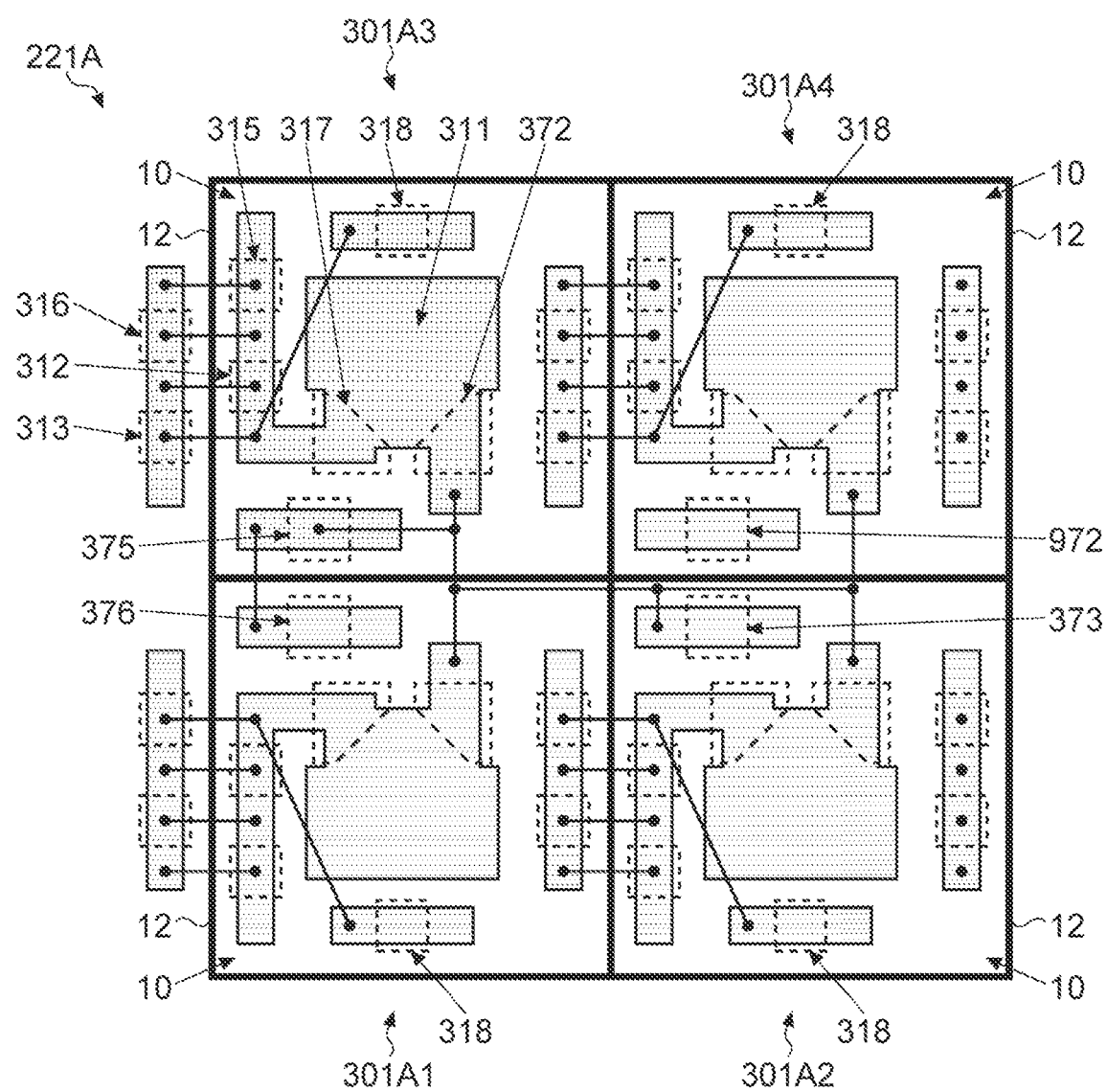
FIG. 60 is a plan view illustrating a layout example of a shared block according to a first layout modification of an eighth embodiment.

In the first layout modification, a layout example of the shared block 221A (refer to FIG. 32) according to the first sharing example of the first embodiment will be described. That is, the first layout modification illustrates a case where each of the response circuits 301A1 to 301A4 includes an individual control transistor 318. FIG. 60 is a plan view illustrating a layout example of the shared block according to the first layout modification.

As illustrated in FIG. 60, in the first layout modification, similarly to the first layout example described above with reference to FIG. 36, the response circuits 301A1 to 301A4 is disposed in the pixel area 10 formed in 2×2 pixel patterns constituting the shared block 221A. The response circuits 301A1 to 301A4 disposed in the individual pixel areas 10 are laid out so as to be symmetric in the vertical direction (For example, the column direction).

In each pixel area 10, the control transistor 318 is disposed close to a peripheral portion of the pixel area 10. In other words, in the first layout modification, the control transistor 318 is disposed in an isolation region that electrically isolates the adjacent photoelectric conversion elements 311 from each other. This makes it possible to dispose the photoelectric conversion element 311 at the center of the pixel area 10, leading to suppression of deterioration in quantum efficiency depending on the incident angle of light. In addition, this arrangement makes it possible to keep a distance between the adjacent photoelectric conversion elements 311, leading to the reduction of color mixing due to leakage of incident light to the adjacent pixel.

Furthermore, in the first layout modification, the reset transistor 373, the amplification transistor 375, and the selection transistor 376 constituting the pixel circuit 370 are arranged at the center of the 2×2 pixel layout constituting the shared block 221A. This arrangement can shorten the length of the wiring connecting the floating diffusion region 374 to the amplification transistor 375 and the reset transistor 373 (and the dummy transistor 972), making it possible to facilitate optimization of the capacitance (FD capacitance) of the floating diffusion region 374.

In the first layout modification, the logarithmic response section 310A illustrated in FIG. 7 is configured by connecting the nMOS transistors 312 and 315 with the nMOS transistors 313 and 316 arranged close to sides facing each other in the adjacent pixel area 10. This also makes it possible to shorten the length of the wiring line connecting the nMOS transistors 312 and 315 with the nMOS transistors 313 and 316, leading to acquisition of an effect such as improvement in operation performance due to a decrease in coupling capacitance.

Other configurations and effects may be similar to those of the layout example described above with reference to FIG. 36 or FIG. 37, and thus, detailed description thereof is omitted here.

8.2 Second Layout Modification

Figure 61:
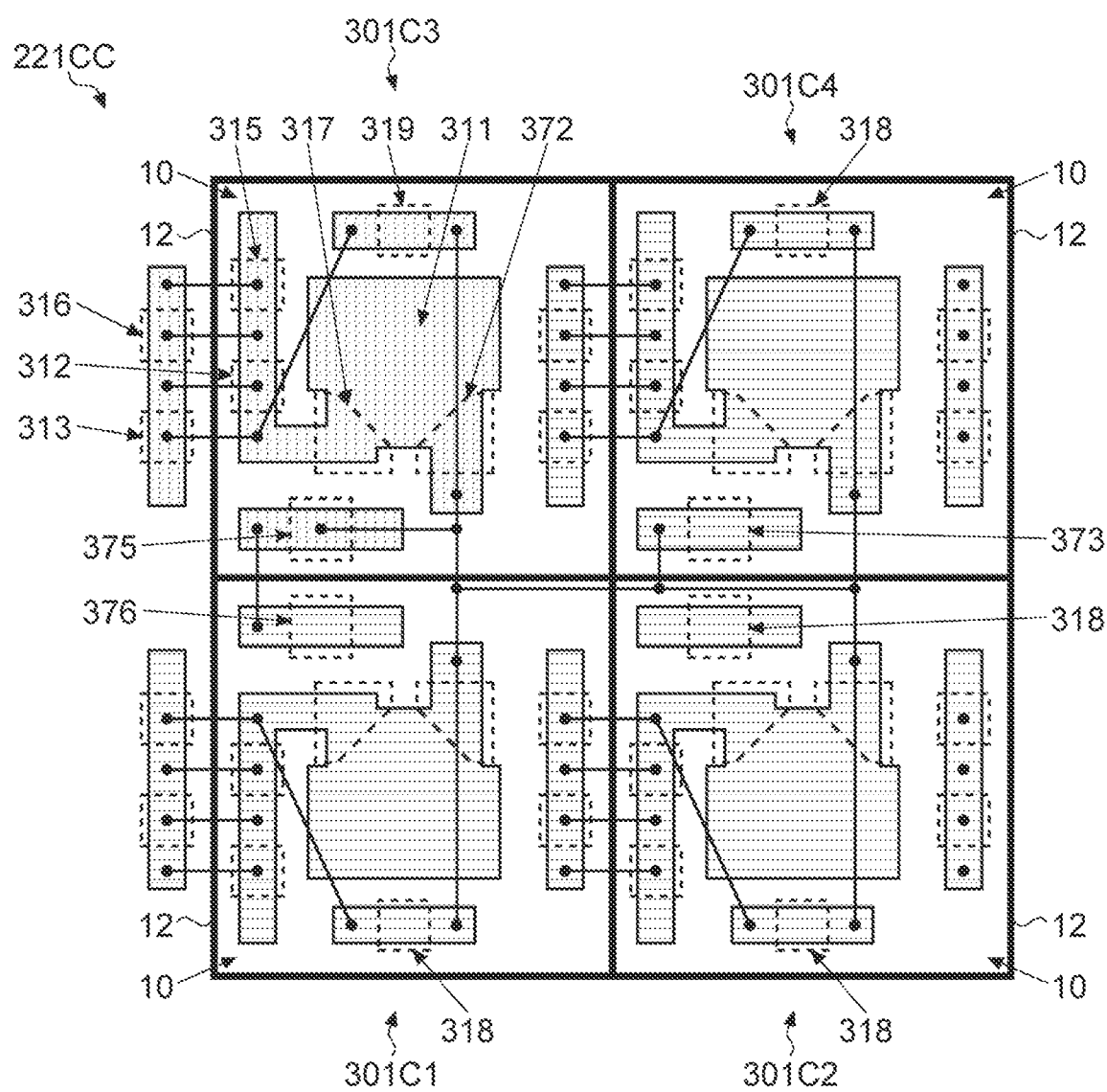
FIG. 61 is a plan view illustrating a layout example of a shared block according to a second layout modification of the eighth embodiment.

In the second layout modification, a layout example of the shared block 221CC (refer to FIG. 35) according to the fourth sharing example of the first embodiment will be described. That is, the second layout modification illustrates a case where the response circuit 301C1 to 301C4 includes the common control transistor 318, and each of the response circuits 301C1 to 301C4 includes the individual control transistor 319. FIG. 61 is a plan view illustrating a layout example of the shared block according to the second layout modification.

As illustrated in FIG. 61, the second layout modification has a layout similar to the first layout modification described above with reference to FIG. 60, in which each control transistor 319 is disposed at the position of each control transistor 318, and the common control transistor 318 is disposed at the position of the dummy transistor 972.

By adopting such a layout, it is possible to achieve effects such as suppression of quantum efficiency deterioration, and reduction of color mixing, similarly to the first layout modification.

Furthermore, the second layout modification has a configuration in which the common control transistor 318 is disposed at the center in the 2×2 pixel layout. Therefore, in the configuration capable of switching between the EVS mode and the CIS mode, it is possible to improve the operation stability at switching between the EVS mode and the CIS mode while suppressing the reduction in the light receiving area, the aperture ratio, the saturation charge amount, and the like, in the photoelectric conversion element 311.

Other configurations and effects may be similar to those of the first layout modification described above with reference to FIG. 60, and thus, detailed description thereof will be omitted here.

8.3 Third Layout Modification

Figure 62:
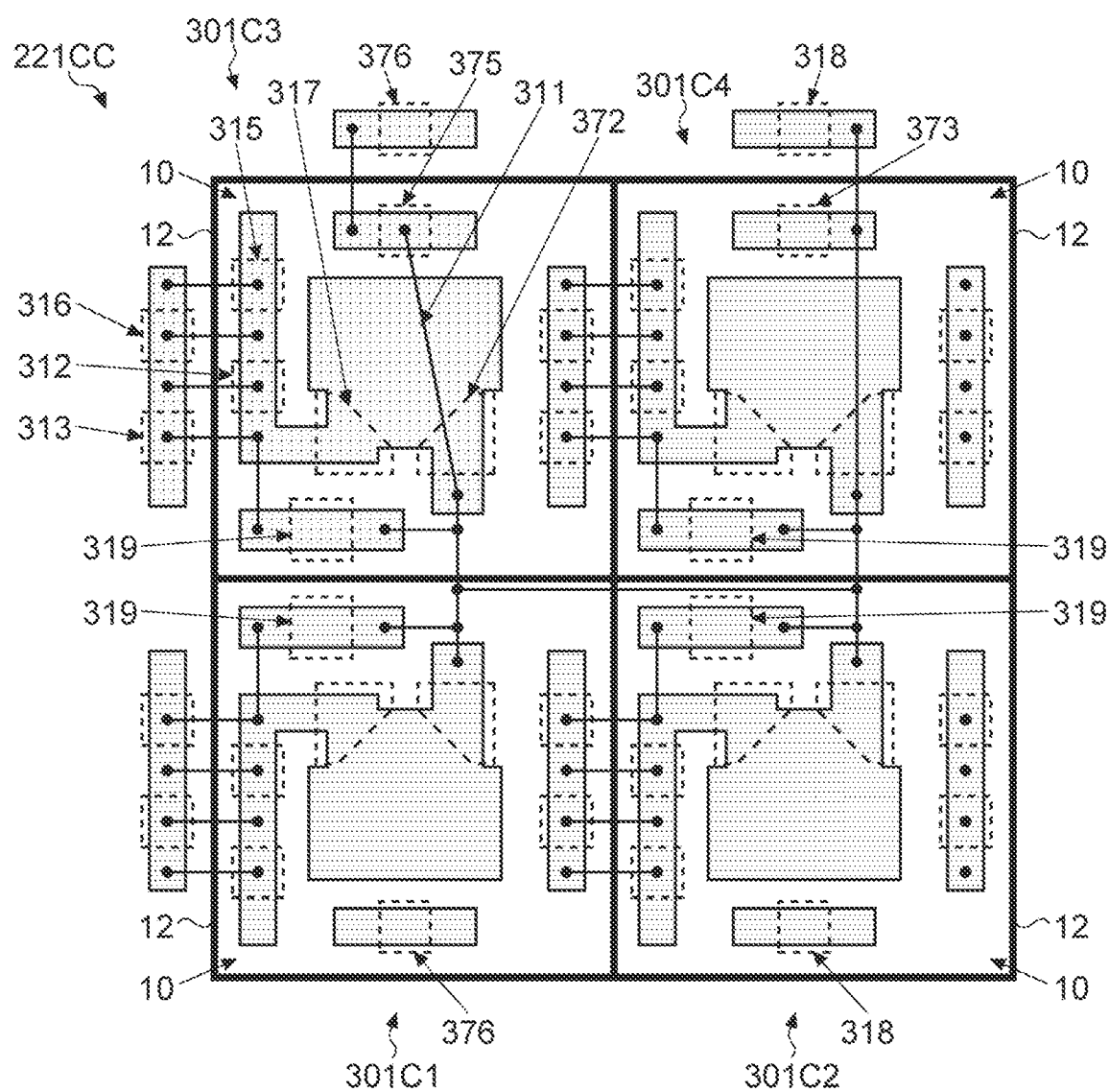
FIG. 62 is a plan view illustrating a layout example of a shared block according to a third layout modification of the eighth embodiment.

In the third layout modification, similarly to the second layout modification, a layout example of the shared block 221CC (refer to FIG. 35) according to the fourth sharing example of the first embodiment will be described. FIG. 62 is a plan view illustrating a layout example of the shared block according to the third layout modification.

As illustrated in FIG. 62, the third layout modification uses a layout similar to the second layout modification described above with reference to FIG. 61, in which the individual control transistors 319 are disposed at the center of the 2×2 pixel layout constituting the shared block 221CC, and the pixel circuit 370 and the control transistor 318 are disposed in a region adjacent to another shared block 221CC.

By adopting such a layout, similarly to the second layout modification, it is possible to improve operation stability at switching between the EVS mode and the CIS mode, and it is possible to achieve effects such as suppression of quantum efficiency deterioration, and reduction of color mixing.

Furthermore, since the individual control transistors 319 are disposed at the center in the 2×2 pixel layout in the third layout modification, it is possible to shorten the wiring length of the sense node SN. This makes it possible to suppress deterioration of latency in the binning mode.

Other configurations and effects may be similar to those of the second layout modification described above with reference to FIG. 61, and thus, detailed description thereof will be omitted here.

8.4 Fourth Layout Modification

Figure 63:
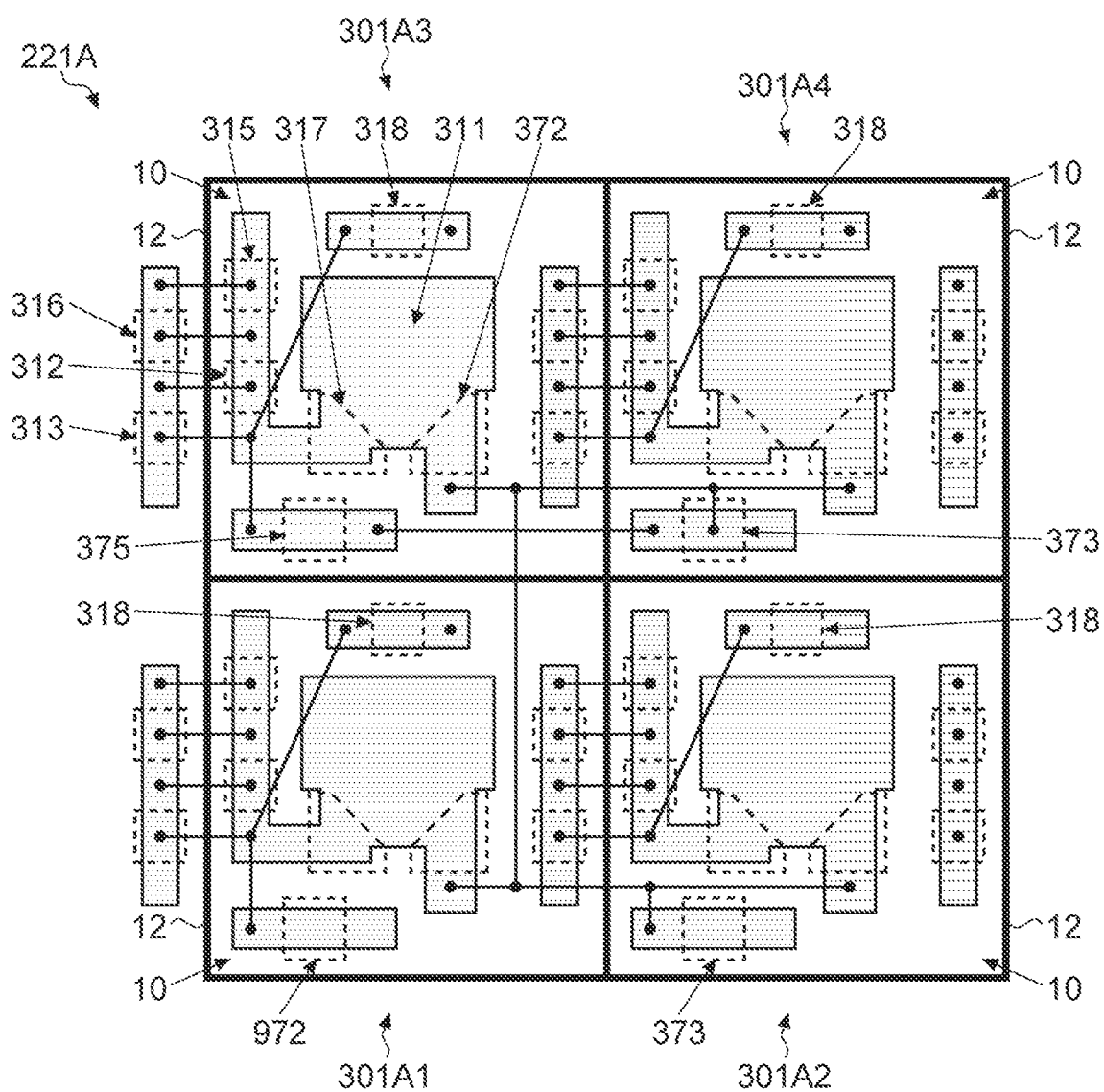
FIG. 63 is a plan view illustrating a layout example of a shared block according to a fourth layout modification of the eighth embodiment.

In the fourth layout modification, similarly to the first layout modification, a layout example of the shared block 221A (refer to FIG. 32) according to the first sharing example of the first embodiment will be described. FIG. 63 is a plan view illustrating a layout example of the shared block according to the fourth layout modification.

As illustrated in FIG. 63, in the fourth layout modification, the response circuits 301A1 to 301A4 disposed in the pixel areas 10 are all laid out so as to face the same direction. That is, in the fourth layout modification, the response circuits of the same layout are periodically arranged in the entire light receiving section 220.

By adopting such a layout, it is possible, in the fourth layout modification, to reduce the misalignment of the photoelectric conversion element 311 with respect to the optical axis of the incident light and the difference between the pixels in the wiring layout, making it possible to reduce the sensitivity difference between the adjacent pixels and the variation in the amount of light leakage to the adjacent pixels, leading to improvement of the uniformity of the pixel sensitivity in the entire light receiving section 220.

Other configurations and effects may be similar to those of the first layout modification described above with reference to FIG. 60, and thus, detailed description thereof will be omitted here.

8.5 Fifth Layout Modification

Figure 64:
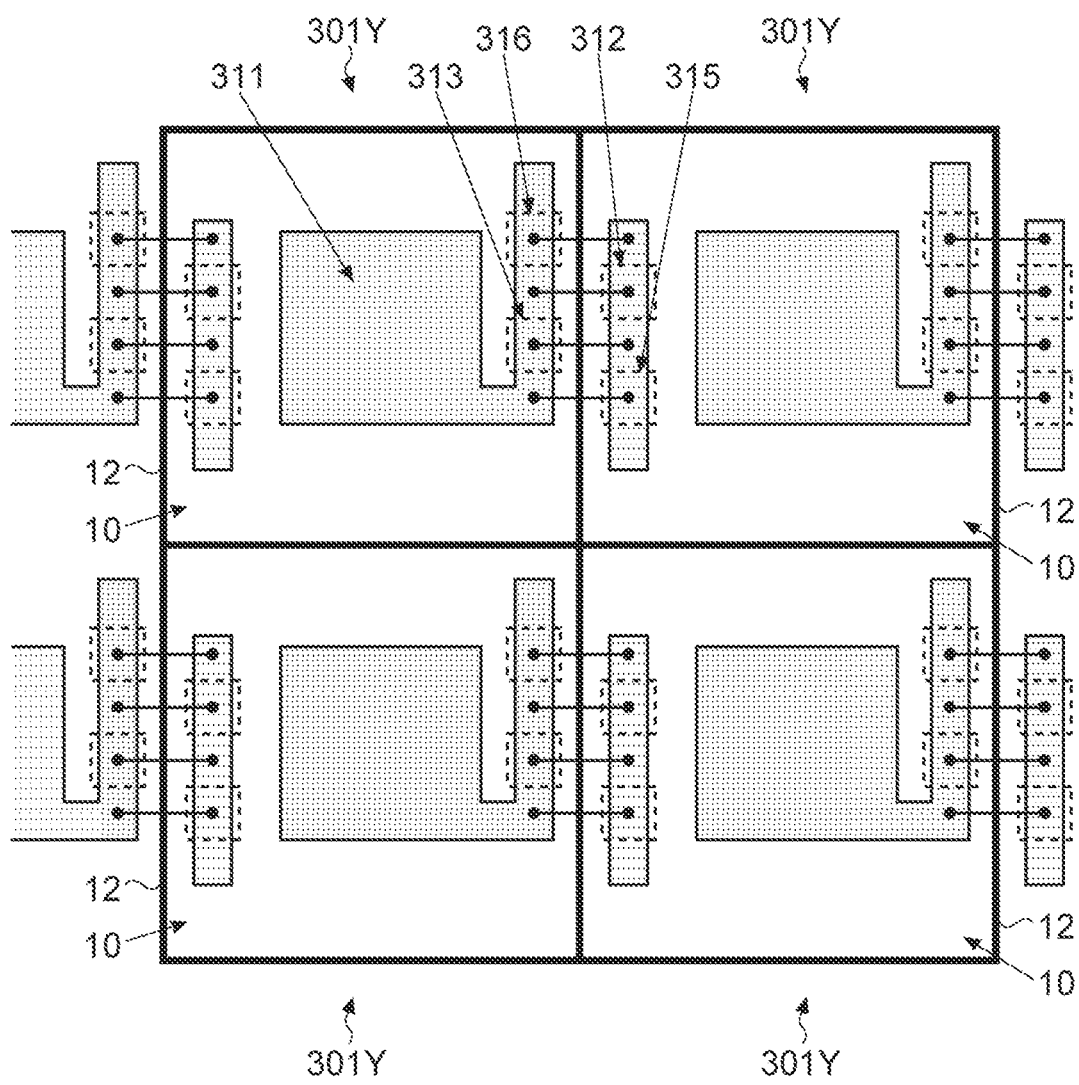
FIG. 64 is a plan view illustrating a layout example of a shared block according to a fifth layout modification of the eighth embodiment.

In a fifth layout modification, a layout example in a case where the pixel circuit 370 is not included in the shared block, that is, in a case where the response circuit is designed as EVS will be described. In this case, a response circuit 301Y (refer to FIG. 64) may include the logarithmic response section 310/310A described with reference to FIG. 7 in the first embodiment. FIG. 64 is a plan view illustrating a layout example of the shared block according to the fifth layout modification.

As illustrated in FIG. 64, in the fifth layout modification, the photoelectric conversion element 311 is disposed at the center of the pixel area 10, with the nMOS transistors 312 and 315, as well as the nMOS transistors 313 and 316, arranged so as to sandwich the photoelectric conversion element 311. One diffusion region of the nMOS transistor 313 is continuous with the photoelectric conversion element 311. Furthermore, one response circuit 301Y is configured by connecting the nMOS transistors 312 and 315 with the nMOS transistors 313 and 316 arranged in two adjacent pixel areas 10.

By adopting such a layout, the response circuits 301Y having the same layout can be periodically arranged with respect to the entire light receiving section 220, and thus, similarly to the fourth layout modification, it is possible to reduce the misalignment of the photoelectric conversion element 311 with respect to the optical axis of the incident light and the difference between the pixels in the wiring layout. This can reduce the sensitivity difference between the adjacent pixels and the variation in the amount of light leaking to the adjacent pixels, making it possible to improve the uniformity of the pixel sensitivity in the entire light receiving section 220.

Other configurations and effects may be similar to those of the layout example described above with reference to FIG. 36 or FIG. 37, and thus, detailed description thereof is omitted here.

8.6 Sixth Layout Modification

Figure 65:
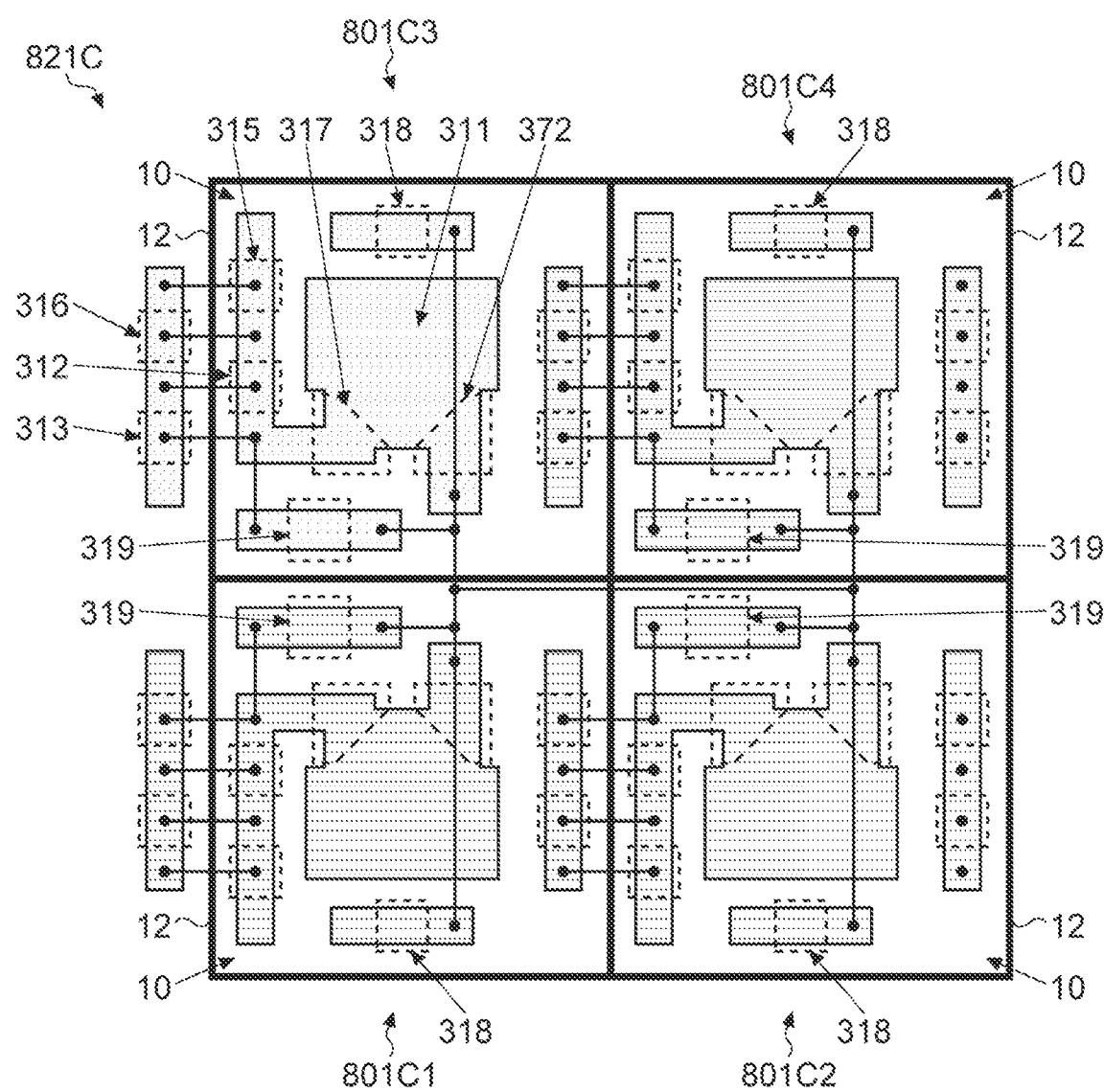
FIG. 65 is a plan view illustrating a layout example of a shared block according to a sixth layout modification of the eighth embodiment.

In a sixth layout modification, a layout example of the shared block 821C (refer to FIG. 55) according to the first sharing example of the fifth embodiment will be described. That is, the sixth layout modification illustrates a case where the shared block 821C is designed as a shared block for EVS, and each of the response circuits 301C1 to 301C4 includes the individual control transistor 318 and the individual control transistor 319. FIG. 65 is a plan view illustrating a layout example of the shared block according to the sixth layout modification.

As illustrated in FIG. 65, the sixth layout modification uses a layout similar to that of the first layout modification described above with reference to FIG. 60, in which individual control transistors 319 are arranged instead of the pixel circuits 370 and the dummy transistors 972.

With such a layout, it is possible to arrange the photoelectric conversion element 311 at the center of the pixel area 10, making it possible to achieve effects such as suppression of quantum efficiency deterioration, and reduction of color mixing. In addition, since the individual control transistors 318 are arranged at the center in the 2×2 pixel layout, it is possible to suppress deterioration of latency in the binning mode due to shortened wiring length of the sense node SN.

Other configurations and effects may be similar to those of the first layout modification described above with reference to FIG. 60, and thus, detailed description thereof will be omitted here.

8.7 Seventh Layout Modification

Figure 66:
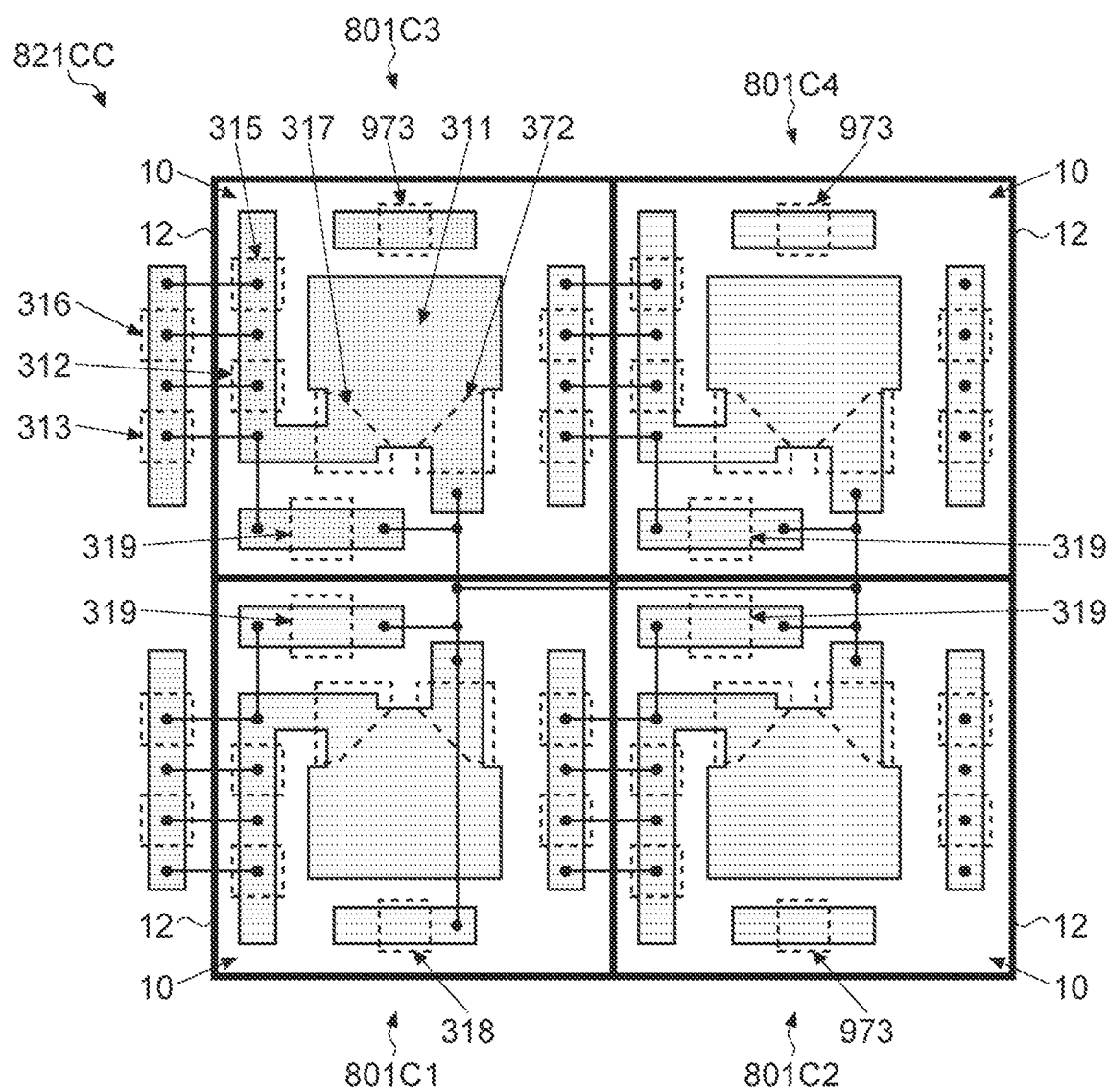
FIG. 66 is a plan view illustrating a layout example of a shared block according to a seventh layout modification of the eighth embodiment.

In the seventh layout modification, a layout example of the shared block 821CC (refer to FIG. 57) according to the third sharing example of the fifth embodiment will be described. That is, the seventh layout modification illustrates a case where the shared block 821C is designed as a shared block for EVS, and each of the response circuit 301C1 to 301C4 includes a common control transistor 318 and an individual control transistor 319. FIG. 66 is a plan view illustrating a layout example of the shared block according to the seventh layout modification.

As illustrated in FIG. 66, the seventh layout modification uses a layout similar to the sixth layout modification described above with reference to FIG. 65, in which three of the four control transistors 318 are replaced with dummy transistors 973. Note that the gate of the dummy transistor 973 may be in an always-off state.

By adopting such a layout, similarly to the sixth layout modification, it is possible to suppress deterioration of latency in the binning mode in addition to effects such as suppression of quantum efficiency deterioration, and reduction of color mixing.

Other configurations and effects may be similar to those of the sixth layout modification described above with reference to FIG. 65, and thus, detailed description thereof will be omitted here.

9. Ninth Embodiment

Next, a ninth embodiment of the present disclosure will be described. In EVS, false detection may occur due to noise even when there is no illuminance change. An occurrence rate of this false detection is referred to as a background rate (BGR). Such BGR is considered to increase when the detection sensitivity of the illuminance change is increased.

For example, in the above-described embodiment, it is known that dominant noise that causes BGR is thermal noise generated in the reset transistor 373, the amplification transistor 375, and the selection transistor 376 constituting the pixel circuit 370, as well as generated in the nMOS transistors 312 and 316 included in the logarithmic conversion circuit. Furthermore, since the BGR is caused by the noise being propagated to the comparator, it can be seen that the frequency bandwidth of the circuit from the pixel to the comparator is a determinant of the BGR.

Since the band is determined by an in-pixel capacitance on the side of the light receiving chip 201 and the bands of the blocks of the source follower (for example, the buffer 330) and the comparison section 500 formed on the side of the detection chip 202, it is also known from the simulation results that the there is a sensitivity to the in-pixel capacitance.

Here, as illustrated in FIG. 18, the EVS according to the above-described embodiment includes: a detection pixel 300 including a logarithmic response section 310/310A, a buffer 330, and a differentiator 340; and a detection circuit 305 including a selection section 400, a comparison section 500, and a transfer circuit 360, for example. For the sake of simplicity, the following will describe an exemplary case of using the logarithmic response section 310A.

The logarithmic response section 310A converts the photocurrent flowing out of the photoelectric conversion element 311 into a voltage signal corresponding to the logarithmic value of the photocurrent and outputs the obtained voltage signal to an output node (referred to as a node N4 (refer to FIG. 7)) connected to the gate of the nMOS transistor 315. Note that the configuration of logarithmic response section 310/310A is not limited to this example. For example, the number of nMOS transistors connected in series is two in the example illustrated in FIG. 6, and three in the example illustrated in FIG. 7. However, the number of nMOS transistors connected in series may be four or more. Furthermore, the number of rMOS transistors connected in series to the photoelectric conversion element 311 may be different from the number of nMOS transistors connected in series opposite thereto.

In the logarithmic response section 310/310A having such a configuration, noise can be generated from the nMOS transistors 312, 313, 315, and 316 constituting the logarithmic conversion circuit. The generated noise is input to the detection circuit 305 through the node N4. Therefore, the detection circuit 305 reacts to voltage fluctuation due to noise, and thus, there is a case where the detection signal is output (false detection) even when there is no change in the incident light amount.

Regarding such a problem, the present inventors have found that the coupling capacitance between the nodes N1 to N4 (refer to FIG. 7) and the coupling capacitance between each of the nodes N1 to N4 and the power supply (VDD, GND, and VSS) are relevant to the BGR.

Therefore, in the present embodiment, the structure and positional relationship between the nodes N1 to M4 and the power supply line are controlled so as to satisfy one or a plurality of the conditions exemplified below. In the present embodiment, it is assumed that the nodes N1 to M4 and the power supply line include two or more wiring layers M1, M2, . . . .

(First Condition)

Each capacitance is formed such that N1-N2 capacitance, N1-N3 capacitance, N1-N4 capacitance, and N3-N4 capacitance formed by a second wiring layer M2 or more are larger than N1-N2 capacitance, N1-N3 capacitance, N1-N4 capacitance, and N3-N4 capacitance formed by the first wiring layer M1 between wiring lines within the same layer.

(Second Condition)

A shield layer is disposed between the N1-N2 capacitance, the N1-N3 capacitance, the N1-N4 capacitance, and the N3-N4 capacitance formed by the second wiring layer or more and the semiconductor substrate on which various transistors are formed, so as to reduce the capacitance between the N1 wiring line/N3 wiring line and the semiconductor substrate. The shield layer may be a wiring line (for example, a power supply line or the like) including another wiring layer, or may be a remaining insulator layer obtained by removing a wiring pattern from another wiring layer.

(Third Condition)

By using a configuration in which the N1-N2 capacitance, the N1-N3 capacitance, the N1-N4 capacitance, and the N3-N4 capacitance are formed with a metal-oxide-metal (MOM) structure such as a comb-tooth structure, or with a metal-insulator-metal (MIM) structure using a wiring layer interlayer insulating film, and by arranging the N4 wiring line on the substrate side, the coupling capacitance (hereinafter, referred to as N4-substrate capacitance) between the node N4 and the semiconductor substrate is to be increased, and the coupling capacitance (hereinafter, referred to as N1-substrate capacitance) between the node N1 and the semiconductor substrate and the coupling capacitance (hereinafter, referred to as N3-substrate capacitance) between the node N3 and the semiconductor substrate are to be reduced. At that time, for example, a first wiring layer or gate electrodes of various transistors may be used for the N4 wiring line.

9.1 Wiring Structure Example

Next, a wiring structure formed to satisfy at least one of the above conditions will be described with some examples. For the sake of simplicity, the following description will excerpt a semiconductor substrate (a semiconductor substrate 1001 to be described below) and a wiring layer (an interlayer insulating film 1010 to be described below) on which the nodes N1 to N4 are disposed. Furthermore, in the present description, the node N1 may represent the sense node SN described above.

Figure 67:
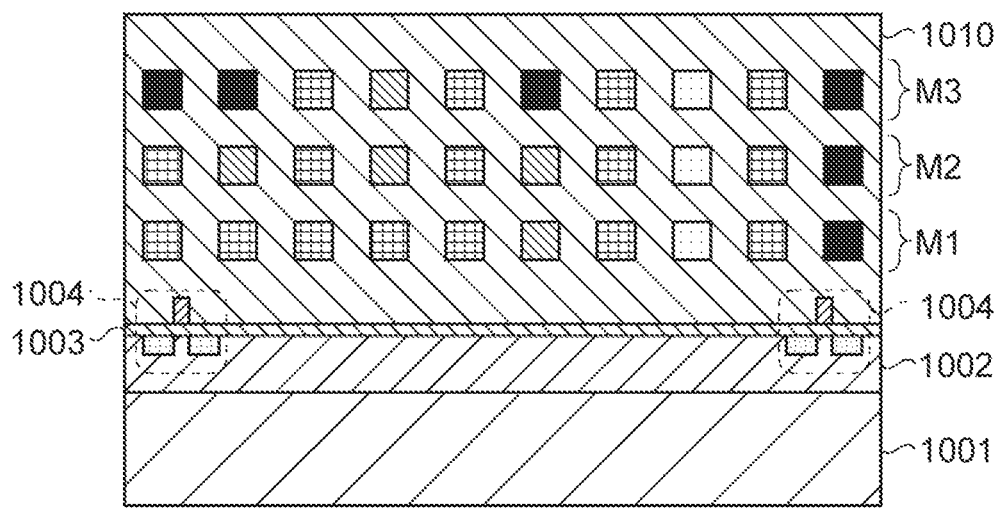
FIG. 67 is a cross-sectional view illustrating a wiring structure according to a first example of a ninth embodiment.
Figure 68:
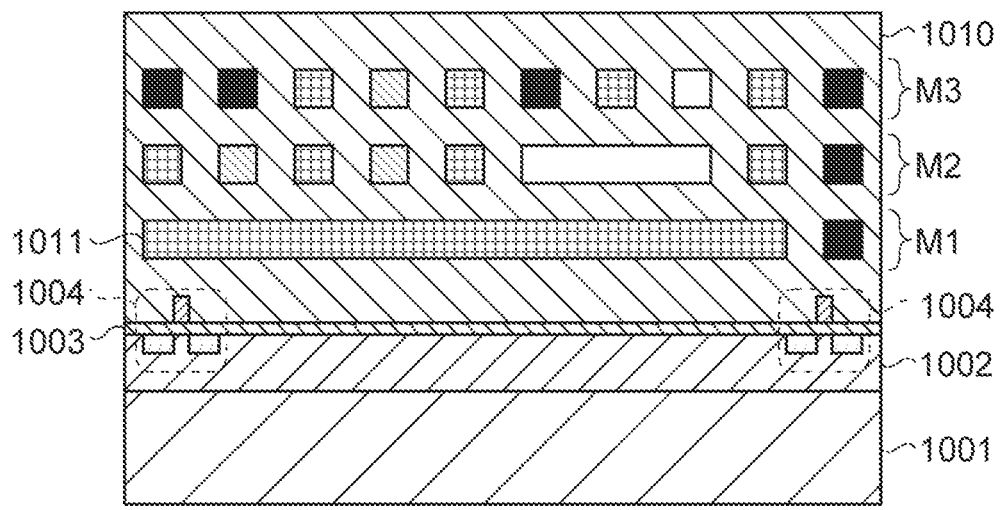
FIG. 68 is a cross-sectional view illustrating a wiring structure according to a second example of the ninth embodiment.
Figure 69:
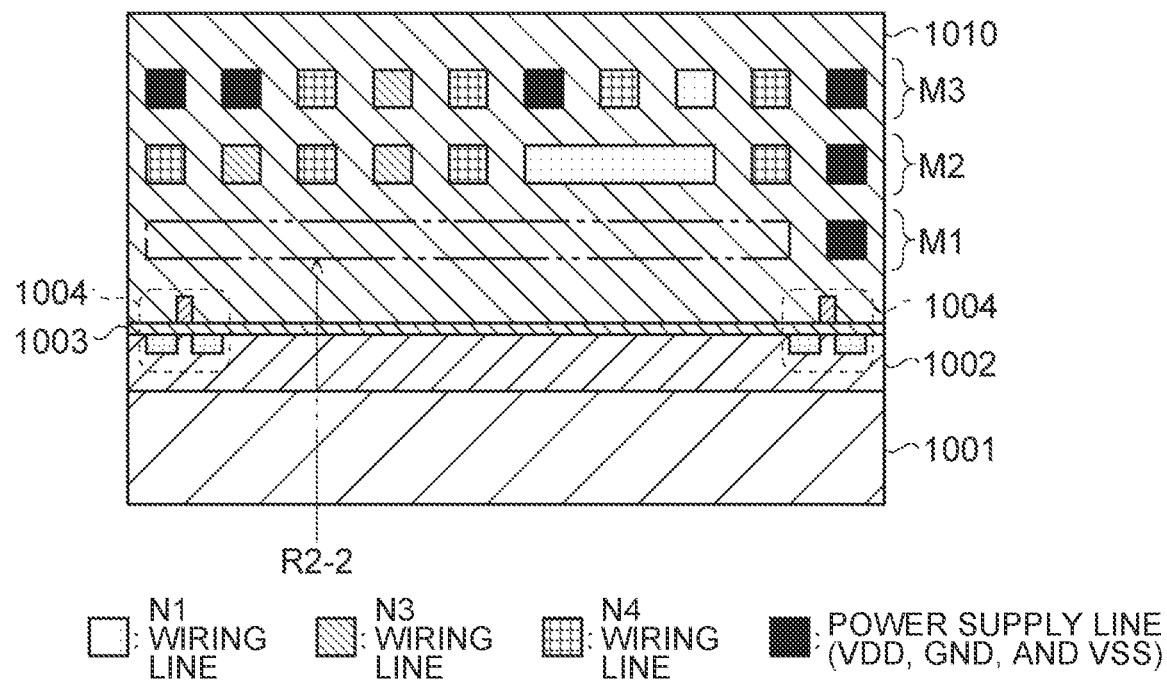
FIG. 69 is a cross-sectional view illustrating a wiring structure according to a third example of the ninth embodiment.
Figure 70:
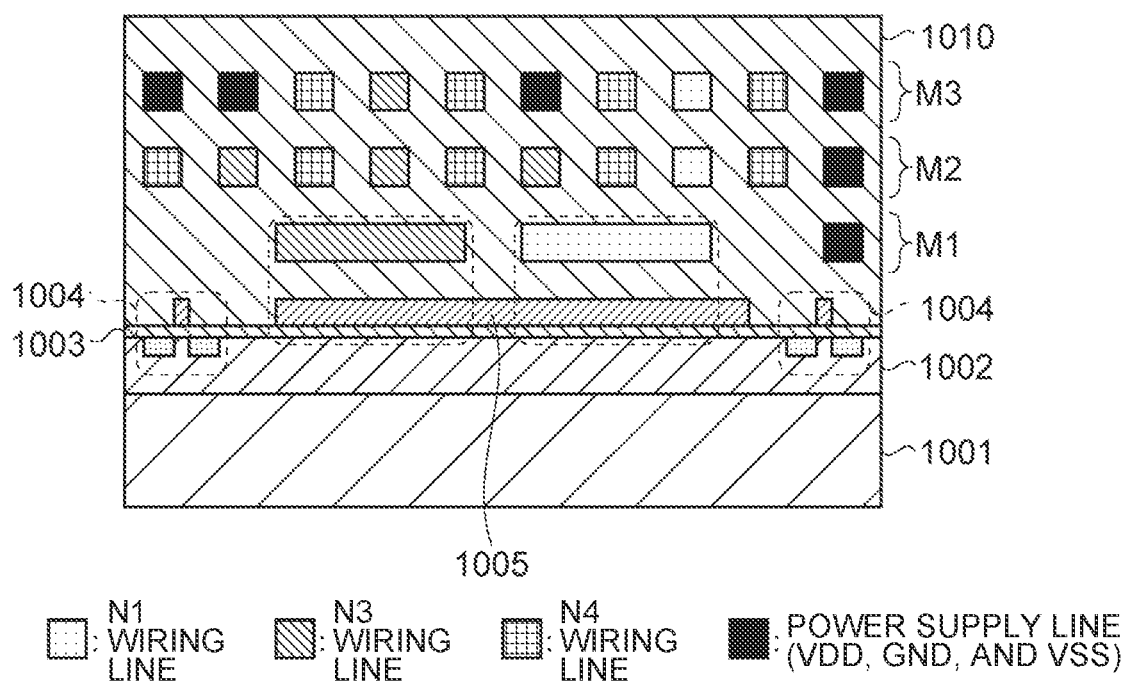
FIG. 70 is a cross-sectional view illustrating a wiring structure according to a fourth example of the ninth embodiment.

FIGS. 67 to 70 are diagrams illustrating examples of a wiring structure designed to satisfy at least one of the above conditions. Specifically, FIG. 67 is a cross-sectional view illustrating a wiring structure according to a first example; FIG. 68 is a cross-sectional view illustrating a wiring structure according to a second example; FIG. 69 is a cross-sectional view illustrating a wiring structure according to a third example; and FIG. 70 is a cross-sectional view illustrating a wiring structure according to a fourth example. In the first to fourth examples, wiring lines (hereinafter, referred to as N1 wiring line, N2 wiring line, N3 wiring line, and N4 wiring line, respectively) and power supply lines (VDD, GND, and VSS) constituting the nodes N1 to N4 are arranged over the three wiring layers M1 to M3. However, FIGS. 67 to 70 are cross sections in which the N2 wiring line is not exposed, and thus, the N2 wiring line is not illustrated.

As illustrated in FIGS. 67 to 70, in the first to fourth examples, various transistors 1004 constituting the pixel circuit 370 and/or the logarithmic response section 310/310A are formed in a well layer 1002 of p-type, which is disposed on an element formation surface side of the semiconductor substrate 1001 across a gate insulating film 1003. On the element formation surface on which the various transistors 1004 are formed, there is an interlayer insulating film 1010 including the N1 wiring line, the N2 wiring line, the N3 wiring line, the N4 wiring line, and power supply lines (VDD, GND, and VSS).

(First Wiring Layer M1)

Among the three wiring layers M1 to M3 provided in the interlayer insulating film 1010, the first wiring layer M1 closest to the semiconductor substrate 1001 is a layer in which the N4 wiring line is mainly disposed. Note that some or all of other wiring lines (N1 to N3 wiring lines, power supply line, and the like) may be disposed in the first wiring layer M1 for the purpose of establishing connection with various transistors 1004 provided on the element formation surface, and the like.

The N4 wiring line disposed in the first wiring layer M1 may have, for example, a comb-tooth structure including two or more comb teeth (hereinafter, referred to as a comb-tooth wiring line) extending in a direction parallel to the element formation surface as in the first example illustrated in FIG. 67, or may be a solid pattern including a main plane parallel to the element formation surface as in the second example illustrated in FIG. 68. However, the configuration is not limited thereto, and it is allowable to have various modifications such as a solid pattern partially having a comb-tooth structure, an opening, and the like.

In this manner, by disposing the N4 wiring line in the first wiring layer M1 closest to the semiconductor substrate 1001, it is possible to increase the coupling capacitance (N4-substrate capacitance) of the N4 wiring line and the semiconductor substrate 1001 (including well layer 1002; the same shall apply hereafter). In addition, since the N4 wiring line can function as a shield layer with respect to other wiring lines formed in the second wiring layer M2 or more, it is possible to suppress an increase in coupling capacitance (N1-substrate capacitance, N2-substrate capacitance, and N3-substrate capacitance) between the N1 to N3 wiring lines and the semiconductor substrate 1001.

However, the configuration is not limited thereto, and as in the third example illustrated in FIG. 69, it is allowable to adopt a configuration in which the N1 to the N4 wiring lines are not disposed in the first wiring layer M1 (refer to a region R2-2). This makes it possible to keep a distance between the N1 to N3 wiring lines formed in the second wiring layer M2 or more and the semiconductor substrate 1001, leading to suppression of an increase in coupling capacitance between the N1 to N3 wiring lines and the semiconductor substrate 1001.

In addition, when the gate electrode 1005 provided on the semiconductor substrate 1001 is used as the node N4 as in the fourth example illustrated in FIG. 70, other wiring lines (N1, N2, and N3 wiring lines) may be arranged in a region on the gate electrode 1005 in the first wiring layer M1, and the N1-N4 capacitance and the N3-N4 capacitance may be formed by the MIM capacitance.

(Second Wiring Layer M2)

One or more wiring lines mainly selected from the N1, N2, and N3 wiring lines may be disposed in the second wiring layer M2 above the first wiring layer M1. However, some or all of other wiring lines (N4 wiring line, power supply line, or the like) may be disposed in the second wiring layer M2 according to the purpose such as adjusting the coupling capacitance between the wiring lines. For example, as illustrated in FIGS. 67 to 70, by arranging the comb-tooth wiring line forming the N4 wiring line between the comb-tooth wiring lines each constituting the N1 wiring line, the N2 wiring line, and the N3 wiring line, the comb-tooth capacitance is formed between the N1 wiring line, the N2 wiring line, and the N3 wiring line, and the N4 wiring line, making it possible to increase the N1-N4 capacitance, the N2-N4 capacitance, and the N3-N4 capacitance.

In the second example illustrated in FIG. 68, the MIM capacitance may be formed between the N1 wiring line disposed in the second wiring layer M2 and the N4 wiring line disposed in the first wiring layer M1. In addition, in the fourth example illustrated in FIG. 70, the MIM capacitance may be formed between the N3 wiring line disposed in the second wiring layer M2 and the gate electrode 1005 disposed in the first wiring layer M1, and between the N1 wiring line disposed in the second wiring layer M2 and the gate electrode 1005 disposed in the first wiring layer M1.

(Third Wiring Layer M3 and Higher Layers)

When the third wiring layer M3 and higher wiring layers are to be disposed on the second wiring layer M2, it is allowable, similarly to the second wiring layer M2, to form the comb-tooth capacitance by disposing the N1 to N4 wiring lines and/or the power supply line according to the coupling capacitance required for each of the wiring lines.

At that time, the power supply lines (VDD, GND, and VSS) are preferably disposed on the uppermost layer (in this example, the third wiring layer M3). This allows the power supply line to function as a shield layer against electromagnetic interference from the outside such as the detection chip 202, leading to improved operation stability.

Additionally, an N4 wire may be further disposed on the uppermost layer to form a comb-tooth capacitance between the N4 wire line and the power supply line.

Further, among the comb-tooth capacitances configured as described above, the comb-tooth capacitance configured by the N4 wire and the other wire is preferably configured such that the N4 wire is disposed on the outermost periphery. In addition, a power supply line may be disposed next to the N4 wire located at the outermost periphery.

9.2 Effects

By designing the N1 to N4 wiring lines and the power supply lines (VDD, GND, and VSS) so as to satisfy at least one of the first to third conditions as described above, the following effects can be exhibited.

By disposing the N4 wiring line in the first wiring layer M1 and disposing the comb-tooth capacitance having the N1 to N3 wiring lines as one side electrode in the second wiring layer M2 or higher layers, the first wiring layer M1 can function as a shield layer that shields the electric field between the N1 to N3 wiring lines and the power supply lines (VDD, GND, and VSS). This can decrease the coupling capacitance between the N1 to N3 wiring lines and the semiconductor substrate 1001, making it possible to reduce the BGR.

By disposing the N4 wiring line in the first wiring layer M1 and forming the N4-substrate capacitance with a large area, leading to formation of the N4-substrate capacitance with a large capacitance, making it possible to significantly reduce the BGR.

By arranging the N3-N4 capacitance, the N2-N4 capacitance, the N1-N4 capacitance, the N1-N3 capacitance, the N1-N2 capacitance, and the N4-power supply line capacitance, which are comb-tooth capacitances, in the second wiring layer M2 or higher layers, it is possible to increase these capacitances without increasing the coupling capacitance between the N1 to N4 wiring lines and the semiconductor substrate 1001, leading to the reduction of the BGR.

By arranging the N4 wiring line in the first wiring layer M1 and arranging the N1 to N3 wiring lines in the second wiring layer M2, a coupling capacitance between the N1 to N3 wiring lines and the N4 wiring line is formed by the interlayer insulating film constituting the interlayer insulating film 1010, leading to the reduction of the BGR.

With the outermost periphery of the comb-tooth capacitance formed with the N4 wiring line, the coupling between the N1 wiring to the N3 wiring and the power supply line in the same layer is shielded by the N4 wiring line in the same layer. This makes it possible to increase the N4-power supply line capacitance while reducing the coupling capacitance between the N1 to N3 wiring lines and the power supply line. This makes it possible to reduce the BGR.

9.3 Specific Example of Wiring Layout

Next, a specific layout example of the N1 to N4 wiring lines and the power supply lines (VDD, GND, and VSS) according to the present embodiment will be described. For the sake of simplicity, the following description is focused on the N1 to N4 wiring lines and the power supply lines (VDD, GND, and VSS) arranged for the response circuit 301. Furthermore, the present example will describe an exemplary case where the interlayer insulating film 1010 includes four layers of the first wiring layer M1 to the fourth wiring layer M4.

Figure 71:
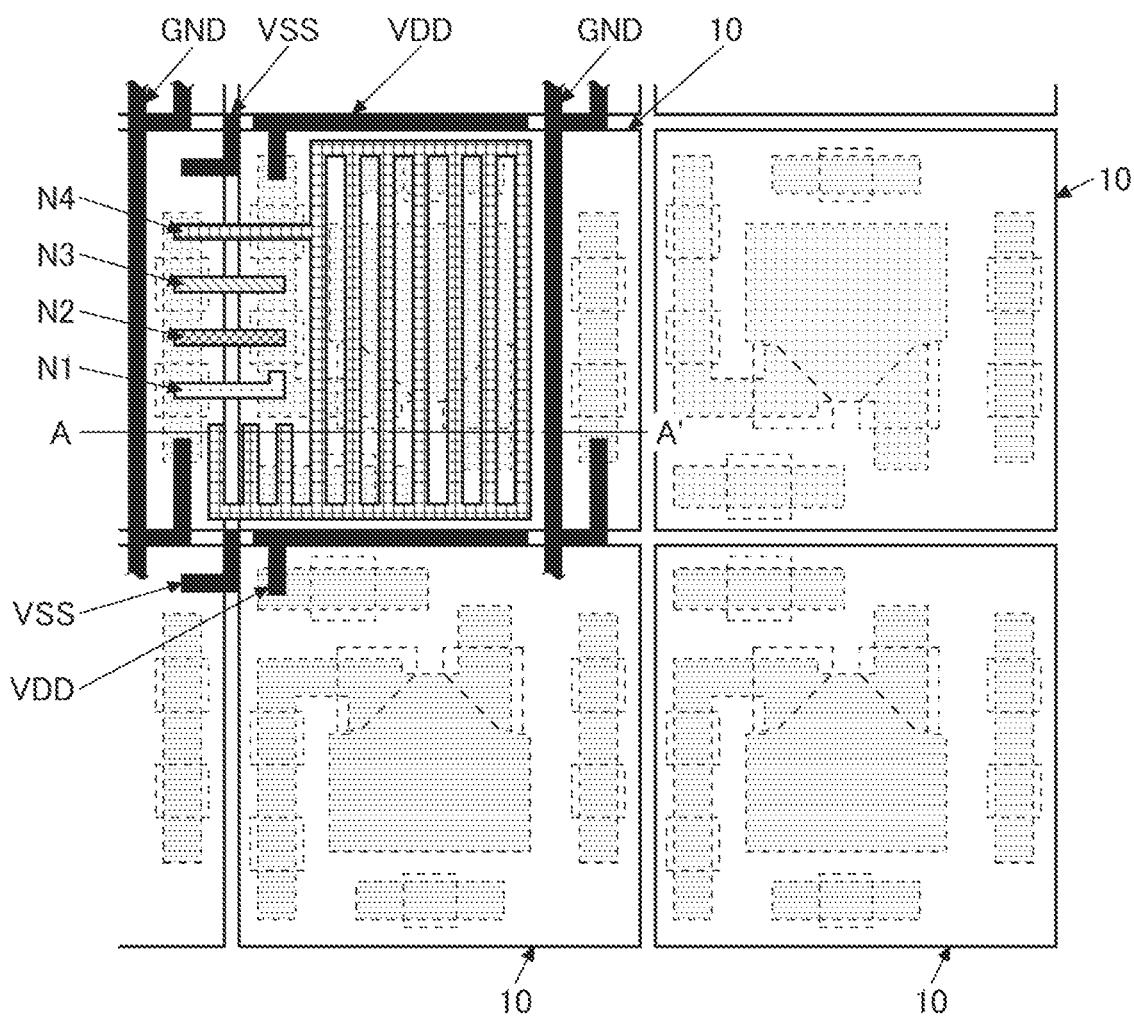
FIG. 71 is a plan view illustrating a wiring layout example of a first wiring layer according to the ninth embodiment.
Figure 72:
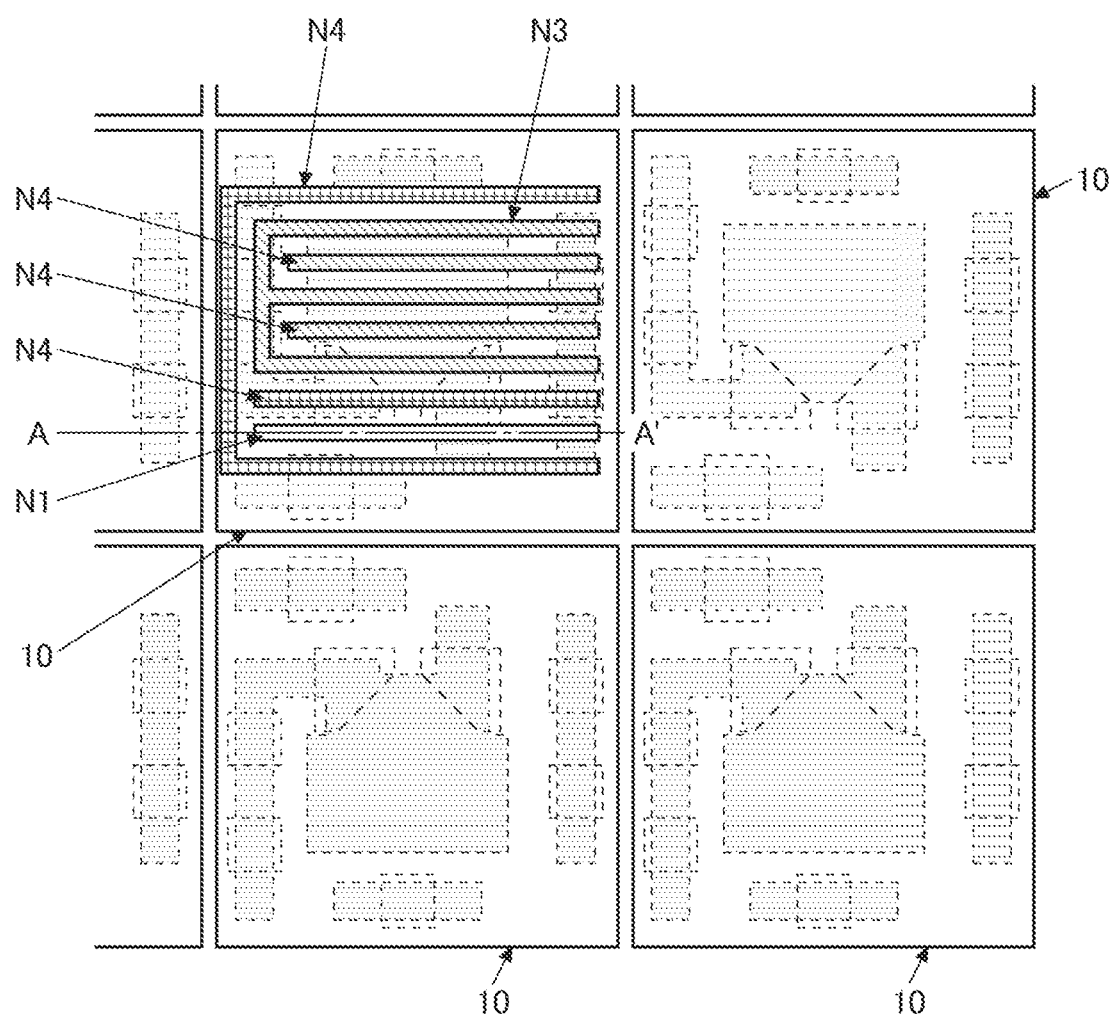
FIG. 72 is a plan view illustrating a wiring layout example of a second wiring layer according to the ninth embodiment.
Figure 73:
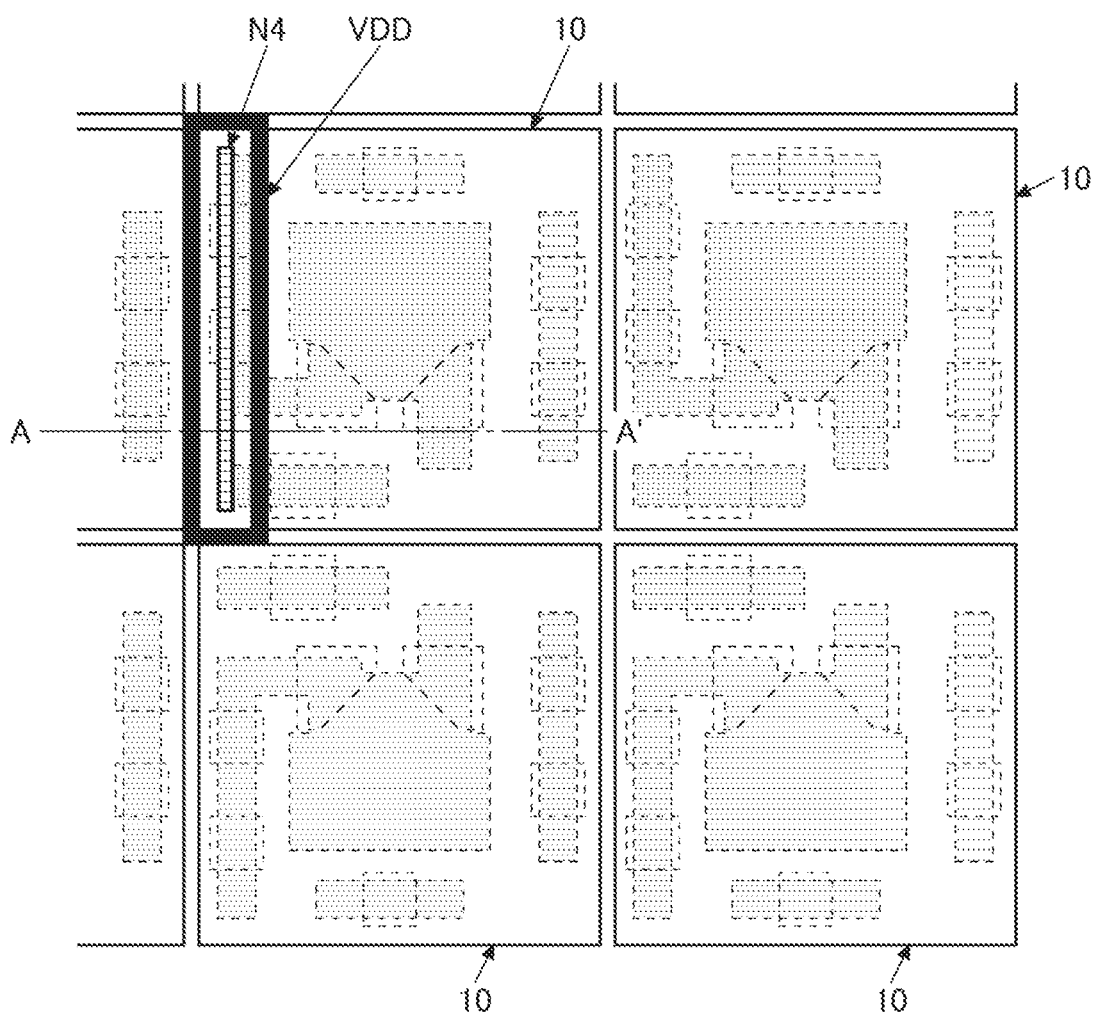
FIG. 73 is a plan view illustrating a wiring layout example of a third wiring layer according to the ninth embodiment.
Figure 74:
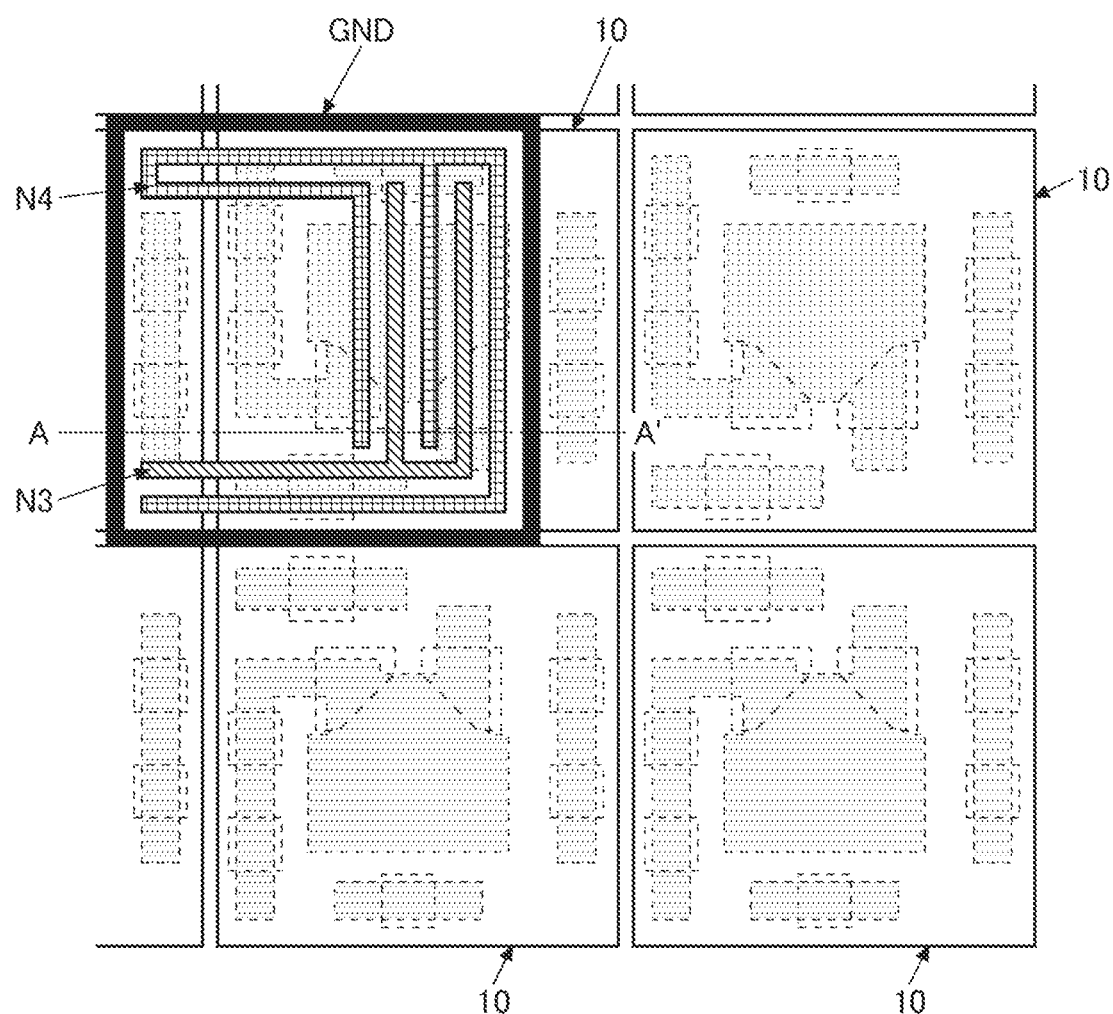
FIG. 74 is a plan view illustrating a wiring layout example of a fourth wiring layer according to the ninth embodiment.
Figure 75:
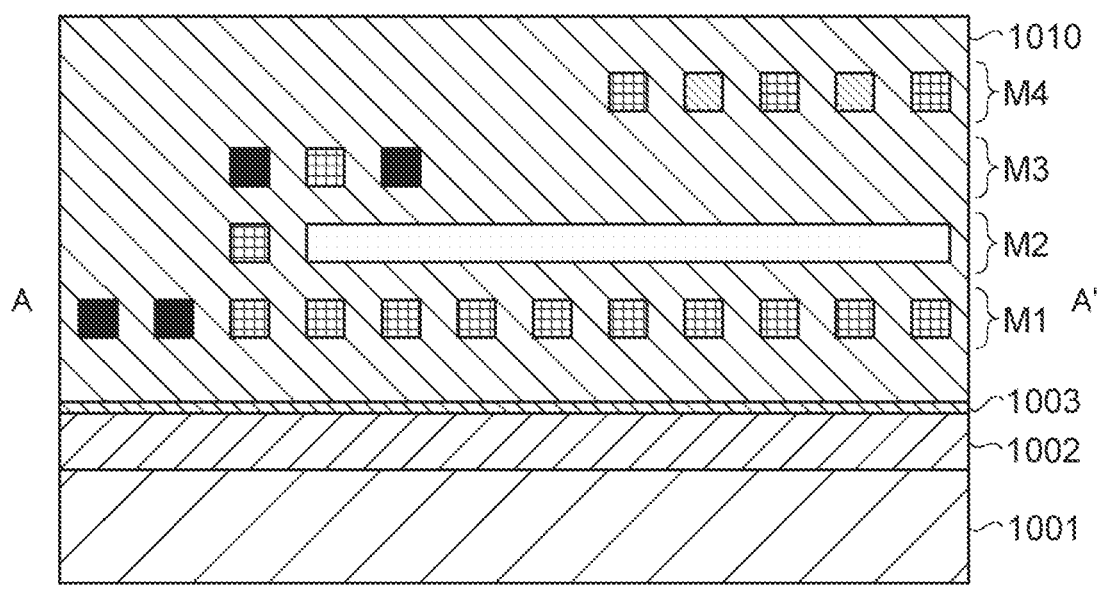
FIG. 75 is a cross-sectional view illustrating a cross-sectional structure example taken along line A-A' in FIGS. 71 to 74.
Figure 76:
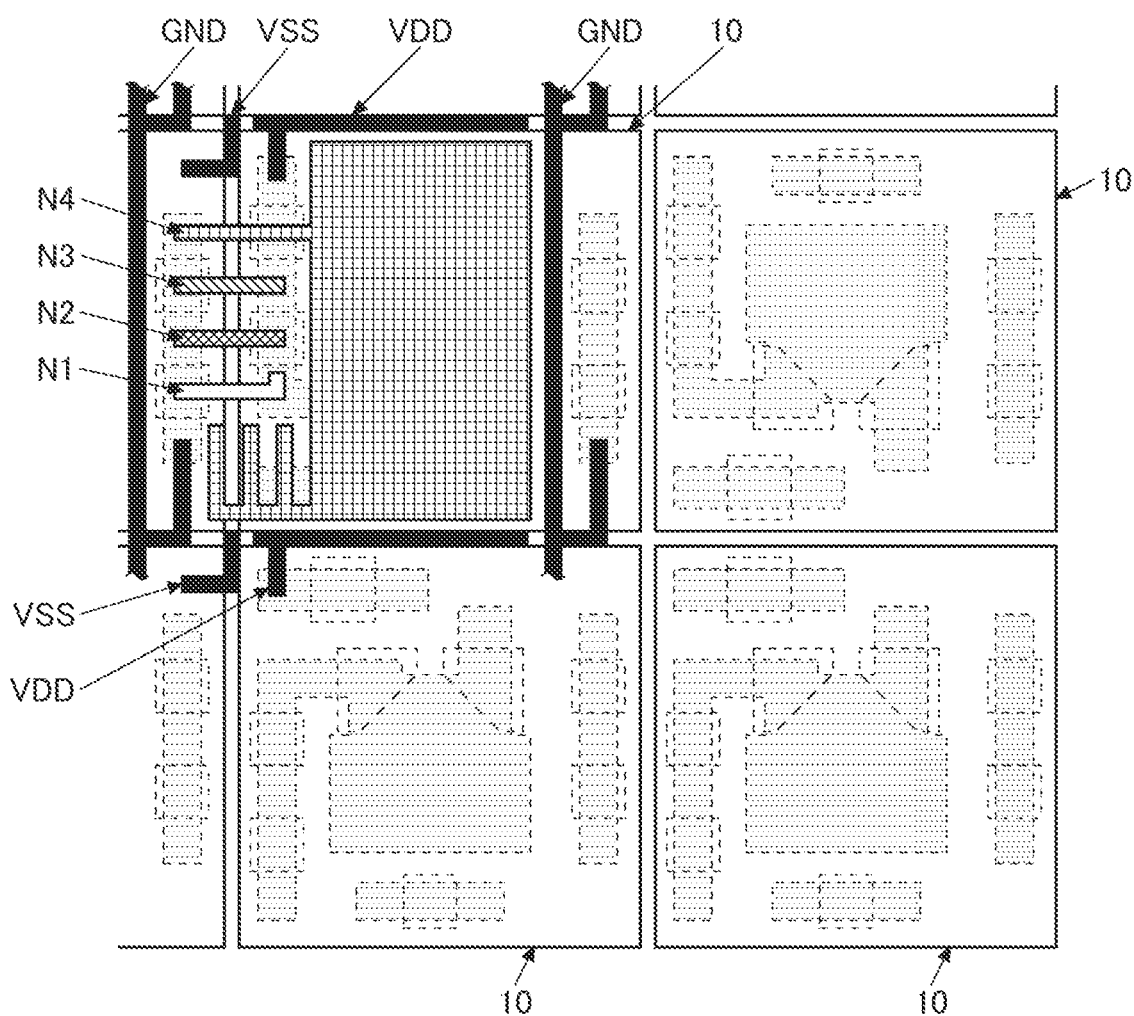
FIG. 76 is a plan view illustrating a wiring layout example of a first wiring layer according to a modification of the ninth embodiment.

FIG. 71 is a plan view illustrating a wiring layout example of the first wiring layer M1; FIG. 72 is a plan view illustrating a wiring layout example of the second wiring layer M2; FIG. 73 is a plan view illustrating a wiring layout example of the third wiring layer M3; and FIG. 74 is a plan view illustrating a wiring layout example of the fourth wiring layer M4. In addition, FIG. 75 is a cross-sectional view illustrating a cross-sectional structure example taken along line A-A' in FIGS. 71 to 74. Furthermore, FIG. 76 is a plan view illustrating a wiring layout example of the first wiring layer M1 according to a modification.

As illustrated in FIGS. 71 to 75, the first wiring layer M1 has a configuration in which the N4 wiring layer having a comb-tooth structure is disposed in most of the region in the pixel area 10, and the power supply lines (VDD, GND, and VSS) are arranged so as to surround the periphery of the N4 wiring line. In the first wiring layer M1, parts of the N1 to N3 wiring lines are arranged in order to be electrically connected to various transistors constituting the response circuit 301.

In the second wiring layer M2, the respective comb-tooth wiring lines are arranged such that the N4 wiring line and the N1 or N3 wiring line are alternately arranged. At that time, an N4 wiring line is arranged on the outermost periphery. In the third wiring layer M3, the power supply line VDD is arranged so as to surround the N4 wiring line.

In the fourth wiring layer M4 which is the uppermost layer, the respective comb-tooth wiring lines are arranged such that the N4 and N3 wiring lines are alternately arranged, and the periphery thereof is surrounded by the power supply line GND.

As illustrated in FIGS. 71 and 72, the extending direction of the comb-tooth wiring lines disposed in a certain wiring layer (the first wiring layer M1 in the present example) and the extending direction of the comb-tooth wiring lines disposed in another wiring layer (second wiring layer M2 in the present example) are preferably not parallel (perpendicular in this example) to each other. With this configuration, the light that has passed through the photoelectric conversion element 311 and entered the interlayer insulating film 1010 can be reflected by the N1 to N4 wiring lines and the power supply line and returned to the photoelectric conversion element 311, leading to improvement in the quantum efficiency.

As illustrated in FIG. 76, the N4 wiring disposed in the first wiring layer M1 may be a solid pattern instead of the comb-tooth structure as described above.

10. Tenth Embodiment

Next, a tenth embodiment of the present disclosure will be described. In the above-described embodiment, when the EVS mode and the CIS mode are simultaneously driven, there is a possibility that the potential of the sense node SN fluctuates due to a potential change of the transfer signal TRG when the transfer transistor 372 of the pixel circuit 370 is driven, and this fluctuation causes false detection and a dead period in the EVS operation. This will be described using a circuit configuration example of a shared block illustrated in FIG. 77 and an example of connecting the transfer transistor 372 and the switching transistor 317 with the drive lines TG11 to TG42 illustrated in FIG. 78. Although a shared block 221Z illustrated in FIG. 77 has a configuration in which the control transistor 318 is omitted from the shared block 221A described above with reference to FIG. 32, this is merely an example, and the configuration of the shared block 221Z is not limited to this example.

Figure 77:
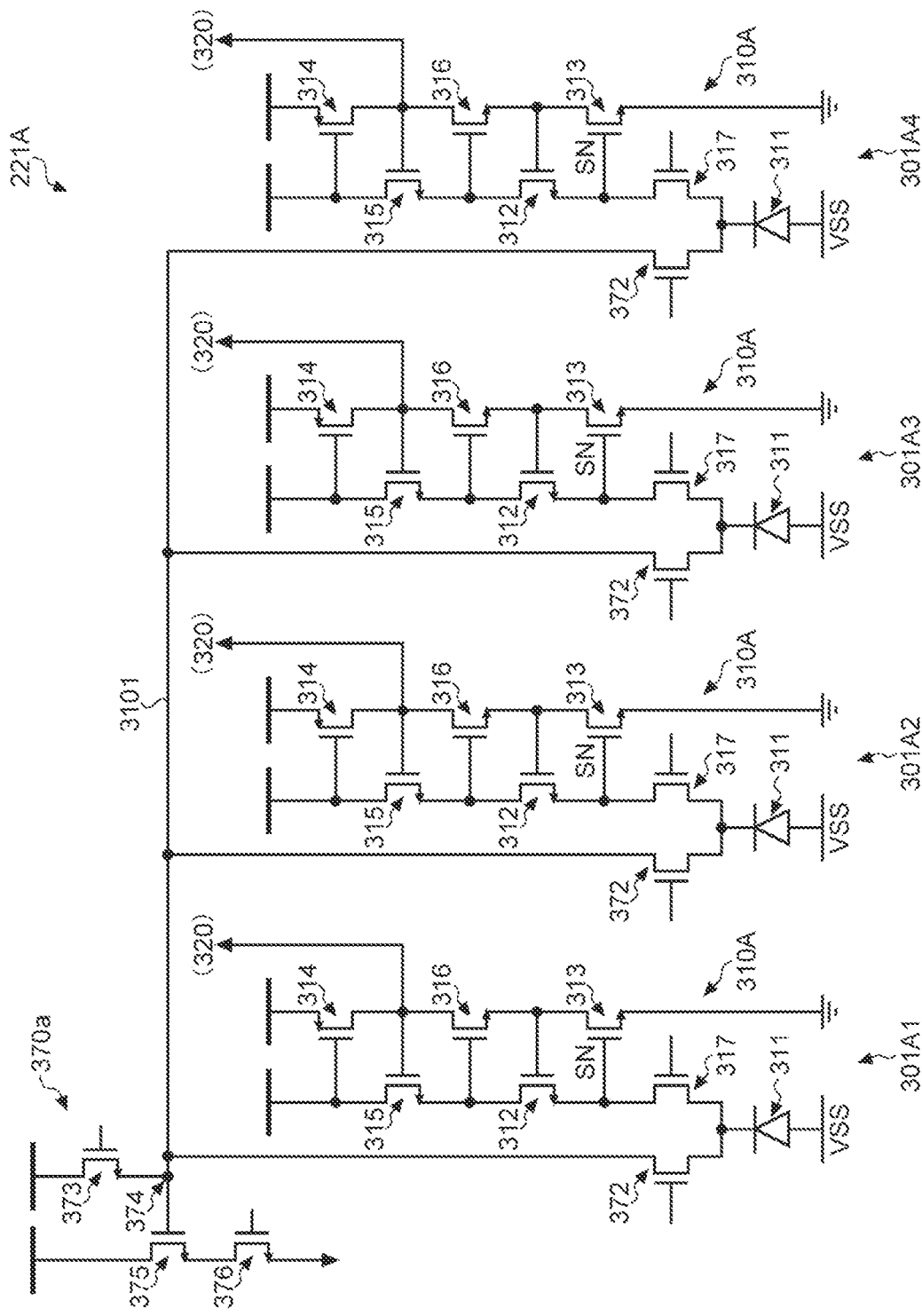
FIG. 77 is a diagram illustrating a circuit configuration example of a shared block illustrated in a tenth embodiment.

As illustrated in FIG. 77, in the hybrid mode in which the EVS mode and the CIS mode are simultaneously driven, one pixel (for example, the response circuit 301A1) among the total of 4 pixels (for example, the response circuit 301A1 to 301A4) of 2×2 pattern constituting the shared block 221X operates in the EVS mode to constantly detect a luminance change, while the remaining three pixels (for example, the response circuit 301A2 to 301A4) operate in the CIS mode to generate a gradation image at a predetermined frame rate. This makes it possible to acquire a gradation image at the moment when a luminance change occurs for the region where the luminance change has been detected in the EVS mode.

Figure 78:
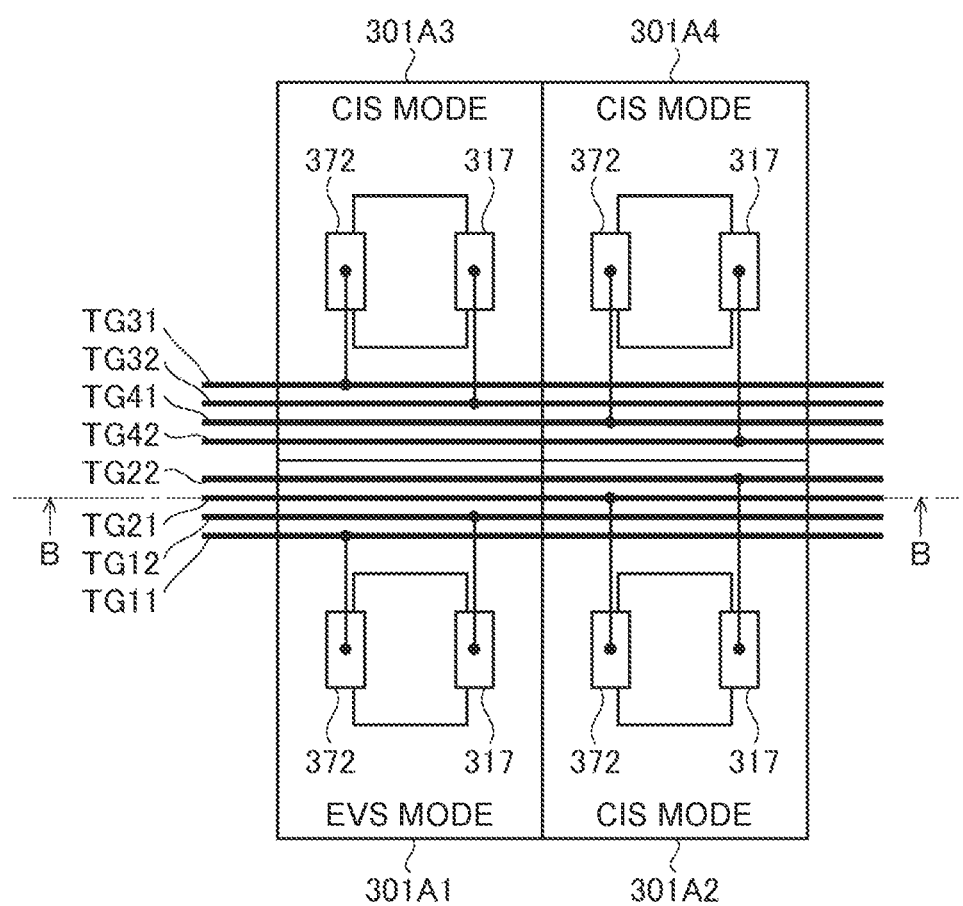
FIG. 78 is a diagram illustrating an example of connection between a transfer transistor/switching transistor and each drive line illustrated in the tenth embodiment.

However, as illustrated in FIG. 78, in the hybrid mode, a transfer signal for transferring a signal charge from the photoelectric conversion element 311 to the floating diffusion region 374 is repeatedly applied, at a predetermined period, to drive lines TG22, TG32, and TG42 connected to the gate of the transfer transistor 372 of the three pixels operating in the CIS mode (response circuit 301A2 to 301A4; hereinafter, the pixel operating in the CIS mode is also referred to as a CIS pixel (corresponding to the gradation pixel described above), while an OFF voltage is constantly applied to a drive line TG12 connected to the gate of the transfer transistor 372 of the pixel operating in the EVS mode (response circuit 301A1; hereinafter, the pixel operating in the EVS mode is also referred to as an EVS pixel (corresponding to the detection pixel described above).

Therefore, when there is a coupling capacitance between the drive lines TG22, TG32, and TG42 connected to the CIS pixels (the response circuit 301A2 to 301A4) and the sense node SN in the EVS pixel (the response circuit 301A1), the SN potential of the sense node SN fluctuates by electrostatic induction according to a potential change of the transfer signal applied to the drive lines TG22, TG32, and TG42. This will have an impact on the operation of the logarithmic response section 310/310A of the EVS pixel similarly to the case where the SN potential fluctuates when the CIS mode transitions to the EVS mode, resulting in possibility of occurrence of false detection or a dead period. Incidentally, such fluctuation of the SN potential of the sense node SN can similarly occur also by a selection signal or a reset signal in addition to the transfer signal, for example.

Therefore, the present embodiment reduces the coupling capacitance between the drive line, each connected to the gate of each of the transfer transistor 372, the selection transistor 376, and the reset transistor 373 of the CIS pixel, and the sense node SN of the EVS pixel, so as to avoid a problem caused by the fluctuation of the SN potential of the sense node SN by the transfer signal.

10.1 Cross-Sectional Structure and Wiring Layout Example

Figure 79:
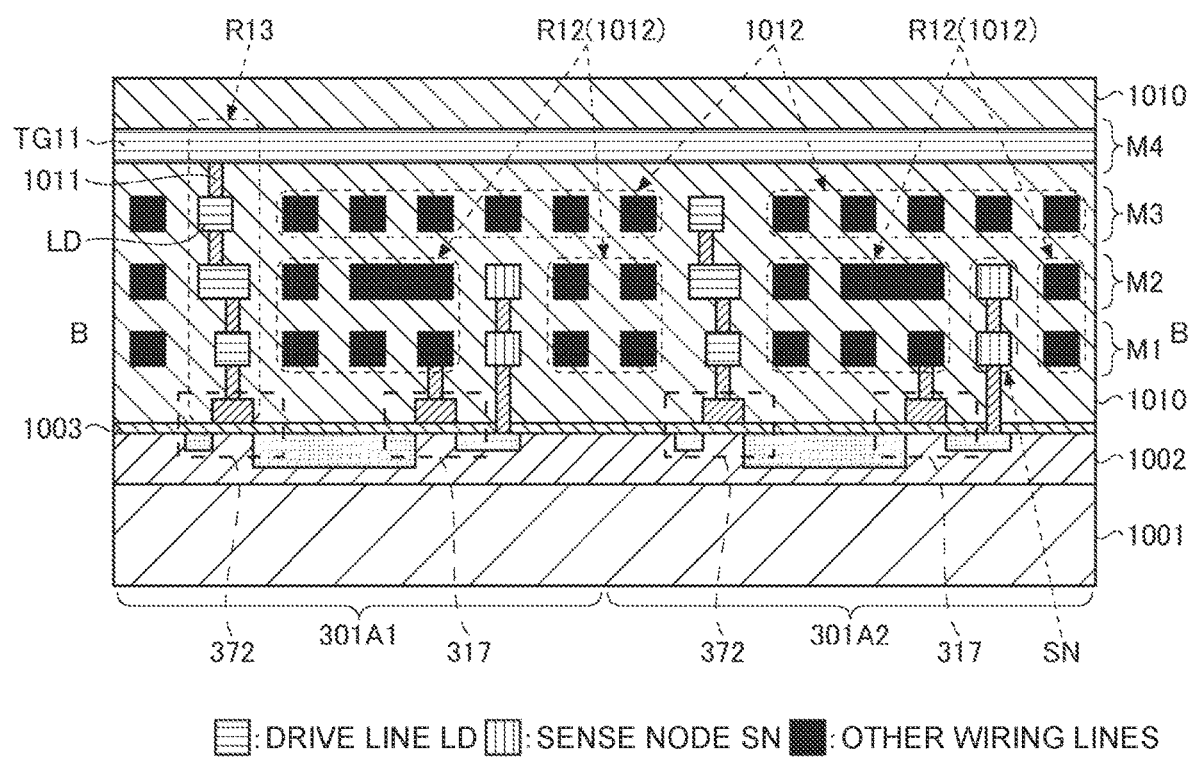
FIG. 79 is a cross-sectional view illustrating an example of a wiring structure according to the tenth embodiment.
Figure 80:
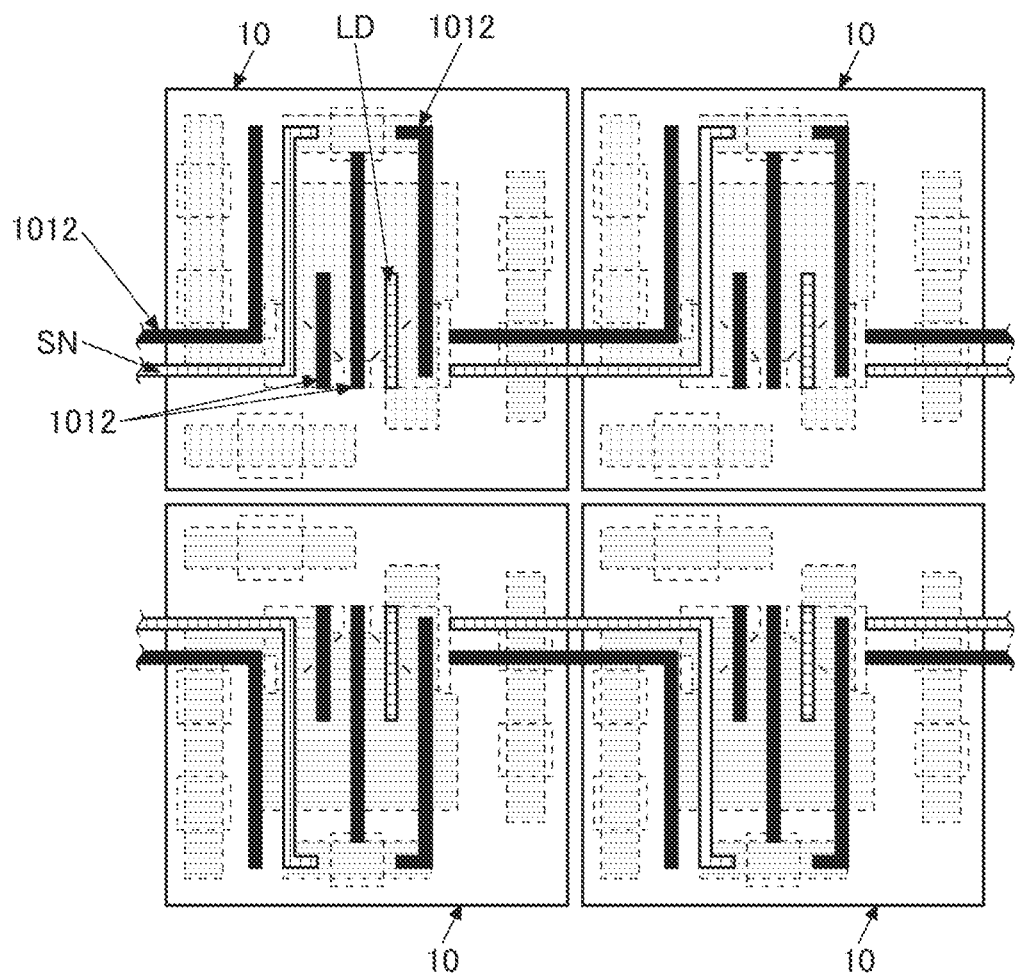
FIG. 80 is a plan view illustrating a wiring layout example of a first wiring layer according to the first embodiment.
Figure 81:
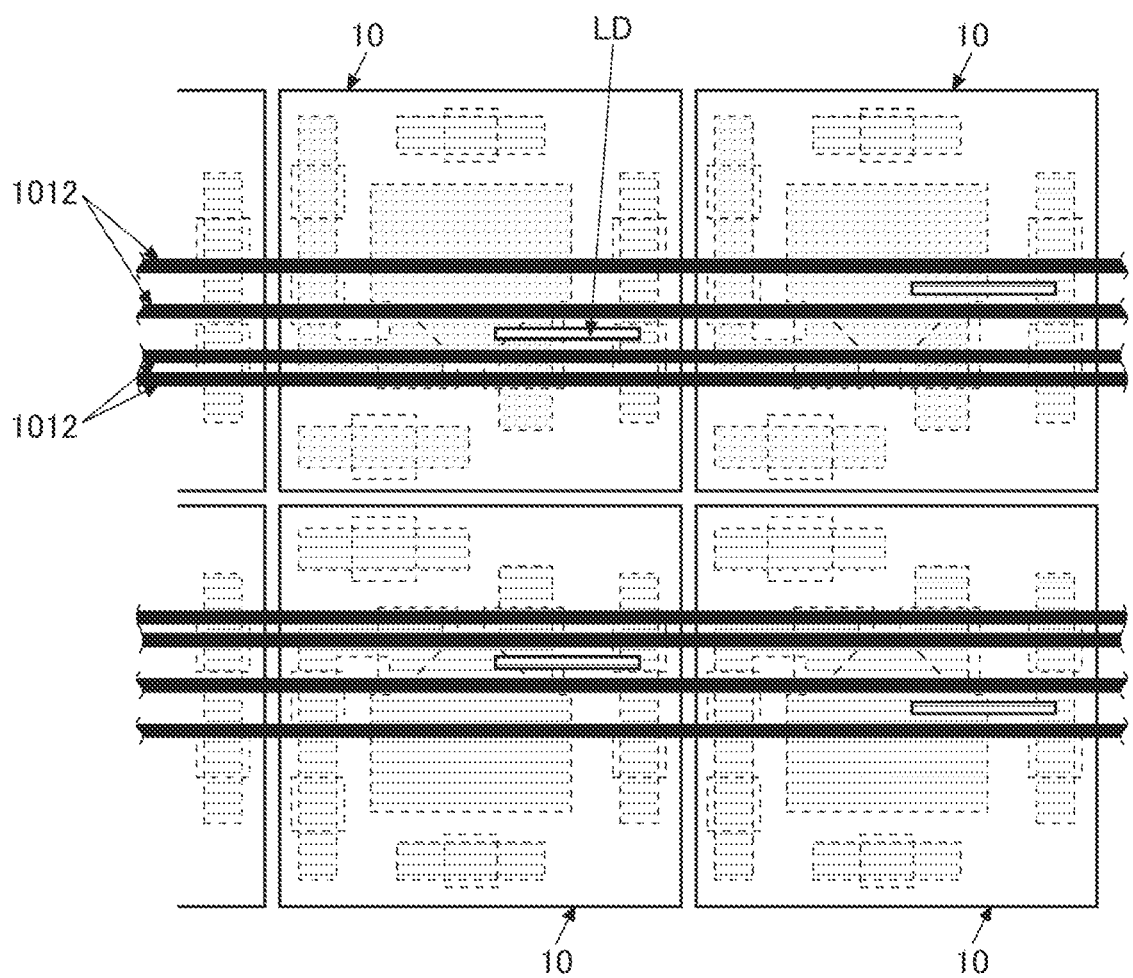
FIG. 81 is a plan view illustrating a wiring layout example of a second wiring layer according to the first embodiment.
Figure 82:
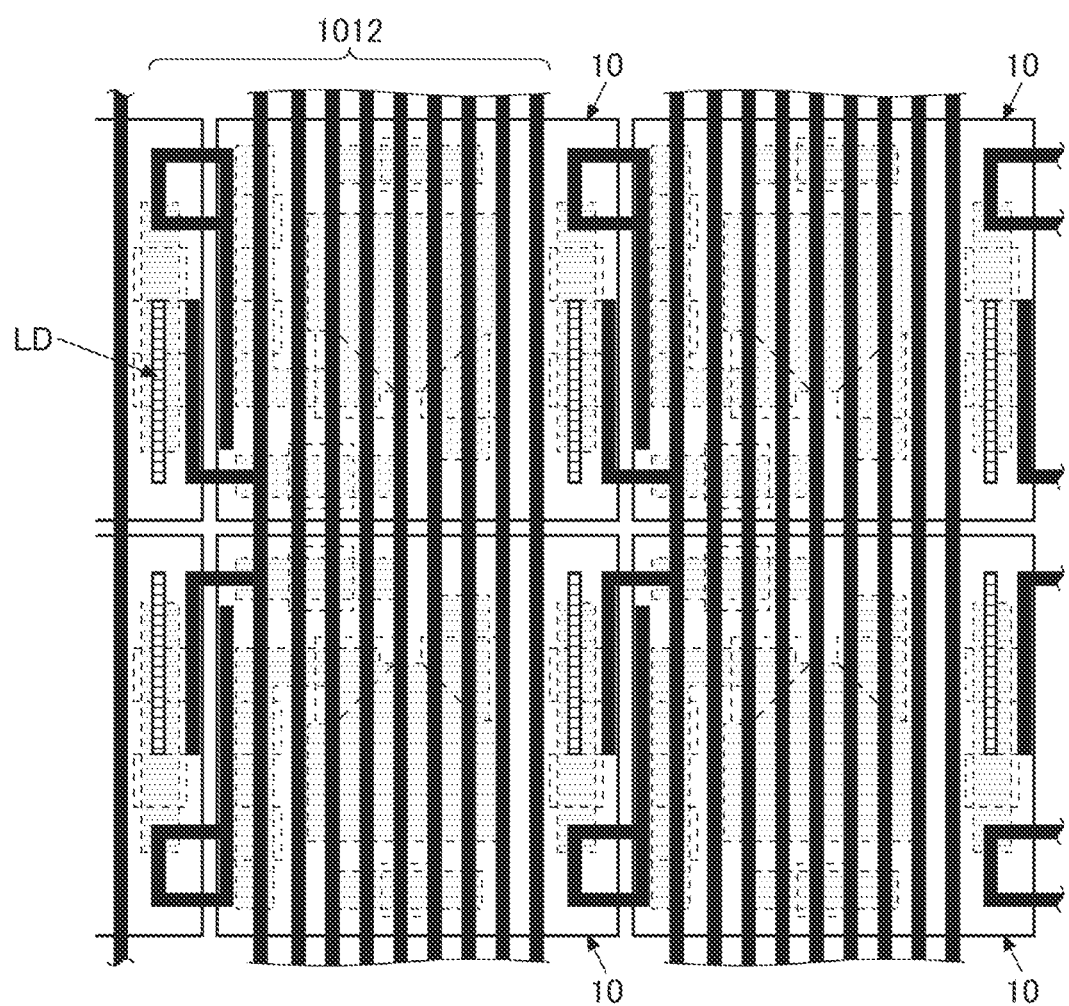
FIG. 82 is a plan view illustrating a wiring layout example of a third wiring layer according to the first embodiment.
Figure 83:
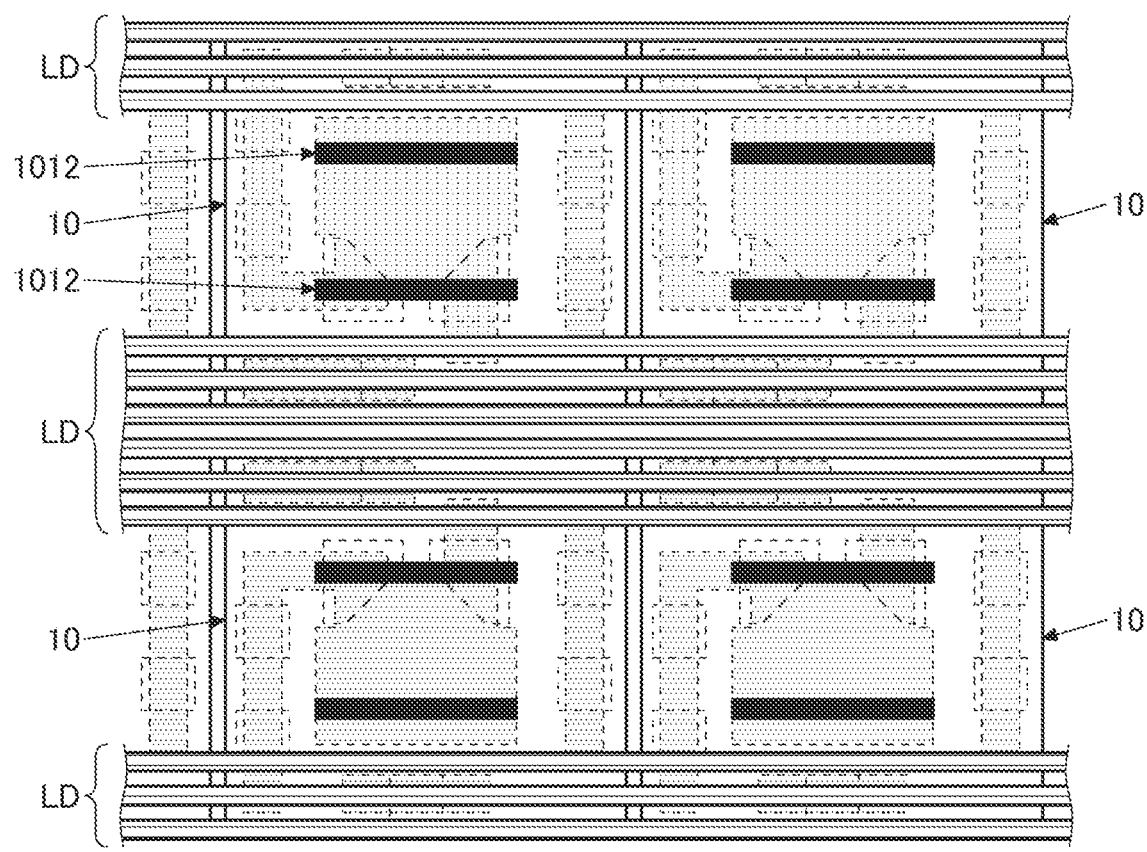
FIG. 83 is a plan view illustrating a wiring layout example of a fourth wiring layer according to the first embodiment.

FIG. 79 is a cross-sectional view illustrating a wiring structure example according to the present embodiment. For simplification of description, FIG. 79 illustrates excerpts of the semiconductor substrate 1001 and the interlayer insulating film 1010 on which the nodes N1 to N4 are arranged. FIG. 80 is a plan view illustrating a wiring layout example of the first wiring layer M1; FIG. 81 is a plan view illustrating a wiring layout example of the second wiring layer M2; FIG. 82 is a plan view illustrating a wiring layout example of the third wiring layer M3; and FIG. 83 is a plan view illustrating a wiring layout example of the fourth wiring layer M2.

As illustrated in FIGS. 79 to 83, in the present embodiment, a drive line LD, which is connected to the gates of the transfer transistor 372, the reset transistor 373, and the selection transistor 376 constituting the pixel circuit 370, is disposed in a wiring layer different from the sense node SN. The examples in FIGS. 79 to 83 illustrate cases where the drive line TG11 of the drive lines LD is disposed in the fourth wiring layer M4 which is the uppermost layer in the interlayer insulating film 1010, and the sense node SN is disposed in the first wiring layer M1 and the second wiring layer M2.

In addition, in the present embodiment, there is a wiring line (hereinafter, also referred to as a shield wiring line) 1012 functioning as an electromagnetic shield, disposed between the drive line LD and the sense node SN. The example in FIG. 79 illustrates a case where the shield wiring line 1012 is disposed in the third wiring layer M3 between the first wiring layer M1 and the second wiring layer M2 in which the sense node SN is arranged and the fourth wiring layer M4 in which the drive line LD is disposed. The shield wiring line 1012 may be, for example, an N2 to N4 wiring lines, power supply lines (VDD, GND, and VSS), or the like.

Furthermore, the drive line LD is connected to the pixel circuit 370 (the transfer transistor 372 in the examples illustrated in FIGS. 79 to 83) provided on the element formation surface of the semiconductor substrate 1001 through a via wiring line 1011 formed in the interlayer insulating film 1010. Accordingly, in a case where the drive line LD is disposed in a wiring layer above the sense node SN, a wiring line (also a part of the drive line LD) connecting the drive line LD and the pixel circuit 370 to each other penetrates through the wiring layer provided with the sense node SN. Therefore, in the present embodiment, in the same layer as the wiring layer provided with the sense node SN, the shield wiring line 1012 functioning as an electromagnetic shield is provided between the drive line LD penetrating the wiring layer and the sense node SN. In the examples illustrated in FIGS. 79 to 83, the shield wiring line is disposed in a region R12 between the drive line LD, which is in a region R13 and connects the drive line TG11 of the fourth wiring layer M4 and the gate of the transfer transistor 372 in the response circuit 301A1 to each other, and the sense node SN in the other response circuit 301A2 (and 301A3, 301A4). The shield wiring line may be, for example, an N2 to N4 wiring lines, power supply lines (VDD, GND, and VSS), or the like.

With the shield wiring line 1012 disposed between the sense node SN and the drive line LD in this manner, it is possible to reduce the coupling capacitance between the sense node SN and the drive line LD. This suppresses the fluctuation of the SN potential due to the potential change of the drive signal applied to the drive line LD, making it possible to suppress the occurrence of false detection and a dead period.

Furthermore, in the present embodiment, the wiring line (the drive line LD in the region R13 in the examples illustrated in FIGS. 79 to 83, for example) connecting the drive lines LD and the gates of the various transistors on the semiconductor substrate 1001 is substantially perpendicular to the element formation surface of the semiconductor substrate 1001. This makes it possible to reduce the facing area between the sense node SN and the drive line LD, leading to the reduction of the coupling capacitance between the sense node SN and the drive line LD. This suppresses the fluctuation of the SN potential due to the drive signal applied to the drive line LD, making it possible to suppress the occurrence of false detection and a dead period.

11. Example of Application to Moving Object

The technology according to the present disclosure (the present technology) is applicable to various products. The technology according to the present disclosure may be applied to devices mounted on any of moving objects such as automobiles, electric vehicles, hybrid electric vehicles, motorcycles, bicycles, personal mobility, airplanes, drones, ships, and robots.

Figure 84:
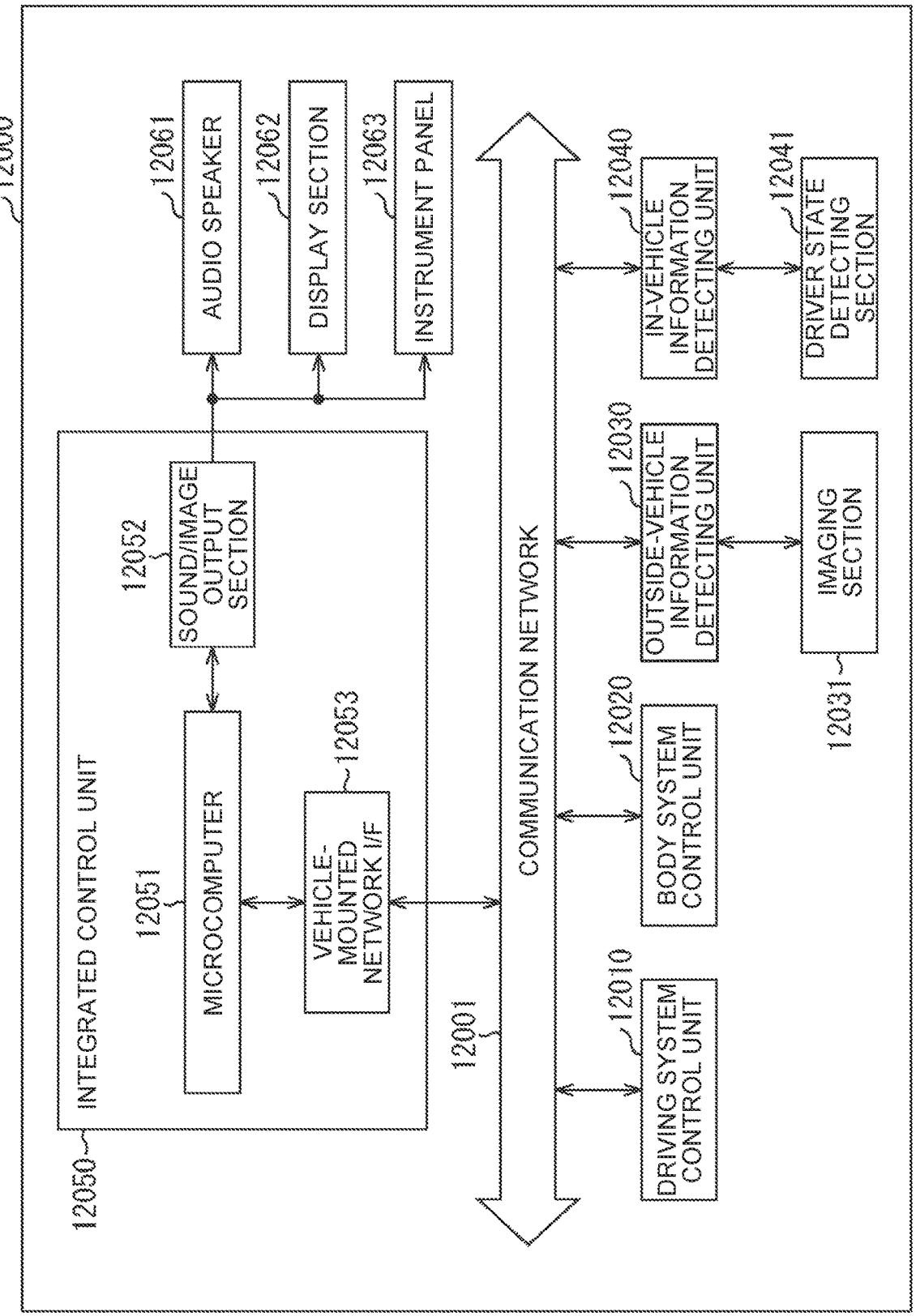
FIG. 84 is a block diagram depicting an example of schematic configuration of a vehicle control system.

FIG. 84 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 84, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

Figure 85:
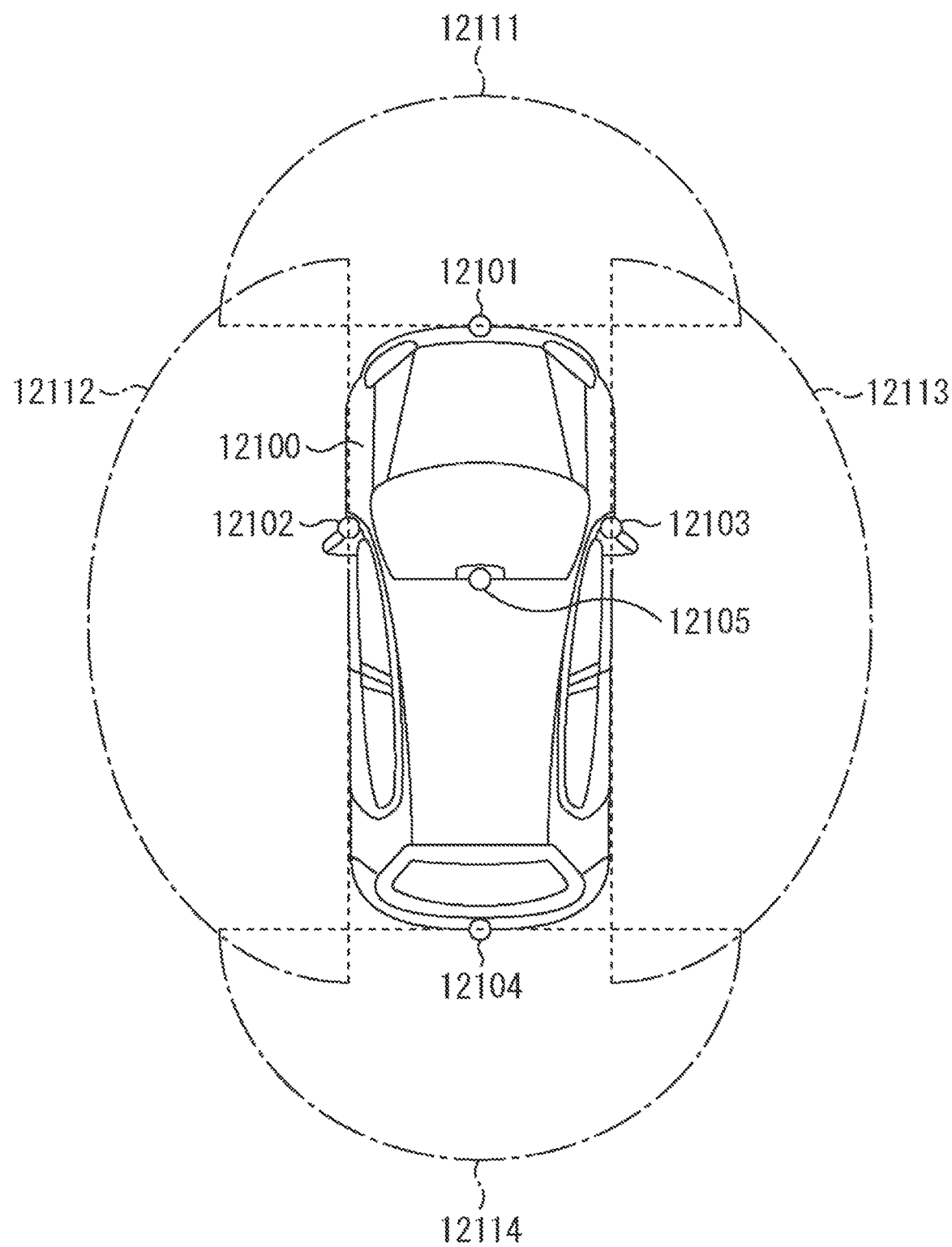
FIG. 85 is a diagram of assistance in explaining an example of installation positions of an outside-vehicle information detecting section and an imaging section.

The sound/image output section 12052 transmits an output signal of at least one of a sound and an image to an output device capable of visually or auditorily notifying information to an occupant of the vehicle or the outside of the vehicle. In the example of FIG. 85, an audio speaker 12061, a display section 12062, and an instrument panel 12063 are illustrated as the output device. The display section 12062 may, for example, include at least one of an on-board display and a head-up display.

FIG. 85 is a diagram depicting an example of the installation position of the imaging section 12031.

In FIG. 85, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 85 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, an example of the vehicle control system to which the technology according to the present disclosure is applicable has been described. The technology according to the present disclosure can be suitably applied to the imaging section 12031 among the configurations described above. Specifically, the imaging device 100 in FIG. 1 can be applied to the imaging section 12031. By applying the technology according to the present disclosure to the imaging section 12031, it is possible to achieve microfabrication of pixels and higher visibility in captured image, leading to alleviation of driver's fatigue.

Note that the above-described embodiment illustrates an example for embodying the present technology, and the matters in the embodiment and the invention specifying matters in the claims have a correspondence relationship. Similarly, the matters specifying the invention in the claims and the matters in the embodiments of the present technology denoted by the same names as the matters specifying the invention have a correspondence relationship. However, the present technology is not limited to the embodiments, and can be embodied by making various modifications to the embodiments without departing from the scope and spirit of the present technology.

The effects described in the present specification are merely examples, and thus, there may be other effects, not limited to the exemplified effects.

Note that the present technology can also have the following configurations.

(1)

A solid-state imaging device comprising:
a plurality of pixels that each outputs a luminance change of incident light; and
a detection circuit that outputs an event signal based on the luminance change output from each of the pixels, wherein each of the pixels includes:
a photoelectric conversion element that generates a charge according to an incident light amount;
a logarithmic conversion circuit that is connected to the photoelectric conversion element and converts a photocurrent flowing out of the photoelectric conversion element into a voltage signal corresponding to a logarithmic value of the photocurrent; and
a first transistor having a drain connected to a sense node of the logarithmic conversion circuit.

(2)

The solid-state imaging device according to (1), wherein the first transistor has a source connected to a first potential that is equal to or higher than a reference potential and lower than a power supply voltage.

(3)

The solid-state imaging device according to (2),
wherein each of the pixels further includes a first circuit that outputs a luminance change of the incident light that has entered on the photoelectric conversion element based on the voltage signal output from the logarithmic conversion circuit, and
the detection circuit includes a second circuit that outputs the event signal based on the luminance change output from each of the pixels.

(4)

The solid-state imaging device according to (2), wherein the reference potential is either a negative potential or a ground potential.

(5)

The solid-state imaging device according to (2), wherein the first potential is a potential lower than a potential of the sense node at normal operation of the logarithmic conversion circuit.

(6)

The solid-state imaging device according to any one of (2) to (5),
wherein the logarithmic conversion circuit includes:
a second transistor having a gate connected to the photoelectric conversion element; and
a third transistor having a source connected to the photoelectric conversion element,
the third transistor has a gate connected to a drain of the second transistor, and
the sense node is a wiring line connected to the gate of the second transistor.

(7)

The solid-state imaging device according to (6), wherein each of the pixels further includes a fourth transistor having a drain connected to the gate of the second transistor and to the source of the third transistor, and having a source connected to the photoelectric conversion element.

(8)

The solid-state imaging device according to (7),
wherein each of the pixels further includes:
a fifth transistor having a source connected to the photoelectric conversion element; and
a readout circuit that is connected to a drain of the fifth transistor and generates a pixel signal according to a charge generated in the photoelectric conversion element.

(9)

The solid-state imaging device according to (8), wherein the first transistor is connected to the sense node through the fifth transistor and the fourth transistor.

(10)

The solid-state imaging device according to (8) or (9), wherein each of the pixels further includes a sixth transistor connected to the drain of the fourth transistor and to the drain of the fifth transistor.

(11)

The solid-state imaging device according to (10), wherein the first transistor is connected to the sense node through the sixth transistor.

(12)

The solid-state imaging device according to any one of (8) to (11),
wherein the readout circuit includes the first transistor having the source connected to the drain of the fifth transistor and having the drain connected to the first potential.

(13)

The solid-state imaging device according to (12), wherein each of the pixels further includes a sixth transistor connected to the drain of the fourth transistor and to the drain of the fifth transistor.

(14)

The solid-state imaging device according to any one of (8) to (13), wherein the first transistor is connected to the sense node through the fourth transistor.

(15)

The solid-state imaging device according to (7),
wherein each of the pixels further includes:
a fifth transistor having a source connected to the drain of the fourth transistor; and
a sixth transistor having a drain connected to the drain of the fourth transistor, to the source of the third transistor, and to the gate of the second transistor, and having a source connected to the drain of the fifth transistor, and
the first transistor is connected to the sense node through the sixth transistor.

(16)
The solid-state imaging device according to (15),
wherein each of the pixels further includes a readout circuit that is connected to the drain of the fifth transistor and generates a pixel signal according to a charge generated in the photoelectric conversion element, and
the readout circuit includes the first transistor having the source connected to the drain of the fifth transistor and having the drain connected to the first potential.

(17)
The solid-state imaging device according to any one of (1) to (16), in which the logarithmic conversion circuit includes a bias circuit that controls a current flowing through the logarithmic conversion circuit.

(18)
The solid-state imaging device according to any one of (1) to (17),
wherein each of the pixels further includes a fifth transistor having a source connected to the photoelectric conversion element, and
the solid-state imaging device further includes a common line that commonly connects the drain of the fifth transistor among the plurality of pixels.

(19)
The solid-state imaging device according to (18), further comprising a readout circuit that is connected to the common line and generates a pixel signal according to a charge generated in the photoelectric conversion element of each of the pixels.

(20)
The solid-state imaging device according to (18) or (19), wherein the first transistor is connected to the common line and shared by the plurality of pixels.

(21)
The solid-state imaging device according to any one of (1) to (20),
wherein the photoelectric conversion elements included in each of the plurality of pixels are arranged in a matrix on an element formation surface of a semiconductor substrate, and
the first transistor is disposed on the element formation surface between the photoelectric conversion elements arranged in the matrix.

(22)
The solid-state imaging device according to (10),
in which the photoelectric conversion elements included in each of the plurality of pixels are arranged in a matrix on an element formation surface of a semiconductor substrate, and
the sixth transistor is disposed on the element formation surface between the photoelectric conversion elements arranged in the matrix.

(23)
The solid-state imaging device according to (21) or (22), in which the photoelectric conversion element and the first transistor are periodically arranged in the matrix on the element formation surface.

(24)
A solid-state imaging device including:
a plurality of pixels that each output a luminance change of incident light; and
a detection circuit that outputs an event signal based on the luminance change output from each of the pixels,
in which each of the pixels includes:
a photoelectric conversion element that generates a charge according to an incident light amount; and
a logarithmic conversion circuit that is connected to the photoelectric conversion element and converts a photocurrent flowing out of the photoelectric conversion element into a voltage signal corresponding to a logarithmic value of the photocurrent,
the photoelectric conversion elements included in each of the plurality of pixels are arranged in a matrix on an element formation surface of a semiconductor substrate,
the logarithmic conversion circuit includes:
a first transistor having a gate connected to the photoelectric conversion element;
a second transistor having a source connected to the photoelectric conversion element and having a gate connected to a drain of the first transistor;
a third transistor having a source connected to a drain of the first transistor and to the gate of the second transistor, and having a gate connected to a drain of the second transistor; and
a fourth transistor having a source connected to the drain of the second transistor and to the gate of the third transistor, and having a gate connected to a drain of the third transistor,
the solid-state imaging device further including:
a first wiring line connected to the gate of the first transistor;
a second wiring line that connects the gate of the second transistor and the drain of the first transistor to each other;
a third wiring line that connects the gate of the third transistor and the drain of the second transistor to each other; and
a fourth wiring line that connects the gate of the fourth transistor and the drain of the third transistor to each other,
the first to fourth wiring lines are dispersedly arranged in a plurality of wiring layers in an interlayer insulating film disposed on a side of the element formation surface of the semiconductor substrate, and
at least a part of the fourth wiring line is disposed in a wiring layer closest to a side of the semiconductor substrate among the plurality of wiring layers disposed in the interlayer insulating film.

(25)
A solid-state imaging device including:
a plurality of pixels that each output a luminance change of incident light; and
a detection circuit that outputs an event signal based on the luminance change output from each of the pixels,
wherein each of the pixels includes:
a photoelectric conversion element that generates a charge according to an incident light amount; and
a logarithmic conversion circuit that is connected to the photoelectric conversion element and converts a photocurrent flowing out of the photoelectric conversion element into a voltage signal corresponding to a logarithmic value of the photocurrent,
the photoelectric conversion elements included in each of the plurality of pixels are arranged in a matrix on an element formation surface of a semiconductor substrate,
the logarithmic conversion circuit includes:
a first transistor having a gate connected to the photoelectric conversion element;
a second transistor having a source connected to the photoelectric conversion element and having a gate connected to a drain of the first transistor;

a third transistor having a source connected to a drain of the first transistor and to a gate of the second transistor, and having a gate connected to a drain of the second transistor; and a fourth transistor having a source connected to a drain of the second transistor and to a gate of the third transistor, and having a gate connected to a drain of the third transistor, the solid-state imaging device further including:

a first wiring line connected to the gate of the first transistor;

a second wiring line that connects the gate of the second transistor and the drain of the first transistor to each other;

a third wiring line that connects the gate of the third transistor and the drain of the second transistor to each other; and a fourth wiring line that connects a gate of the fourth transistor and the drain of the third transistor to each other, the first to fourth wiring lines are dispersedly arranged in a plurality of wiring layers in an interlayer insulating film disposed on a side of the element formation surface of the semiconductor substrate, and at least one of the first to fourth wiring lines has a comb-tooth structure.

(26)

A solid-state imaging device including:

a plurality of pixels that each output a luminance change of incident light; and a detection circuit that outputs an event signal based on the luminance change output from each of the pixels, in which each of the pixels includes:

a photoelectric conversion element that generates a charge according to an incident light amount; and a logarithmic conversion circuit that is connected to the photoelectric conversion element and converts a photocurrent flowing out of the photoelectric conversion element into a voltage signal corresponding to a logarithmic value of the photocurrent, the photoelectric conversion elements included in each of the plurality of pixels are arranged in a matrix on an element formation surface of a semiconductor substrate, the logarithmic conversion circuit includes:

a first transistor having a gate connected to the photoelectric conversion element;

a second transistor having a source connected to the photoelectric conversion element and having a gate connected to a drain of the first transistor;

a third transistor having a source connected to the drain of the first transistor and to a gate of the second transistor, and having a gate connected to a drain of the second transistor; and a fourth transistor having a source connected to the drain of the second transistor and to the gate of the third transistor, and having a gate connected to a drain of the third transistor, the solid-state imaging device further comprising:

a first wiring line connected to the gate of the first transistor;

a second wiring line that connects the gate of the second transistor and the drain of the first transistor to each other;

a third wiring line that connects the gate of the third transistor and the drain of the second transistor to each other; and a fourth wiring line that connects the gate of the fourth transistor and the drain of the third transistor to each other, the first to fourth wiring lines are dispersedly arranged in a plurality of wiring layers in an interlayer insulating film disposed on a side of the element formation surface of the semiconductor substrate, at least a part of the fourth wiring line is disposed in a wiring layer closest to a side of the semiconductor substrate among the plurality of wiring layers disposed in the interlayer insulating film, and the at least a part of the fourth wiring line disposed in the wiring layer closest to the side of the semiconductor substrate has a solid pattern.

(27)

A solid-state imaging device including:

a plurality of pixels that each output a luminance change of incident light; and a detection circuit that outputs an event signal based on the luminance change output from each of the pixels, in which each of the pixels includes:

a photoelectric conversion element that generates a charge according to an incident light amount; and a logarithmic conversion circuit that is connected to the photoelectric conversion element and converts a photocurrent flowing out of the photoelectric conversion element into a voltage signal corresponding to a logarithmic value of the photocurrent, the photoelectric conversion elements included in each of the plurality of pixels are arranged in a matrix on an element formation surface of a semiconductor substrate, the logarithmic conversion circuit includes:

a first transistor having a gate connected to the photoelectric conversion element;

a second transistor having a source connected to the photoelectric conversion element and having a gate connected to a drain of the first transistor;

a third transistor having a source connected to the drain of the first transistor and to the gate of the second transistor, and having a gate connected to a drain of the second transistor; and a fourth transistor having a source connected to the drain of the second transistor and to the gate of the third transistor, and having a gate connected to a drain of the third transistor, the solid-state imaging device further including:

a first wiring line connected to the gate of the first transistor;

a second wiring line that connects the gate of the second transistor and the drain of the first transistor to each other;

a third wiring line that connects the gate of the third transistor and the drain of the second transistor to each other; and a fourth wiring line that connects the gate of the fourth transistor and the drain of the third transistor to each other, the first to fourth wiring lines are dispersedly arranged in a plurality of wiring layers in an interlayer insulating film disposed on a side of the element formation surface of the semiconductor substrate, a wiring layer closest to the semiconductor substrate includes a gate electrode of one or more transistors formed on the element formation surface of the semiconductor substrate, and the at least a part of the fourth wiring line is a gate electrode of at least one of the one or more transistors.

(28)

A solid-state imaging device including:
a plurality of pixels that each output a luminance change of incident light; and
a detection circuit that outputs an event signal based on the luminance change output from each of the pixels,
in which each of the pixels includes:
a photoelectric conversion element that generates a charge according to an incident light amount; and
a logarithmic conversion circuit that is connected to the photoelectric conversion element and converts a photocurrent flowing out of the photoelectric conversion element into a voltage signal corresponding to a logarithmic value of the photocurrent,
the photoelectric conversion elements included in each of the plurality of pixels are arranged in a matrix on an element formation surface of a semiconductor substrate,
the logarithmic conversion circuit includes:
a first transistor having a gate connected to the photoelectric conversion element;
a second transistor having a source connected to the photoelectric conversion element and having a gate connected to a drain of the first transistor;
a third transistor having a source connected to the drain of the first transistor and to the gate of the second transistor, and having a gate connected to a drain of the second transistor; and
a fourth transistor having a source connected to the drain of the second transistor and to the gate of the third transistor, and having a gate connected to a drain of the third transistor,
the solid-state imaging device further including:
a first wiring line connected to the gate of the first transistor;
a second wiring line that connects the gate of the second transistor and the drain of the first transistor to each other;
a third wiring line that connects the gate of the third transistor and the drain of the second transistor to each other;
a fourth wiring line that connects the gate of the fourth transistor and the drain of the third transistor to each other; and
a power supply line that is disposed in the interlayer insulating film and connected to one of a power supply voltage, ground, or a predetermined potential,
the first to fourth wiring lines are dispersedly arranged in a plurality of wiring layers in an interlayer insulating film disposed on a side of the element formation surface of the semiconductor substrate, and
at least a part of the fourth wiring line disposed at a position closer to the semiconductor substrate than a layer closest to the semiconductor substrate, among a layer in which the power supply line is disposed.

(29)

The solid-state imaging device according to any one of (24) to (28), in which a coupling capacitance formed between wiring lines disposed in a wiring layer closest to the side of the semiconductor substrate among the first to fourth wiring lines is smaller than a coupling capacitance formed between wiring lines disposed in a wiring layer above the wiring layer closest to the side of the semiconductor substrate.

(30)

A solid-state imaging device including:
a plurality of pixels that each output a luminance change of incident light; and
a detection circuit that outputs an event signal based on the luminance change output from each of the pixels,
in which each of the pixels includes:
a photoelectric conversion element that generates a charge according to an incident light amount; and
a logarithmic conversion circuit that is connected to the photoelectric conversion element and converts a photocurrent flowing out of the photoelectric conversion element into a voltage signal corresponding to a logarithmic value of the photocurrent,
the photoelectric conversion elements included in each of the plurality of pixels are arranged in a matrix on an element formation surface of a semiconductor substrate,
the logarithmic conversion circuit includes:
a first transistor having a gate connected to the photoelectric conversion element;
a second transistor having a source connected to the photoelectric conversion element and having a gate connected to a drain of the first transistor; and
a sense node connected to the gate of the first transistor,
each of the pixels further includes:
a third transistor having a drain connected to the gate of the first transistor and to the source of the second transistor and having a source connected to the photoelectric conversion element;
a fourth transistor having a source connected to the photoelectric conversion element; and
a readout circuit that is connected to a drain of the fourth transistor and generates a pixel signal according to a charge generated in the photoelectric conversion element,
the solid-state imaging device further includes:
a first drive line connected to a gate of the third transistor;
a second drive line connected to a gate of the fourth transistor; and
one or more third drive lines connected to gates of one or more transistors constituting the readout circuit,
the first to third drive lines and the sense node are dispersedly arranged in a plurality of wiring layers in an interlayer insulating film disposed on a side of the element formation surface of the semiconductor substrate, and
the first to third drive lines and the sense node are disposed in mutually different layers among the plurality of wiring layers.

(31)

The solid-state imaging device according to (30), further including a shield layer disposed between the sense node and the first to third drive lines.

(32)

The solid-state imaging device according to (31), in which the shield layer includes at least one of: a power supply line connected to a power supply voltage, a ground voltage, or a predetermined potential; and a wiring line other than the sense node among wiring lines constituting the logarithmic conversion circuit.

(33)

The solid-state imaging device according to any one of (30) to (32), in which the first to third drive lines are arranged in an uppermost layer of the plurality of wiring layers.

(34)

The solid-state imaging device according to any one of (30) to (32), in which a wiring line that connects at least one of the first to third drive lines and the gate to each other extends substantially perpendicularly to the element formation surface.

(35)

An imaging device including:

the solid-state imaging device according to (2); and a control section that controls the solid-state imaging device, wherein the solid-state imaging device includes a plurality of operation modes, and the control section controls a potential of the sense node at a time of switching operation modes of the solid-state imaging device.

(36)

The imaging device according to (35), in which the control section applies the first potential to the sense node and/or the cathode of the photoelectric conversion element via the first transistor at the time of switching the operation modes of the solid-state imaging device.

(37)

The imaging device according to (35) or (36), in which the control section cuts off a current flowing through the logarithmic conversion circuit at the time of switching the operation modes of the solid-state imaging device.

REFERENCE SIGNS LIST

100 IMAGING DEVICE
110 OPTICAL SECTION
120 RECORDING SECTION
130 CONTROL SECTION
200 SOLID-STATE IMAGING DEVICE
201 LIGHT RECEIVING CHIP
202, 202A, 1202 DETECTION CHIP
211 to 213, 231 to 233 VIA ARRANGEMENT PORTION
220 LIGHT RECEIVING SECTION
221, 221A, 221C, 221CC, 221D, 821, 821C, 821CC, 821D SHARED BLOCK
240 SIGNAL PROCESSING CIRCUIT
251 ROW DRIVE CIRCUIT
252 COLUMN DRIVE CIRCUIT
260 ADDRESS EVENT DETECTION SECTION
270 COLUMN ADC
280 ROW ARBITER
300 DETECTION PIXEL
301, 301A to 301N, 301Y, 801A, 801C, 801D RESPONSE CIRCUIT
305 DETECTION CIRCUIT
310, 310A LOGARITHMIC RESPONSE SECTION
311 PHOTOELECTRIC CONVERSION ELEMENT
312, 313, 315, 316, 347, 512 nMOS TRANSISTOR
314, 314a, 314b, 345, 346, 411, 511 pMOS TRANSISTOR
314A, 314B BIAS CIRCUIT
314c DAC
314d BIAS CONTROL TRANSISTOR
314e CONSTANT CURRENT SOURCE
317 SWITCHING TRANSISTOR
318, 319 CONTROL TRANSISTOR
320 DETECTION BLOCK
370 PIXEL CIRCUIT
370a READOUT CIRCUIT
372 TRANSFER TRANSISTOR
373 RESET TRANSISTOR
374 FLOATING DIFFUSION REGION
375 AMPLIFICATION TRANSISTOR
376 SELECTION TRANSISTOR
330 BUFFER
340 DIFFERENTIATOR
341, 343 CAPACITOR
342 INVERTER
344 SWITCH
360 TRANSFER CIRCUIT
400 SELECTION SECTION
410, 420 SELECTOR
500 COMPARISON SECTION
510, 520 COMPARATOR
972, 973 DUMMY TRANSISTOR
1001 SEMICONDUCTOR SUBSTRATE
1002 WELL LAYER
1003 GATE INSULATING FILM
1004 TRANSISTOR
1010 INTERLAYER INSULATING FILM
1011 VIA WIRING LINE
1012 SHIELD WIRING LINE
3101 COMMON LINE
LD, TG11 to TG42 DRIVE LINE
M1 FIRST WIRING LAYER
M2 SECOND WIRING LAYER
M3 THIRD WIRING LAYER
M4 FOURTH WIRING LAYER
N1 NODE (N1 WIRING LINE)
N2 NODE (N2 WIRING LINE)
N3 NODE (N3 WIRING LINE)
N4 NODE (N4 WIRING LINE)
SN SENSE NODE
VSL VERTICAL SIGNAL LINE

The invention claimed is:

1. A solid-state imaging device comprising:

a plurality of pixels that each outputs a luminance change of incident light; and a detection circuit that outputs an event signal based on the luminance change output from each of the plurality of pixels, wherein each of the plurality of pixels includes:

a photoelectric conversion element that generates a charge according to an incident light amount;

a logarithmic conversion circuit that is connected to the photoelectric conversion element and converts a photocurrent flowing out of the photoelectric conversion element into a voltage signal corresponding to a logarithmic value of the photocurrent; and a first transistor having a drain connected to a sense node of the logarithmic conversion circuit.

2. The solid-state imaging device according to claim 1, wherein the first transistor has a source connected to a first potential that is equal to or higher than a reference potential and lower than a power supply voltage.

3. The solid-state imaging device according to claim 2, wherein each of the plurality of pixels further includes a first circuit that outputs a luminance change of the incident light that has entered on the photoelectric conversion element based on the voltage signal output from the logarithmic conversion circuit, and the detection circuit includes a second circuit that outputs the event signal based on the luminance change output from each of the plurality of pixels.

4. The solid-state imaging device according to claim 2, wherein the reference potential is either a negative potential or a ground potential.

5. The solid-state imaging device according to claim 2, wherein the first potential is a potential lower than a potential of the sense node at normal operation of the logarithmic conversion circuit.

6. The solid-state imaging device according to claim 2, wherein the logarithmic conversion circuit includes:
a second transistor having a gate connected to the photoelectric conversion element; and
a third transistor having a source connected to the photoelectric conversion element,
the third transistor has a gate connected to a drain of the second transistor, and
the sense node is a wiring line connected to the gate of the second transistor.

7. The solid-state imaging device according to claim 6, wherein each of the plurality of pixels further includes a fourth transistor having a drain connected to the gate of the second transistor and to the source of the third transistor, and having a source connected to the photoelectric conversion element.

8. The solid-state imaging device according to claim 7, wherein each of the plurality of pixels further includes:
a fifth transistor having a source connected to the photoelectric conversion element; and
a readout circuit that is connected to a drain of the fifth transistor and generates a pixel signal according to a charge generated in the photoelectric conversion element.

9. The solid-state imaging device according to claim 8, wherein the first transistor is connected to the sense node through the fifth transistor and the fourth transistor.

10. The solid-state imaging device according to claim 8, wherein each of the plurality of pixels further includes a sixth transistor connected to the drain of the fourth transistor and to the drain of the fifth transistor.

11. The solid-state imaging device according to claim 10, wherein the first transistor is connected to the sense node through the sixth transistor.

12. The solid-state imaging device according to claim 8, wherein the readout circuit includes the first transistor having the source connected to the drain of the fifth transistor and having the drain connected to the first potential.

13. The solid-state imaging device according to claim 12, wherein each of the plurality of pixels further includes a sixth transistor connected to the drain of the fourth transistor and to the drain of the fifth transistor.

14. The solid-state imaging device according to claim 8, wherein the first transistor is connected to the sense node through the fourth transistor.

15. The solid-state imaging device according to claim 7, wherein each of the plurality of pixels further includes:
a fifth transistor having a source connected to the drain of the fourth transistor; and
a sixth transistor having a drain connected to the drain of the fourth transistor, to the source of the third transistor, and to the gate of the second transistor, and having a source connected to the drain of the fifth transistor, and
the first transistor is connected to the sense node through the sixth transistor.

16. The solid-state imaging device according to claim 15, wherein each of the plurality of pixels further includes a readout circuit that is connected to the drain of the fifth transistor and generates a pixel signal according to a charge generated in the photoelectric conversion element, and
the readout circuit includes the first transistor having the source connected to the drain of the fifth transistor and having the drain connected to the first potential.

17. The solid-state imaging device according to claim 1, wherein each of the plurality of pixels further includes a fifth transistor having a source connected to the photoelectric conversion element, and
the solid-state imaging device further includes a common line that commonly connects the drain of the fifth transistor among the plurality of pixels.

18. The solid-state imaging device according to claim 17, further comprising a readout circuit that is connected to the common line and generates a pixel signal according to a charge generated in the photoelectric conversion element of each of the plurality of pixels.

19. The solid-state imaging device according to claim 17, wherein the first transistor is connected to the common line and shared by the plurality of pixels.

20. The solid-state imaging device according to claim 1, wherein the photoelectric conversion elements included in each of the plurality of pixels are arranged in a matrix on an element formation surface of a semiconductor substrate, and
the first transistor is disposed on the element formation surface between the photoelectric conversion elements arranged in the matrix.

* * * * *